US012641999B2

(12) United States Patent
Kwon et al.

(10) Patent No.: US 12,641,999 B2
(45) Date of Patent: May 26, 2026

(54) COMPOSITION FOR ORGANIC OPTOELECTRONIC DEVICE, ORGANIC OPTOELECTRONIC DEVICE AND DISPLAY DEVICE

(71) Applicant: SAMSUNG SDI CO., LTD., Yongin-si (KR)

(72) Inventors: Jiyun Kwon, Suwon-si (KR); Youngkyoung Jo, Suwon-si (KR); Dong Min Kang, Suwon-si (KR); Byungku Kim, Suwon-si (KR); Hyungyu Lee, Suwon-si (KR); Eunjeong Choi, Suwon-si (KR); Namheon Lee, Suwon-si (KR); Kipo Jang, Suwon-si (KR); Sung-Hyun Jung, Suwon-si (KR); Ho Kuk Jung, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 1234 days.

(21) Appl. No.: 17/370,443

(22) Filed: Jul. 8, 2021

(65) Prior Publication Data

US 2023/0039779 A1 Feb. 9, 2023

(30) Foreign Application Priority Data

Jul. 17, 2020 (KR) ........................ 10-2020-0088979

(51) Int. Cl.

| | |
|---|---|
| ***H10K 85/60*** | (2023.01) |
| ***H10K 50/11*** | (2023.01) |
| ***H10K 50/15*** | (2023.01) |
| ***H10K 50/17*** | (2023.01) |
| ***H10K 85/40*** | (2023.01) |
| ***H10K 101/10*** | (2023.01) |
| ***H10K 101/30*** | (2023.01) |

(52) U.S. Cl.

CPC ........... *H10K 85/654* (2023.02); *H10K 85/40* (2023.02); *H10K 85/622* (2023.02); *H10K 85/636* (2023.02); *H10K 85/6572* (2023.02); *H10K 85/6574* (2023.02); *H10K 85/6576* (2023.02); *H10K 50/11* (2023.02); *H10K 50/15* (2023.02); *H10K 50/17* (2023.02); *H10K 2101/10* (2023.02); *H10K 2101/30* (2023.02)

(58) Field of Classification Search

CPC ............. H10K 85/654; H10K 85/6574; H10K 85/636; H10K 85/622; H10K 85/6576; H10K 85/6572

See application file for complete search history.

(56) References Cited

U.S. PATENT DOCUMENTS

| | | | | |
|---|---|---|---|---|
| 5,061,569 | A | 10/1991 | Vanslyke et al. | |
| 2002/0182441 | A1* | 12/2002 | Lamansky | C07F 15/0033 428/917 |
| 2007/0252516 | A1* | 11/2007 | Kondakova | H10K 50/11 428/917 |
| 2012/0112174 | A1 | 5/2012 | Lee et al. | |
| 2020/0111967 | A1 | 4/2020 | Lee et al. | |
| 2021/0163452 | A1* | 6/2021 | Yoo | H10K 85/6576 |

FOREIGN PATENT DOCUMENTS

| | | | | |
|---|---|---|---|---|
| CN | 102558121 | A | 11/2011 | |
| CN | 109575002 | A * | 4/2019 | C07D 209/86 |
| CN | 111009612 | A | 4/2020 | |
| JP | 1993-009471 | A | 1/1993 | |
| JP | 1995-126615 | A | 5/1995 | |
| JP | 1998-095973 | A | 4/1998 | |
| JP | 2014-531420 | A | 11/2014 | |
| KR | 10-2013-0025190 | A | 3/2013 | |
| KR | 10-2014-0057439 | A | 5/2014 | |
| KR | 10-1423173 | B1 | 7/2014 | |
| KR | 10-2015-0094398 | A | 8/2015 | |
| KR | 10-1603070 | B1 | 3/2016 | |
| KR | 20160029721 | A * | 3/2016 | |
| KR | 10-1638071 | B1 | 7/2016 | |
| KR | 10-2018-0138269 | A | 12/2018 | |
| KR | 10-2019-0068271 | A | 6/2019 | |
| KR | 10-2019-0089764 | A | 7/2019 | |
| KR | 10-2019-0123138 | A | 10/2019 | |
| KR | 10-2020-0038763 | A | 4/2020 | |
| WO | WO 1995/009147 | A1 | 4/1995 | |
| WO | WO 2010/021524 | A2 | 2/2010 | |
| WO | WO 2010/114264 | A2 | 10/2010 | |
| WO | WO 2011/068204 | A1 | 6/2011 | |
| WO | WO 2013/035275 | A1 | 3/2013 | |
| WO | WO-2013032297 | A1 * | 3/2013 | C07B 59/002 |
| WO | WO 2013/077352 | A1 | 5/2013 | |
| WO | WO 2013/077362 | A1 | 5/2013 | |
| WO | WO 2014/002871 | A1 | 1/2014 | |
| WO | WO 2018/110958 | A1 | 6/2018 | |

OTHER PUBLICATIONS

Cha et al., machine translation of KR-20160029721-A (2016) pp. 1-73. (Year: 2016).*
He et al., machine translation of CN-109575002-A (2019) pp. 1-36. (Year: 2019).*
Korean Office Action dated Oct. 26, 2023, of the corresponding Korean Patent Application No. 10-2020-0088979.
Chinese Office action dated Feb. 29, 2024.

* cited by examiner

*Primary Examiner* — Dylan C Kershner
(74) *Attorney, Agent, or Firm* — Lee IP Law, P.C.

(57) ABSTRACT

Provided are a composition for an organic optoelectronic device including a first compound represented by Chemical Formula 1 and a second compound represented by Chemical Formula 2, an organic optoelectronic device including the same, and a display device. Details of Chemical Formula 1 and Chemical Formula 2 are as defined in the specification.

14 Claims, 1 Drawing Sheet

COMPOSITION FOR ORGANIC OPTOELECTRONIC DEVICE, ORGANIC OPTOELECTRONIC DEVICE AND DISPLAY DEVICE

CROSS-REFERENCE TO RELATED APPLICATION

This application claims priority to and the benefit of Korean Patent Application No. 10-2020-0088979 filed in the Korean Intellectual Property Office on Jul. 17, 2020, the entire contents of which are incorporated herein by reference.

BACKGROUND

1. Field

Embodiments relate to a composition for an organic optoelectronic device, an organic optoelectronic device, and a display device.

2. Description of the Related Art

An organic optoelectronic device (e.g., organic optoelectronic diode) is a device capable of converting electrical energy and optical energy to each other.

Organic optoelectronic devices may be divided into two types according to a principle of operation. One is a photoelectric device that generates electrical energy by separating excitons formed by light energy into electrons and holes, and transferring the electrons and holes to different electrodes, respectively and the other is light emitting device that generates light energy from electrical energy by supplying voltage or current to the electrodes.

Examples of the organic optoelectronic device include an organic photoelectric device, an organic light emitting diode, an organic solar cell, and an organic photoconductor drum.

Among them, organic light emitting diodes (OLEDs) are attracting much attention in recent years due to increasing demands for flat panel display devices. The organic light emitting diode is a device that converts electrical energy into light, and the performance of the organic light emitting diode may be influenced by an organic material between electrodes.

SUMMARY

The embodiments may be realized by providing a composition for an organic optoelectronic device, the composition including a first compound represented by Chemical Formula 1, and a second compound represented by Chemical Formula 2:

[Chemical Formula 1]

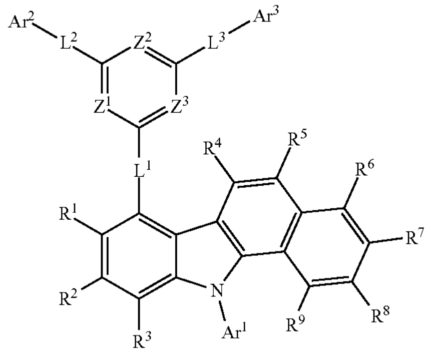

wherein in Chemical Formula 1, $Z^1$ to $Z^3$ are each independently N or $CR^a$, at least two of $Z^1$ to $Z^3$ being N, $R^a$ and $R^1$ to $R^9$ are each independently hydrogen, deuterium, a substituted or unsubstituted C1 to C30 alkyl group, a substituted or unsubstituted C6 to C30 aryl group, or a substituted or unsubstituted C2 to C30 heterocyclic group, $L^1$ to $L^3$ are each independently a single bond, or a substituted or unsubstituted C6 to C30 arylene group, and $Ar^1$ to $Ar^3$ are each independently a substituted or unsubstituted C6 to C30 aryl group or a substituted or unsubstituted C2 to C30 heterocyclic group;

[Chemical Formula 2]

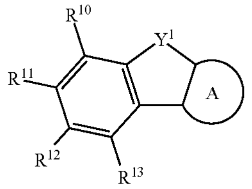

in Chemical Formula 2, $Y^1$ is O, S, or N—$R^b$, $R^b$ and $R^{10}$ to $R^{13}$ are each independently hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, and A is a ring of Group I or Group II,

[Group I]

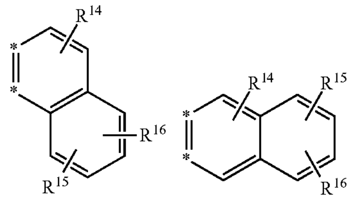

[Group II]

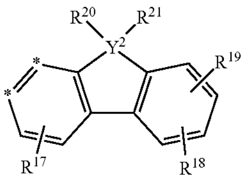

-continued

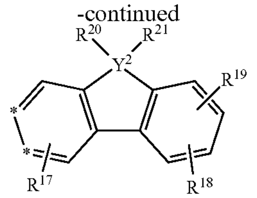

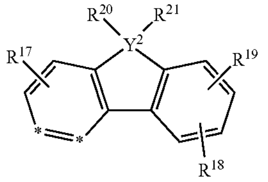

in Group I and Group II, each * is a linking carbon, $Y^2$ is C or Si, $R^{14}$ to $R^{19}$ are each independently hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, $R^{20}$ and $R^{21}$ are each independently a substituted or unsubstituted C1 to C30 alkyl group, or a substituted or unsubstituted C6 to C30 aryl group, and in Chemical Formula 2 and Groups I and II, at least one of $R^{10}$ to $R^{19}$ is a group represented by Chemical Formula a,

[Chemical Formula a]

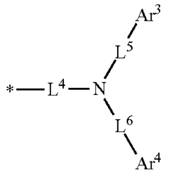

in Chemical Formula a, $L^4$ to $L^6$ are each independently a single bond or a substituted or unsubstituted C6 to C30 arylene group, $Ar^3$ and $Ar^4$ are each independently a substituted or unsubstituted amine group, a substituted or unsubstituted C6 to C30 aryl group, or a substituted or unsubstituted C2 to C30 heterocyclic group, and * is a linking point.

The embodiments may be realized by providing an organic optoelectronic device including an anode and a cathode facing each other, and at least one organic layer between the anode and the cathode, wherein the at least one organic layer includes a light emitting layer, and the light emitting layer includes the composition for an organic optoelectronic device according to an embodiment.

The embodiments may be realized by providing a display device comprising the organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
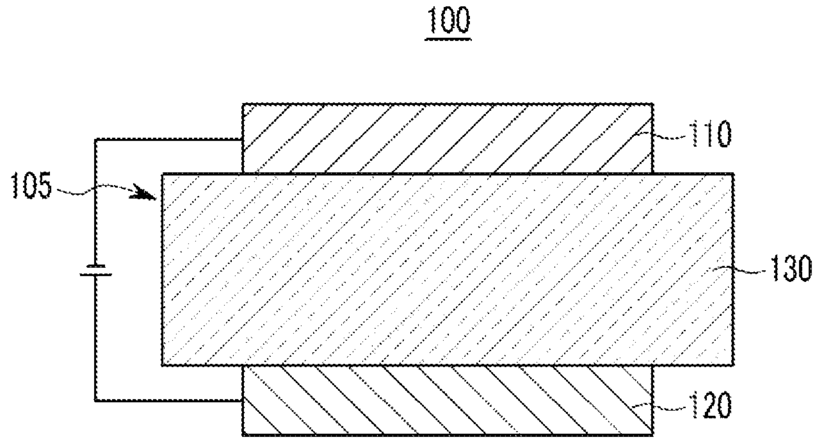
FIGS. 1 and 2 are cross-sectional views each illustrating an organic light emitting diode according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

In one example of the present disclosure, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof. As used herein, the term "or" is not an exclusive term, e.g., "A or B" would include A, B, or A and B.

In specific example of the present disclosure, the "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In specific example of the present disclosure, the "substituted" refers to replacement of at least one hydrogen of a substituent or a compound by deuterium, a C1 to C20 alkyl group, a C6 to C30 aryl group, or a cyano group. In specific example of the present disclosure, the "substituted" refers to replacement of at least one hydrogen of a substituent or a compound by deuterium, a C1 to C5 alkyl group, a C6 to C18 aryl group, or a cyano group. In specific example of the present disclosure, the "substituted" refers to replacement of at least one hydrogen of a substituent or a compound by deuterium, a cyano group, a methyl group, an ethyl group, a propyl group, a butyl group, a phenyl group, a biphenyl group, a terphenyl group, or a naphthyl group.

As used herein, when a definition is not otherwise provided, "hetero" refers to one including one to three heteroatoms selected from N, O, S, P, and Si, and remaining carbons in one functional group.

As used herein, "an aryl group" refers to a group including at least one hydrocarbon aromatic moiety, and all elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring, for example a fluorenyl group.

The aryl group may include a monocyclic, polycyclic, or fused ring polycyclic (i.e., rings sharing adjacent pairs of carbon atoms) functional group.

As used herein, "a heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "a heteroaryl group" may refer to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof, but is not limited thereto.

More specifically, the substituted or unsubstituted C2 to C30 heterocyclic group may be a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, or a substituted or unsubstituted dibenzothiophenyl group, or a combination thereof, but is not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

Hereinafter, a composition for an organic optoelectronic device according to an embodiment is described.

A composition for an organic optoelectronic device according to an embodiment may include, e.g., a first compound represented by Chemical Formula 1 and a second compound represented by Chemical Formula 2.

[Chemical Formula 1]

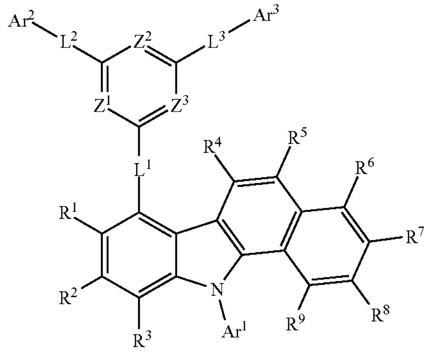

In Chemical Formula 1, $Z^1$ to $Z^3$ may each independently be, e.g., N or $CR^a$. In an implementation, at least two of $Z^1$ to $Z^3$ may be N.

$R^a$ and $R^1$ to $R^9$ may each independently be or include, e.g., hydrogen, deuterium, a substituted or unsubstituted C1 to C30 alkyl group, a substituted or unsubstituted C6 to C30 aryl group, or a substituted or unsubstituted C2 to C30 heterocyclic group.

$L^1$ to $L^3$ may each independently be or include, e.g., a single bond or a substituted or unsubstituted C6 to C30 arylene group.

$Ar^1$ to $Ar^3$ may each independently be or include, e.g., a substituted or unsubstituted C6 to C30 aryl group or a substituted or unsubstituted C2 to C30 heterocyclic group.

[Chemical Formula 2]

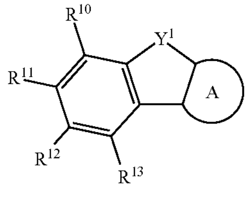

In Chemical Formula 2, $Y^1$ may be, e.g., O, S, or N—$R^b$.

$R^b$ and $R^{10}$ to $R^{13}$ may each independently be or include, e.g., hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

A may be, e.g., a ring of Group I or Group II.

[Group I]

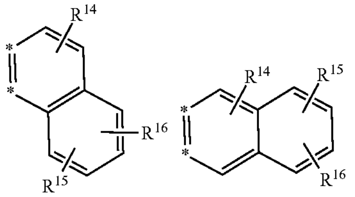

[Group II]

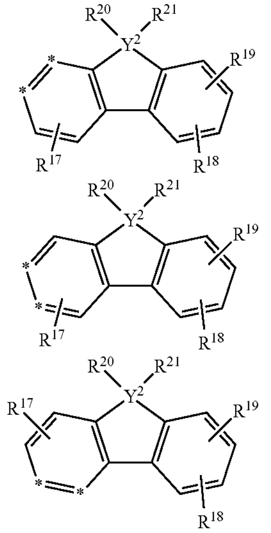

In Group I and Group II, * is a linking carbon. As used herein, the term "linking carbon" refers to a shared carbon at which fused rings are linked.

$Y^2$ may be, e.g., C or Si.

$R^{14}$ to $R^{19}$ may each independently be or include, e.g., hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

$R^{20}$ and $R^{21}$ may each independently be or include, e.g., a substituted or unsubstituted C1 to C30 alkyl group, or a substituted or unsubstituted C6 to C30 aryl group.

In an implementation, in Chemical Formula 2 and Groups I and II, at least one of $R^{10}$ to $R^{19}$ may be, e.g., a group (e.g., substituted amine group) represented by Chemical Formula a.

[Chemical Formula a]

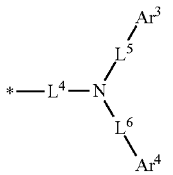

In Chemical Formula a, $L^4$ to $L^6$ may each independently be or include, e.g., a single bond or a substituted or unsubstituted C6 to C30 arylene group.

$Ar^3$ and $Ar^4$ may each independently be or include, e.g., a substituted or unsubstituted amine group, a substituted or unsubstituted C6 to C30 aryl group, or a substituted or unsubstituted C2 to C30 heterocyclic group.

* is a linking point.

The first compound represented by Chemical Formula 1 may have a structure in which a nitrogen-containing 6-membered ring is substituted at or bonded to position 7 of the benzocarbazole skeleton or moiety, in which a benzene ring is fused at positions 1 and 2 of a carbazole moiety.

The first compound having such a structure may have excellent stability, e.g., due to a low ΔEst value, which is a difference between the lowest excitation singlet energy level (S1) and the lowest triplet excitation energy level (T1).

In an implementation, when applied to an organic light emitting diode together with a second compound having excellent hole transport characteristics, charge balance may be achieved, so that high efficiency and long life-span characteristics may be realized.

The second compound represented by Chemical Formula 2 may have a structure in which an amine is substituted with or on a benzocarbazole moiety, or an amine group is substituted with or on an additionally fused fluorene (or further fused dibenzosilole) ring.

When benzocarbazole has a structure in which an amine is substituted or bonded thereto, the HOMO electron cloud may expand from the amine to benzocarbazole, resulting in high HOMO energy, and excellent hole injection and transport characteristics.

The compound including benzocarbazole may have a relatively high HOMO energy, e.g., compared with the compound including bicarbazole or indolocarbazole, and a device having a low driving voltage may be implemented.

In an implementation, the structure in which amine is substituted with benzocarbazole may have a T1 energy suitable as a red host. Accordingly, the device including the composition according to an embodiment may realize high efficiency/long life-span characteristics.

In an implementation, in the case of having a structure in which an amine group is substituted in or on an additionally fused fluorene (or additionally fused dibenzosilole) ring, such a compound may be included (e.g., mixed to form a composition) with the first compound to help increase a balance between holes and electrons, thereby greatly improving life-span characteristics of the device including the same.

In an implementation, in Chemical Formula 1, $Z^1$ and $Z^2$ may be N, and $Z^3$ may be $CR^a$.

In an implementation, in Chemical Formula 1, $Z^1$ and $Z^3$ may be N, and $Z^2$ may be $CR^a$.

In an implementation, $R^a$ may be, e.g., hydrogen, deuterium, a substituted or unsubstituted C1 to C10 alkyl group, or a substituted or unsubstituted C6 to C12 aryl group.

In an implementation, each of $Z^1$ to $Z^3$ in Chemical Formula 1 may be N.

In an implementation, $R^1$ to $R^9$ may each independently be, e.g., hydrogen, deuterium, a substituted or unsubstituted C1 to C10 alkyl group, or a substituted or unsubstituted C6 to C12 aryl group.

In an implementation, $Ar^1$ may be, e.g., a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted phenanthrenyl group, a substituted or unsubstituted triphenylene group, a substituted or unsubstituted fluorenyl group, a substituted or unsubstituted dibenzofuranyl group, a substituted or unsubstituted dibenzothiphenyl group, a substituted or unsubstituted carbazolyl group, or a combination thereof.

In an implementation, $Ar^1$ may be, e.g., a substituted or unsubstituted phenyl group.

In an implementation, $Ar^2$ and $Ar^3$ may each independently be, e.g., a substituted or unsubstituted phenyl group, a substituted or unsubstituted biphenyl group, a substituted or unsubstituted naphthyl group, a substituted or unsubstituted terphenyl group, a substituted or unsubstituted dibenzofuranyl group, a substituted or unsubstituted dibenzothiophenyl group, a substituted or unsubstituted dibenzosilolyl group, a substituted or unsubstituted benzonaphthofuranyl group, or a substituted or unsubstituted benzonaphthothiophenyl group.

In an implementation, $Ar^2$ and $Ar^3$ may each independently be, e.g., a substituted or unsubstituted phenyl group, a substituted or unsubstituted biphenyl group, a substituted or unsubstituted dibenzofuranyl group, a substituted or unsubstituted dibenzothiophenyl group, or a substituted or unsubstituted dibenzosilolyl group.

In an implementation, $L^1$ may be, e.g., a single bond or a substituted or unsubstituted phenylene group, and $L^2$ and $L^3$ may each independently be, e.g., a single bond, a substituted or unsubstituted phenylene group, a substituted or unsubstituted biphenylene group, a substituted or unsubstituted terphenylene group, or a substituted or unsubstituted naphthylene group.

In an implementation, $L^1$ may be a single bond, and $L^2$ and $L^3$ may each independently be, e.g., a single bond or a substituted or unsubstituted phenylene group.

In an implementation, moieties *-$L^2$-$Ar^2$ and *-$L^3$-$Ar^3$ may each independently be a moiety of Group X.

[Group X]

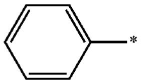
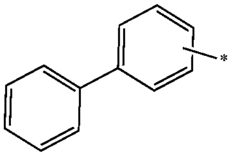
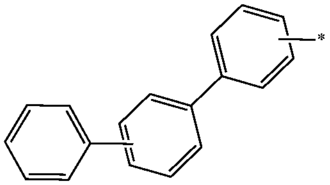
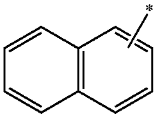
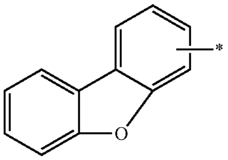
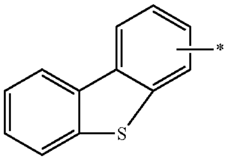
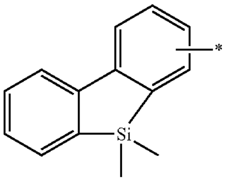
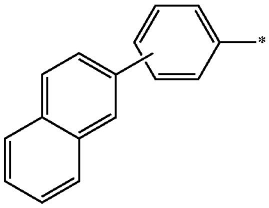

-continued

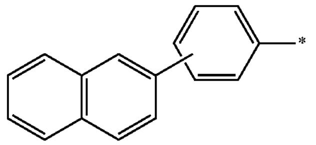
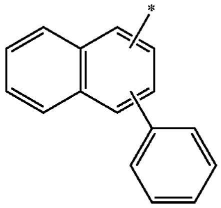
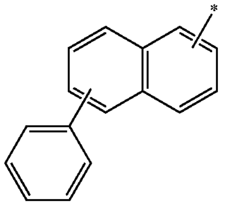
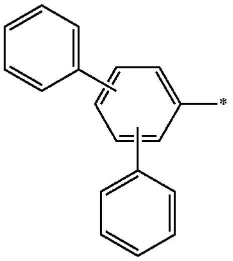
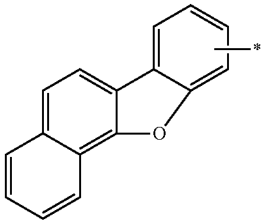
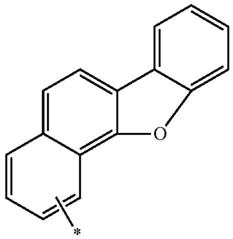
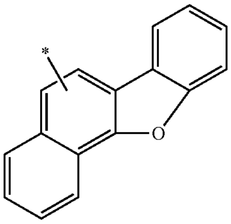
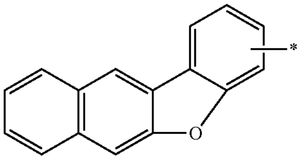
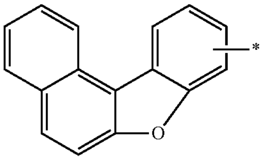
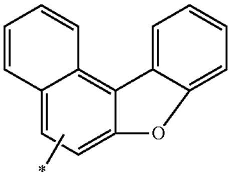
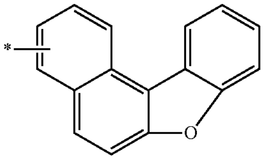

In Group X, * is a linking point.

In an implementation, the first compound may be, e.g., a compound of Group 1.

[Group 1]
[1]
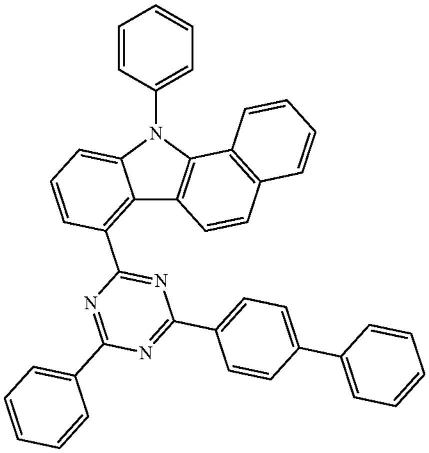
[2]
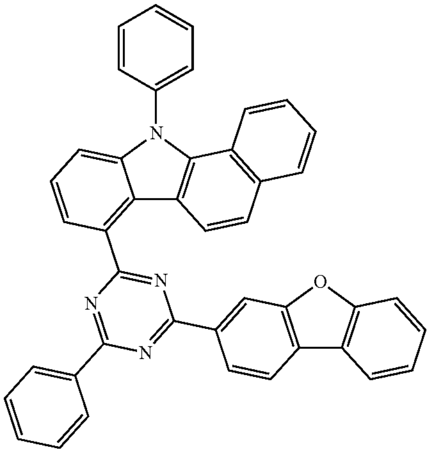
[3]
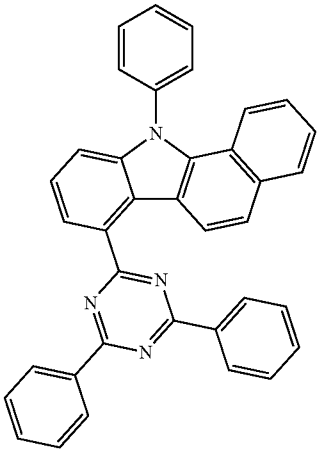
-continued
[4]
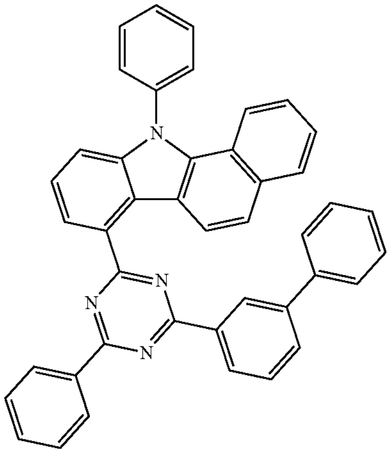
[5]
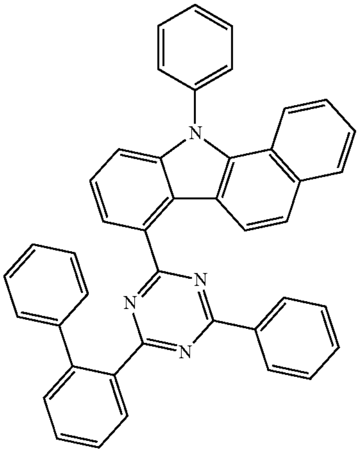
[6]
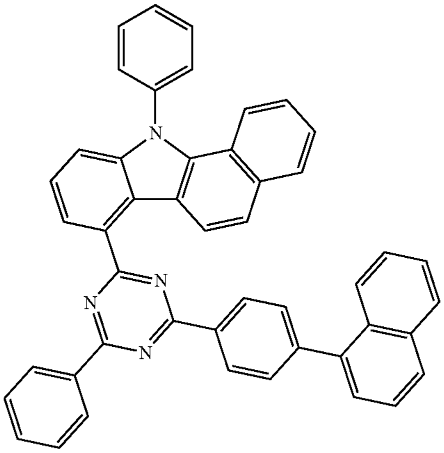

-continued
[7]
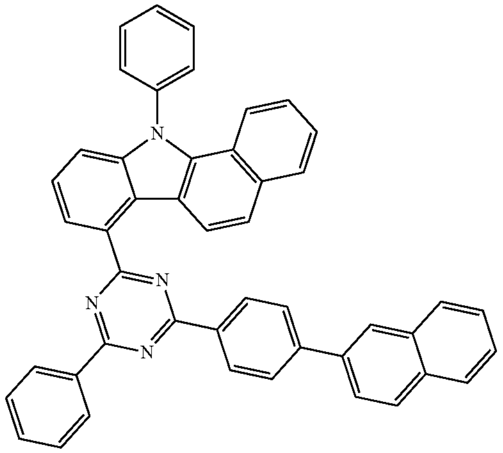
[8]
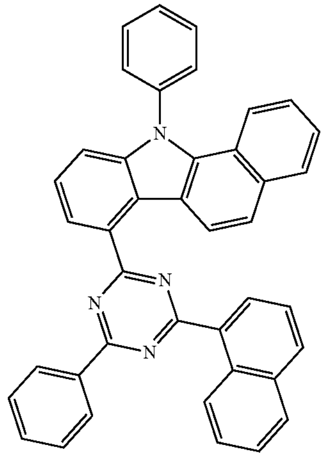
[9]
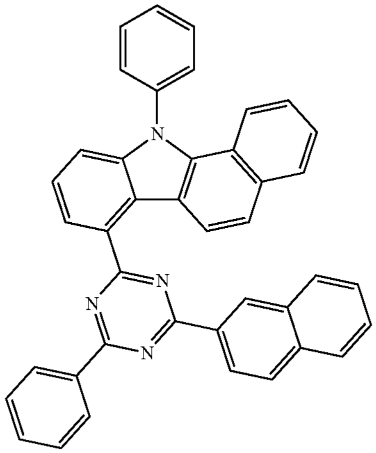
-continued
[10]
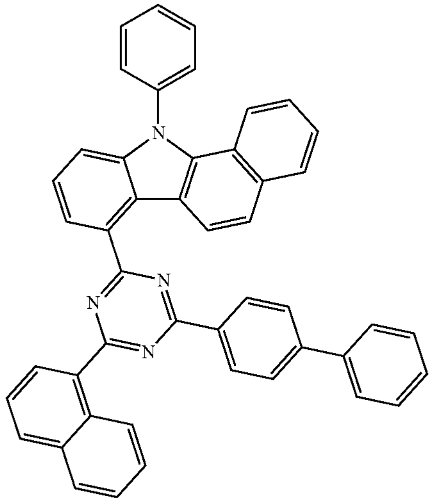
[11]
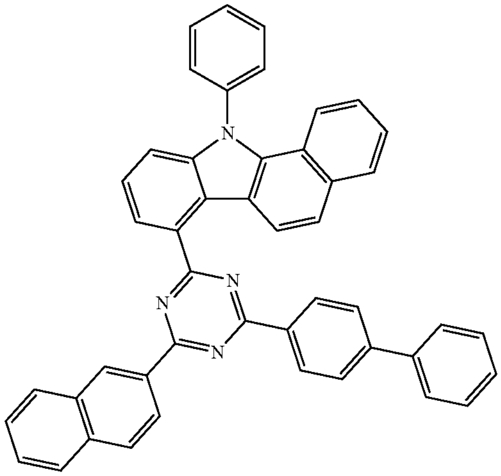
[12]
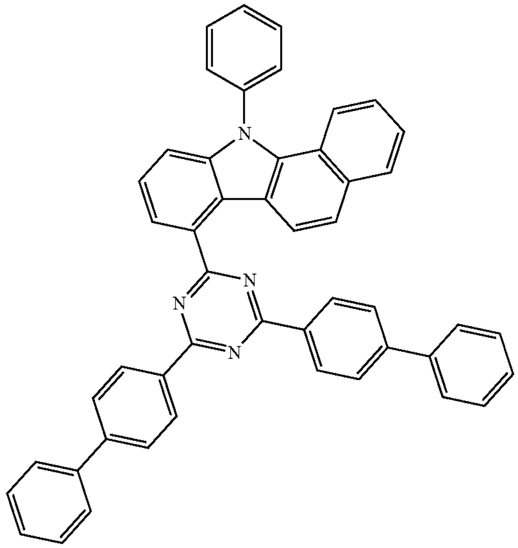

-continued
[13]
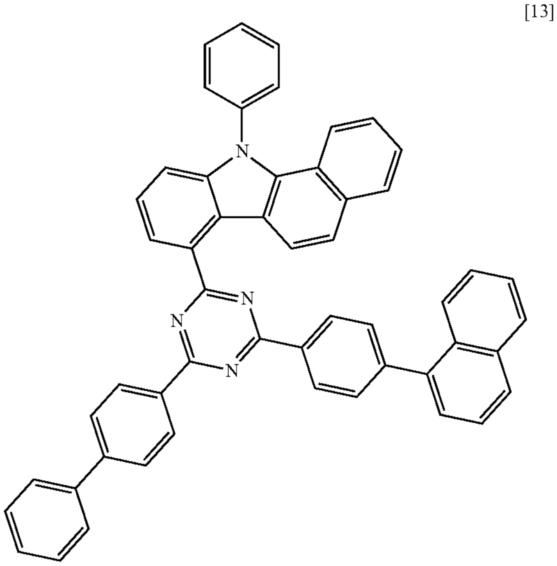
[14]
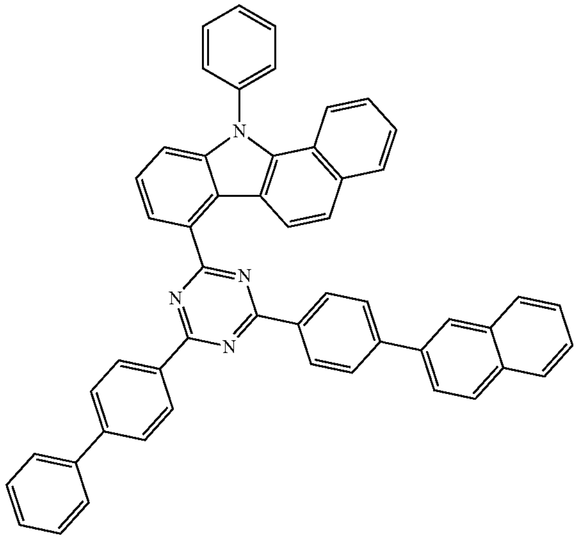
[15]
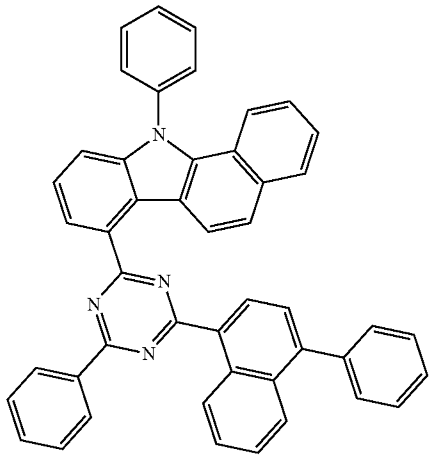
-continued
[16]
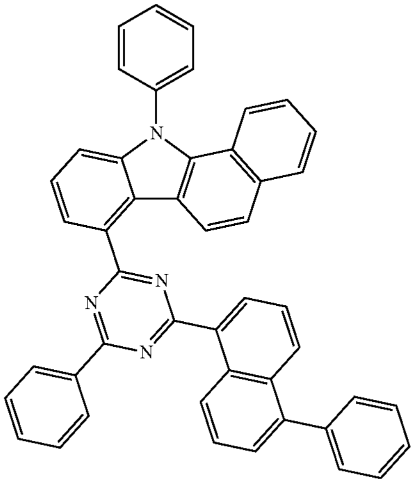
[17]
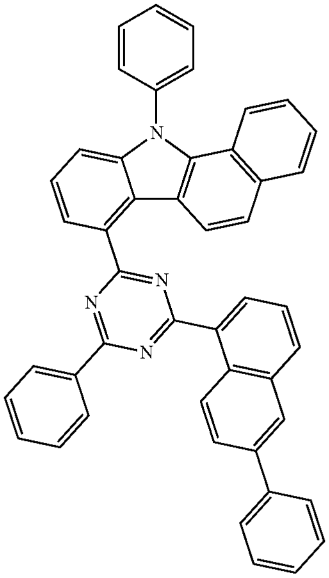
[18]
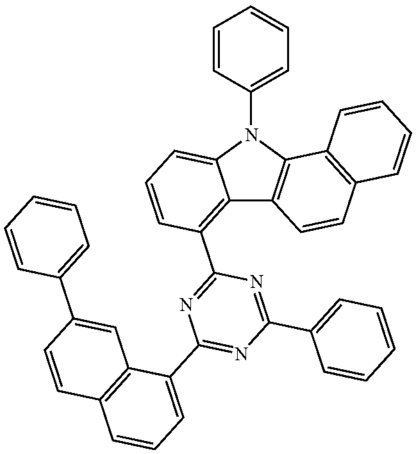

-continued
[19]
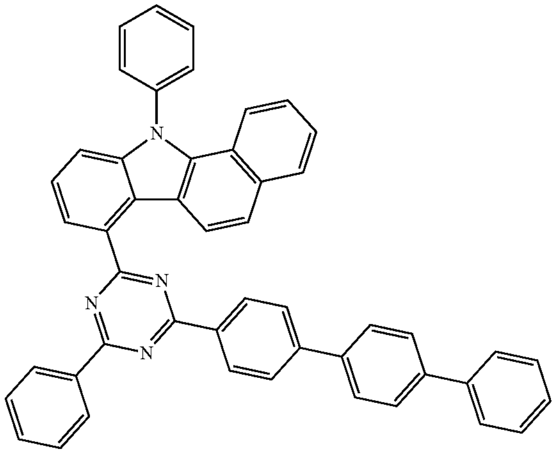
[20]
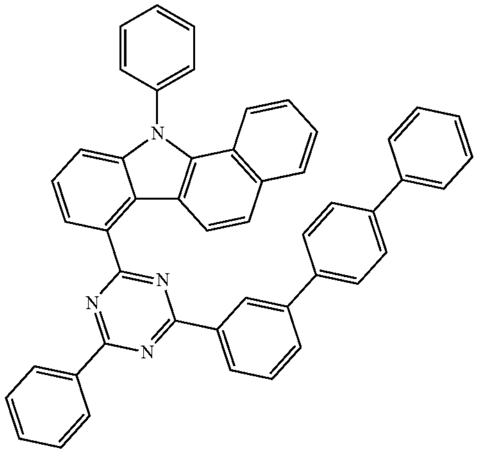
[21]
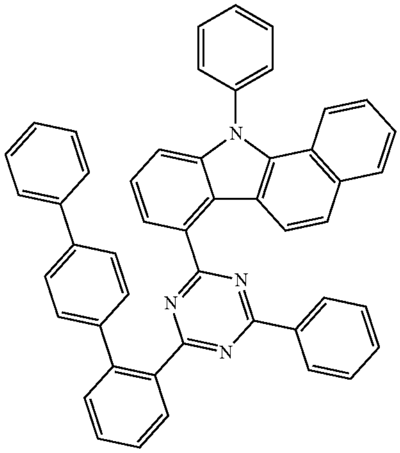
-continued
[22]
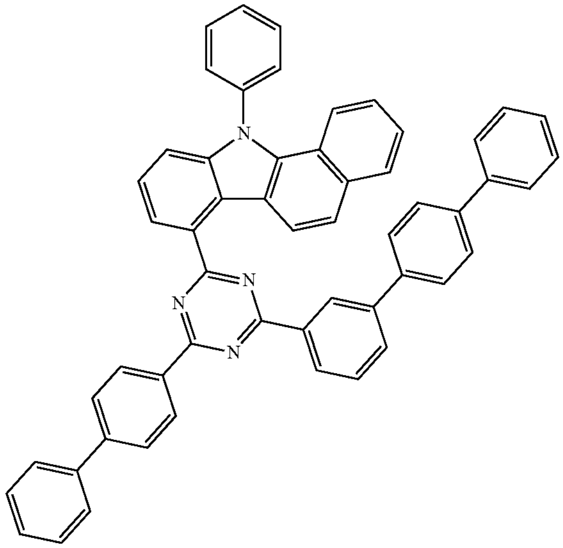
[23]
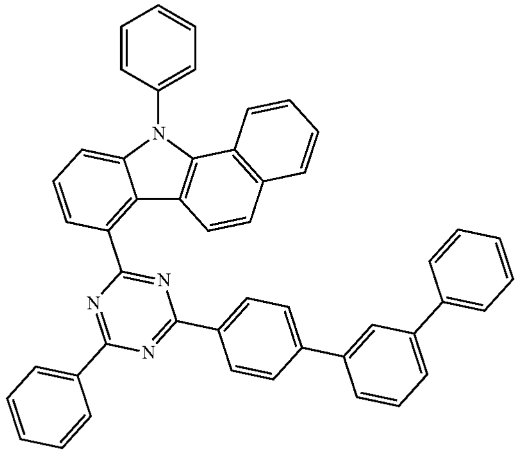
[24]
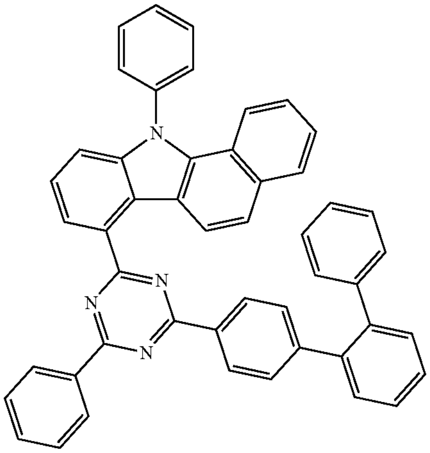

-continued
[25]
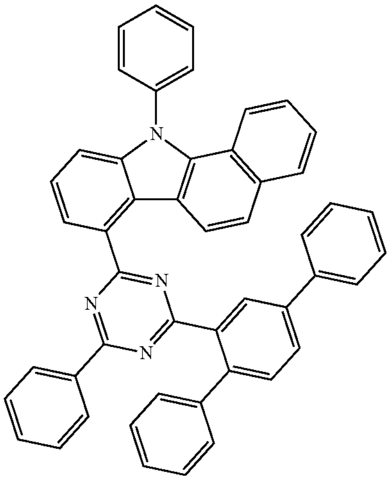
[26]
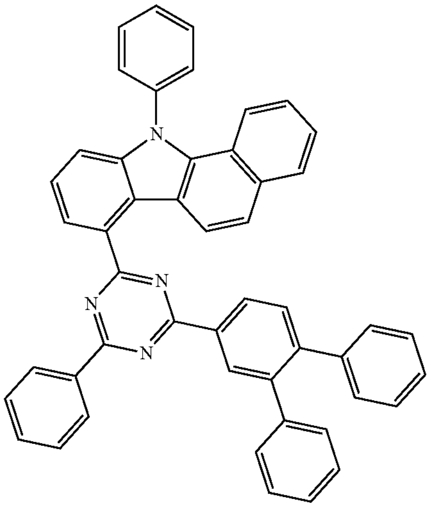
[27]
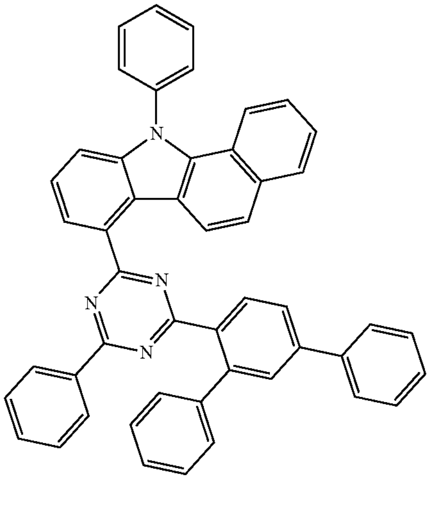
-continued
[28]
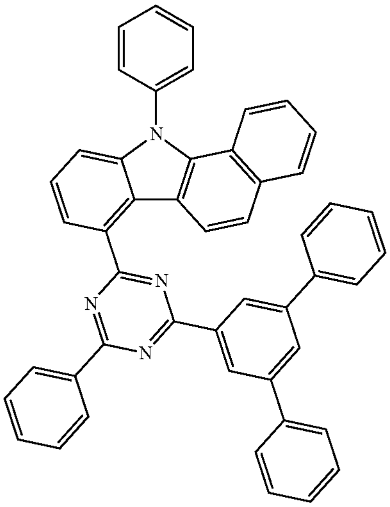
[29]
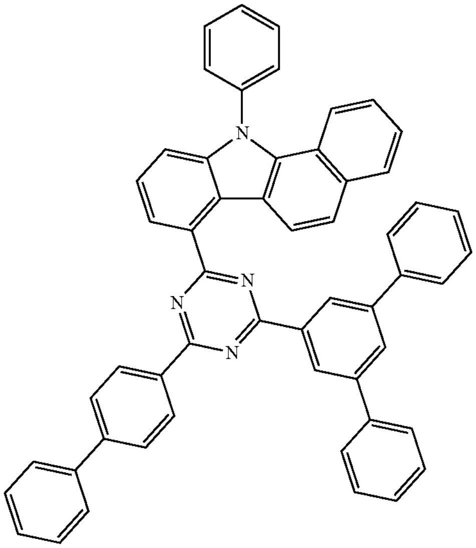
[30]
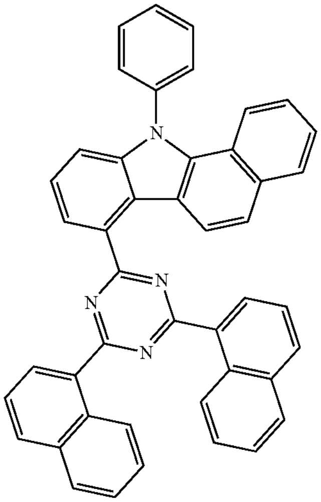

-continued
[31]
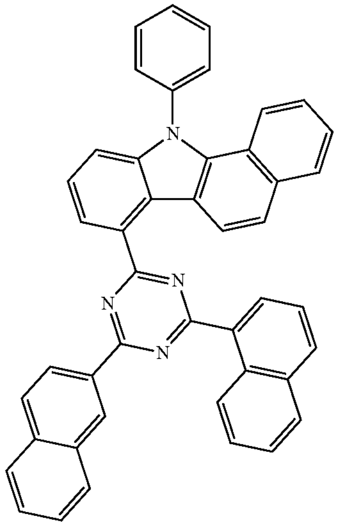
[32]
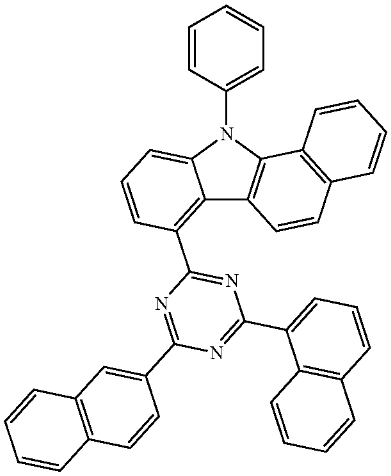
[33]
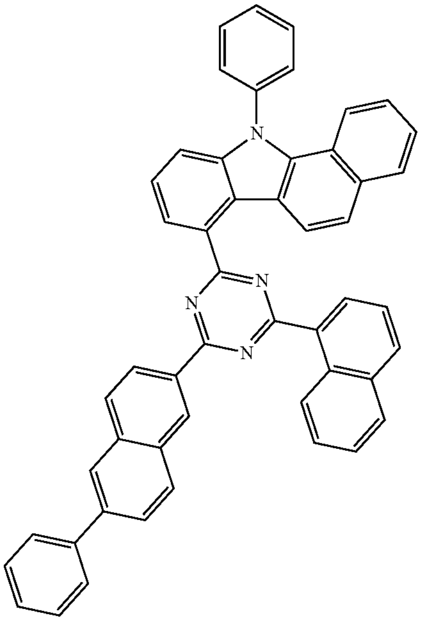
-continued
[34]
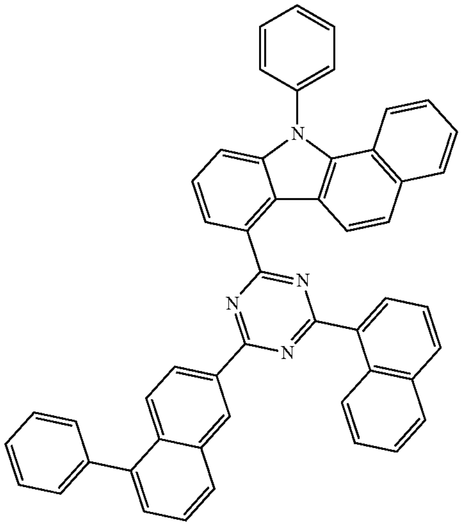
[35]
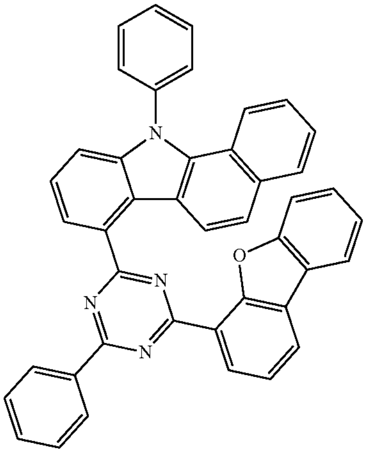
[36]
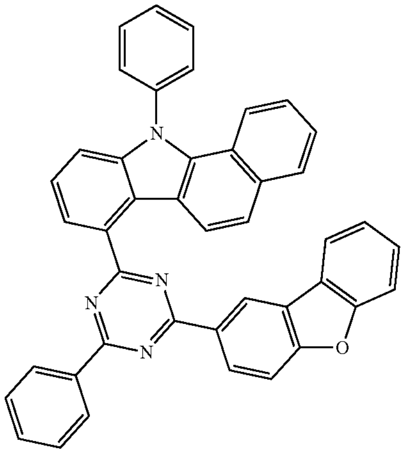

-continued
[37]
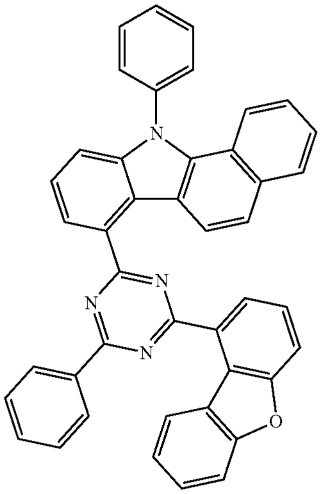
[38]
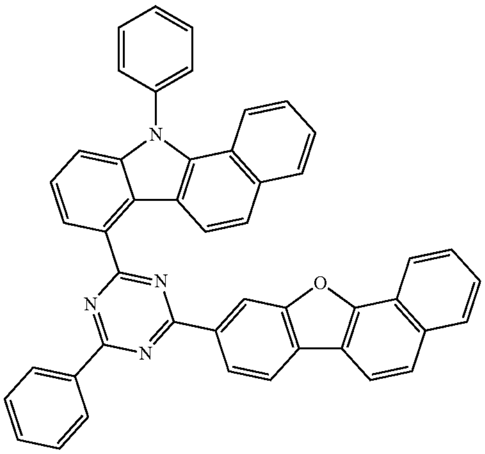
[39]
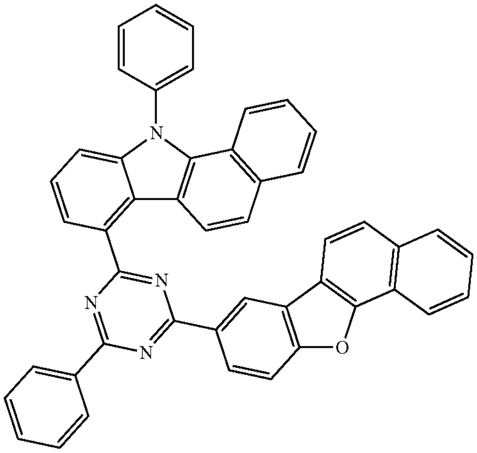
-continued
[40]
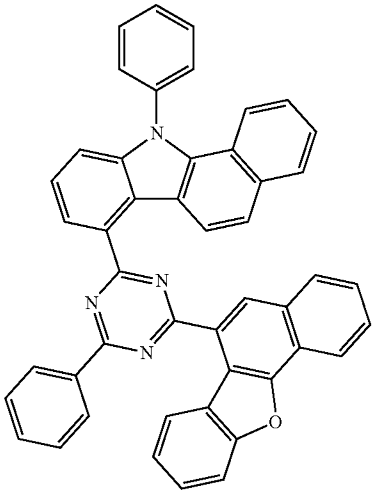
[41]
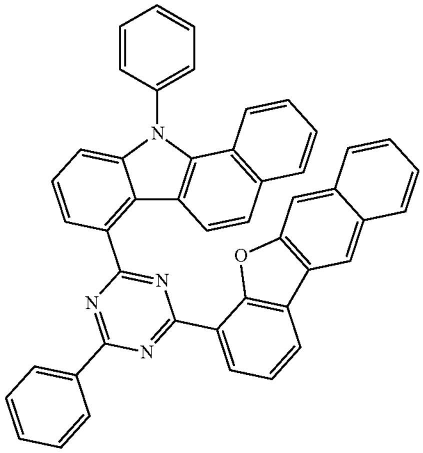
[42]
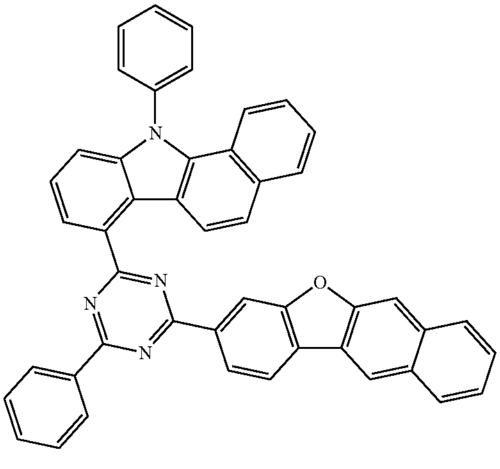

-continued
[43]
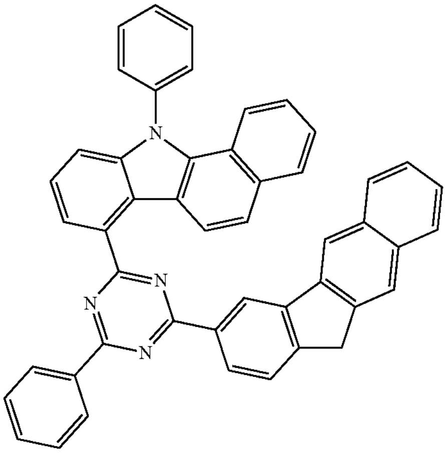
[44]
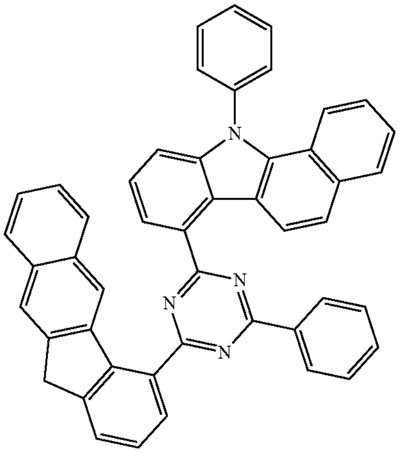
[45]
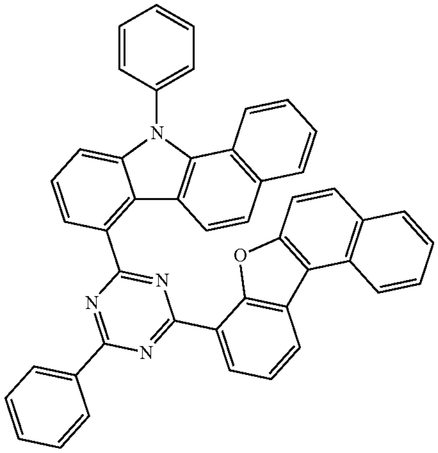
-continued
[46]
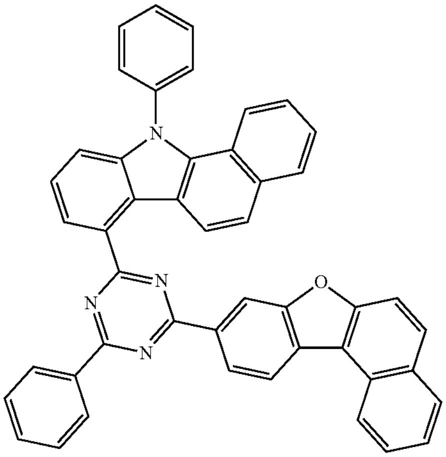
[47]
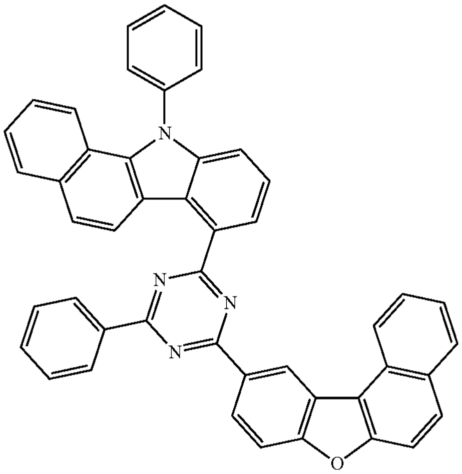
[48]
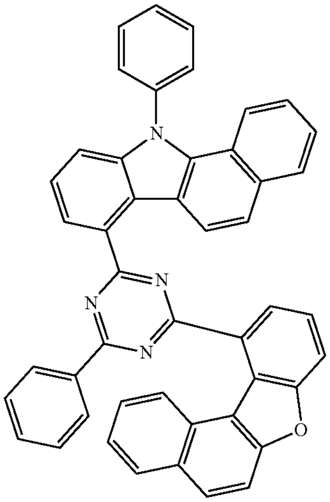

-continued
[49]
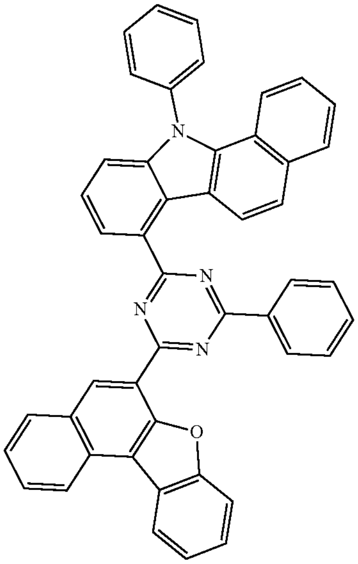
[50]
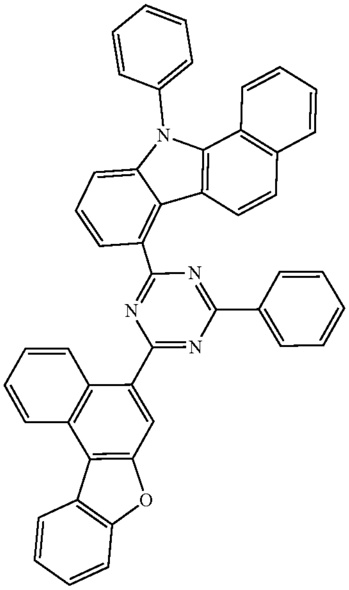
[51]
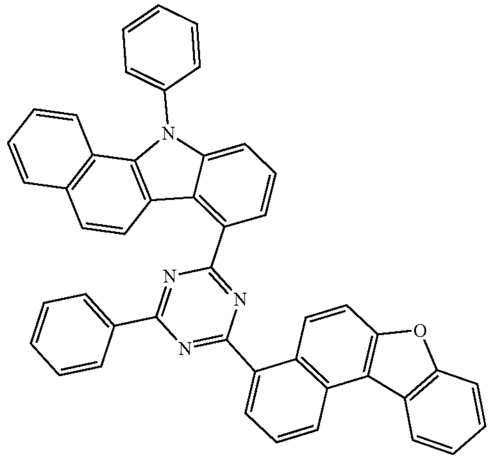
-continued
[52]
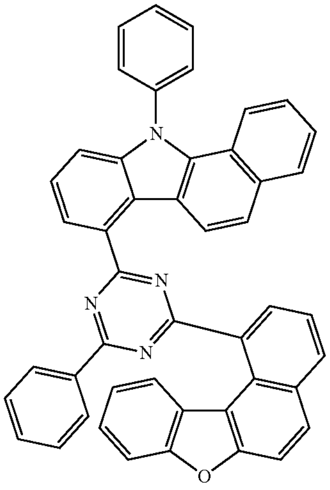
In an implementation, the second compound may have a structure in which an amine is substituted with or bonded to benzocarbazole, and may be represented by one of Chemical Formula 2I-A to Chemical Formula 2I-F, depending on the fusion position of the additional benzene ring.
[Chemical Formula 2I-A]
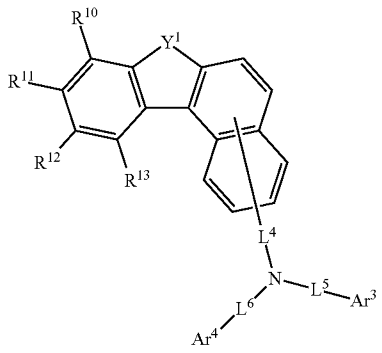
[Chemical Formula 2I-B]
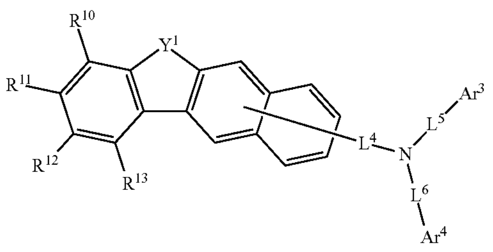

-continued

[Chemical Formula 2I-C]

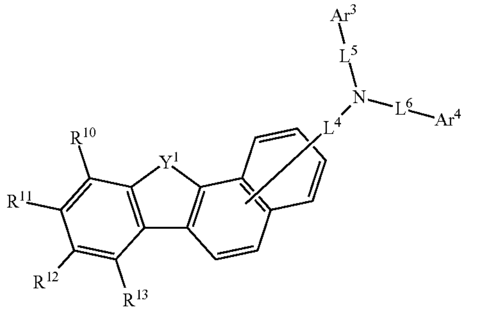

[Chemical Formula 2I-D]

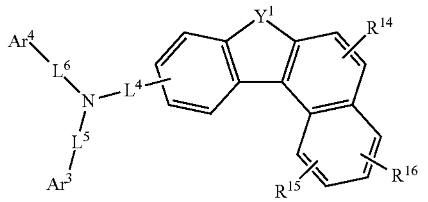

[Chemical Formula 2I-E]

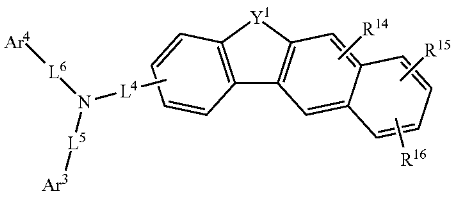

[Chemical Formula 2I-F]

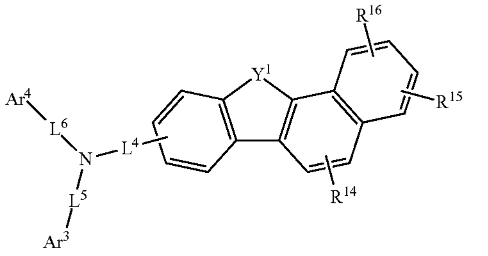

In Chemical Formula 2I-A to Chemical Formula 2I-F, $Y^1$ may be, e.g., O, S, or N—$R^b$.

$R^b$ and $R^{10}$ to $R^{16}$ may each independently be, e.g., hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

$L^4$ to $L^6$ may each independently be, e.g., a single bond or a substituted or unsubstituted C6 to C30 arylene group.

$Ar^3$ and Art may each independently be, e.g., a substituted or unsubstituted amine group, a substituted or unsubstituted C6 to C30 aryl group, or a substituted or unsubstituted C2 to C30 heterocyclic group.

In an implementation, in Chemical Formula 2I-A to Chemical Formula 2I-F, $Y^1$ may be N—$R^b$.

In an implementation, $R^b$ may be, e.g., a substituted or unsubstituted phenyl group, a substituted or unsubstituted biphenyl group, or a substituted or unsubstituted naphthyl group.

In an implementation, $R^{10}$ to $R^{16}$ may each independently be, e.g., hydrogen, deuterium, a substituted or unsubstituted C1 to C10 alkyl group, or a substituted or unsubstituted C6 to C12 aryl group.

In an implementation, $L^4$ may be, e.g., a single bond, a substituted or unsubstituted phenylene group, or a substituted or unsubstituted naphthylene group.

In an implementation, $L^5$ and $L^6$ may each independently be, e.g., a single bond, a substituted or unsubstituted phenylene group, or a substituted or unsubstituted biphenylene group.

In an implementation, $Ar^3$ and Art may each independently be, e.g., a substituted or unsubstituted amine group, a substituted or unsubstituted phenyl group, a substituted or unsubstituted biphenyl group, a substituted or unsubstituted naphthyl group, a substituted or unsubstituted terphenyl group, a substituted or unsubstituted anthracenyl group, a substituted or unsubstituted phenanthrenyl group, or a substituted or unsubstituted triphenylene group.

In an implementation, Chemical Formula 2I-A may be represented by, e.g., one of Chemical Formula 2A-I-1 to Chemical Formula 2A-I-6, depending on the substitution point of the group represented by Chemical Formula a.

[Chemical Formula 2I-A-1]

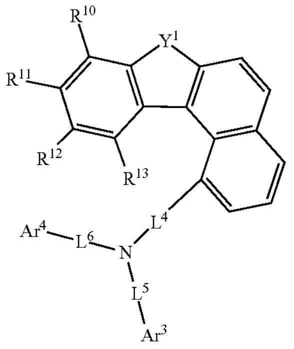

[Chemical Formula 2I-A-2]

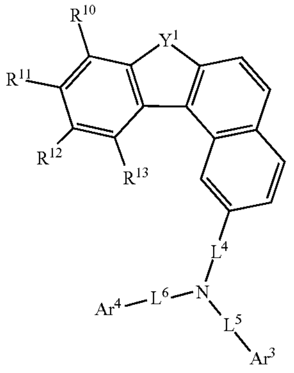

[Chemical Formula 2I-A-3]

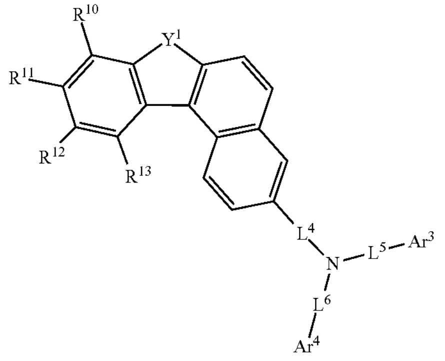

-continued

[Chemical Formula 2I-A-4]

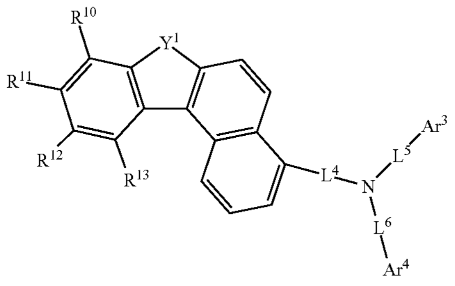

[Chemical Formula 2I-A-5]

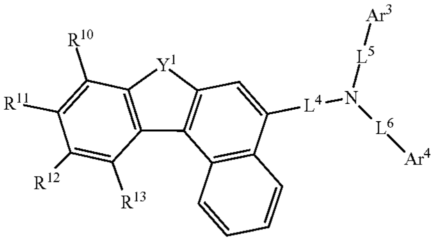

[Chemical Formula 2I-A-6]

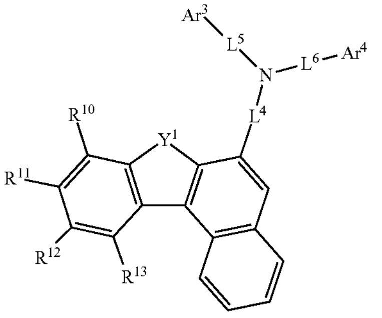

In Chemical Formula 2A-I-1 to Chemical Formula 2A-1-6, $Y^1$, $L^4$ to $L^6$, $Ar^3$, $Ar^4$, and $R^{10}$ to $R^{13}$ may be defined the same as those described above.

In an implementation, Chemical Formula 2I-B may be represented by, e.g., one of Chemical Formula 2B-I-1 to Chemical Formula 2B-I-6, depending on the substitution point of the group represented by Chemical Formula a.

[Chemical Formula 2I-B-1]

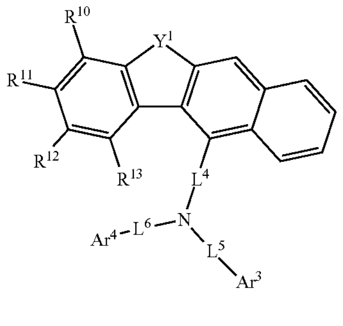

-continued

[Chemical Formula 2I-B-2]

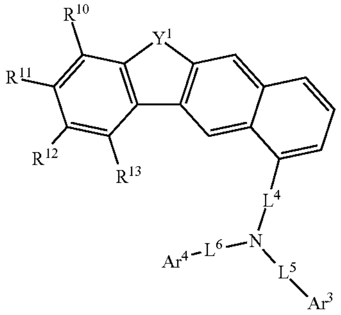

[Chemical Formula 2I-B-3]

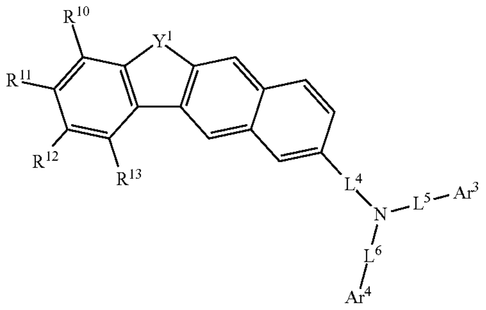

[Chemical Formula 2I-B-4]

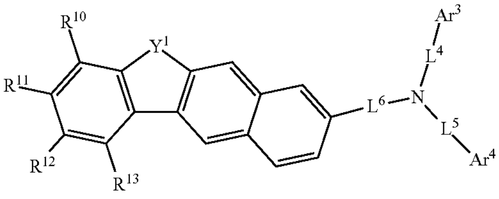

[Chemical Formula 2I-B-5]

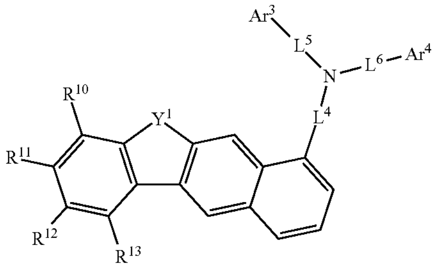

[Chemical Formula 2I-B-6]

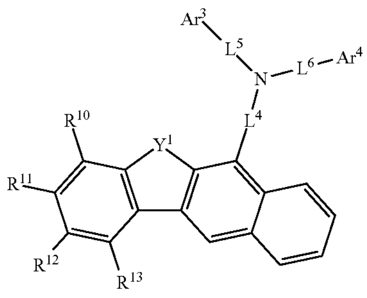

In Chemical Formula 2B-I-1 to Chemical Formula 2B-1-6, $Y^1$, $L^1$ to $L^6$, $Ar^3$, $Ar^4$, and $R^{10}$ to $R^{13}$ may be defined the same as those described above.

In an implementation, Chemical Formula 2I-C may be represented by, for example, one of Chemical Formula 2C-I-1 to Chemical Formula 2C-I-6 depending on the substitution point of the group represented by Chemical Formula a.

[Chemical Formula 2I-C-1]

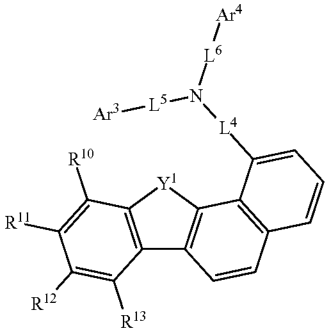

[Chemical Formula 2I-C-2]

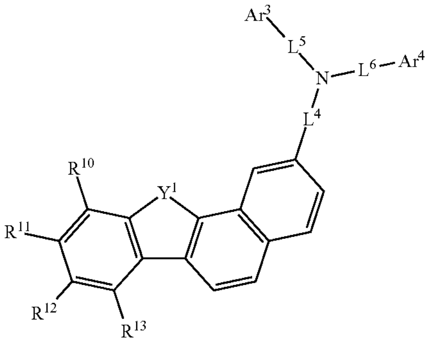

[Chemical Formula 2I-C-3]

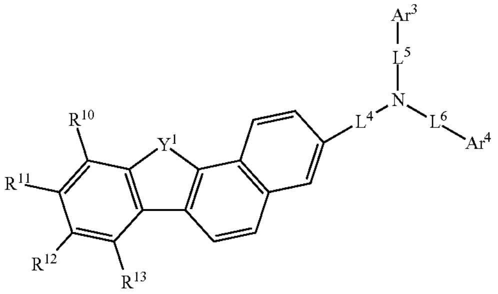

[Chemical Formula 2I-C-4]

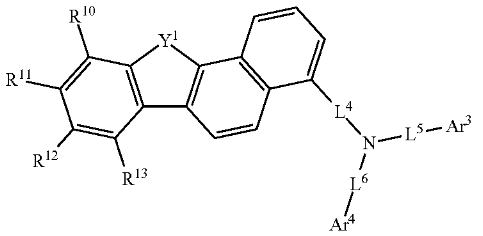

-continued

[Chemical Formula 2I-C-5]

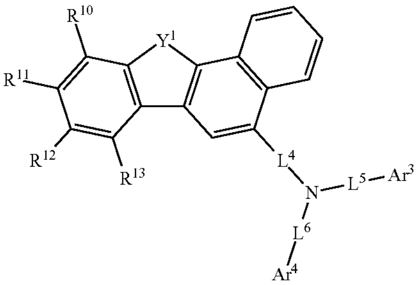

[Chemical Formula 2I-C-6]

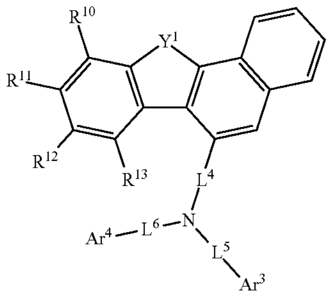

In Chemical Formula 2C-I-1 to Chemical Formula 2C-1-6, $Y^1$, $L^4$ to $L^6$, $Ar^3$, Art, and $R^{10}$ to $R^{13}$ may be defined the same as those described above.

In an implementation, Chemical Formula 2I-D may be represented by, e.g., one of Chemical Formula 2D-I-1 to Chemical Formula 2D-I-4, depending on the substitution point of the group represented by Chemical Formula a.

[Chemical Formula 2I-D-1]

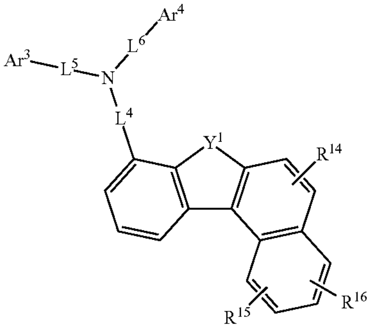

[Chemical Formula 2I-D-2]

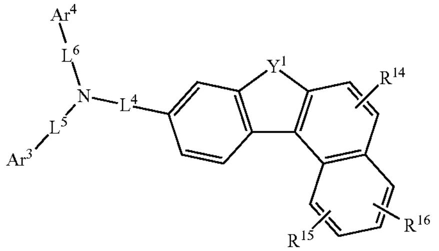

-continued

[Chemical Formula 2I-D-3]

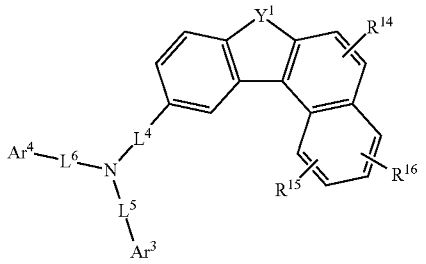

[Chemical Formula 2I-D-4]

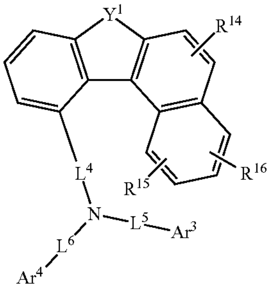

In Chemical Formula 2D-I-1 to Chemical Formula 2D-1-4, $Y^1$, $L^4$ to $L^6$, $Ar^3$, $Ar^4$, and $R^{14}$ to $R^{16}$ may be defined the same as those described above.

In an implementation, Chemical Formula 2I-E may be represented by, e.g., one of Chemical Formula 2E-I-1 to Chemical Formula 2E-I-4, depending on the substitution point of the group represented by Chemical Formula a.

[Chemical Formula 2I-E-1]

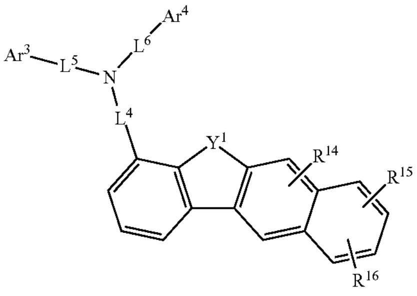

[Chemical Formula 2I-E-2]

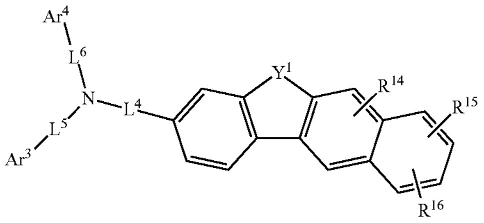

-continued

[Chemical Formula 2I-E-3]

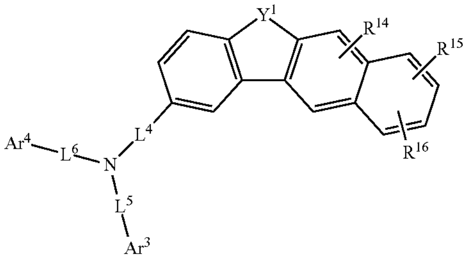

[Chemical Formula 2I-E-4]

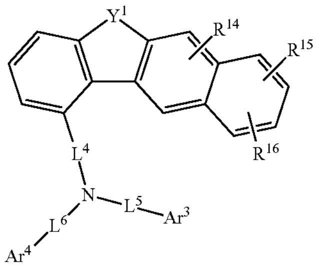

In Chemical Formula 2E-I-1 to Chemical Formula 2E-I-4, $Y^1$, $L^4$ to $L^6$, $Ar^3$, $Ar^4$, and $R^{14}$ to $R^{16}$ may be defined the same as those described above.

In an implementation, Chemical Formula 2I-F may be represented by, e.g., one of Chemical Formula 2F-I-1 to Chemical Formula 2F-I-4, depending on the substitution point of the group represented by Chemical Formula a.

[Chemical Formula 2I-F-1]

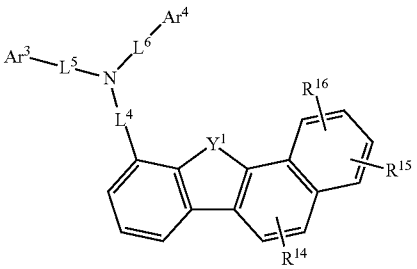

[Chemical Formula 2I-F-2]

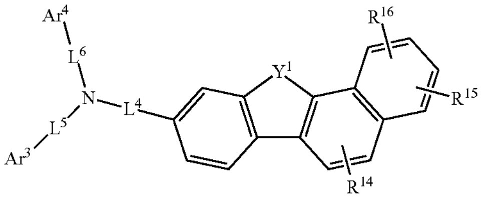

-continued

[Chemical Formula 2I-F-3]

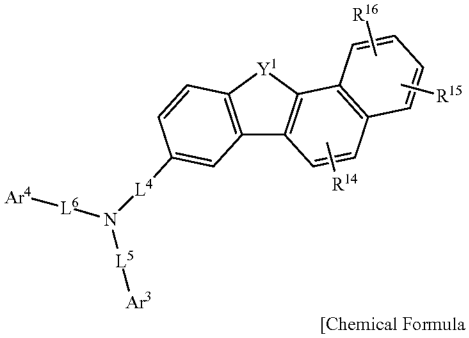

[Chemical Formula 2I-F-4]

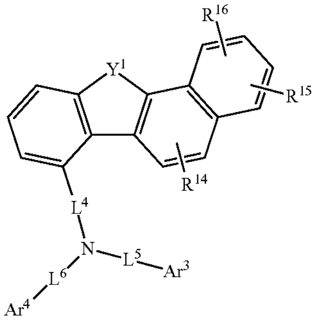

In Chemical Formula 2F-I-1 to Chemical Formula 2F-I-4, $Y^1$, $L^4$ to $L^6$, $Ar^3$, $Ar^4$, and $R^{14}$ to $R^{16}$ may be defined the same as those described above.

In an implementation, the second compound may be represented by, e.g., one of Chemical Formula 2I-A-1 to Chemical Formula 2I-A-6, Chemical Formula 2I-B-1 to Chemical Formula 2I-B-6, Chemical Formula 2I-C-1 to Chemical Formula 2I-C-6, Chemical Formula 2I-D-1 to Chemical Formula 2I-D-4, Chemical Formula 2I-E-1 to Chemical Formula 2I-E-4, or Chemical Formula 2I-F-1 to Chemical Formula 2I-F-4.

In an implementation, the second compound may be represented by, e.g., Chemical Formula 2I-C-2.

In an implementation, the second compound may have a structure in which an amine group is substituted on or bonded to an additionally fused fluorene (or further fused dibenzosilole) ring, and may be, e.g., represented by one of Chemical Formula 2II-A to Chemical Formula 2I I-L, depending on the fusion position of the additional benzene ring.

[Chemical Formula 2II-A]

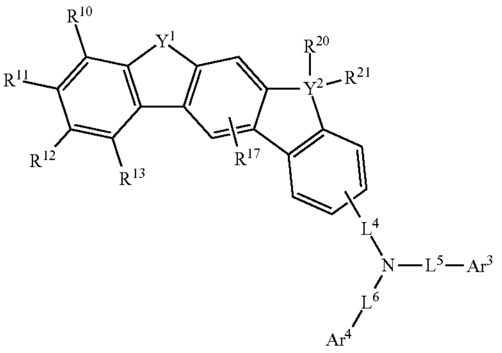

-continued

[Chemical Formula 2II-B]

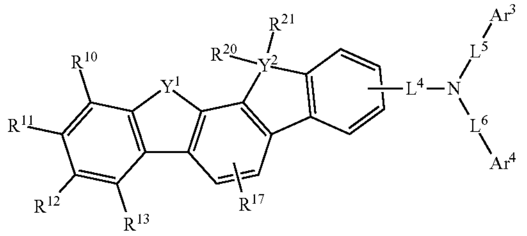

[Chemical Formula 2II-C]

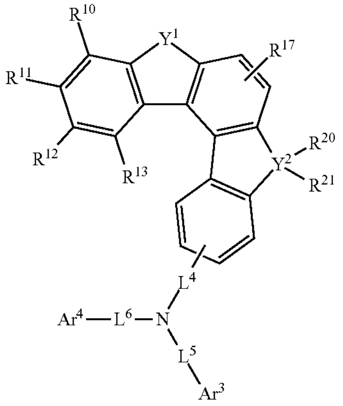

[Chemical Formula 2II-D]

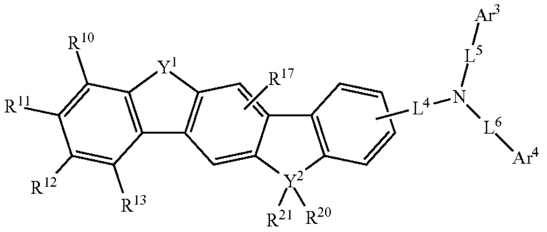

[Chemical Formula 2II-E]

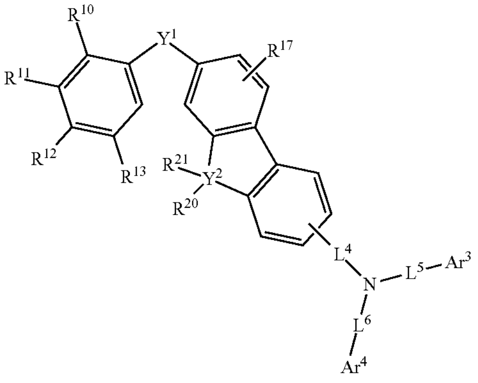

-continued

[Chemical Formula 2II-F]

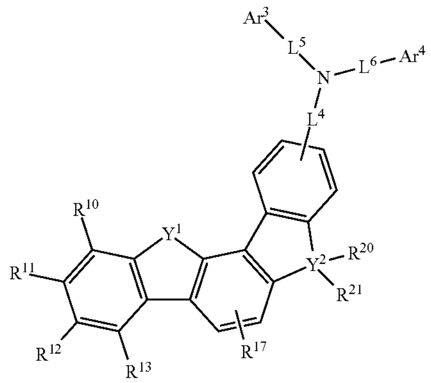

[Chemical Formula 2II-G]

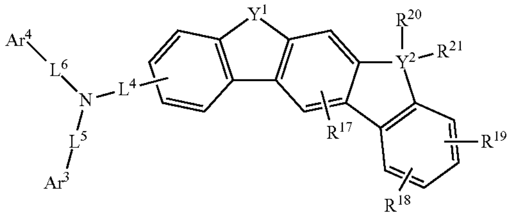

[Chemical Formula 2II-H]

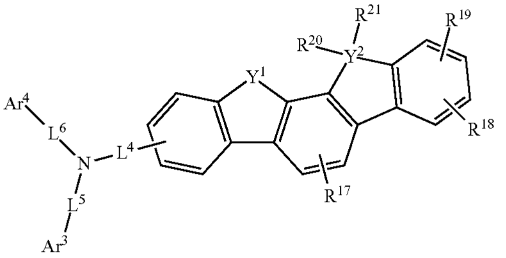

[Chemical Formula 2II-I]

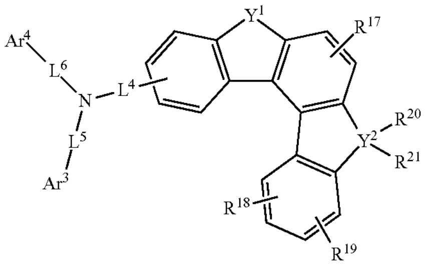

[Chemical Formula 2II-J]

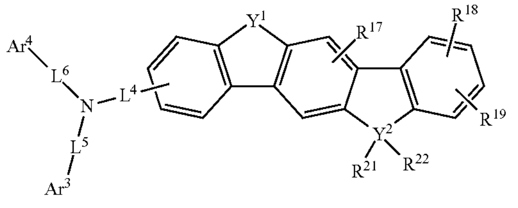

-continued

[Chemical Formula 2II-K]

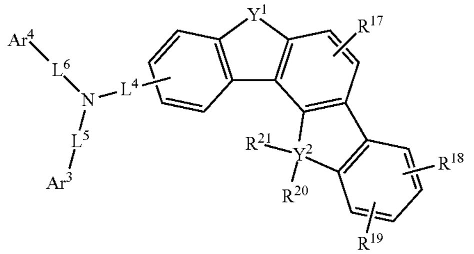

[Chemical Formula 2II-L]

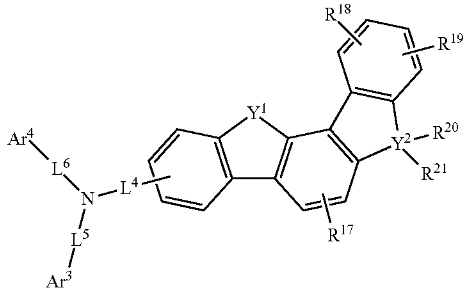

In Chemical Formula 2II-A to Chemical Formula 2II-L, $Y^1$ may be, e.g., O, S, or N—$R^b$.

$Y^2$ may be, e.g., C or Si.

$R^b$, $R^{10}$ to $R^{13}$ and $R^{17}$ to $R^{19}$ may each independently be, e.g., hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

$R^{20}$ and $R^{21}$ may each independently be, e.g., a substituted or unsubstituted C1 to C30 alkyl group or a substituted or unsubstituted C6 to C30 aryl group.

$L^4$ to $L^6$ may each independently be, e.g., a single bond or a substituted or unsubstituted C6 to C30 arylene group.

$Ar^3$ and Art may each independently be, e.g., a substituted or unsubstituted amine group, a substituted or unsubstituted C6 to C30 aryl group, or a substituted or unsubstituted C2 to C30 heterocyclic group.

In an implementation, in Chemical Formula 2II-A to Chemical Formula 2II-L, $Y^1$ may be, e.g., O or S.

In an implementation, $Y^2$ may be, e.g., C or Si.

In an implementation, $R^b$, $R^{b1}$ to $R^{b4}$, $R^{10}$ to $R^{13}$ and $R^{17}$ to $R^{19}$ may each independently be, e.g., hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, In an implementation, $L^4$ to $L^6$ may each independently be, e.g., a single bond, or a substituted or unsubstituted C6 to C30 arylene group, and In an implementation, $Ar^3$ and Art may each independently be, e.g., a substituted or unsubstituted amine group, a substituted or unsubstituted C6 to C30 aryl group, or a substituted or unsubstituted C2 to C30 heterocyclic group.

In an implementation, in Chemical Formula 2I-A to Chemical Formula 2I-F, $Y^1$ may be, e.g., N—$R^b$.

In an implementation, $R^b$ may be, e.g., a substituted or unsubstituted phenyl group, a substituted or unsubstituted biphenyl group, or a substituted or unsubstituted naphthyl group.

In an implementation, $R^{10}$ to $R^{13}$ and $R^{17}$ to $R^{19}$ may each independently be, e.g., hydrogen, deuterium, a substituted or unsubstituted C1 to C10 alkyl group, or a substituted or unsubstituted C6 to C12 aryl group, In an implementation, $R^{20}$ and $R^{21}$ may each independently be, e.g., a substituted or unsubstituted C1 to C10 alkyl group, or a substituted or unsubstituted C6 to C12 aryl group, In an implementation, $L^4$ may be, e.g., a single bond, a substituted or unsubstituted phenylene group, or a substituted or unsubstituted naphthylene group.

In an implementation, $L^5$ and $L^6$ may each independently be, e.g., a single bond, a substituted or unsubstituted phenylene group, or a substituted or unsubstituted biphenylene group.

In an implementation, $Ar^3$ and $Ar^4$ may each independently be, e.g., a substituted or unsubstituted phenyl group, a substituted or unsubstituted biphenyl group, a substituted or unsubstituted naphthyl group, a substituted or unsubstituted terphenyl group, a substituted or unsubstituted fluorenyl group, a substituted or unsubstituted anthracenyl group, a substituted or unsubstituted phenanthrenyl group, a substituted or unsubstituted triphenylene group, a substituted or unsubstituted carbazolyl group, a substituted or unsubstituted dibenzofuranyl group, a substituted or unsubstituted dibenzothiophenyl group, a substituted or unsubstituted benzofuranfluorenyl group, a substituted or unsubstituted benzothiophenefluorenyl group.

In an implementation, Chemical Formula 2II-A may be represented by, e.g., one of Chemical Formula 2II-A-1 to Chemical Formula 2II-A-4 depending on the substitution point of the group represented by Formula a.

[Chemical Formula 2II-A-1]

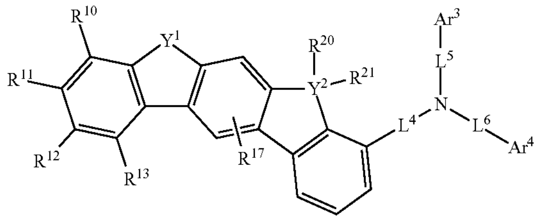

[Chemical Formula 2II-A-2]

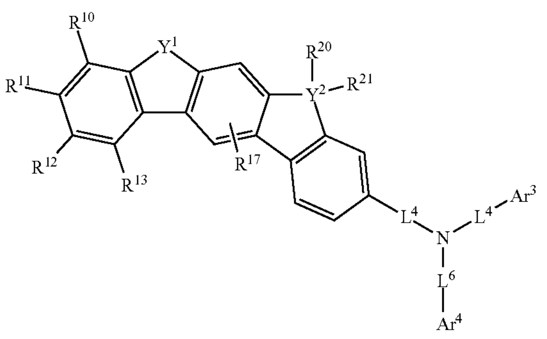

-continued

[Chemical Formula 2II-A-3]

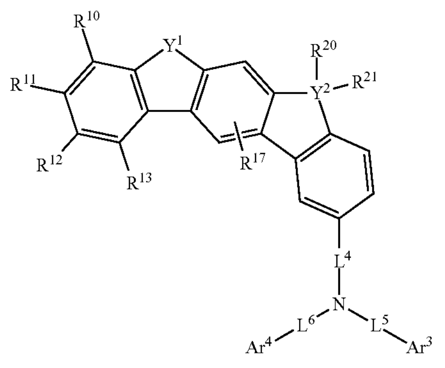

[Chemical Formula 2II-A-4]

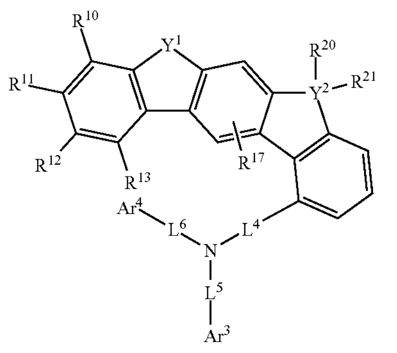

In Chemical Formula 2II-A-1 to Chemical Formula 2II-A-4, $Y^1$, $Y^2$, $L^4$ to $L^6$, $Ar^3$, $Ar^4$, and $R^{10}$ to $R^{13}$, $R^{17}$, $R^{20}$, and $R^{21}$ may be defined the same as those described above.

In an implementation, Chemical Formula 2II-B may be represented by, e.g., one of Chemical Formula 2II-B-1 to Chemical Formula 2II-B-4 depending on the substitution point of the group represented by Formula a.

[Chemical Formula 2II-B-1]

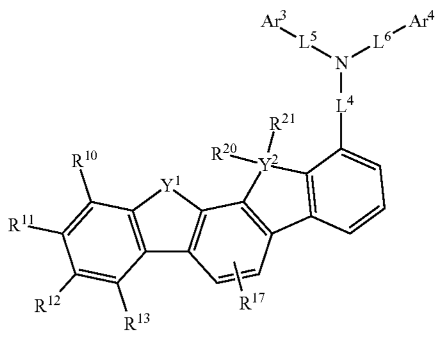

-continued

[Chemical Formula 2II-B-2]

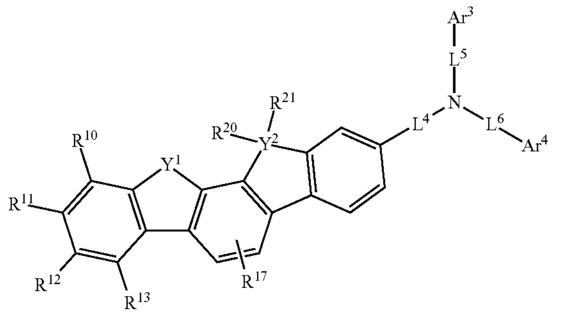

[Chemical Formula 2II-B-3]

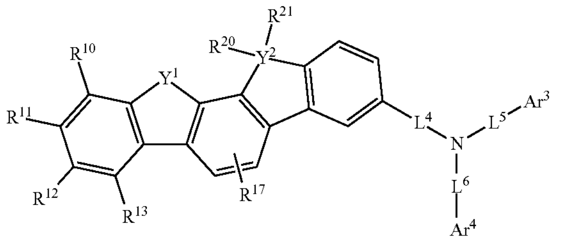

[Chemical Formula 2II-B-4]

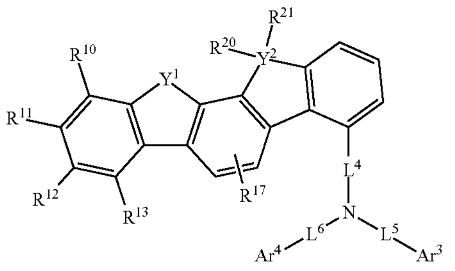

In Chemical Formula 2II-B-1 to Chemical Formula 2II-B-4, $Y^1$, $Y^2$, $L^4$ to $L^6$, $Ar^3$, $Ar^4$, and $R^{10}$ to $R^{13}$, $R^{17}$, $R^{20}$, and $R^{21}$ may be defined the same as those described above.

In an implementation, Chemical Formula 2II-C may be represented by, e.g., one of Chemical Formula 2II-C-1 to Chemical Formula 2II-C-4 depending on the substitution point of the group represented by Formula a.

[Chemical Formula 2II-C-1]

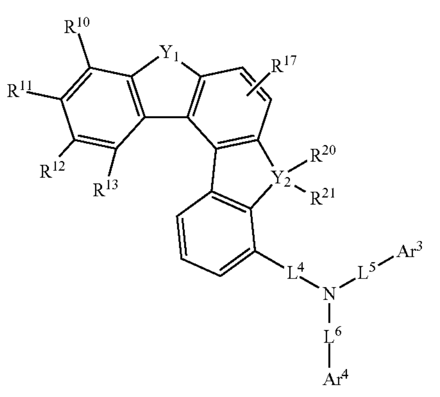

-continued

[Chemical Formula 2II-C-2]

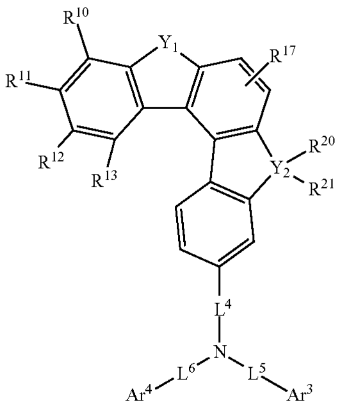

[Chemical Formula 2II-C-3]

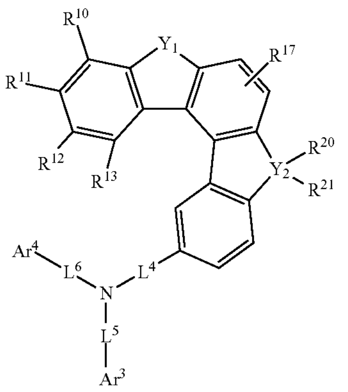

[Chemical Formula 2II-C-4]

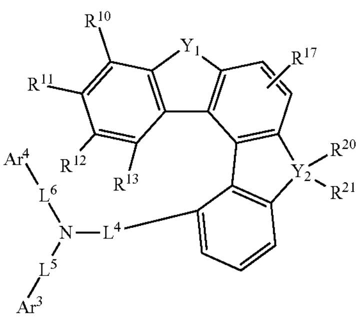

In Chemical Formula 2II-C-1 to Chemical Formula 2II-C-4, $Y^1$, $Y^2$, $L^4$ to $L^6$, $Ar^3$, $Ar^4$, and $R^{10}$ to $R^{13}$, $R^{17}$, $R^{20}$, and $R^{21}$ may be defined the same as those described above.

In an implementation, Chemical Formula 2II-D may be represented by, e.g., one of Chemical Formula 2II-D-1 to Chemical Formula 2II-D-4 depending on the substitution point of the group represented by Formula a.

[Chemical Formula 2II-D-1]

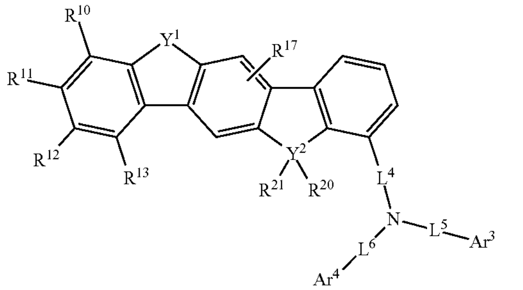

[Chemical Formula 2II-D-2]

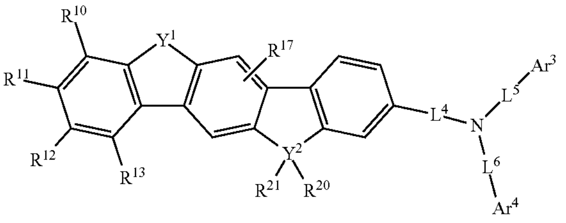

[Chemical Formula 2II-D-3]

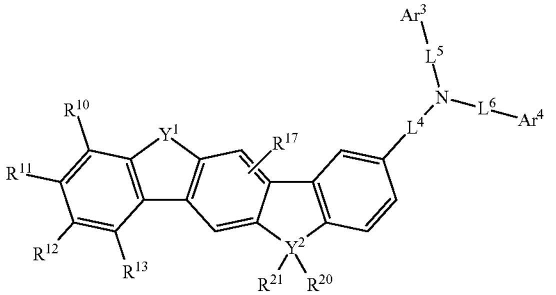

[Chemical Formula 2II-D-4]

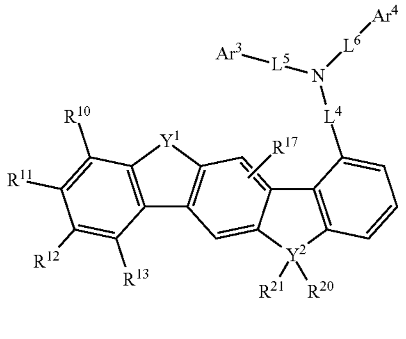

In Chemical Formula 2II-D-1 to Chemical Formula 2II-D-4, $Y^1$, $Y^2$, $L^4$ to $L^6$, $Ar^3$, $Ar^4$, and $R^{10}$ to $R^{13}$, $R^{17}$, $R^{20}$, and $R^{21}$ may be defined the same as those described above.

In an implementation, Chemical Formula 2II-E may be represented by, e.g., one of Chemical Formula 2II-E-1 to Chemical Formula 2II-E-4 depending on the substitution point of the group represented by Formula a.

[Chemical Formula 2II-E-1]

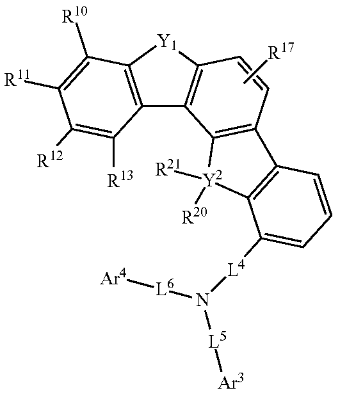

[Chemical Formula 2II-E-2]

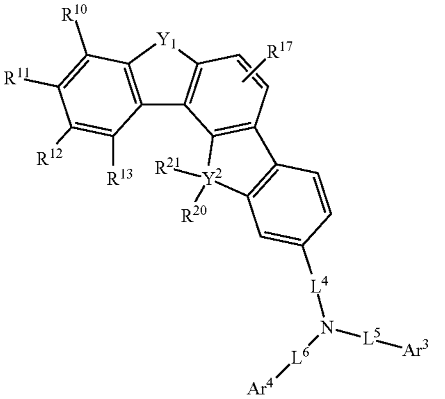

[Chemical Formula 2II-E-3]

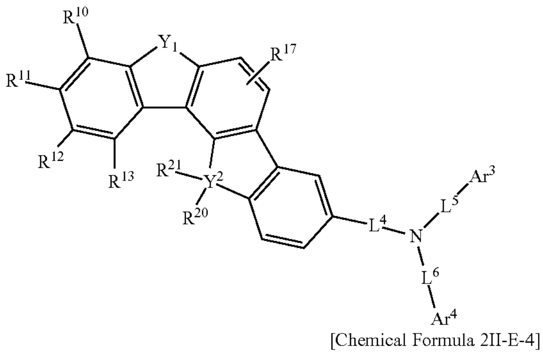

[Chemical Formula 2II-E-4]

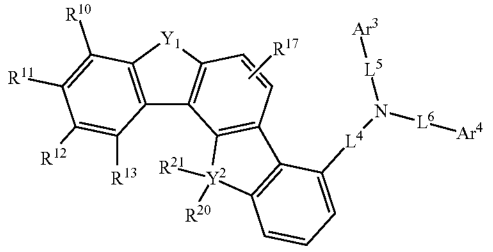

In Chemical Formula 2II-E-1 to Chemical Formula 2II-E-4, $Y^1$, $Y^2$, $L^4$ to $L^6$, $Ar^3$, $Ar^4$, and $R^{10}$ to $R^{13}$, $R^{17}$, $R^{20}$, and $R^{21}$ may be defined the same as those described above.

In an implementation, Chemical Formula 2II-F may be represented by, e.g., one of Chemical Formula 2II-F-1 to Chemical Formula 2II-F-4, depending on the substitution point of the group represented by Chemical Formula a.

[Chemical Formula 2II-F-1]

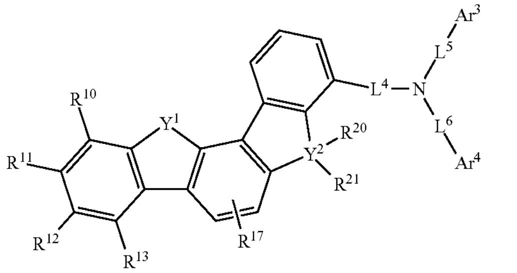

[Chemical Formula 2II-F-2]

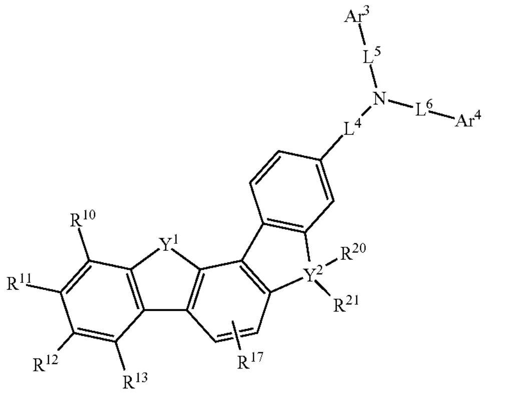

[Chemical Formula 2II-F-3]

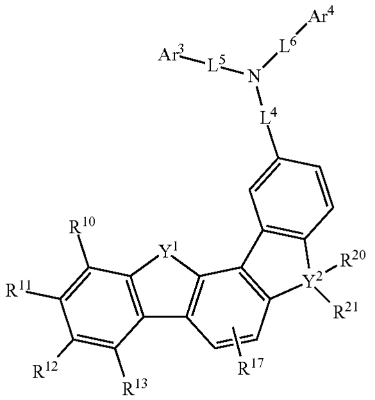

[Chemical Formula 2II-F-4]

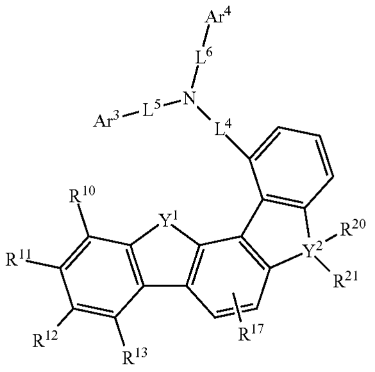

In Chemical Formula 2II-F-1 to Chemical Formula 2II-F-4, $Y^1$, $Y^2$, $L^4$ to $L^6$, $Ar^3$, $Ar^4$, and $R^{10}$ to $R^{13}$, $R^{17}$, $R^{20}$, and $R^{21}$ may be defined the same as those described above.

In an implementation, Chemical Formula 2II-G may be represented by, e.g., one of Chemical Formula 2II-G-1 to Chemical Formula 2II-G-4, depending on the substitution point of the group represented by Chemical Formula a.

[Chemical Formula 2II-G-1]

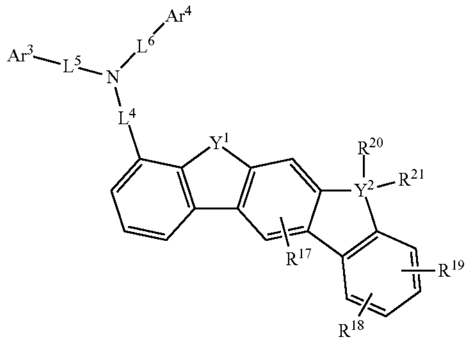

[Chemical Formula 2II-G-2]

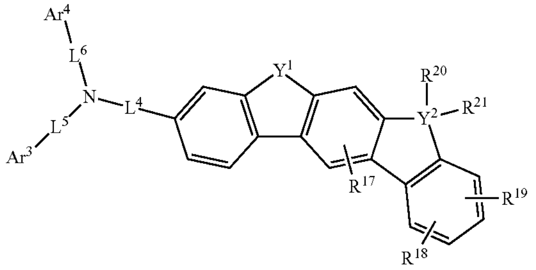

[Chemical Formula 2II-G-3]

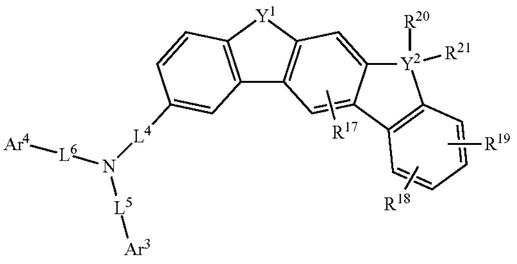

[Chemical Formula 2II-G-4]

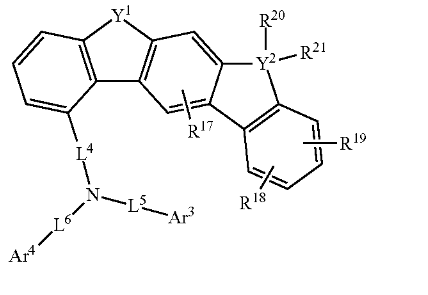

In Chemical Formula 2II-G-1 to Chemical Formula 2II-G-4, $Y^1$, $Y^2$, $L^4$ to $L^6$, $Ar^3$, $Ar^4$, and $R^{17}$ to $R^{21}$ may be defined the same as those described above.

In an implementation, Chemical Formula 2II-H may be represented by, e.g., one of Chemical Formula 2II-H-1 to Chemical Formula 2II-H-4, depending on the substitution point of the group represented by Chemical Formula a.

[Chemical Formula 2II-H-1]

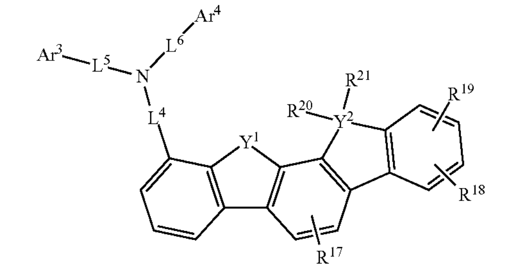

[Chemical Formula 2II-H-2]

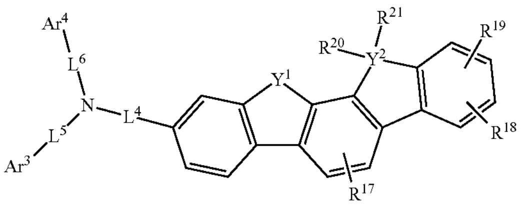

[Chemical Formula 2II-H-3]

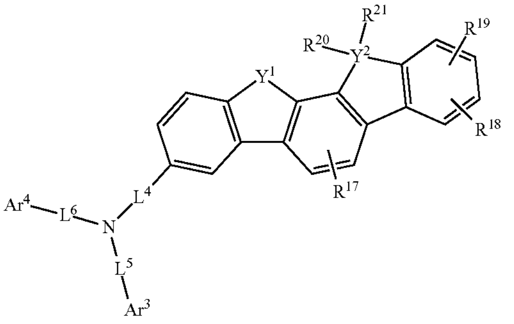

[Chemical Formula 2II-H-4]

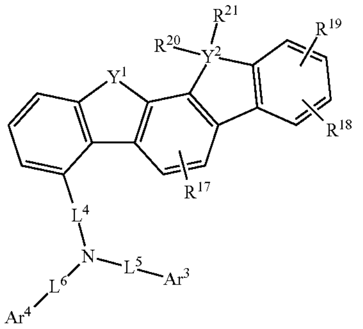

In Chemical Formula 2II-H-1 to Chemical Formula 2II-H-4, $Y^1$, $Y^2$, $L^4$ to $L^6$, $Ar^3$, $Ar^4$, and $R^{17}$ to $R^{21}$ may be defined the same as those described above.

In an implementation, Chemical Formula 2II-I may be represented by, e.g., one of Chemical Formula 2II-I-1 to Chemical Formula 2II-I-4, depending on the substitution point of the group represented by Chemical Formula a.

[Chemical Formula 2II-I-1]

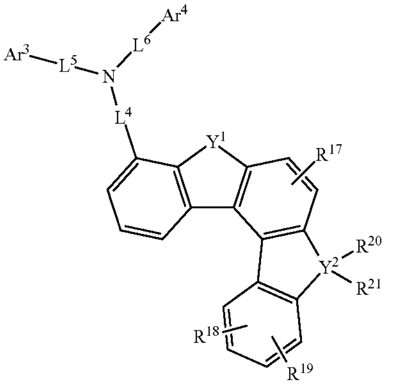

[Chemical Formula 2II-I-2]

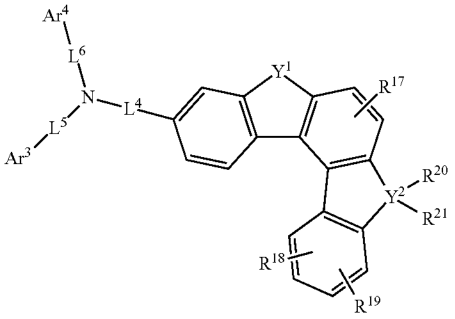

[Chemical Formula 2II-I-3]

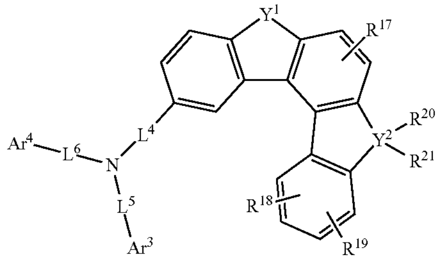

[Chemical Formula 2II-I-4]

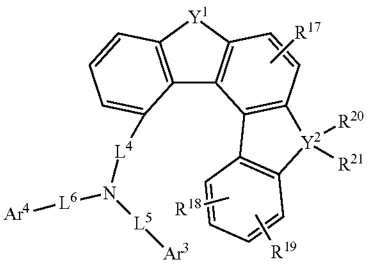

In Chemical Formula 2II-I-1 to Chemical Formula 2II-I-4, $Y^1$, $Y^2$, $L^4$ to $L^6$, $Ar^3$, $Ar^4$, and $R^{17}$ to $R^{21}$ may be defined the same as those described above.

In an implementation, Chemical Formula 2II-J may be represented by, e.g., one of Chemical Formula 2II-J-1 to Chemical Formula 2II-J-4, depending on the substitution point of the group represented by Chemical Formula a.

[Chemical Formula 2II-J-1]

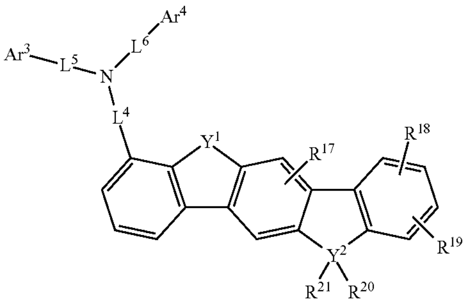

[Chemical Formula 2II-J-2]

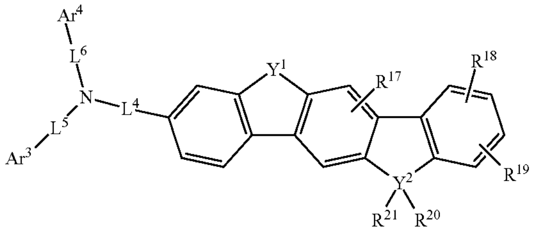

[Chemical Formula 2II-J-3]

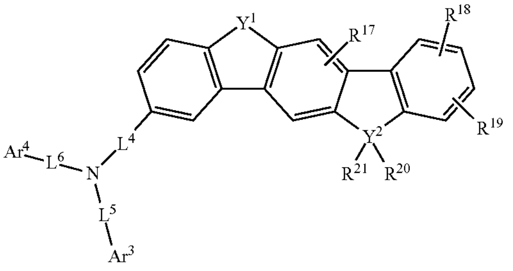

[Chemical Formula 2II-J-4]

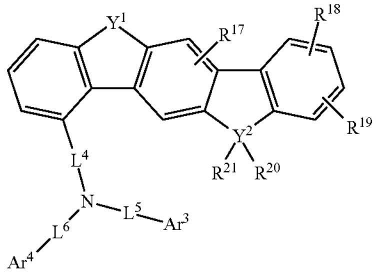

In Chemical Formula 2II-J-1 to Chemical Formula 2II-J-4, $Y^1$, $Y^2$, $L^4$ to $L^6$, $Ar^3$, $Ar^4$, and $R^{17}$ to $R^{21}$ may be defined the same as those described above.

In an implementation, Chemical Formula 2II-K may be represented by, e.g., one of Chemical Formula 2II-K-1 to Chemical Formula 2II-K-4, depending on the substitution point of the group represented by Chemical Formula a.

[Chemical Formula 2II-K-1]

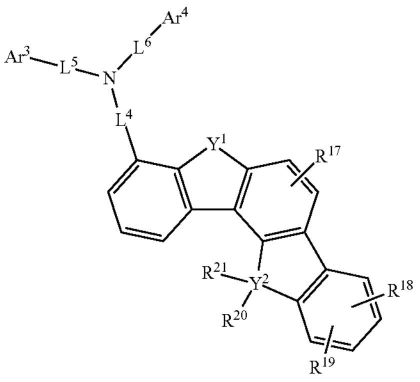

[Chemical Formula 2II-K-2]

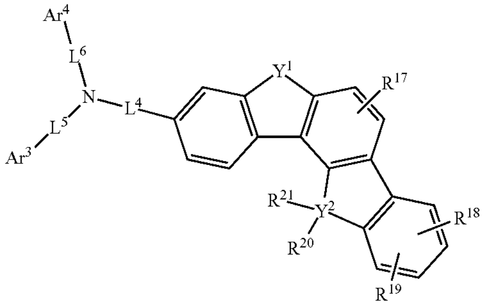

[Chemical Formula 2II-K-3]

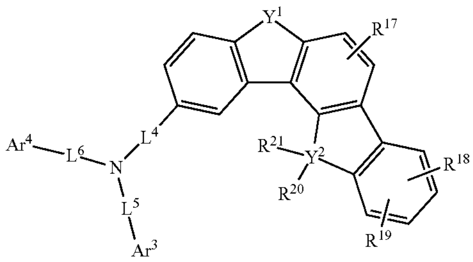

[Chemical Formula 2II-K-4]

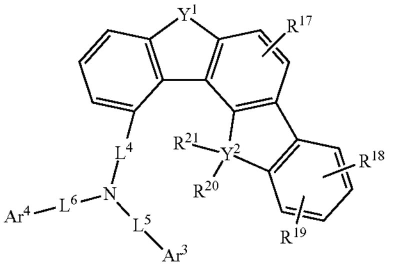

In Chemical Formula 2II-K-1 to Chemical Formula 2II-K-4, $Y^1$, $Y^2$, $L^4$ to $L^6$, $Ar^3$, Art, and $R^{17}$ to $R^{21}$ may be defined the same as those described above.

In an implementation, Chemical Formula 2II-L may be represented by, e.g., one of Chemical Formula 2II-L-1 to Chemical Formula 2II-L-4, depending on the substitution point of the group represented by Chemical Formula a.

[Chemical Formula 2II-L-1]

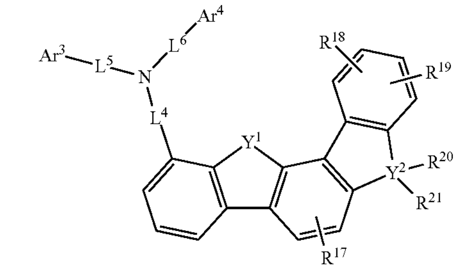

[Chemical Formula 2II-L-2]

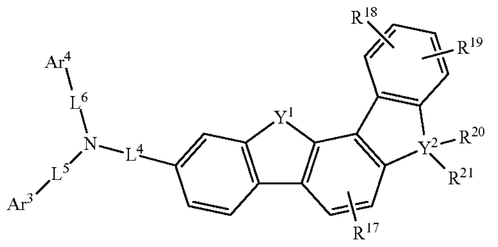

[Chemical Formula 2II-L-3]

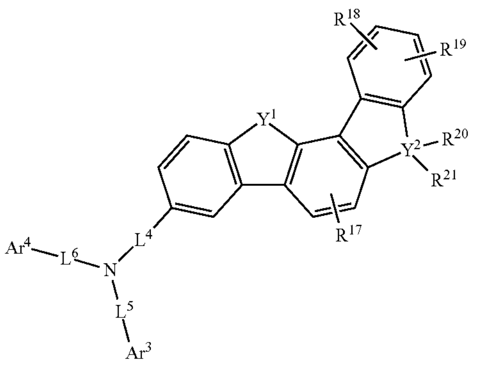

[Chemical Formula 2II-L-4]

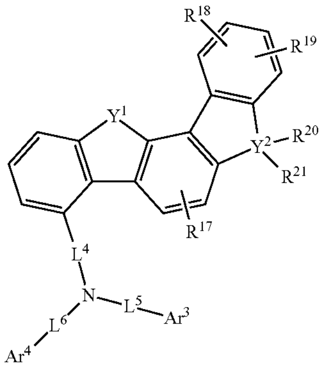

In Chemical Formula 2II-L-1 to Chemical Formula 2II-L-4, $Y^1$, $Y^2$, $L^4$ to $L^6$, $Ar^3$, $Ar^4$, and $R^{17}$ to $R^{21}$ may be defined the same as those described above.

In an implementation, the second compound may be represented by, e.g., one of Chemical Formula 2II-A-2, Chemical Formula 2II-A-3, Chemical Formula 2II-B-2, Chemical Formula 2II-B-3, Chemical Formula 2II-C-2, Chemical Formula 2II-C-3, Chemical Formula 2II-D-2, Chemical Formula 2II-D-3, Chemical Formula 2II-E-2, Chemical Formula 2II-E-3, Chemical Formula 2II-F-1 to Chemical Formula 2II-F-4, Chemical Formula 2II-G-1, Chemical Formula 2II-H-1, Chemical Formula 2II-I-1, Chemical Formula 2II-J-1, Chemical Formula 2II-K-1, and Chemical Formula 2II-L-1 to Chemical Formula 2II-L-4.

In an implementation, the second compound may be represented by, e.g., Chemical Formula 2II-F-2.

In an implementation, the second compound may be, e.g., a compound of Group 2.

[Group 2]

A-1

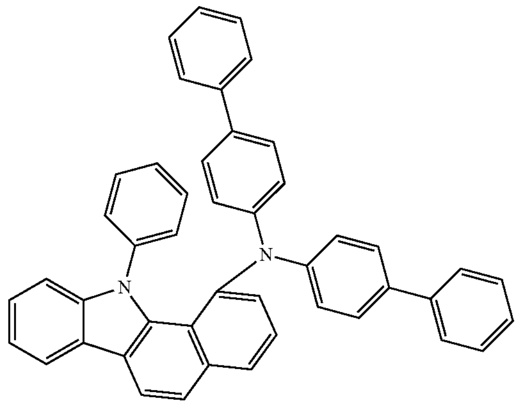

A-2

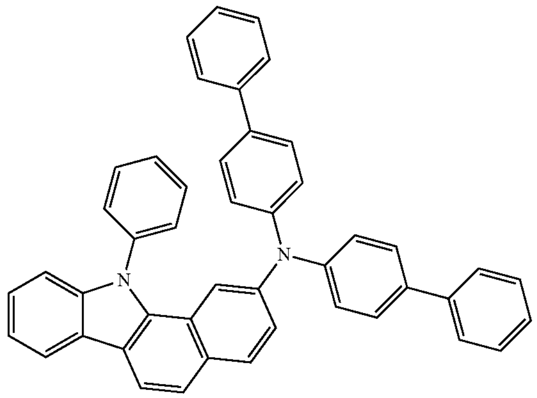

A-3

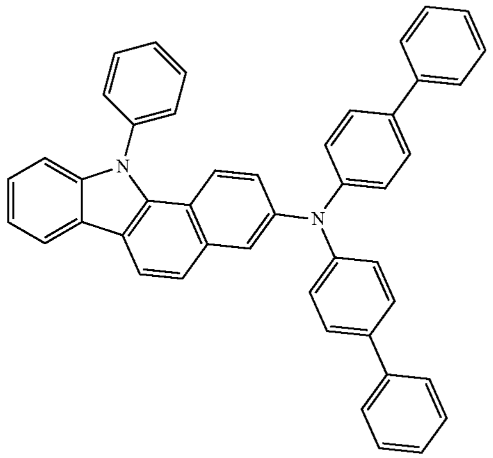

-continued
A-4
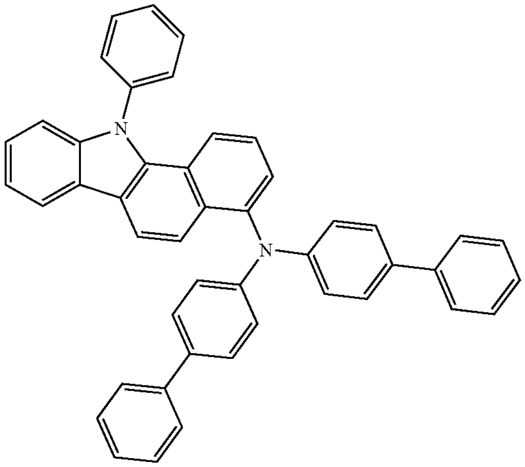
A-5
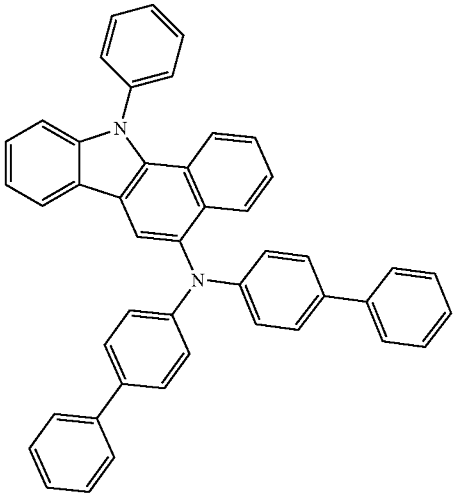
A-6
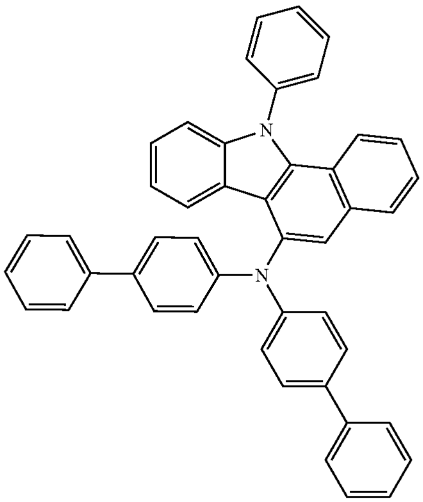
-continued
A-7
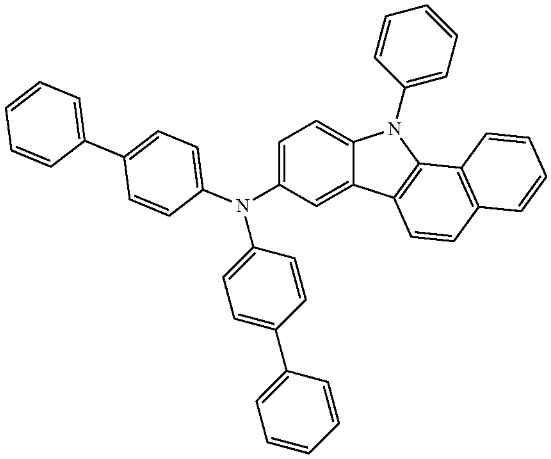
A-8
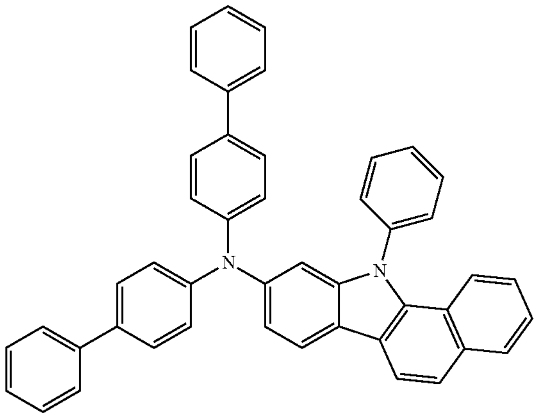
A-9
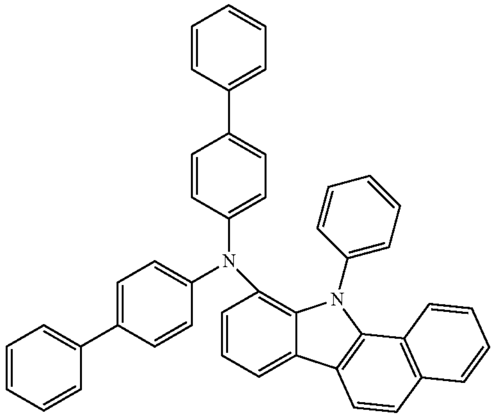

-continued
A-10
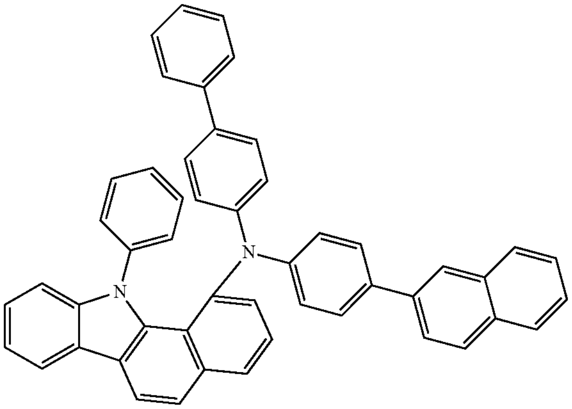
A-11
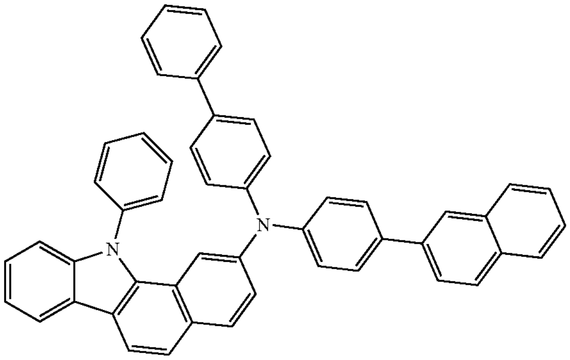
A-12
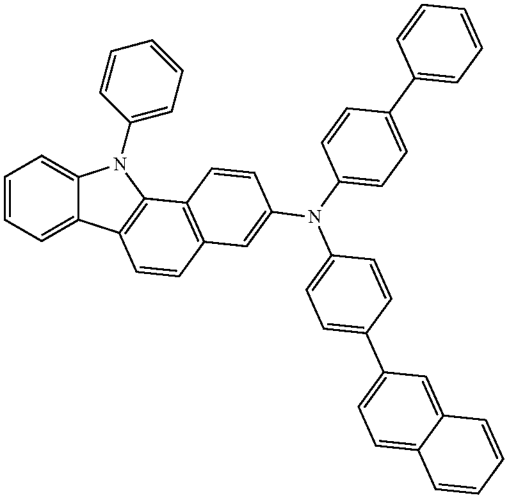
-continued
A-13
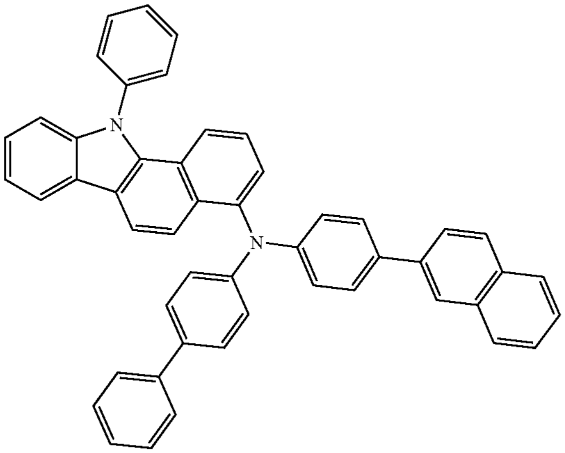
A-14
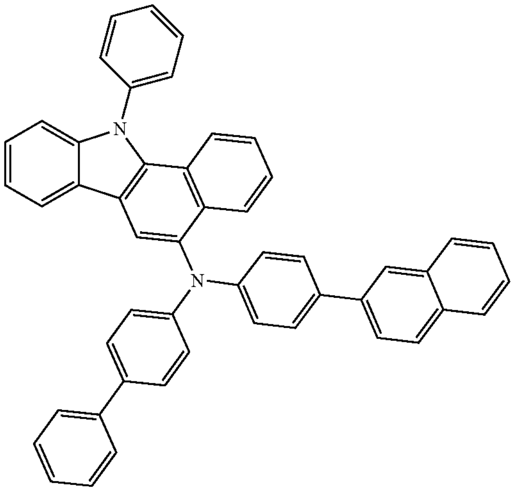
A-15
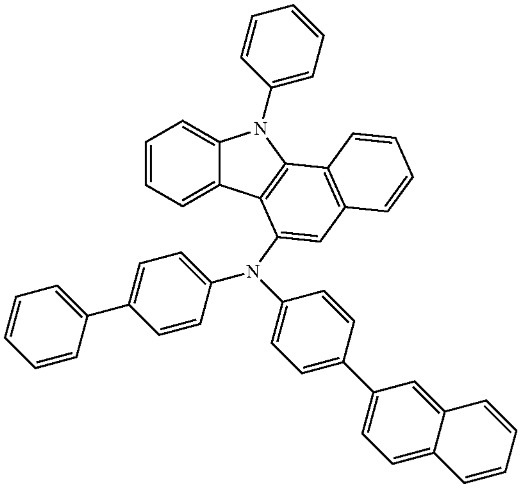

-continued
A-16
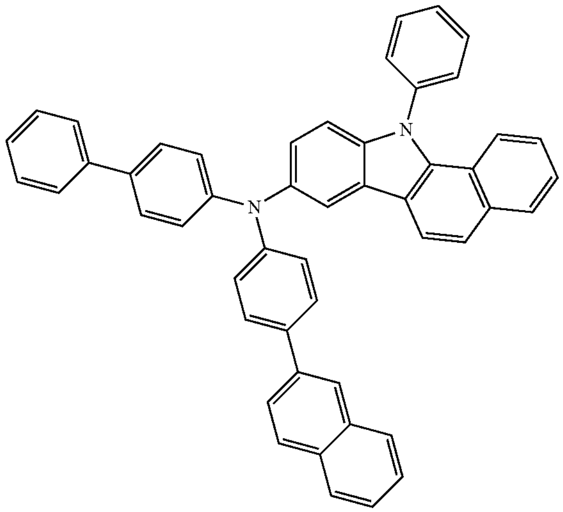
A-17
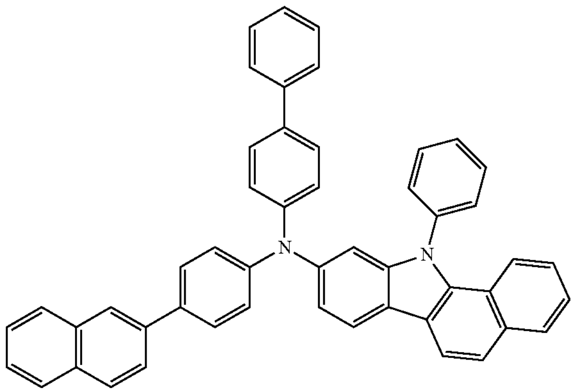
A-18
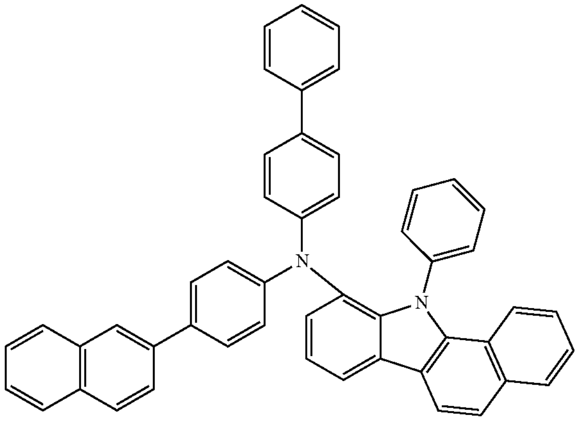
-continued
A-19
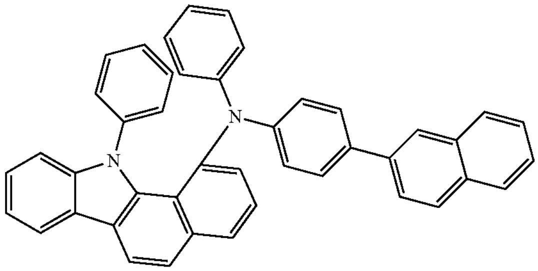
A-20
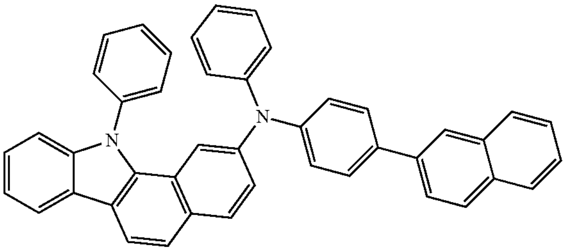
A-21
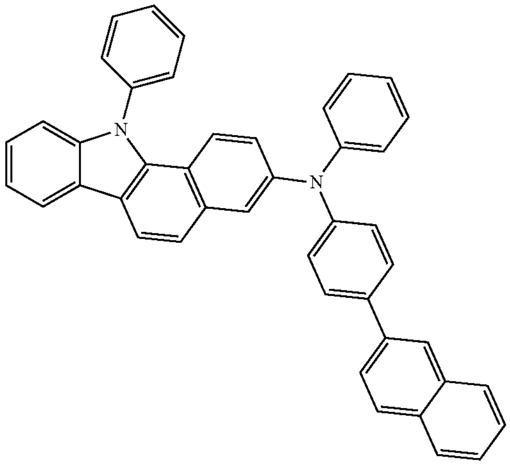
A-22
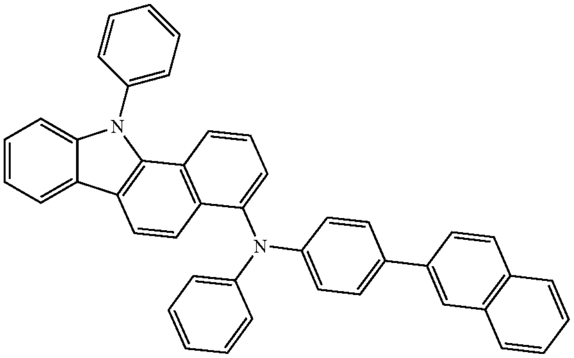

-continued
A-23
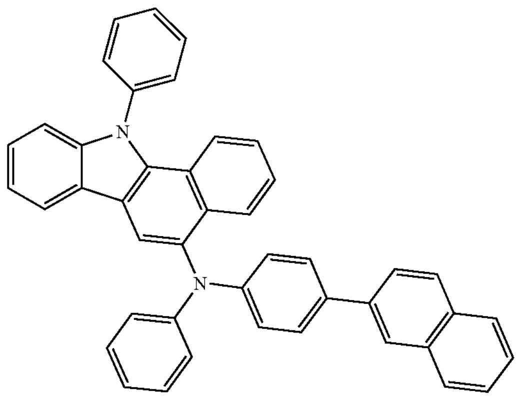
A-24
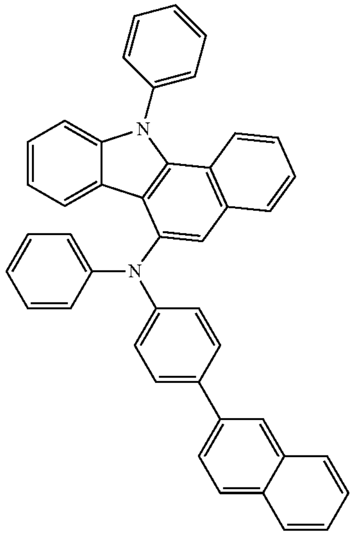
A-25
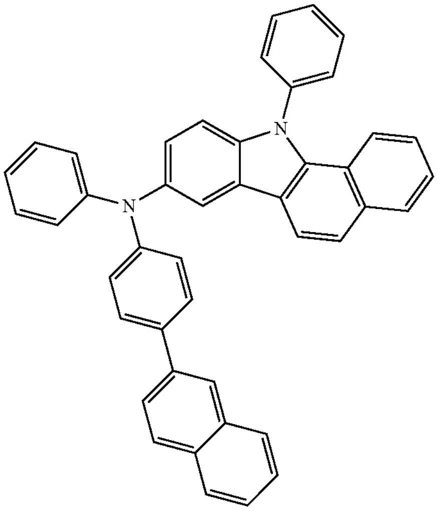
-continued
A-26
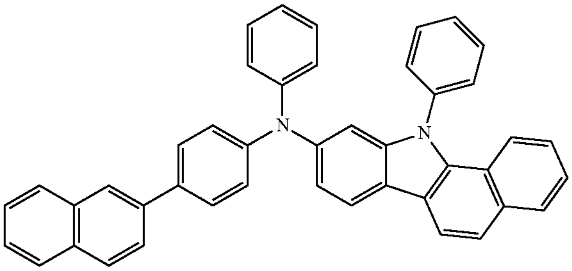
A-27
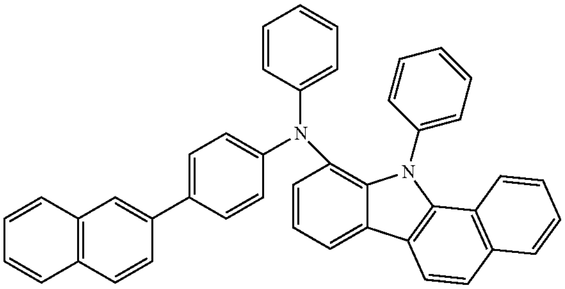
A-28
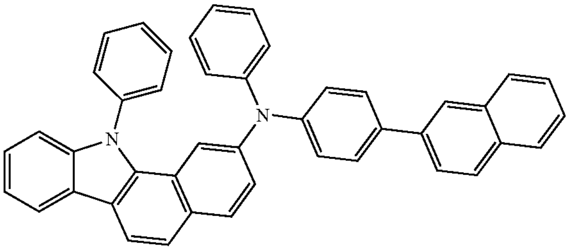
A-45
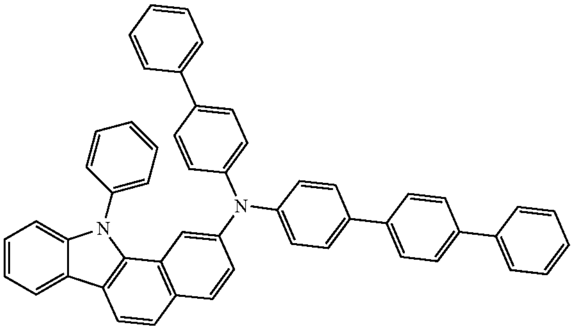
A-46
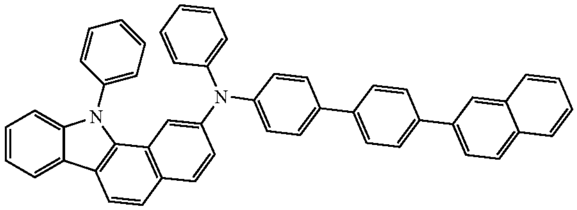

-continued
A-47
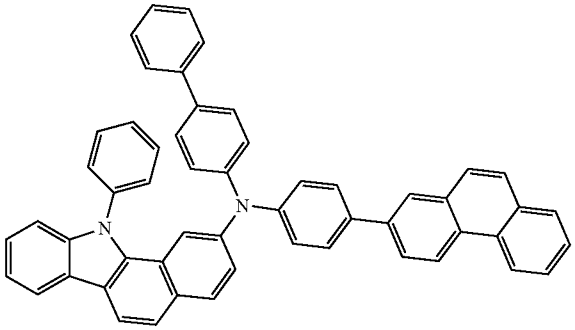
A-48
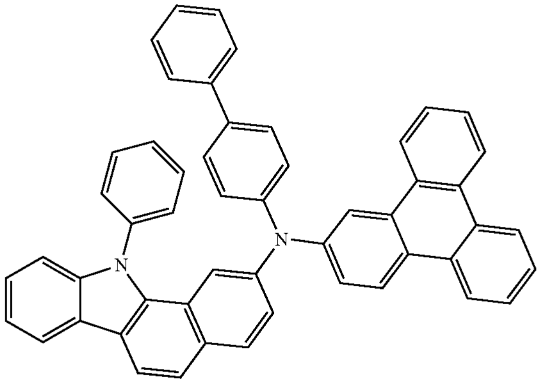
A-49
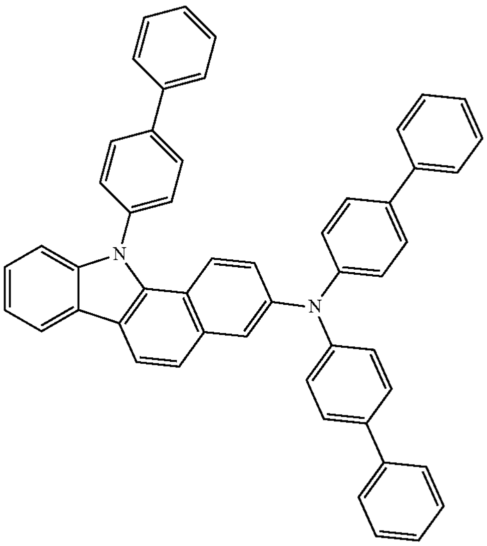
-continued
A-50
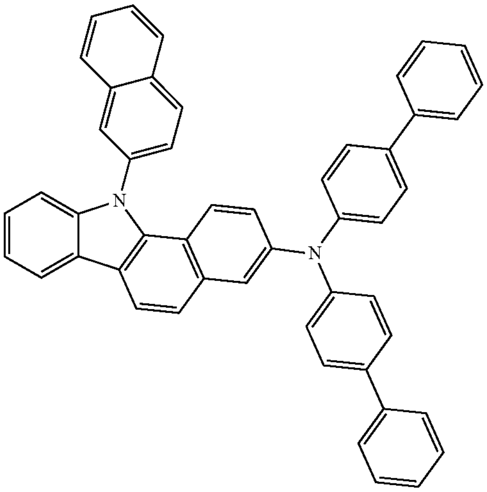
A-51
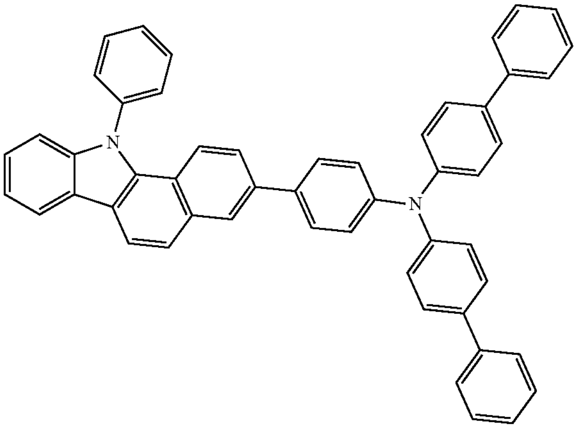
A-52
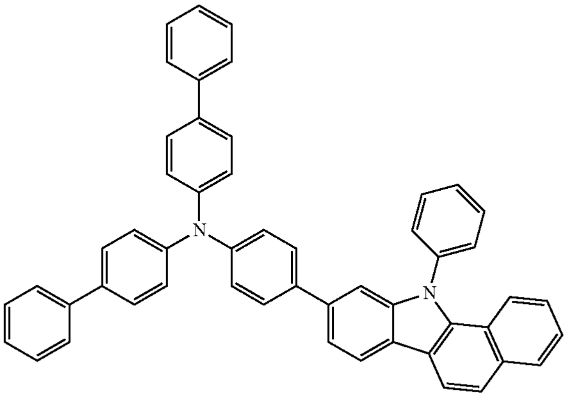

-continued
A-53
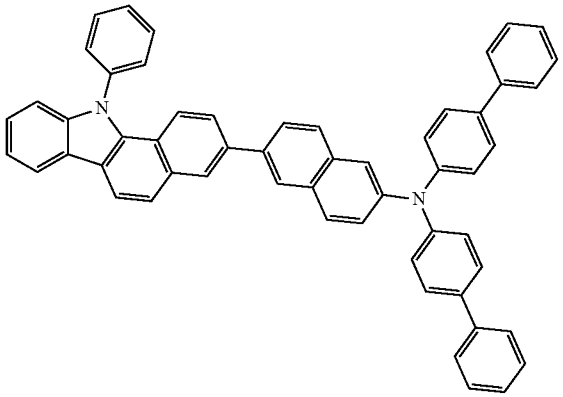
A-54
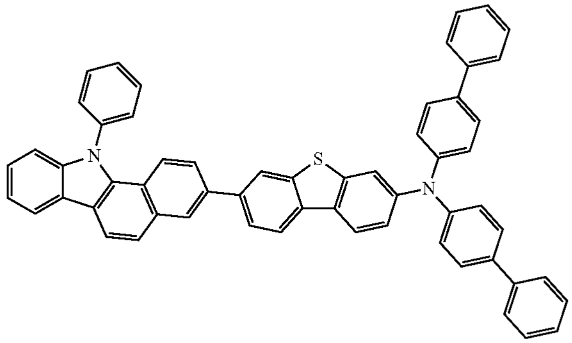
A-55
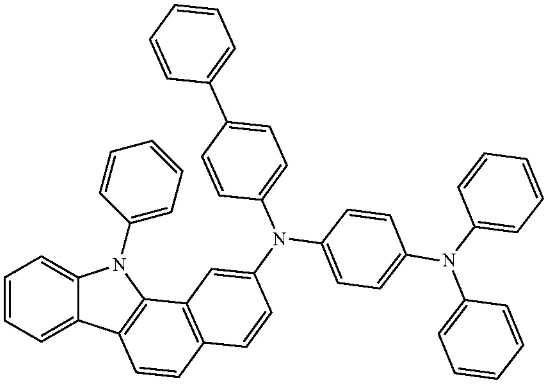
A-56
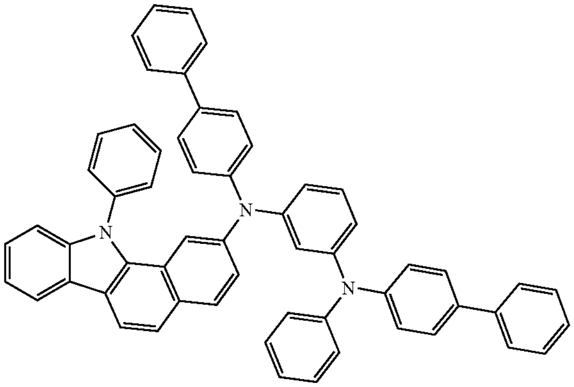
-continued
A-57
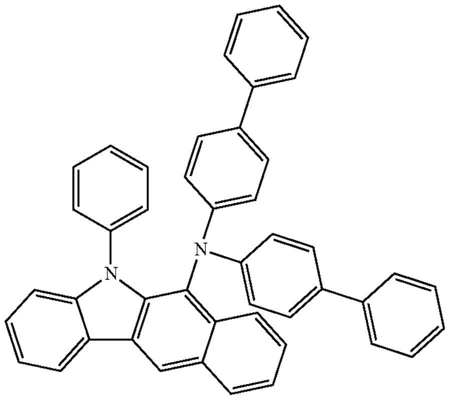
A-58
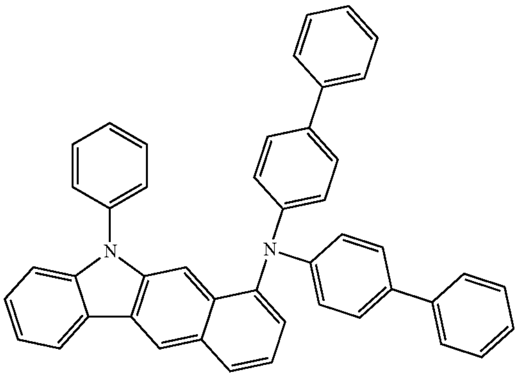
A-59
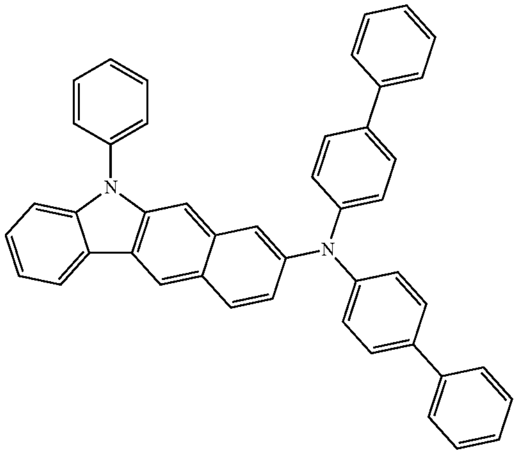

-continued
A-60
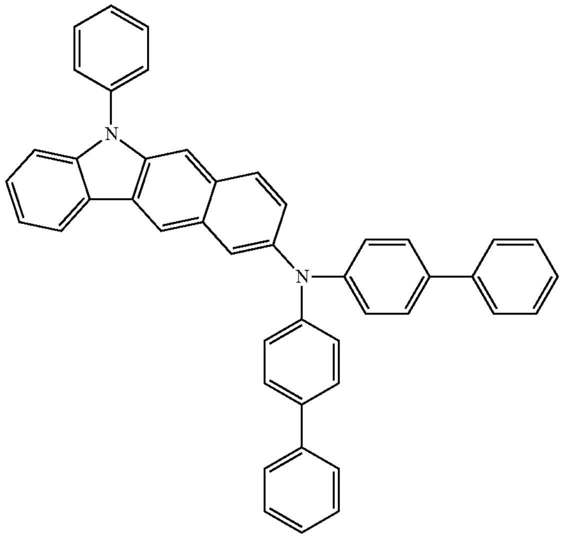
A-61
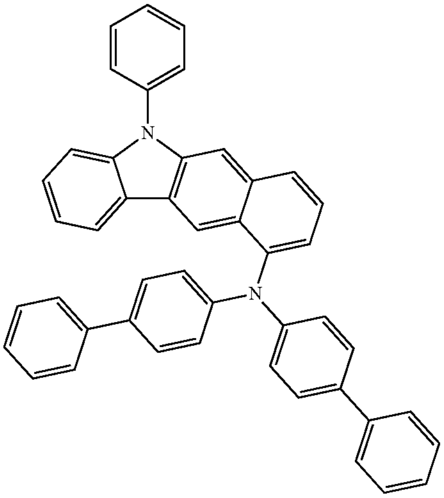
A-62
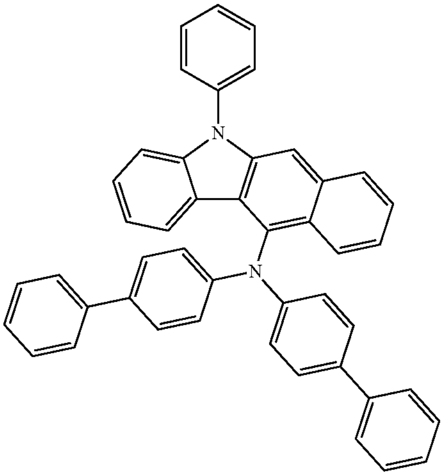
-continued
A-63
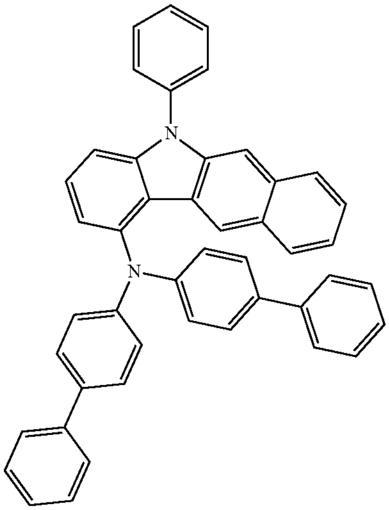
A-64
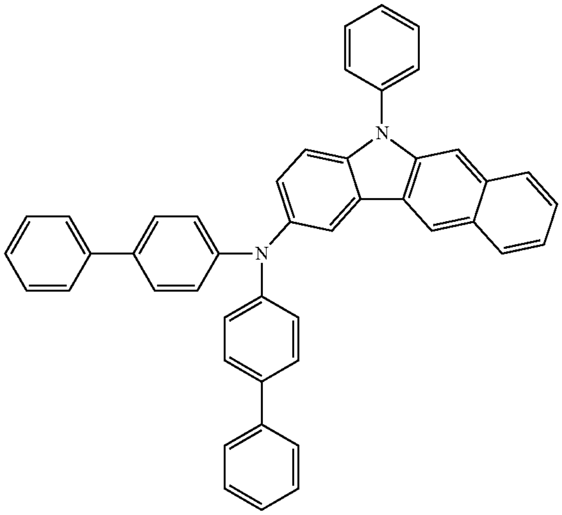
A-65
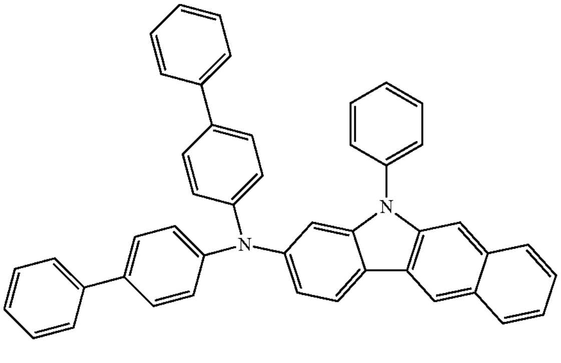

-continued
A-66
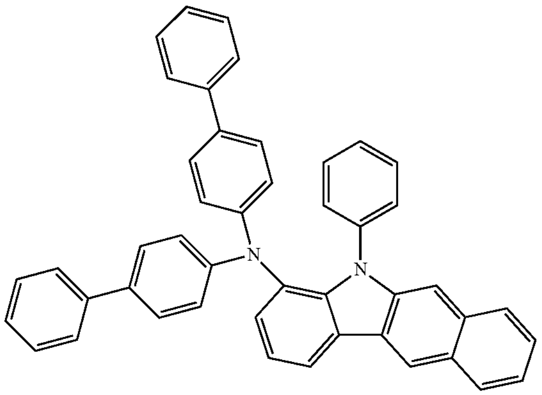
A-67
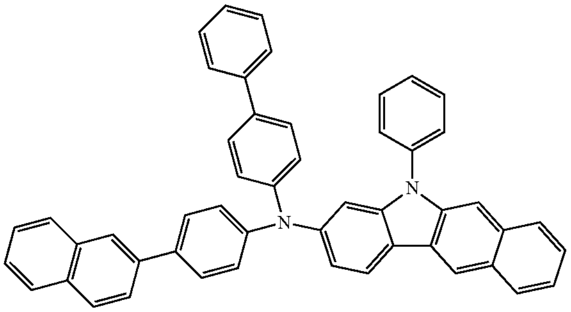
A-69
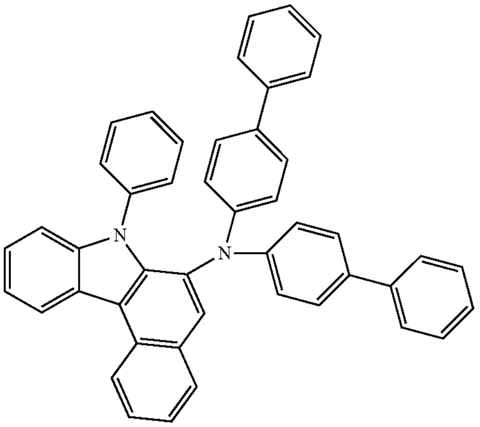
A-70
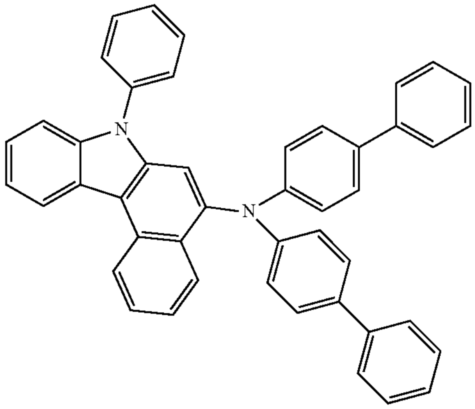
-continued
A-71
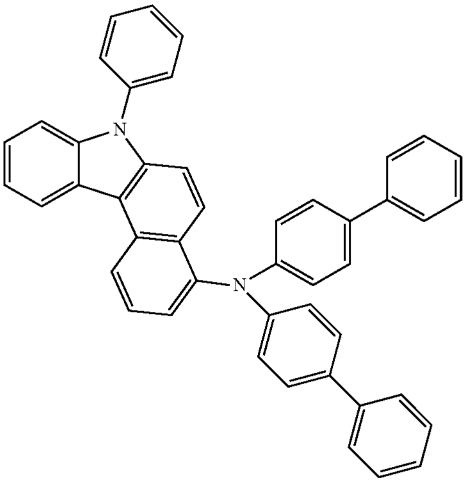
A-73
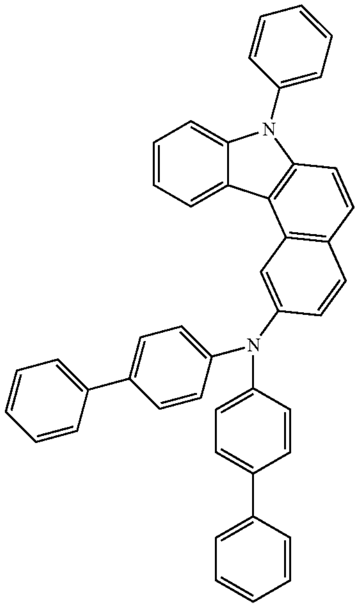
A-74
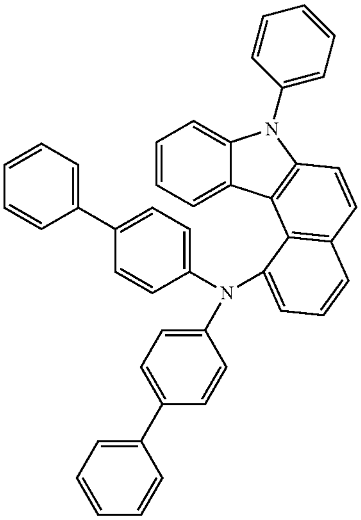

-continued
A-75
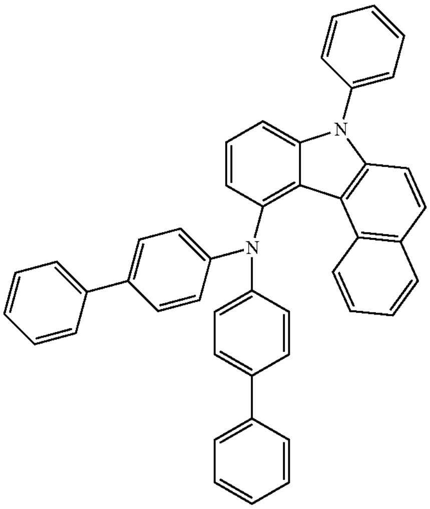
A-76
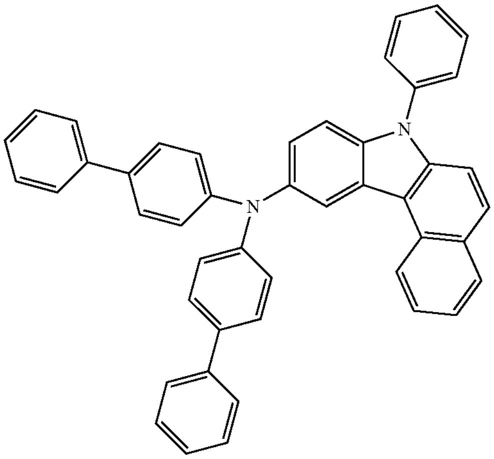
A-77
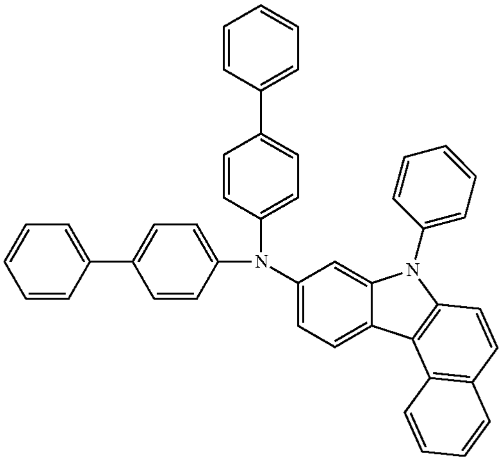
-continued
A-78
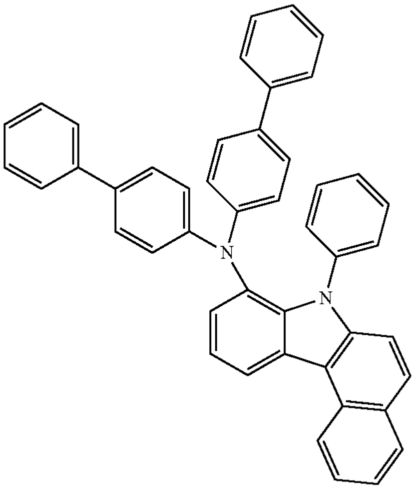
A-79
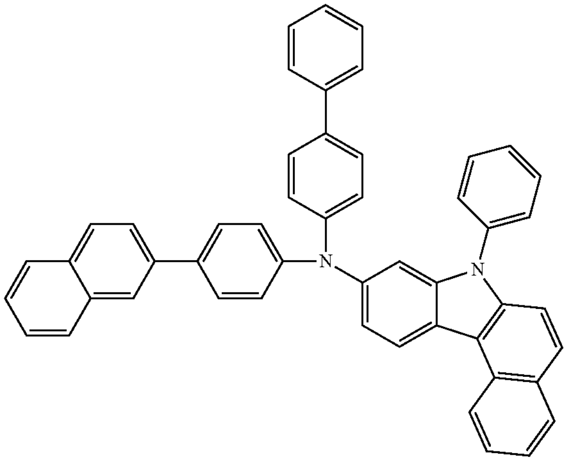
A-80
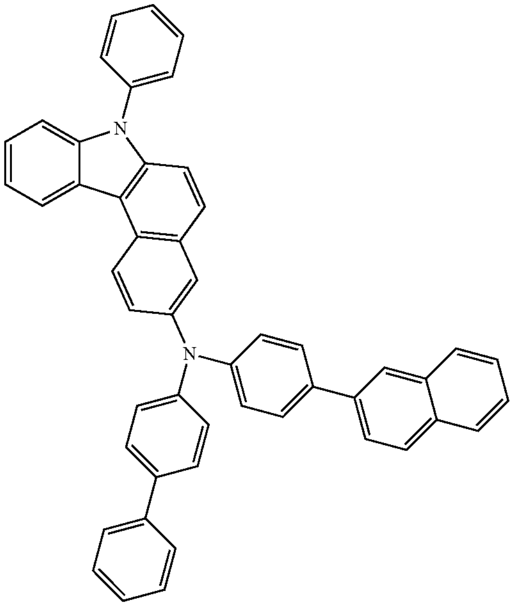

-continued
A-81
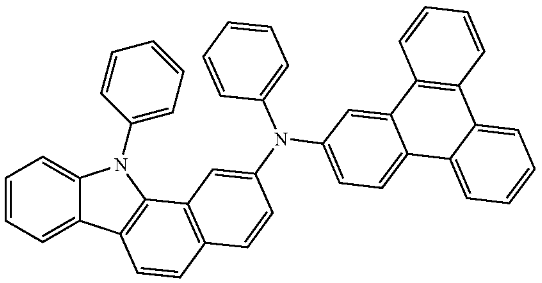
A-82
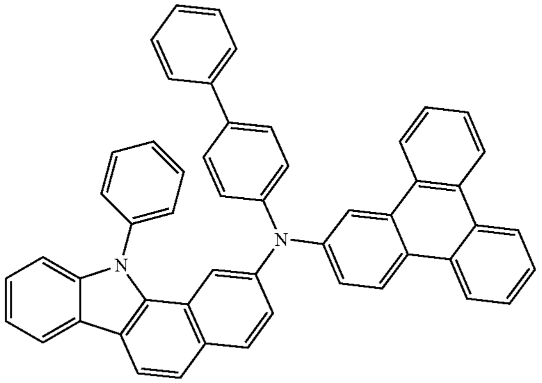
A-83
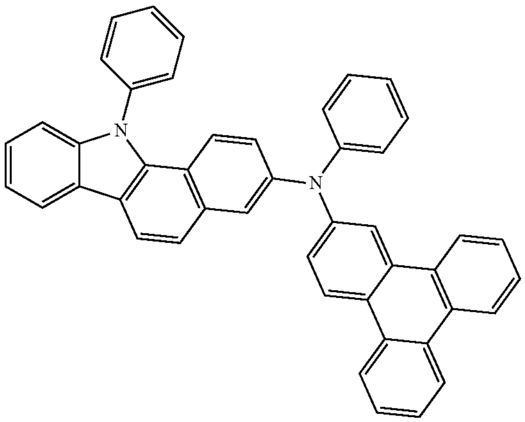
-continued
A-84
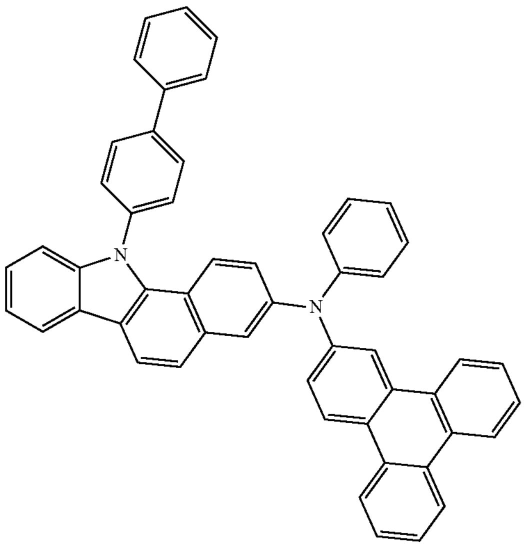
A-85
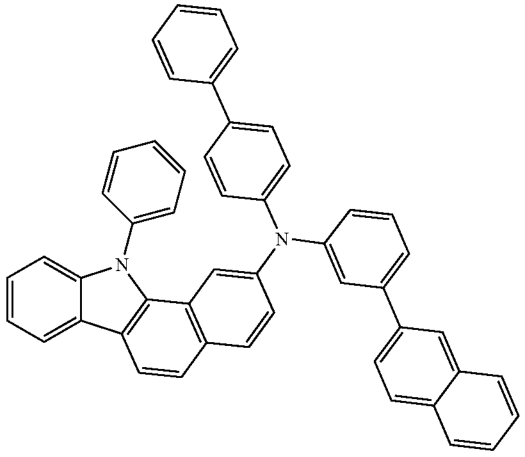
[2-1]
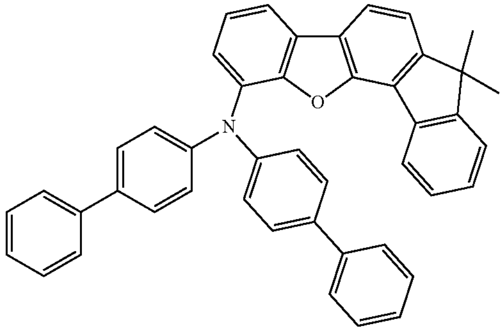

-continued
[2-2]
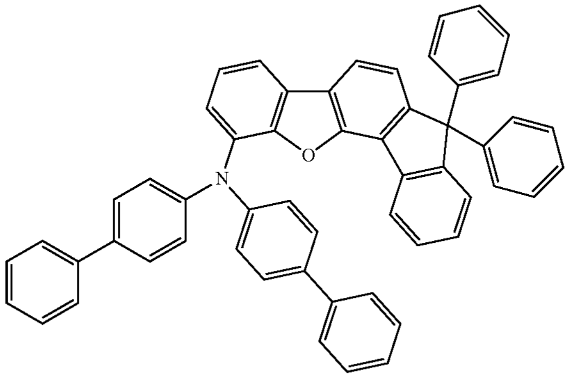
[2-3]
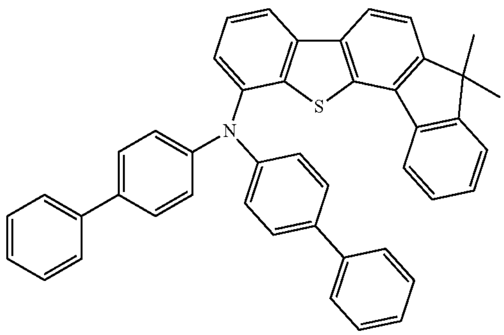
[2-4]
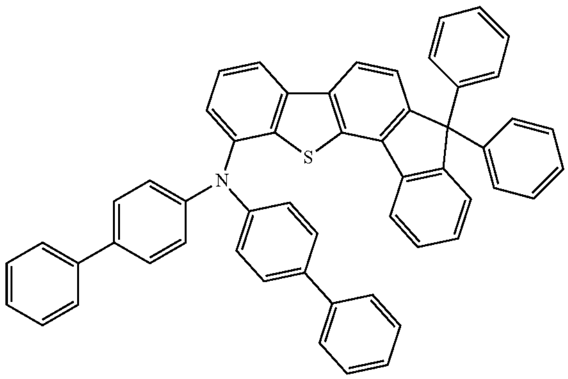
[2-5]
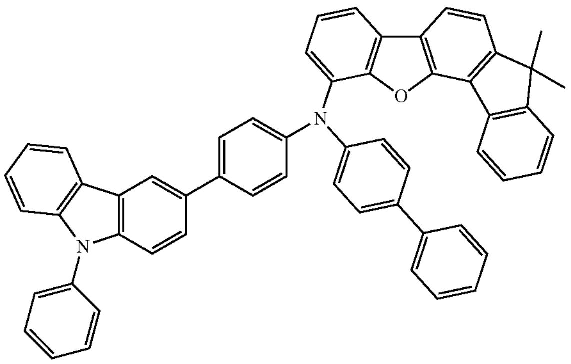
-continued
[2-6]
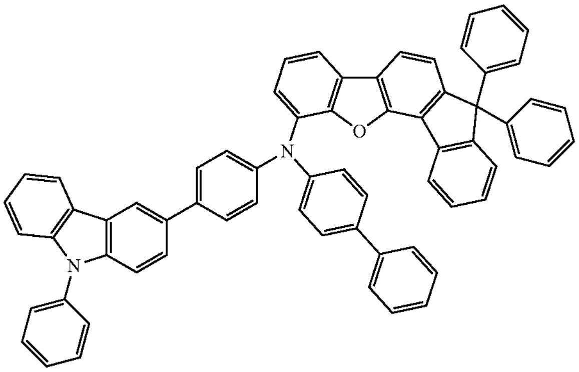
[2-7]
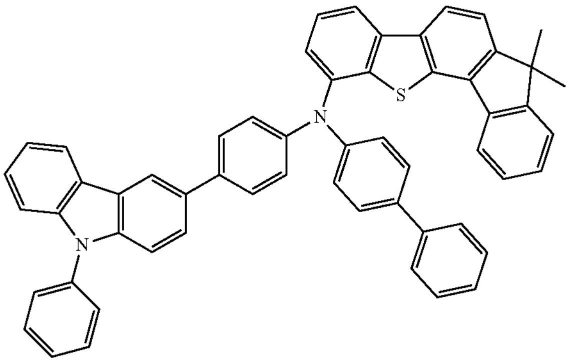
[2-8]
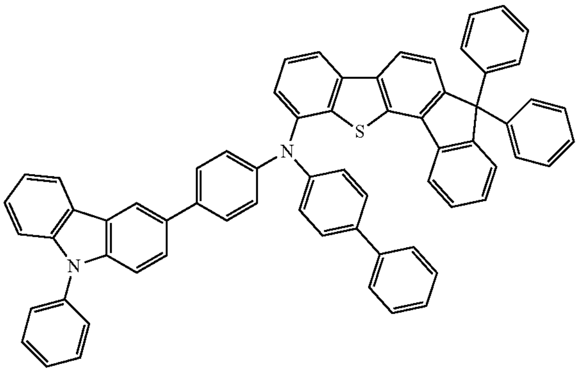
[2-9]
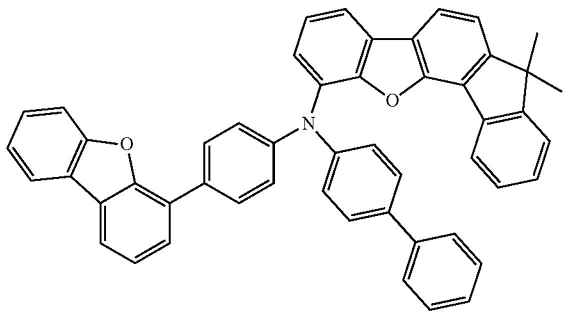

-continued
[2-10]
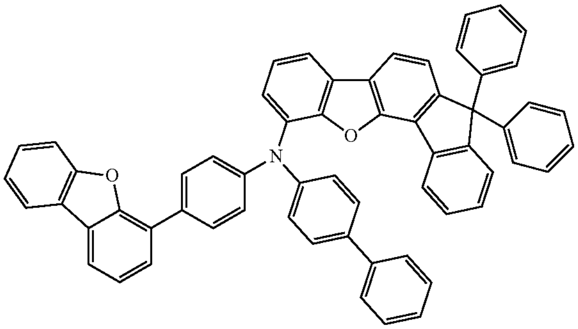
[2-11]
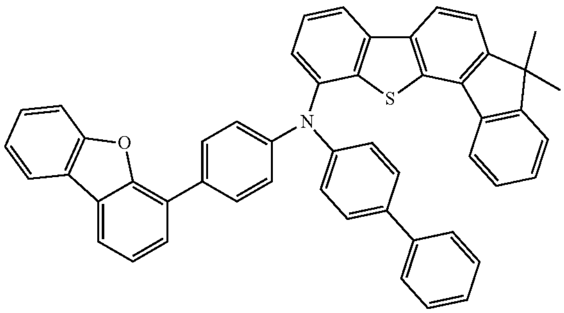
[2-12]
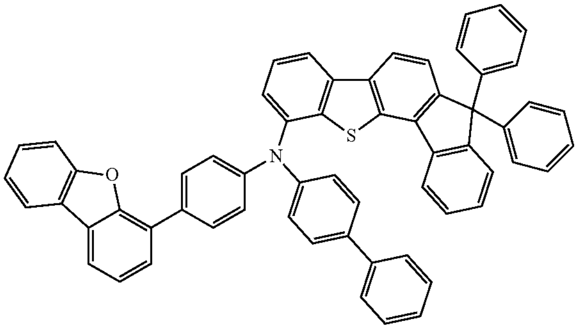
[2-13]
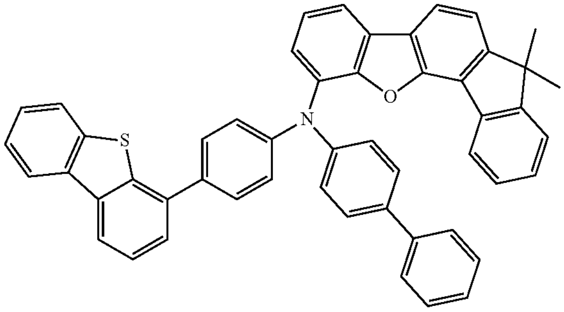
-continued
[2-14]
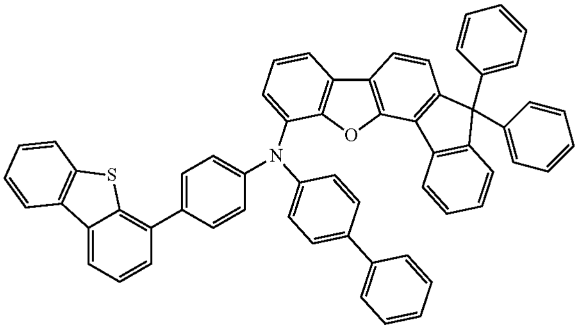
[2-15]
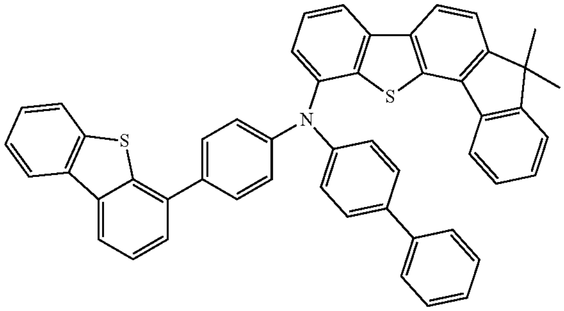
[2-16]
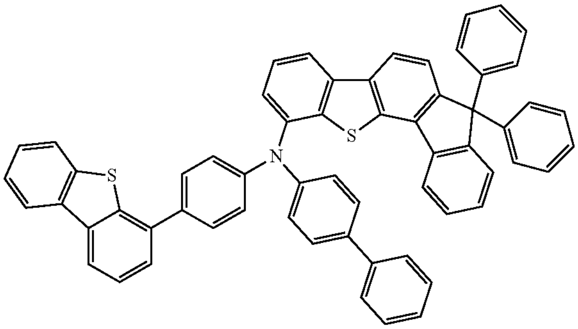
[2-17]
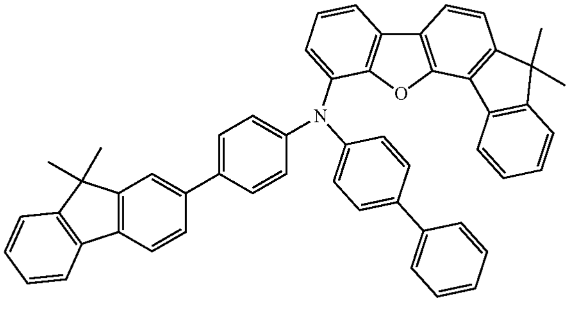

-continued
[2-18]
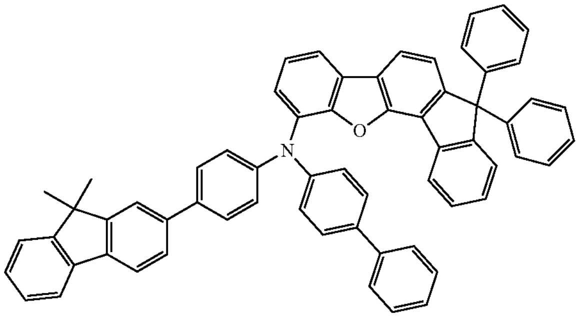
[2-19]
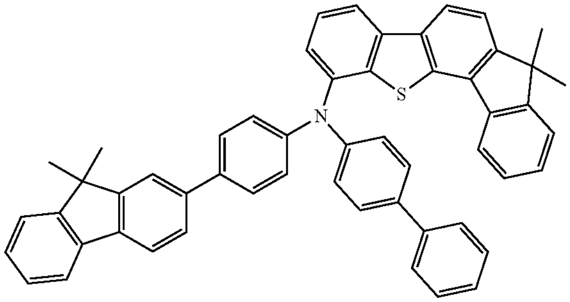
[2-20]
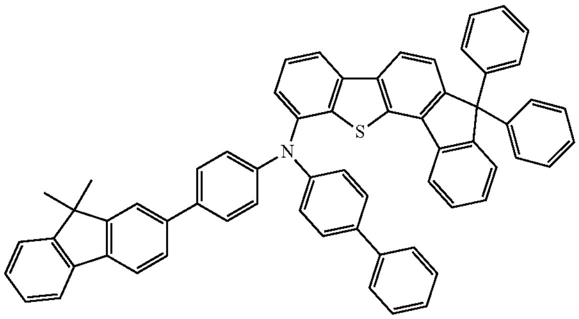
[2-21]
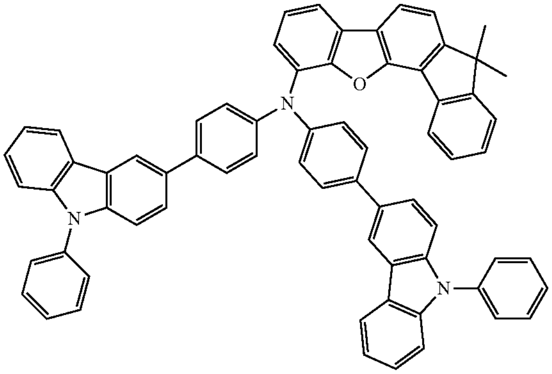
-continued
[2-22]
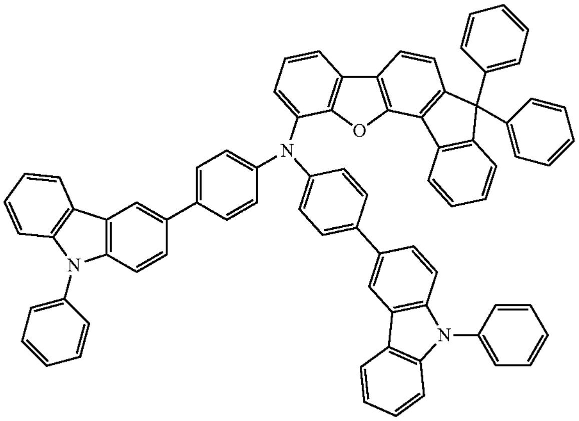
[2-23]
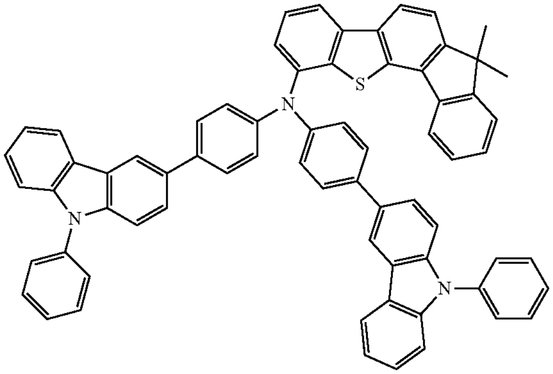
[2-24]
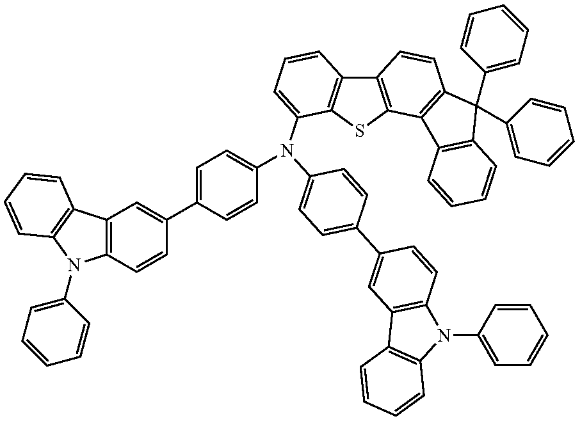

-continued
[2-23]
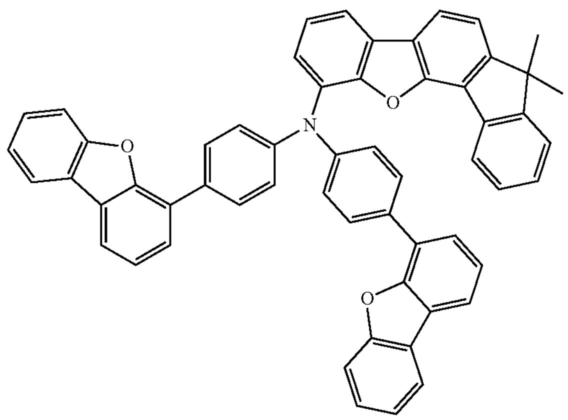
[2-24]
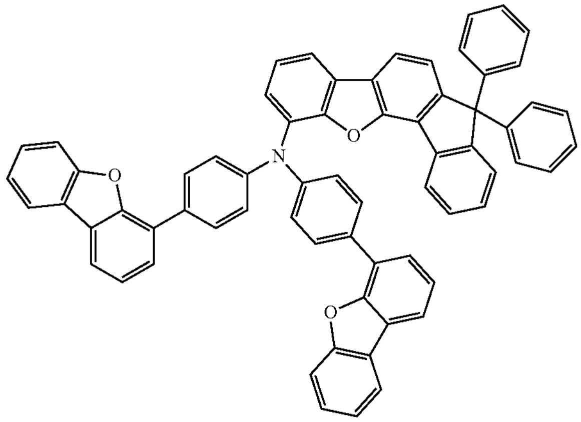
[2-25]
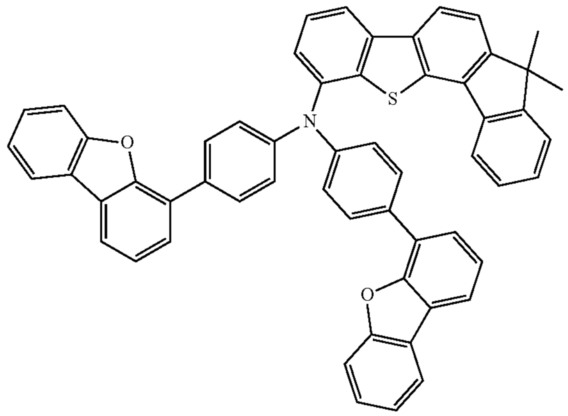
-continued
[2-26]
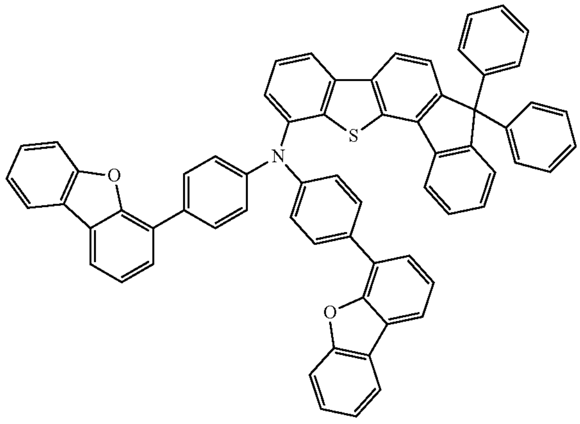
[2-27]
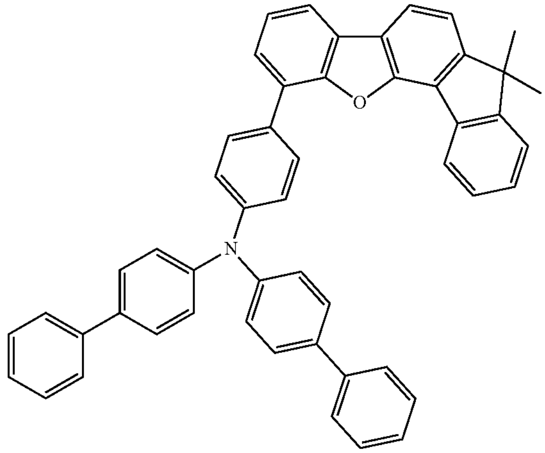
[2-28]
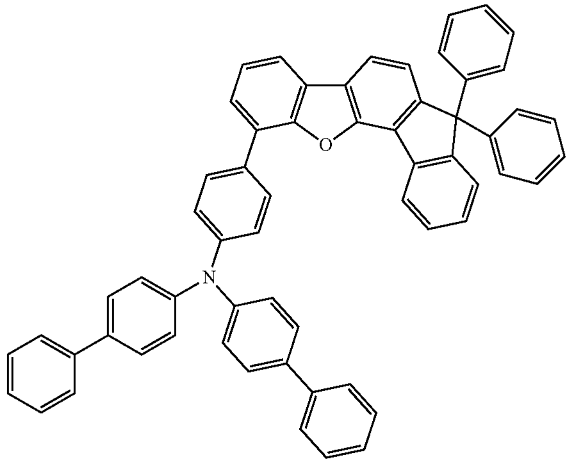

-continued
[2-29]
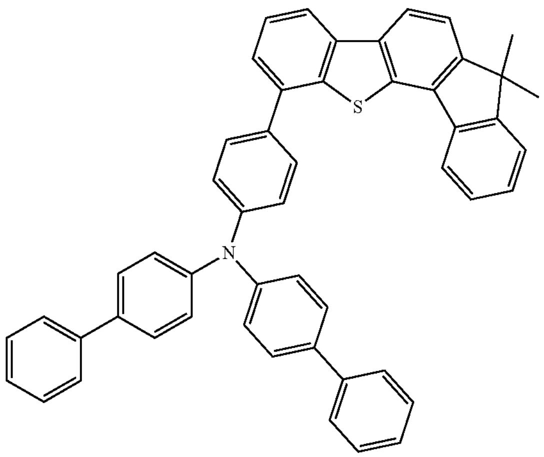
[2-30]
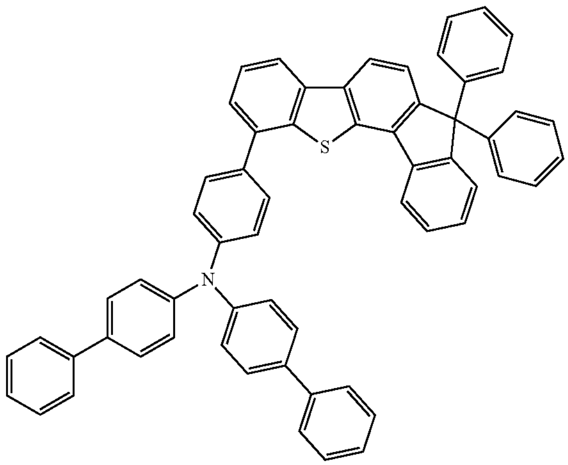
[2-31]
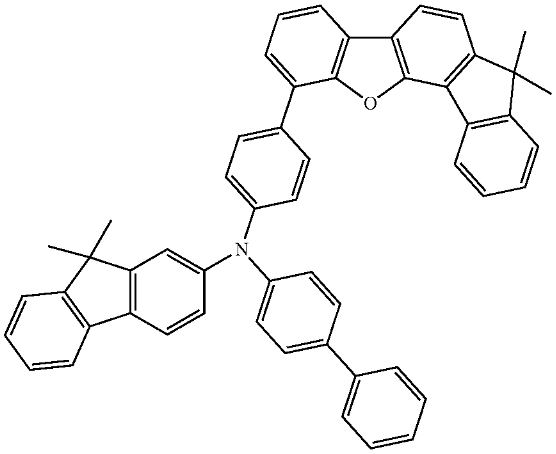
-continued
[2-32]
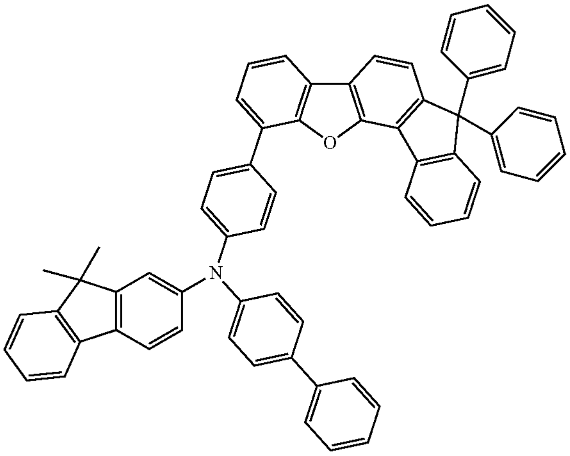
[2-33]
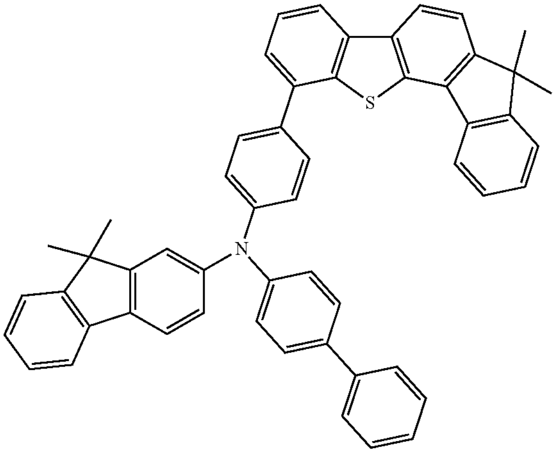
[2-34]
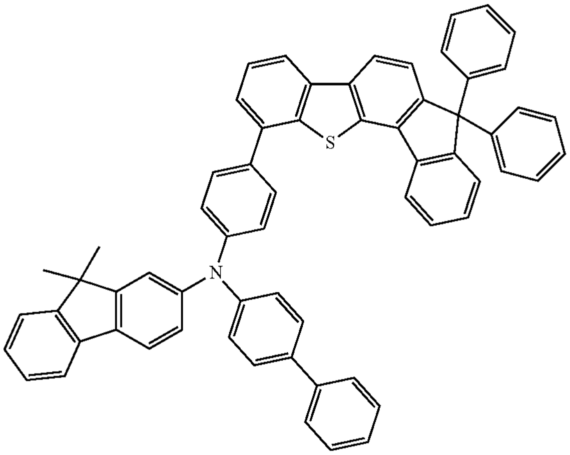

-continued
[2-35]
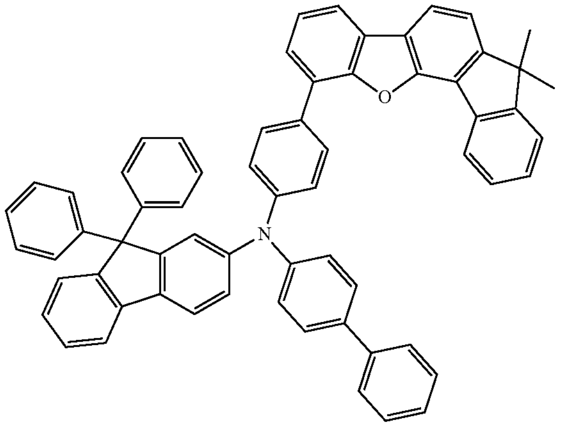
[2-36]
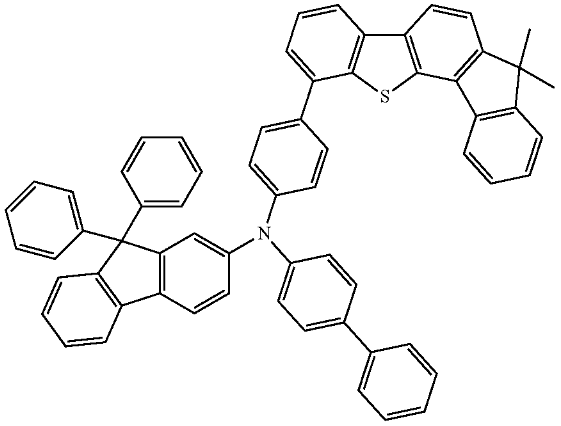
[2-37]
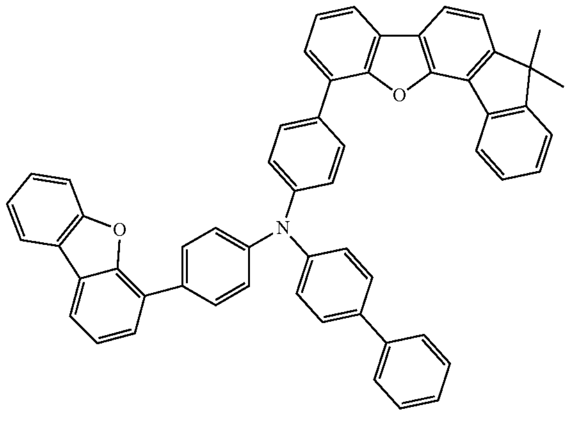
-continued
[2-38]
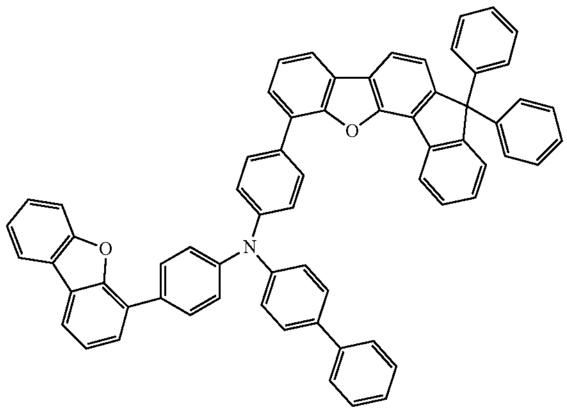
[2-39]
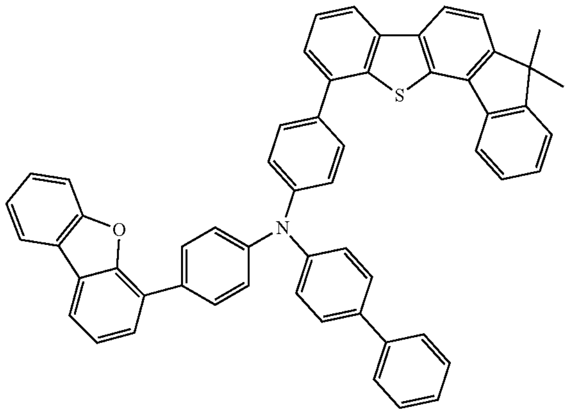
[2-38]
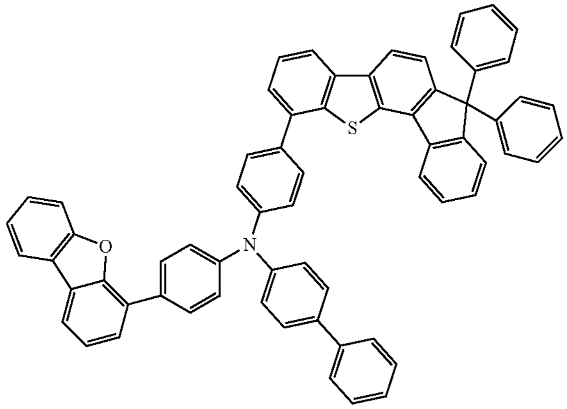

-continued
[2-39]
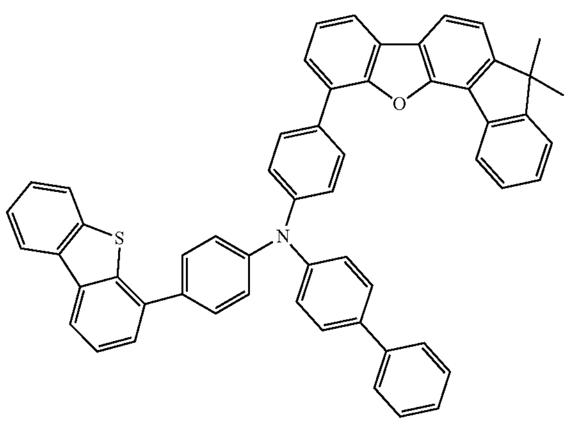
[2-40]
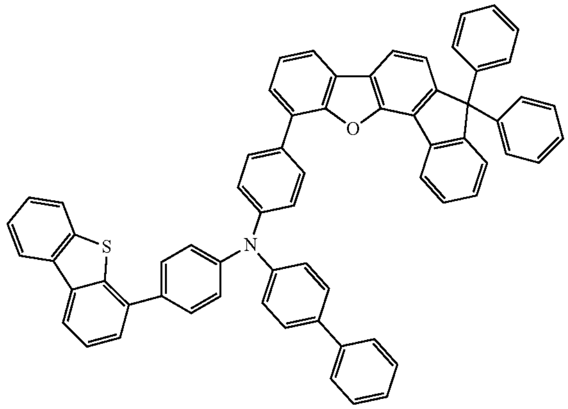
[2-41]
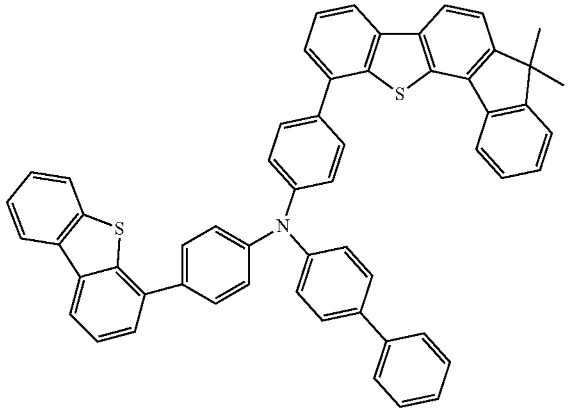
-continued
[2-44]
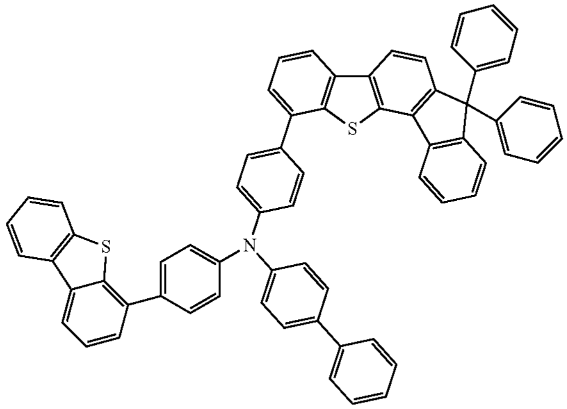
[2-45]
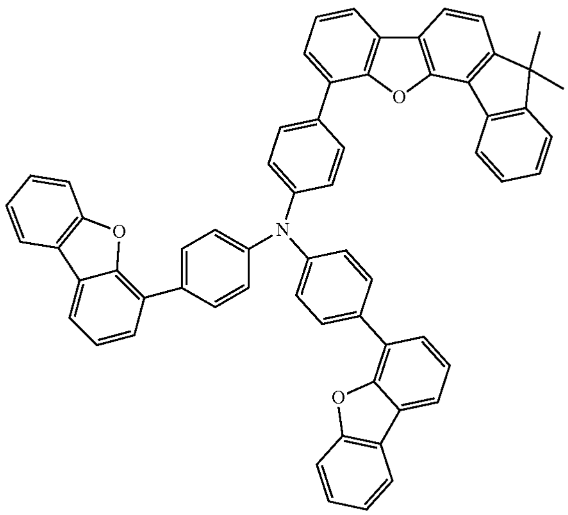
[2-46]
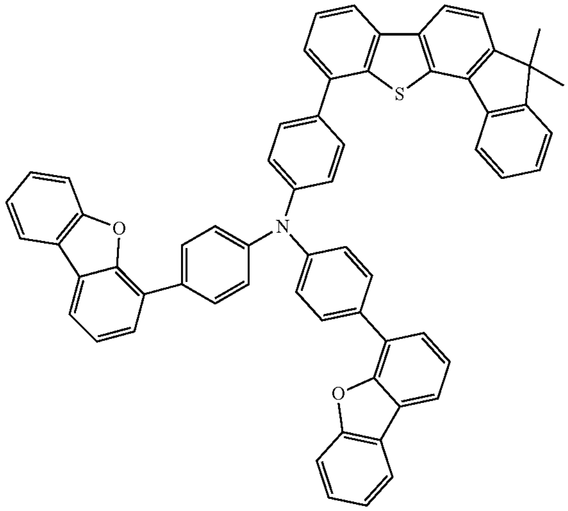

-continued
[2-47]
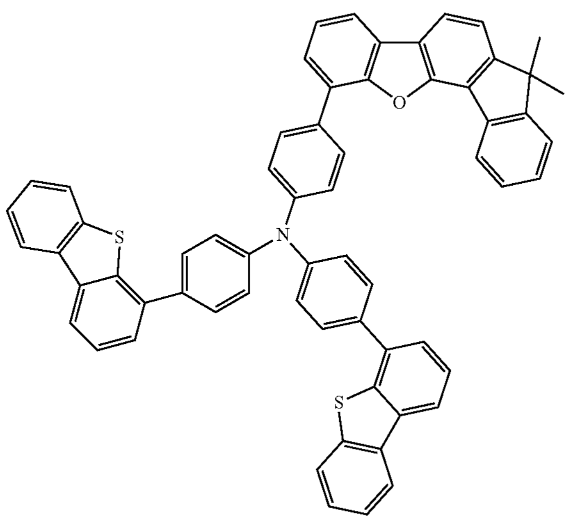
[2-48]
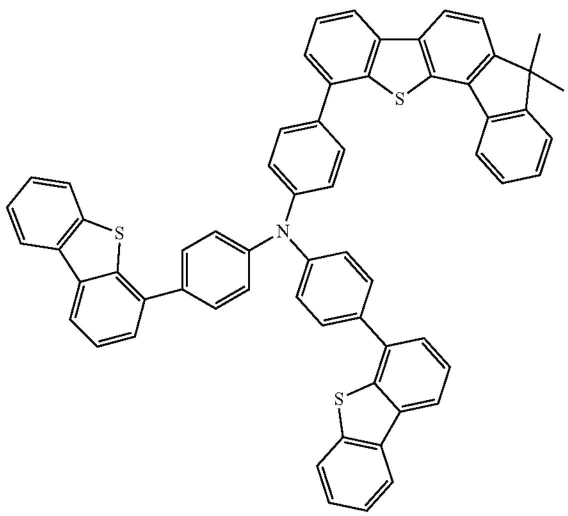
[2-49]
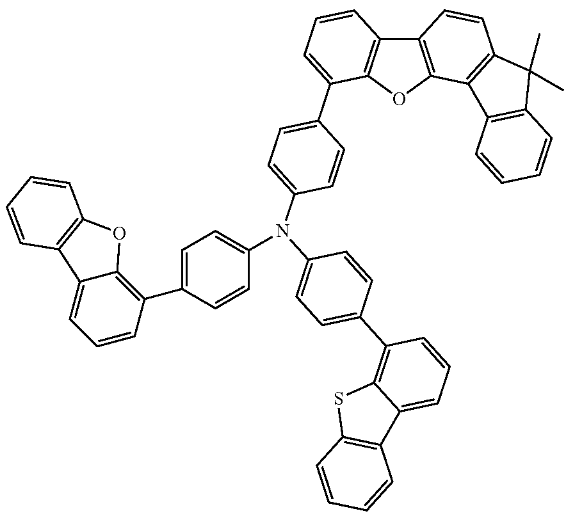
-continued
[2-50]
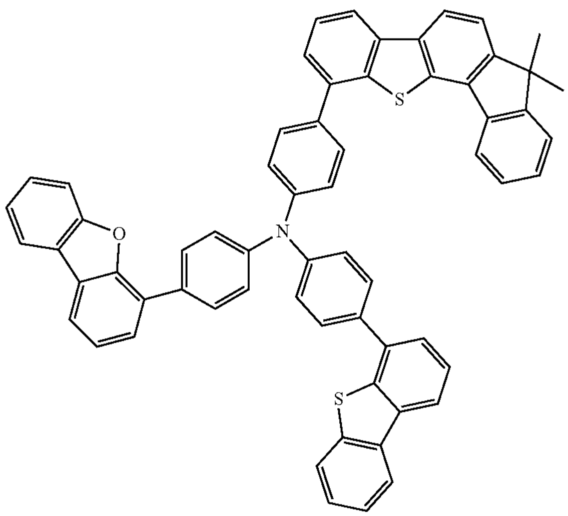
[2-51]
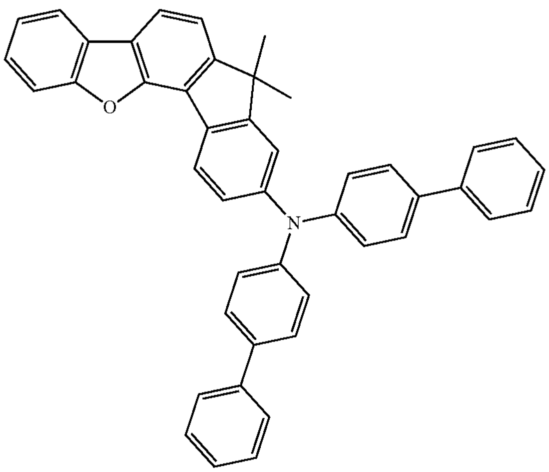
[2-52]
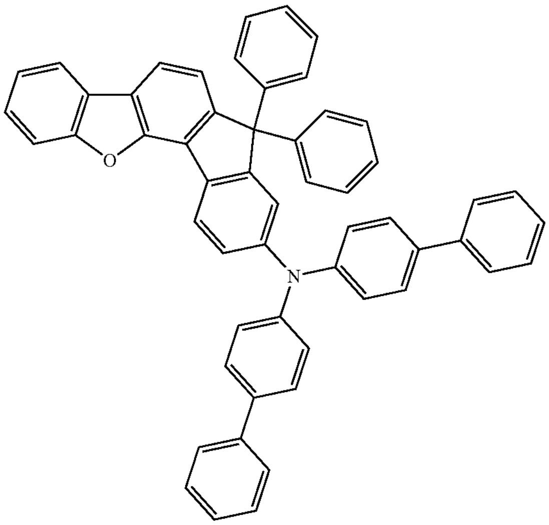

-continued
[2-53]
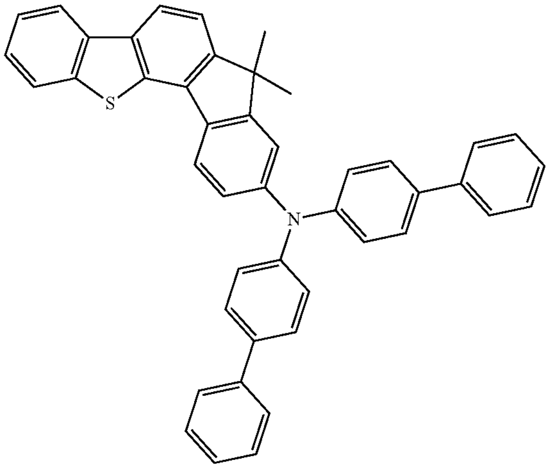
[2-54]
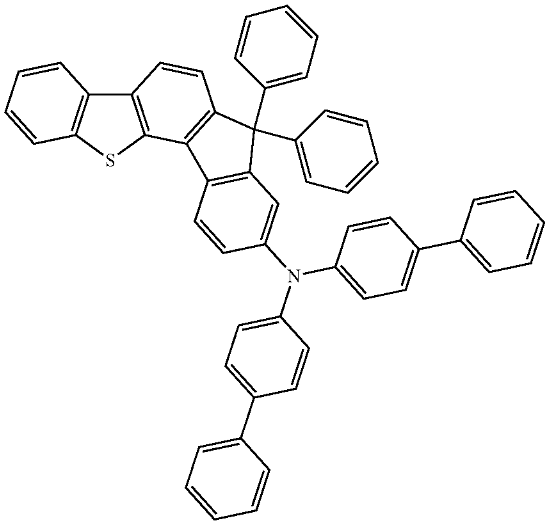
[2-55]
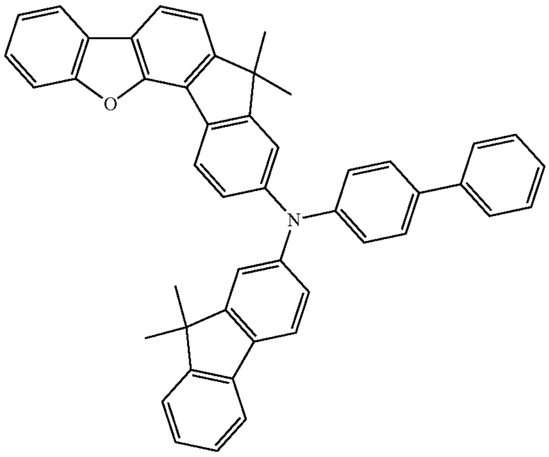
-continued
[2-56]
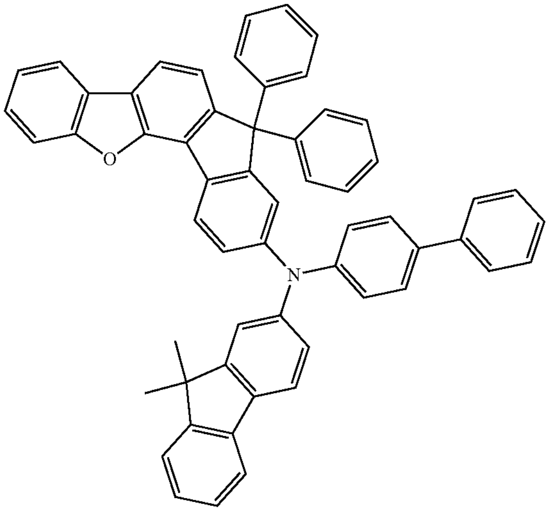
[2-57]
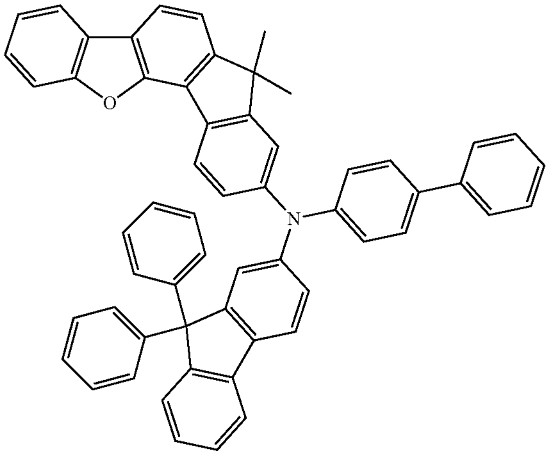
[2-58]
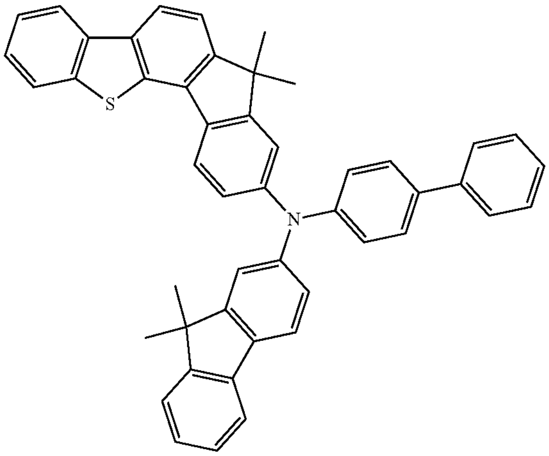

-continued
[2-59]
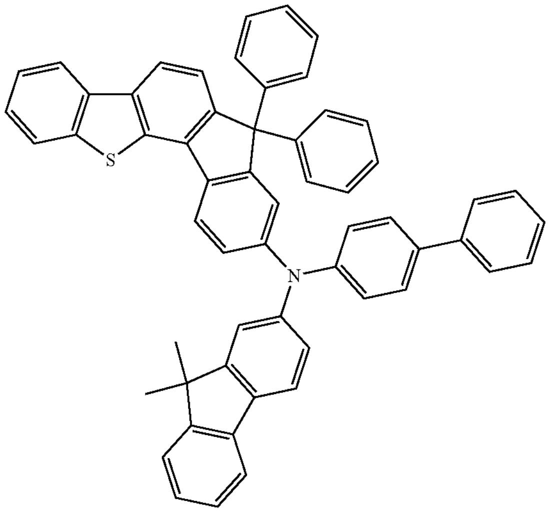
[2-60]
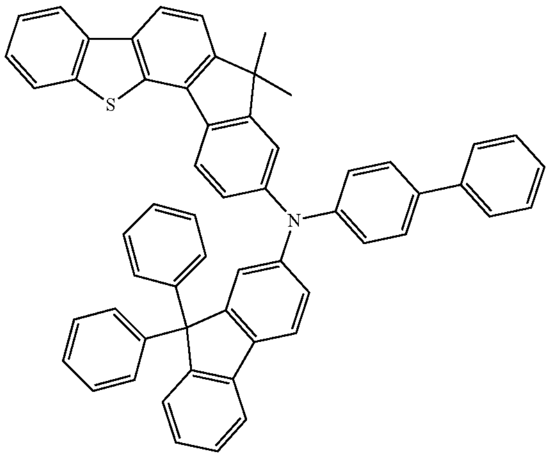
[2-61]
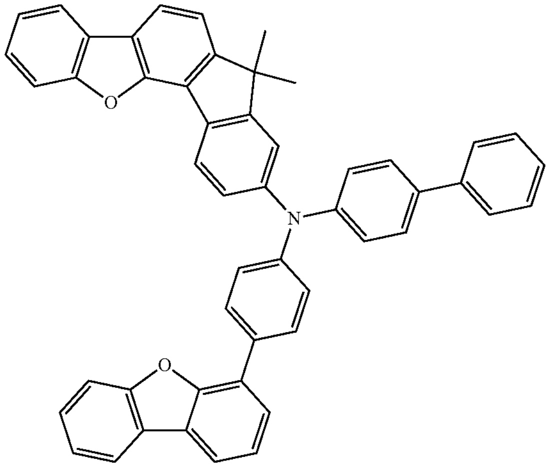
-continued
[2-62]
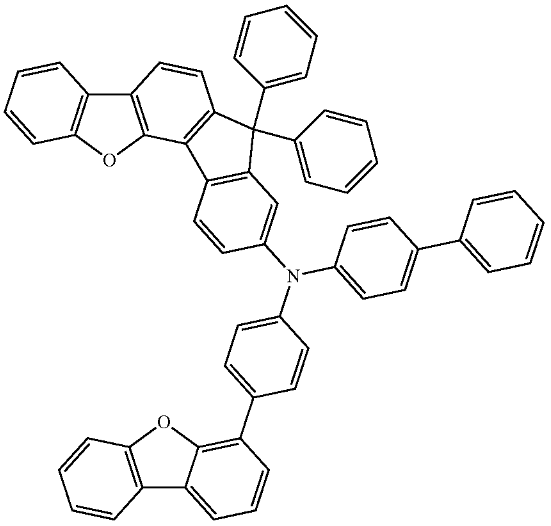
[2-63]
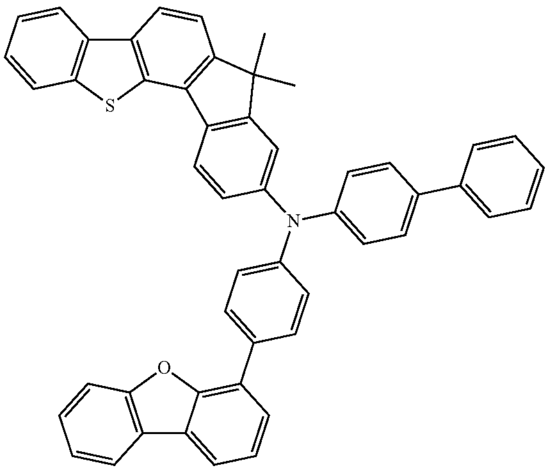
[2-64]
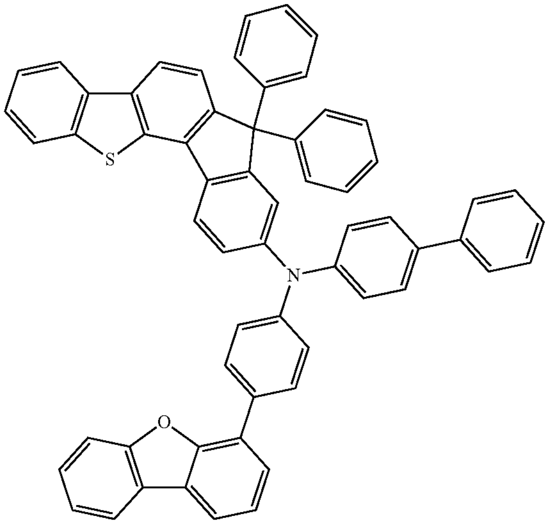

-continued
[2-65]
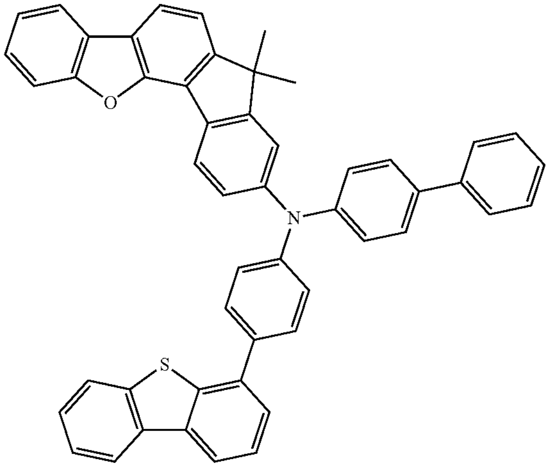
[2-66]
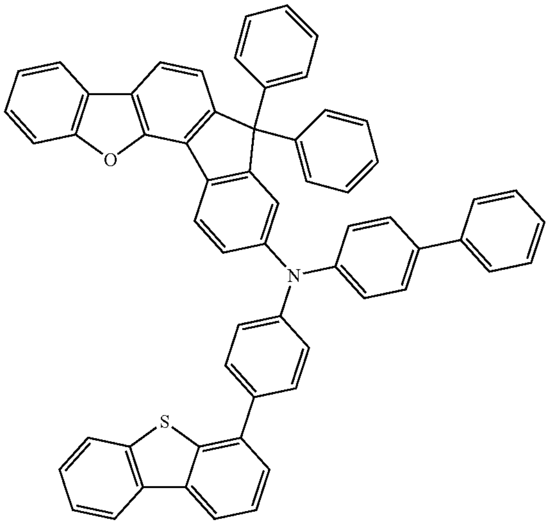
[2-67]
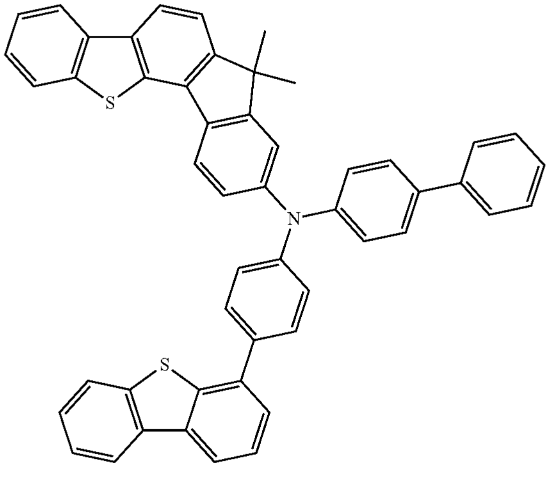
-continued
[2-68]
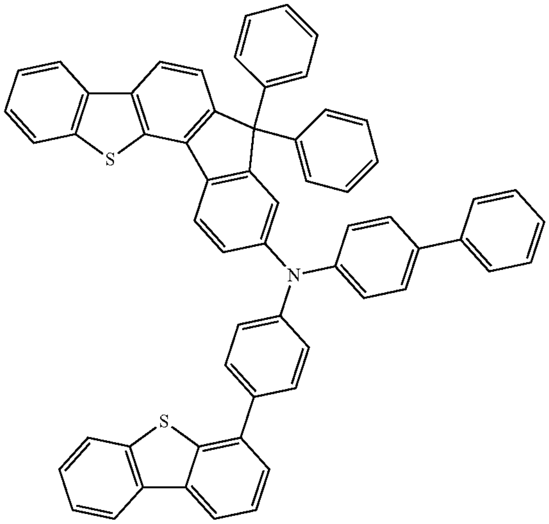
[2-69]
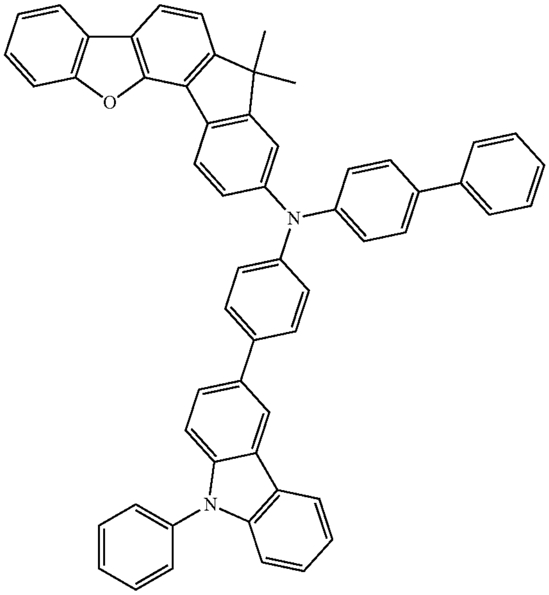

-continued
[2-70]
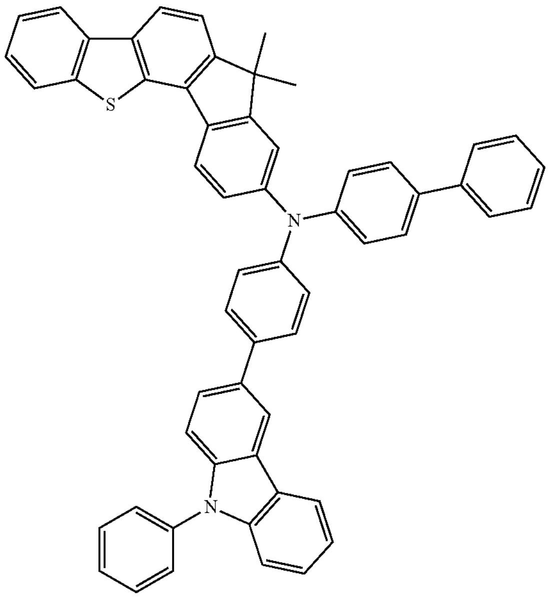
[2-71]
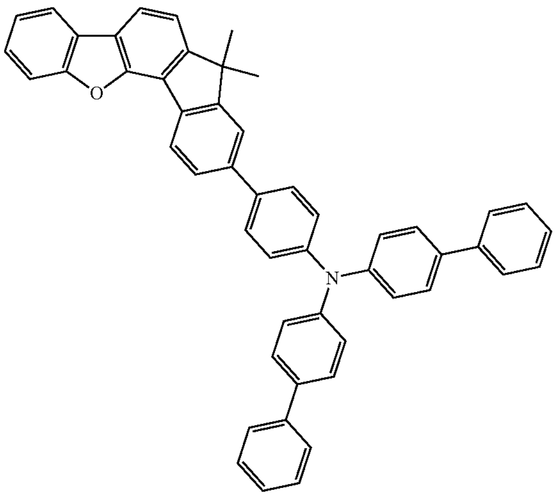
[2-72]
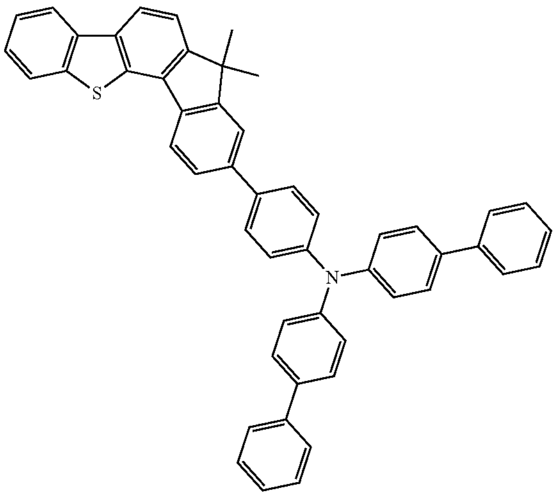
-continued
[2-73]
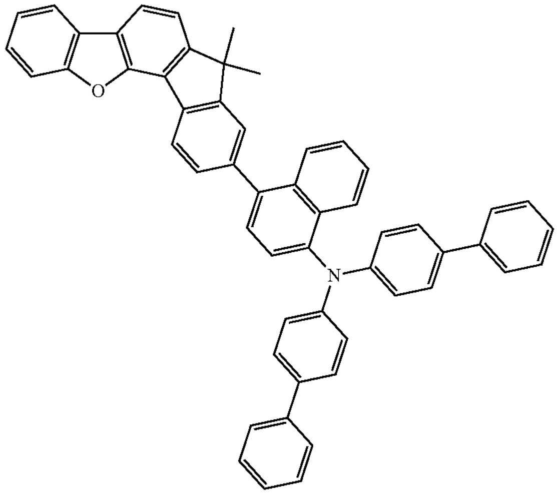
[2-74]
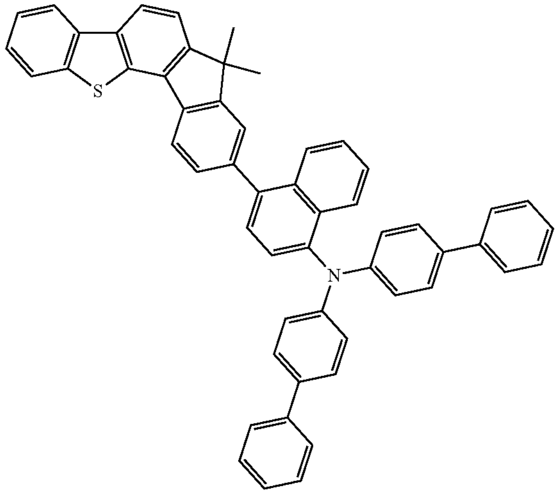
[2-75]
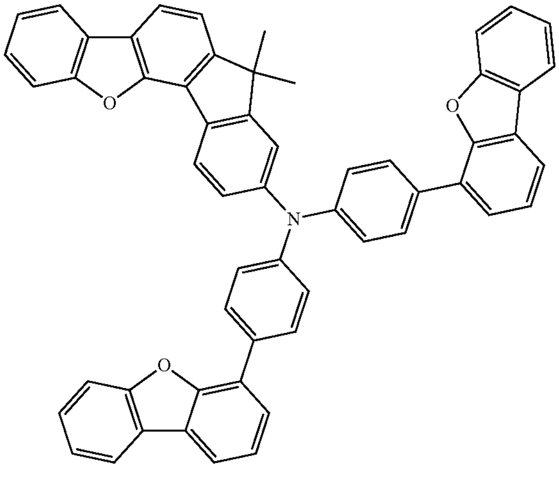

-continued
[2-76]
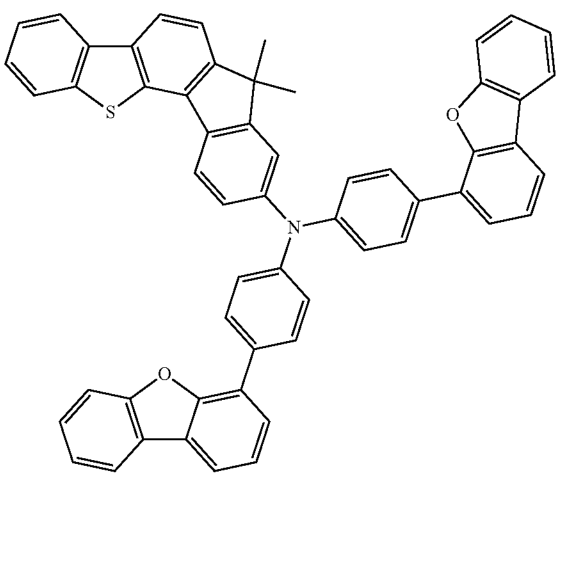
[2-77]
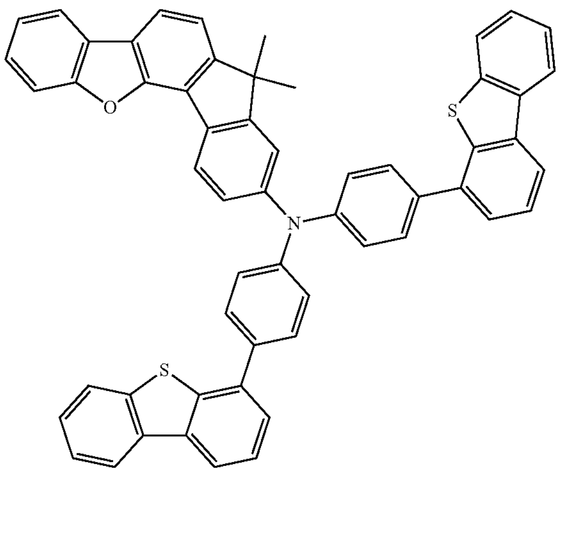
[2-78]
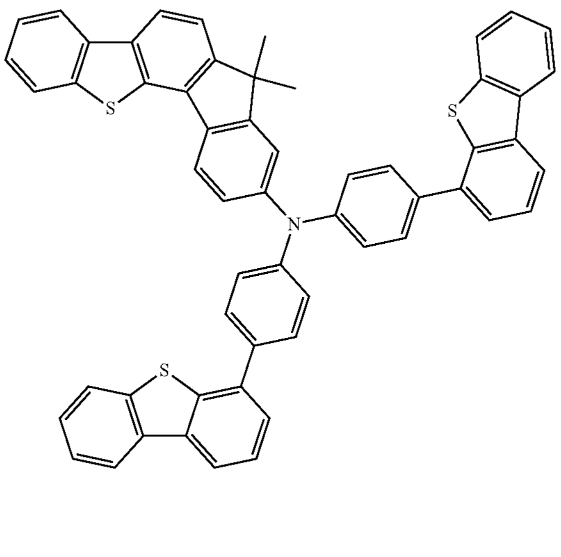
-continued
[2-79]
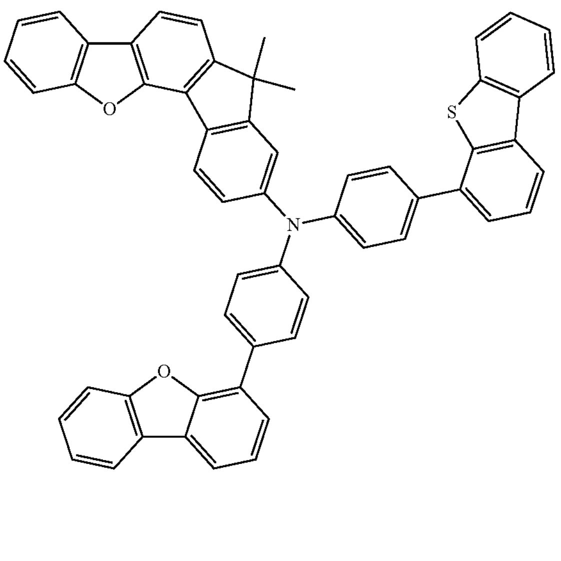
[2-80]
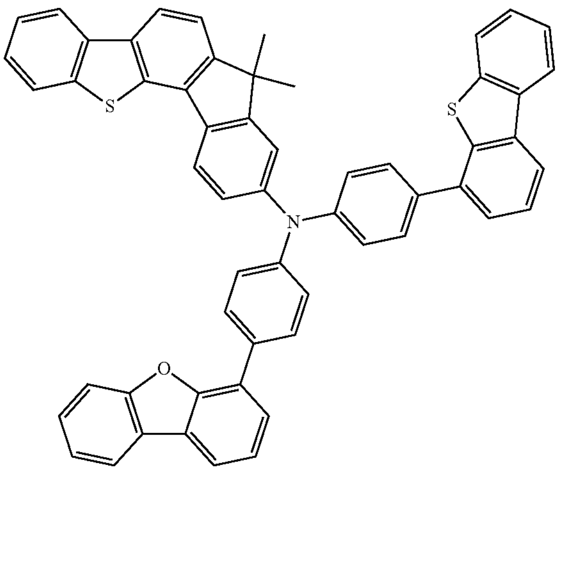
[2-81]
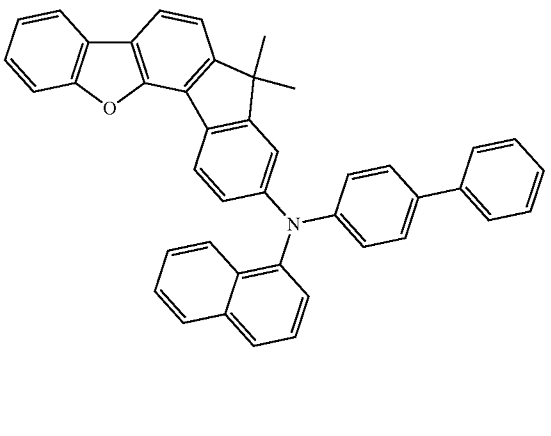

[2-82]
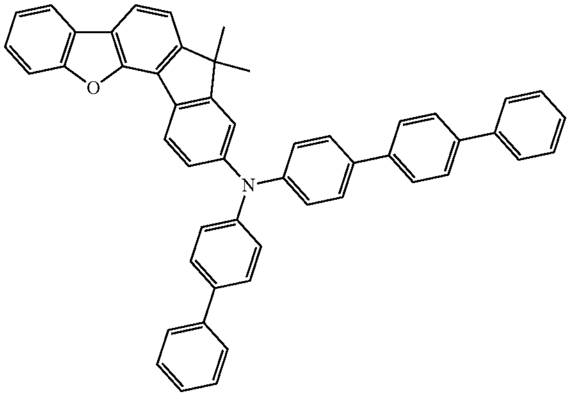
[2-83]
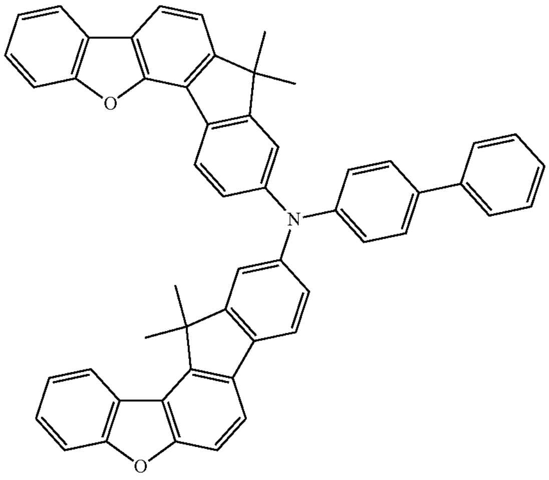
[2-84]
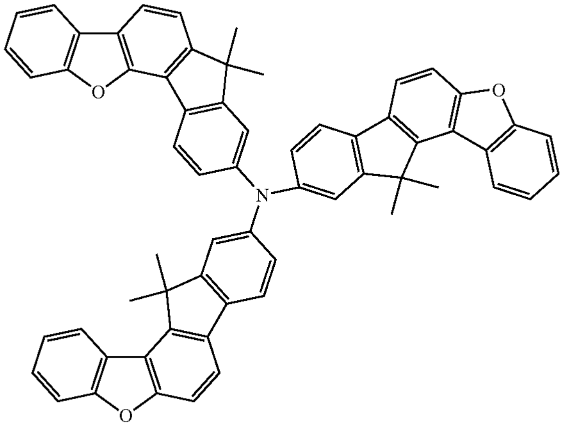
[2-85]
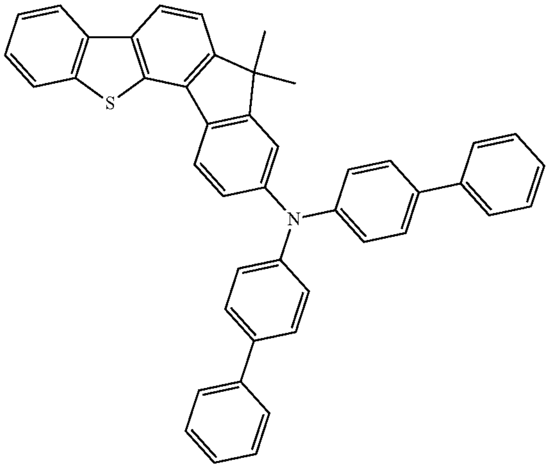
[2-86]
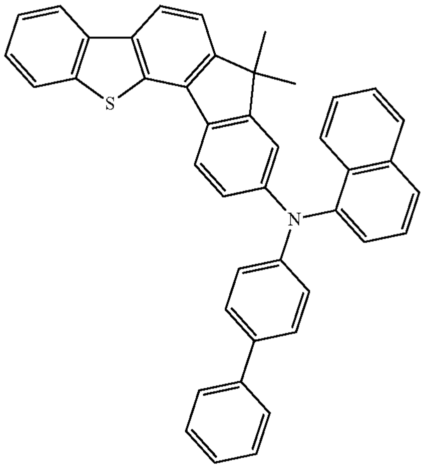
[2-87]
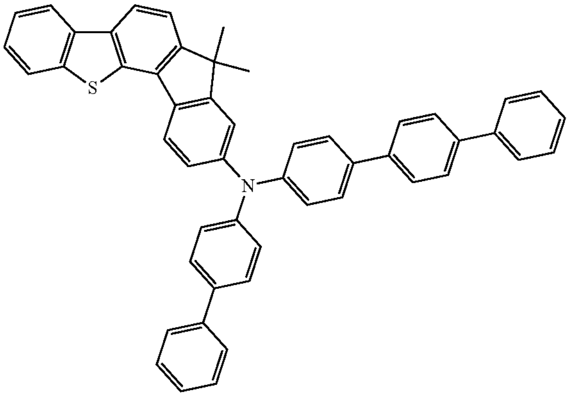

-continued
[2-88]
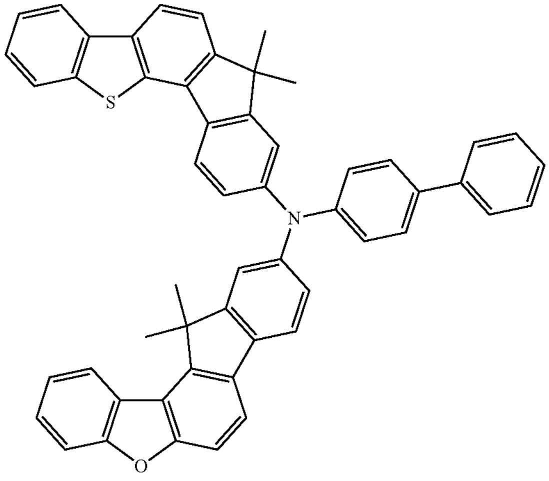
[2-89]
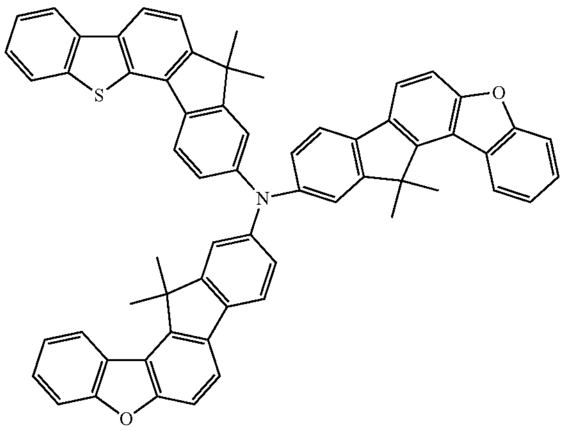
[2-90]
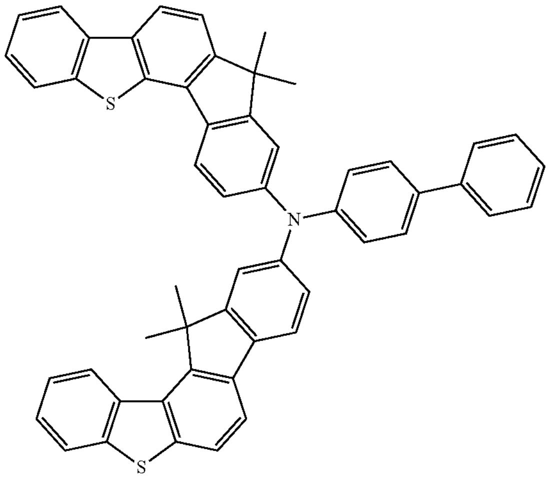
-continued
[2-91]
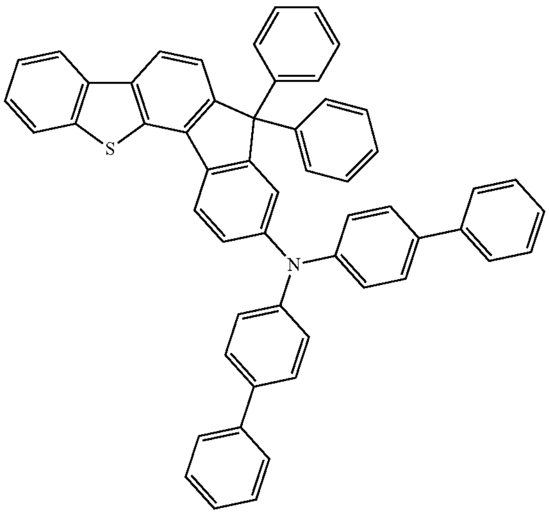
[2-92]
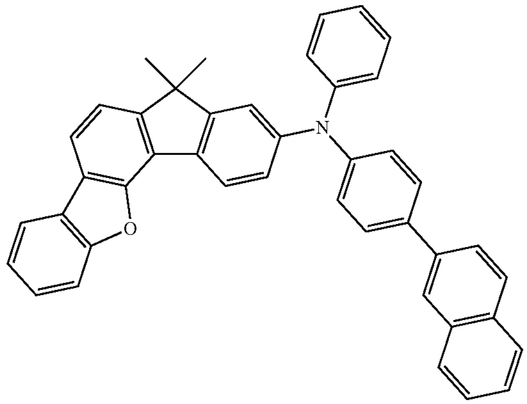
[2-93]
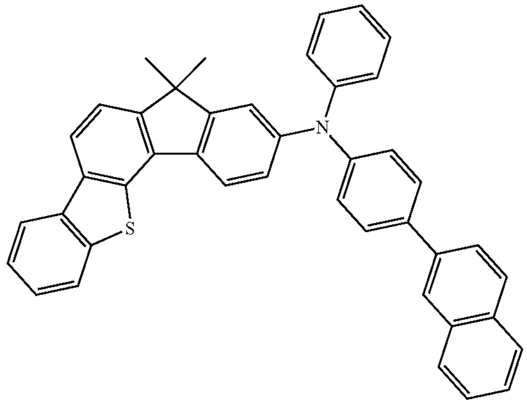

-continued
[2-94]
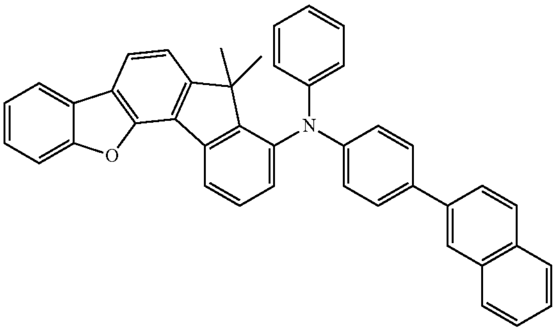
[2-95]
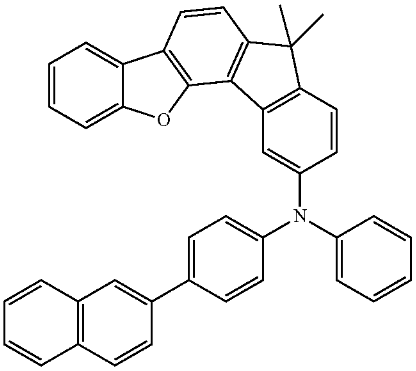
[2-96]
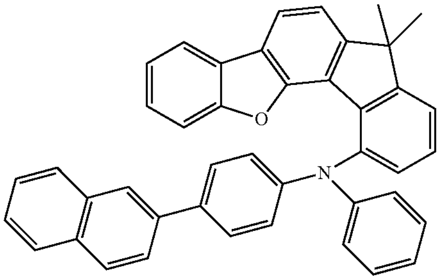
[2-97]
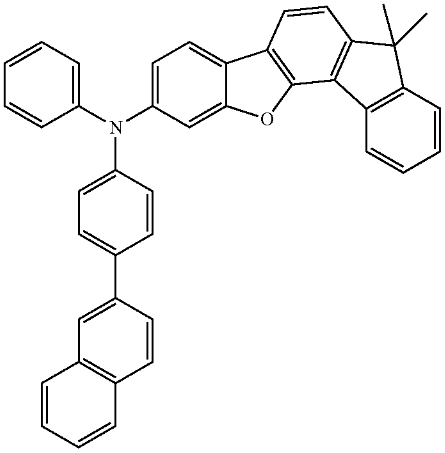
-continued
[2-98]
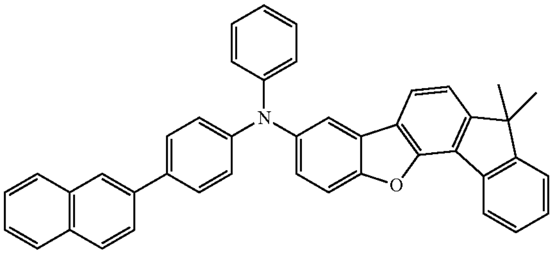
[2-99]
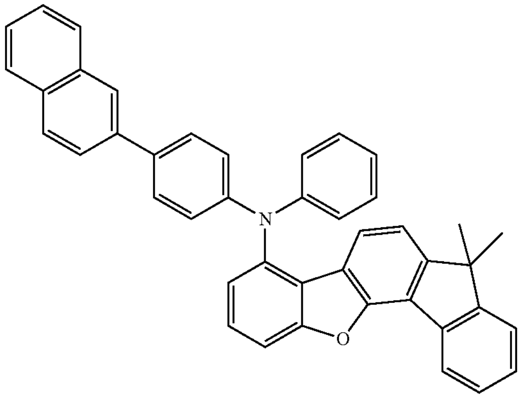
[2-100]
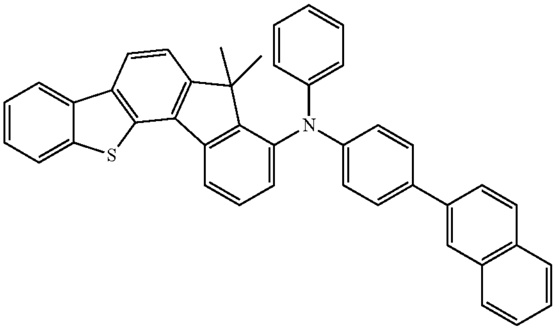
[2-101]
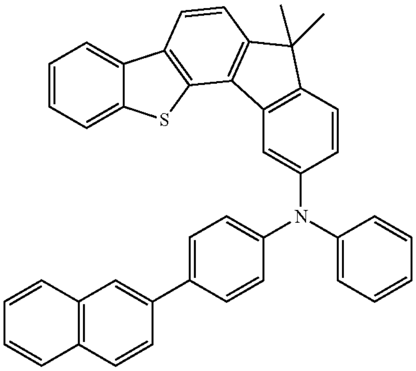

-continued
[2-102]
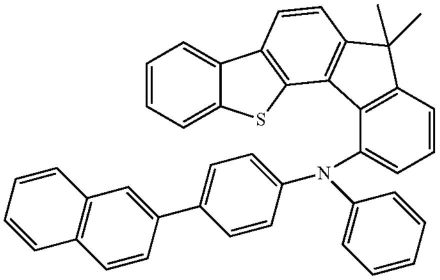
[2-103]
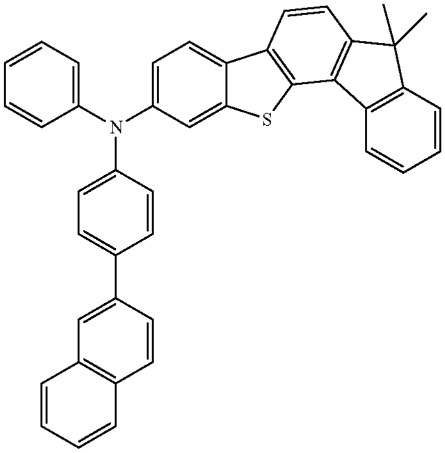
[2-104]
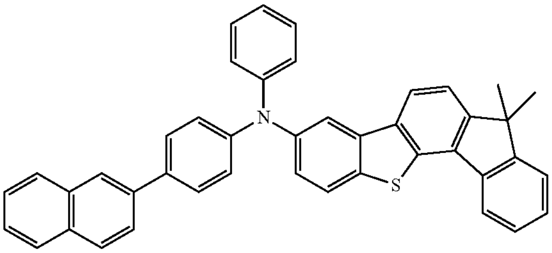
[2-105]
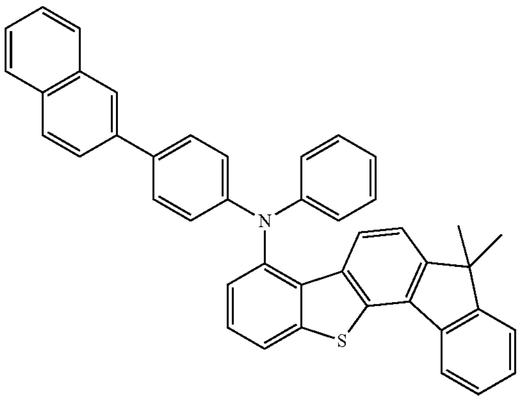
-continued
[2-106]
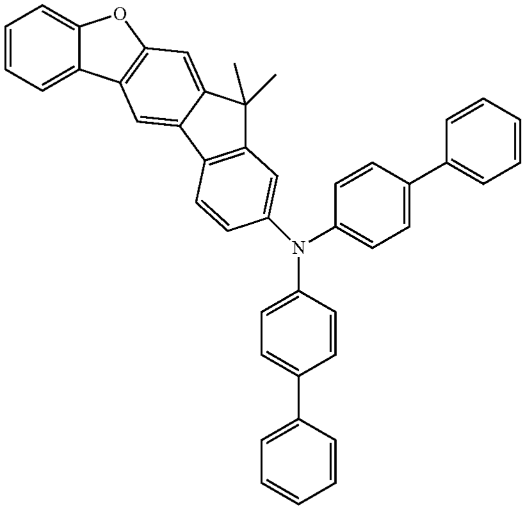
[2-107]
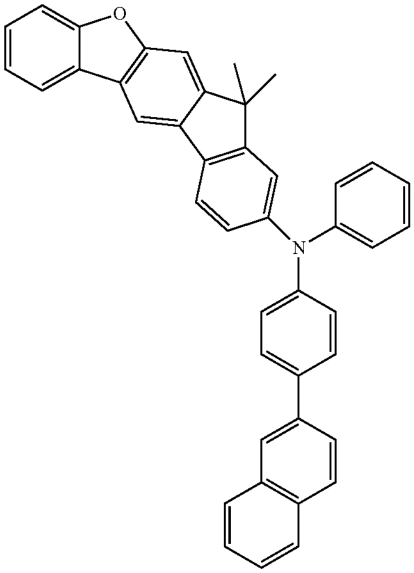
[2-108]
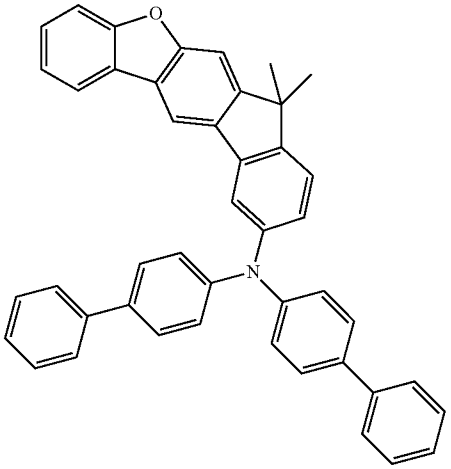

-continued
[2-109]
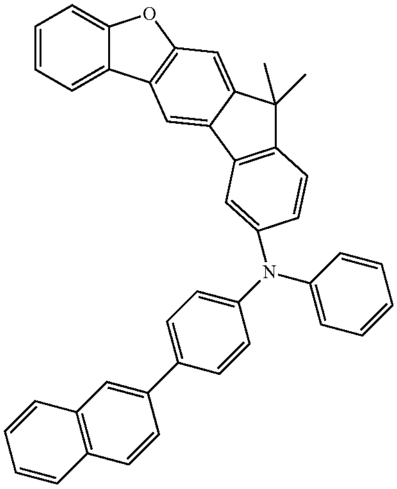
[2-110]
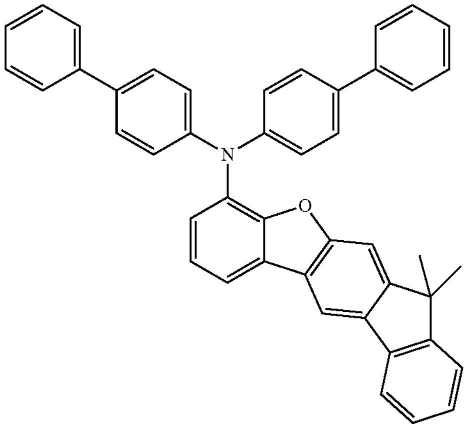
[2-111]
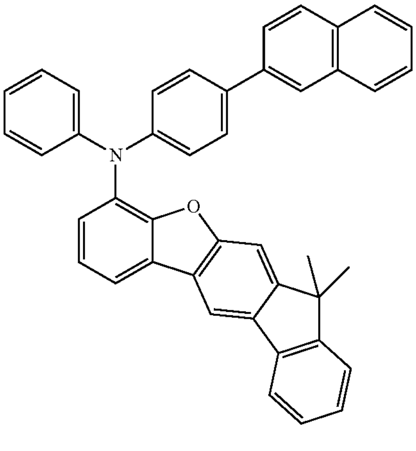
-continued
[2-112]
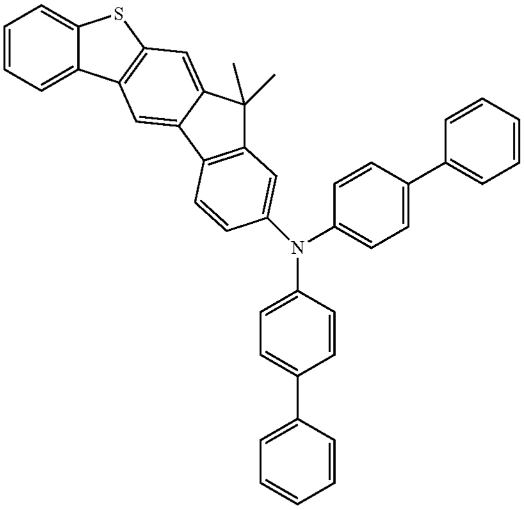
[2-113]
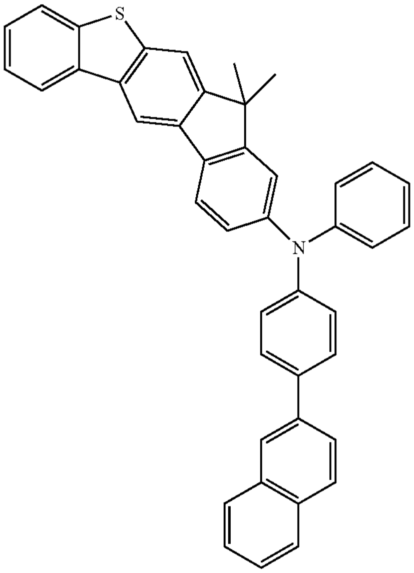
[2-114]
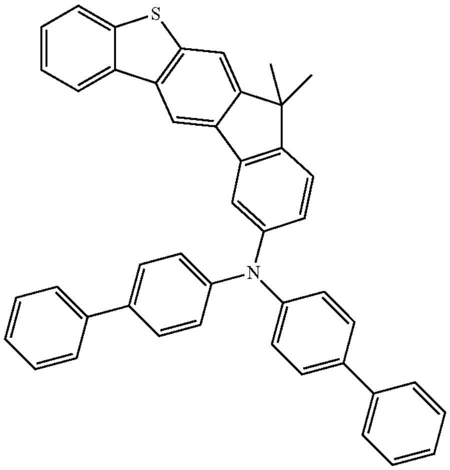

-continued
[2-115]
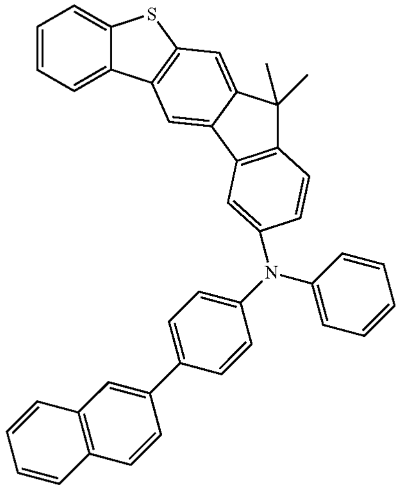
[2-116]
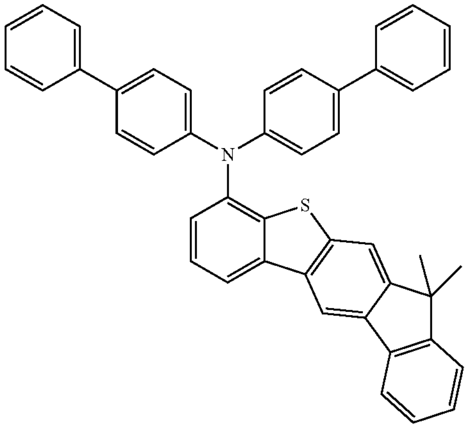
[2-117]
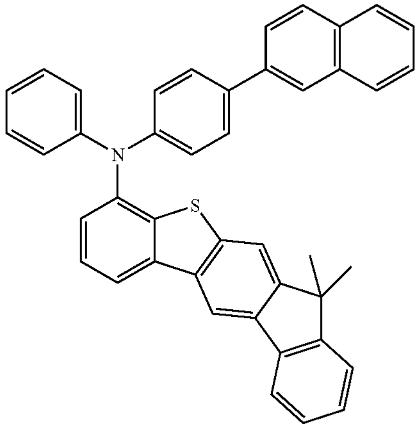
-continued
[2-118]
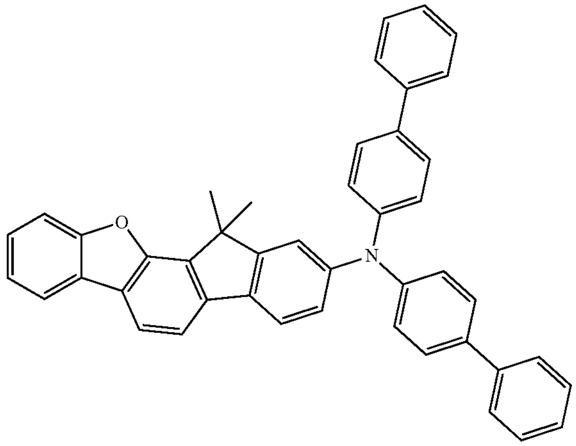
[2-119]
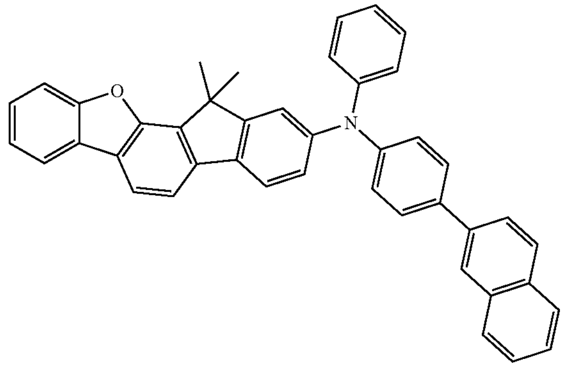
[2-120]
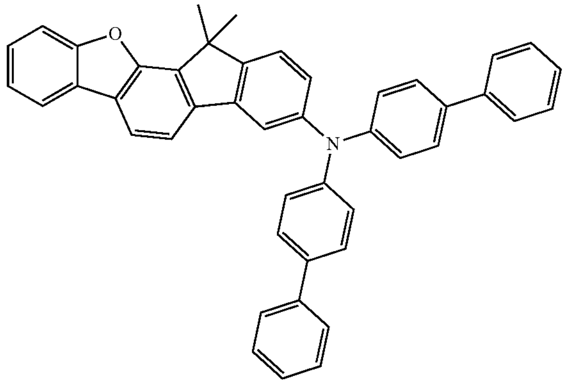

[2-121]
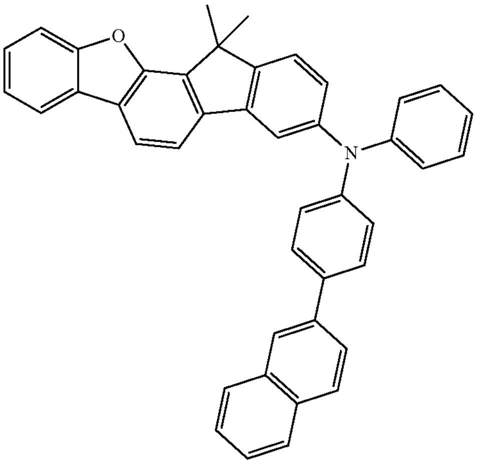
[2-122]
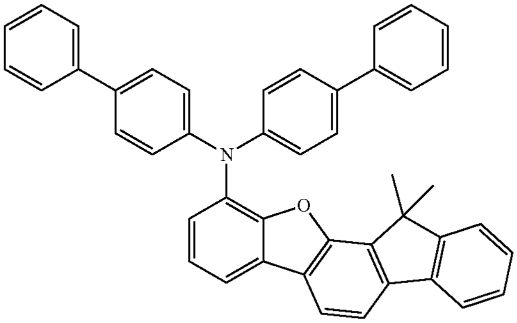
[2-223]
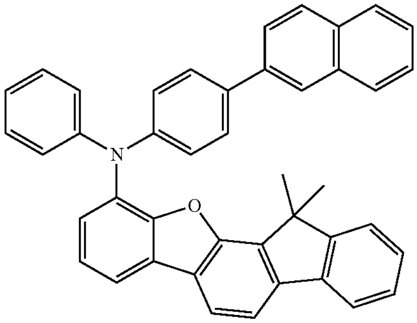
[2-124]
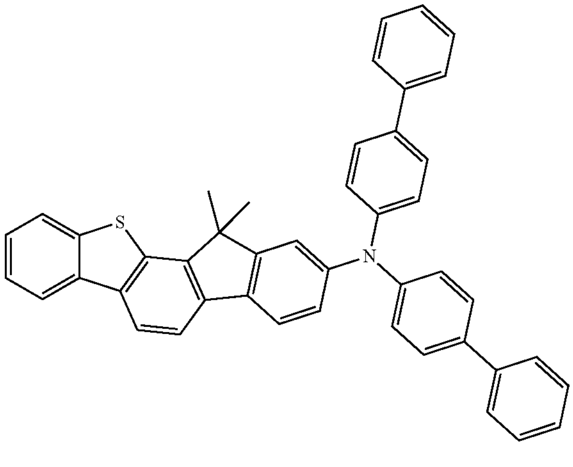
[2-125]
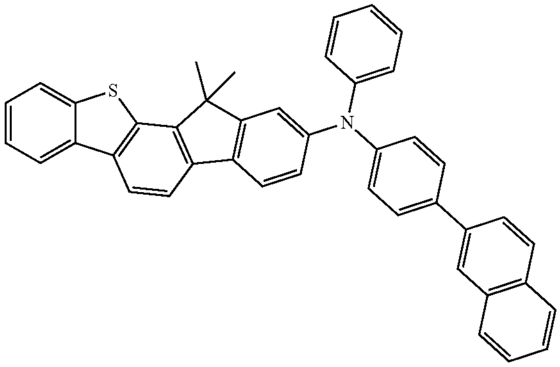
[2-126]
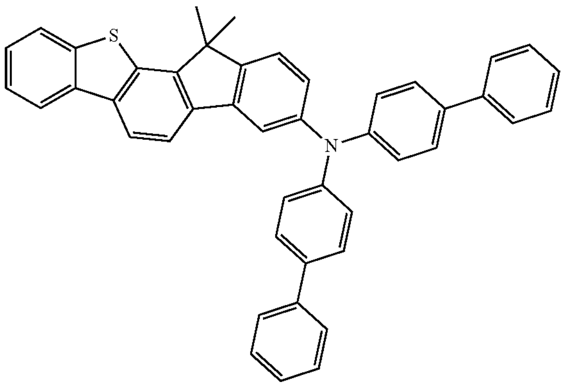
[2-127]
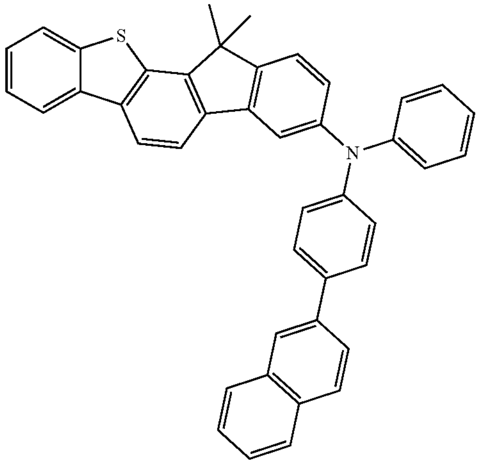
[2-128]
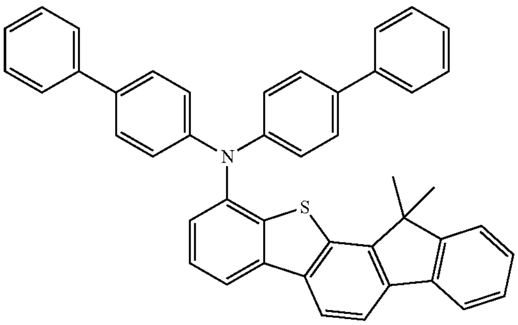

-continued
[2-129]
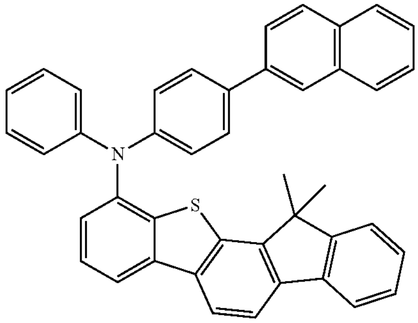
[2-130]
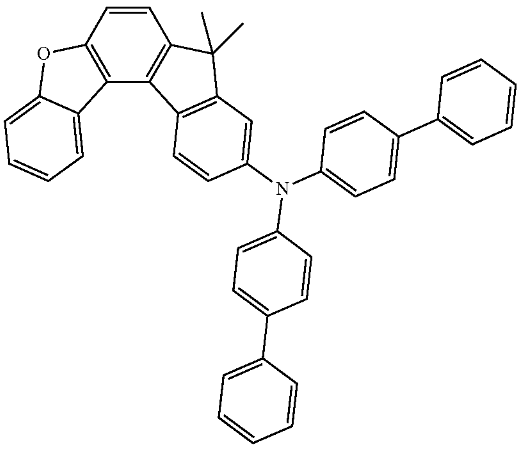
[2-131]
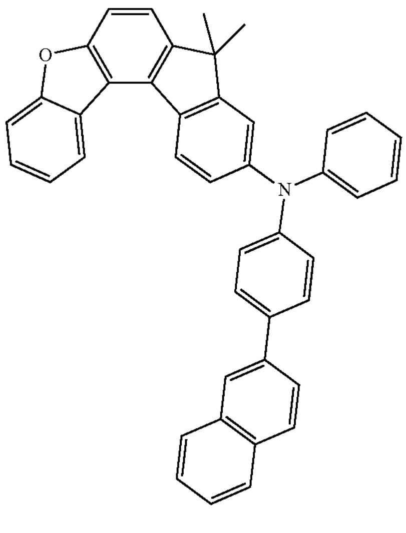
-continued
[2-132]
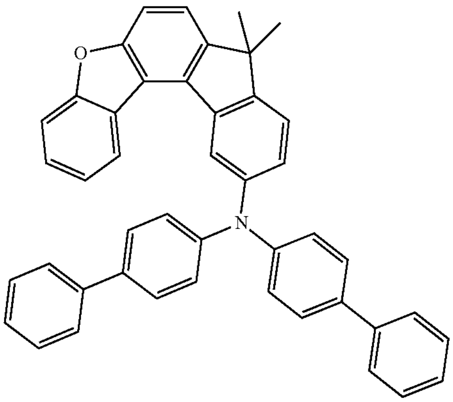
[2-133]
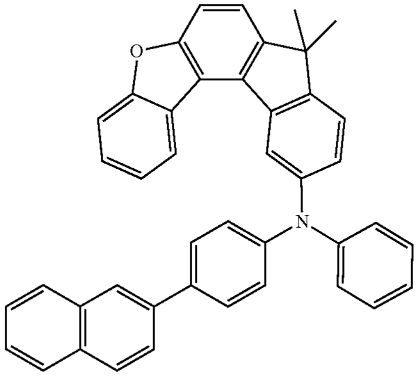
[2-134]
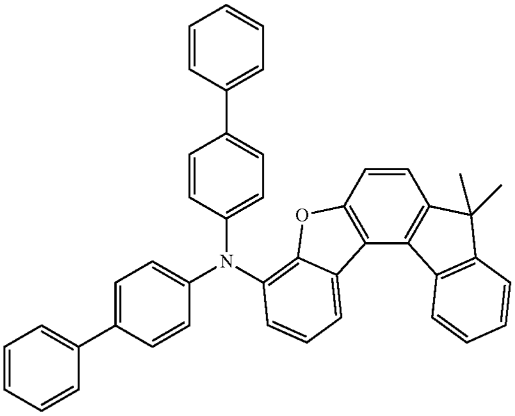
[2-135]
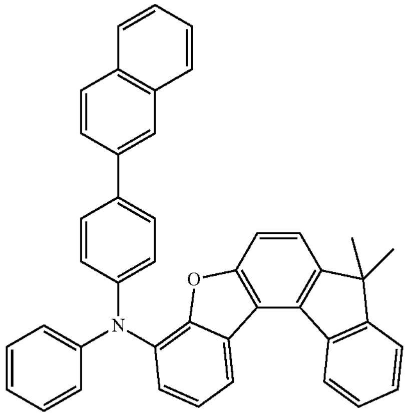

-continued
[2-136]
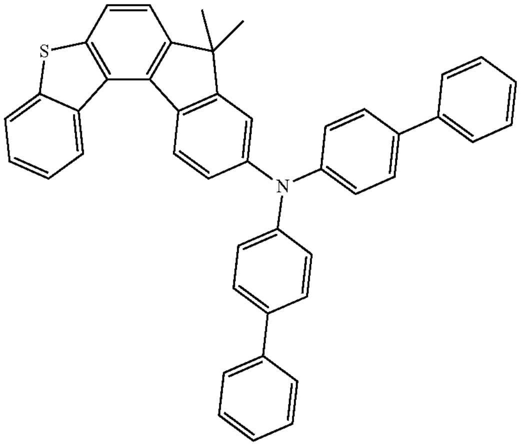
[2-137]
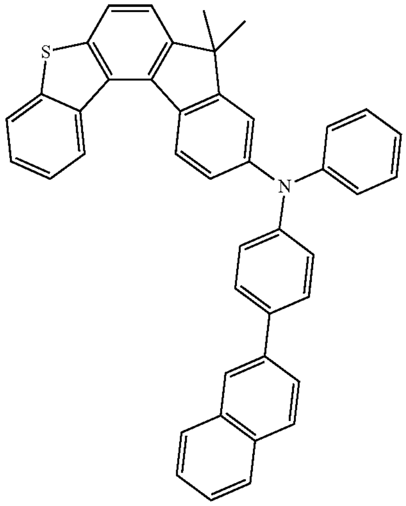
[2-138]
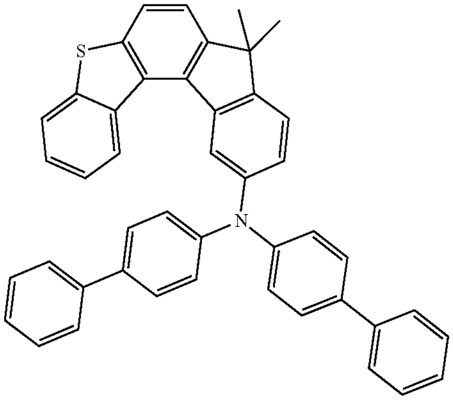
-continued
[2-139]
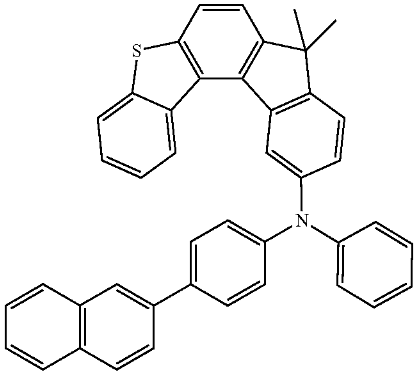
[2-140]
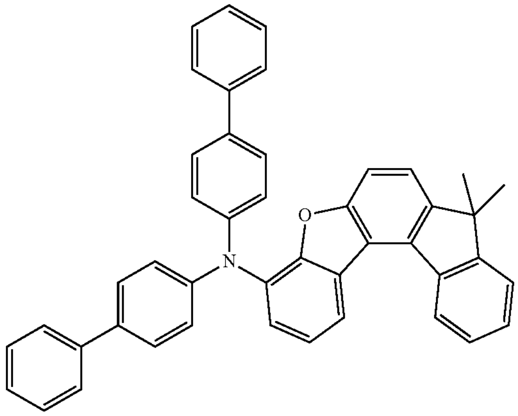
[2-141]
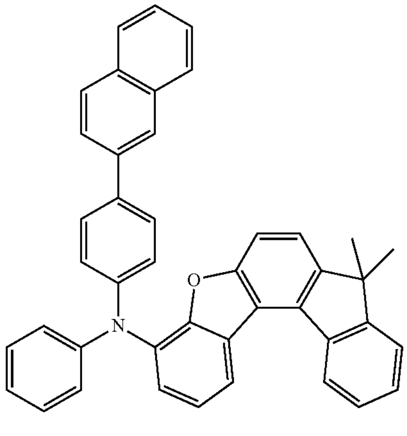

-continued
[2-142]
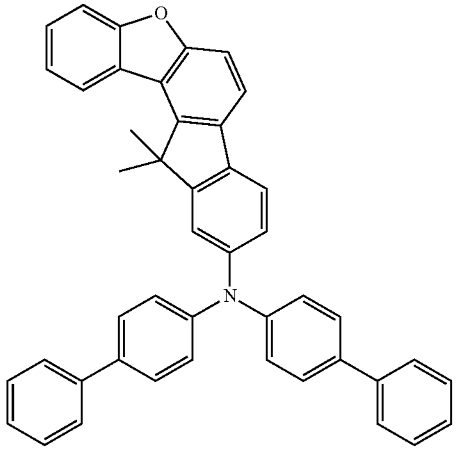
[2-144]
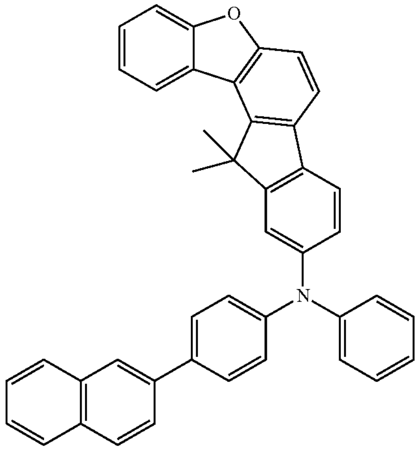
[2-145]
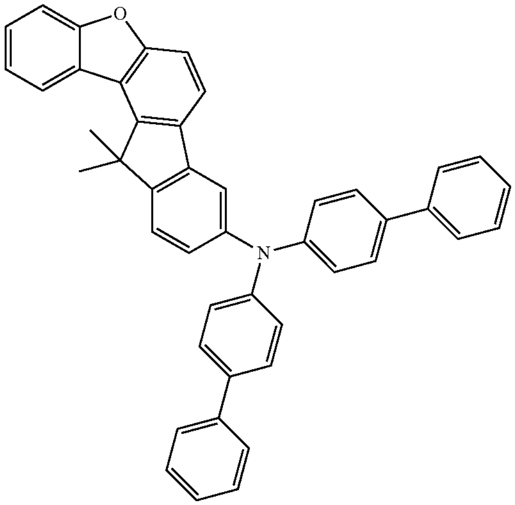
-continued
[2-146]
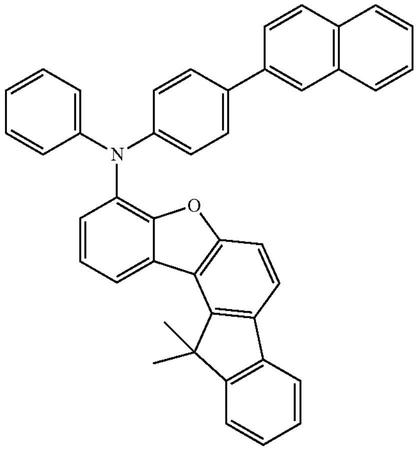
[2-147]
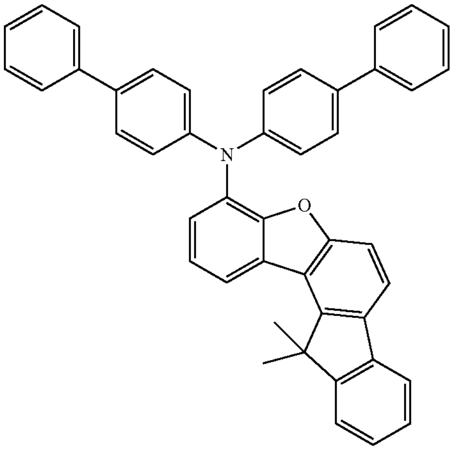
[2-148]
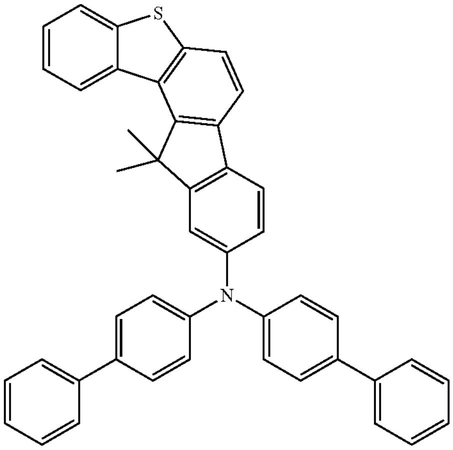

[2-149]
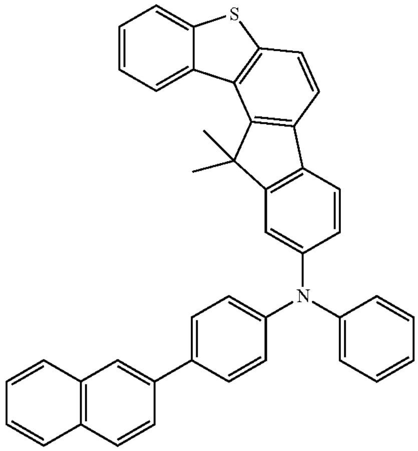
[2-150]
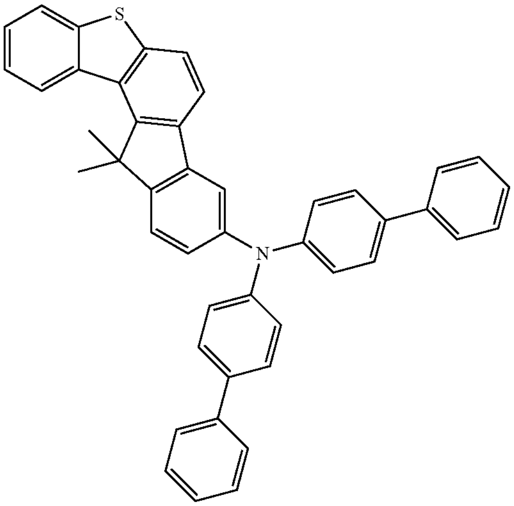
[2-151]
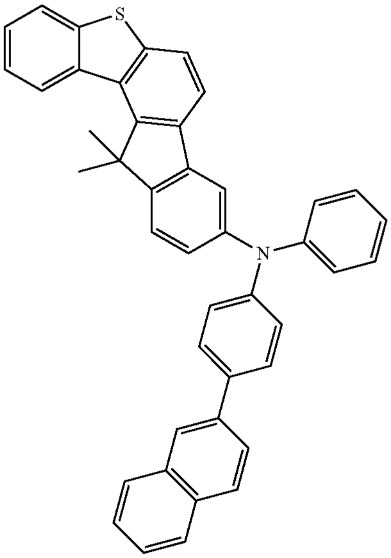
[2-152]
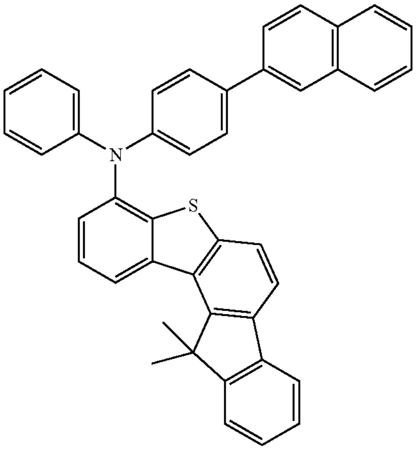
[2-153]
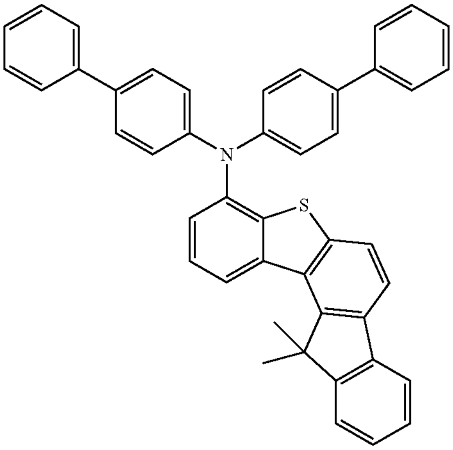
[2-154]
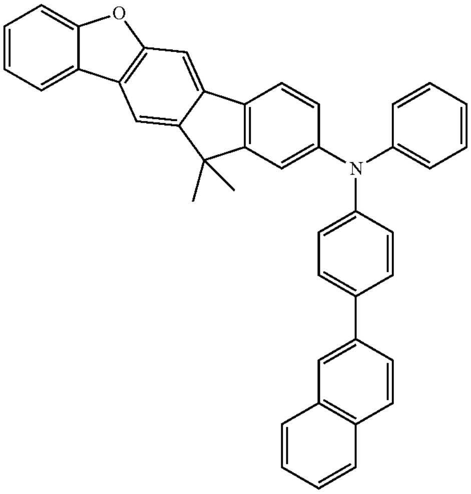

-continued
[2-155]
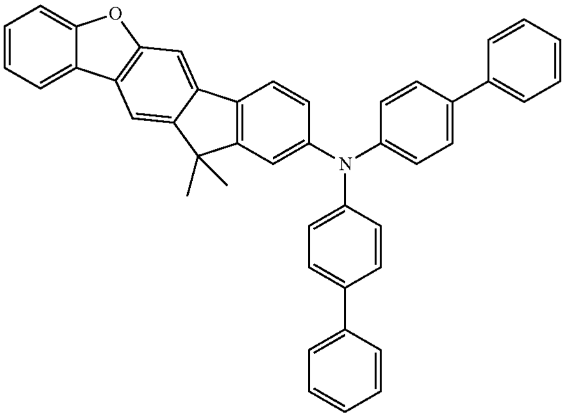
[2-156]
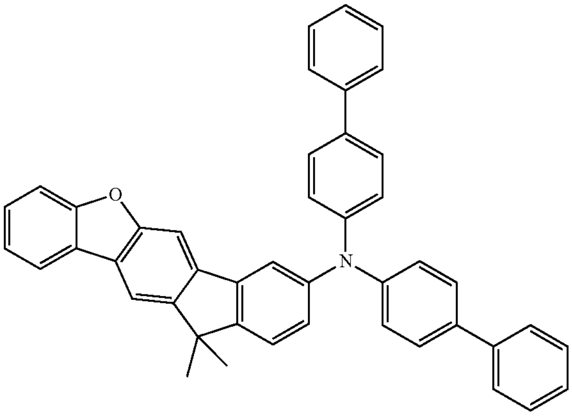
[2-157]
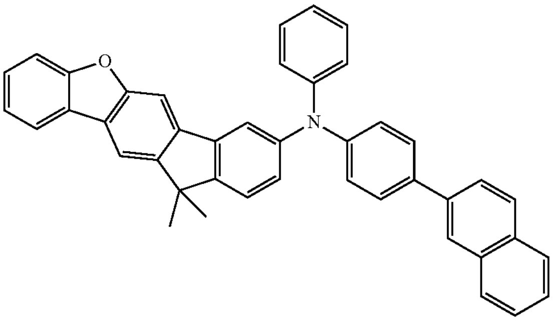
[2-158]
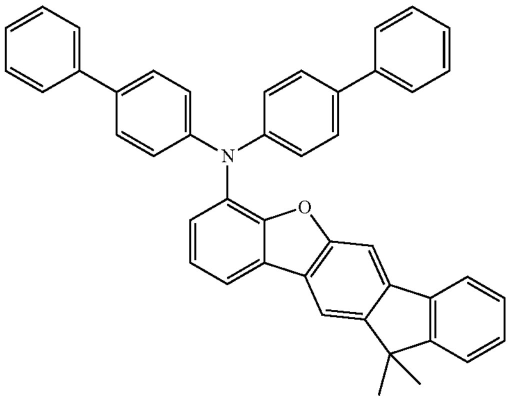
-continued
[2-159]
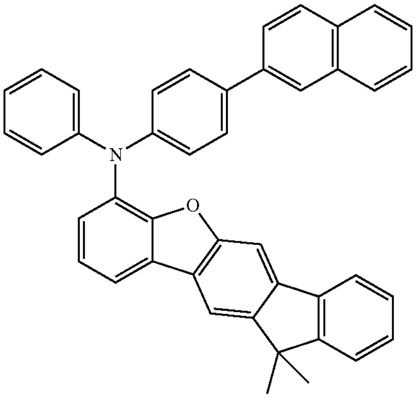
[2-160]
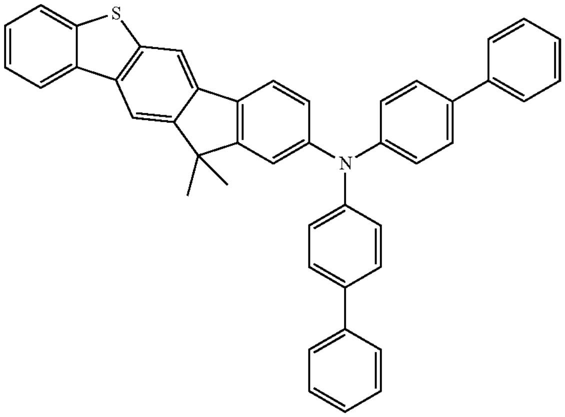
[2-161]
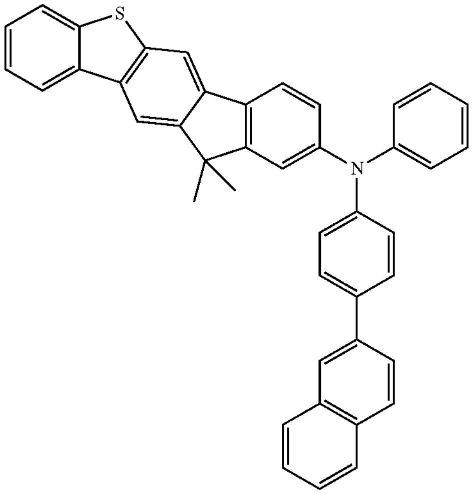

-continued
[2-162]
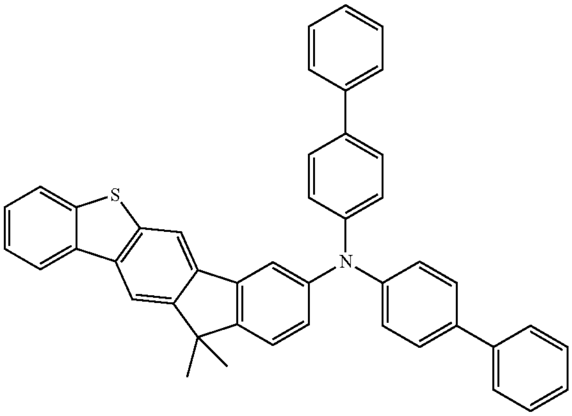
[2-163]
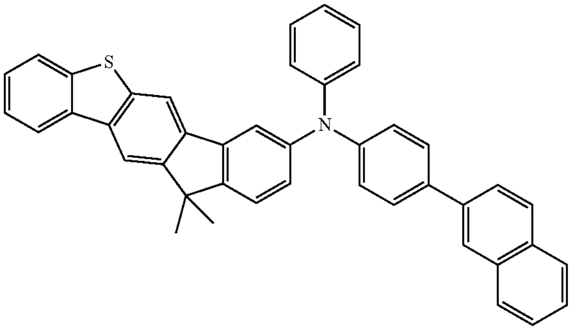
[2-164]
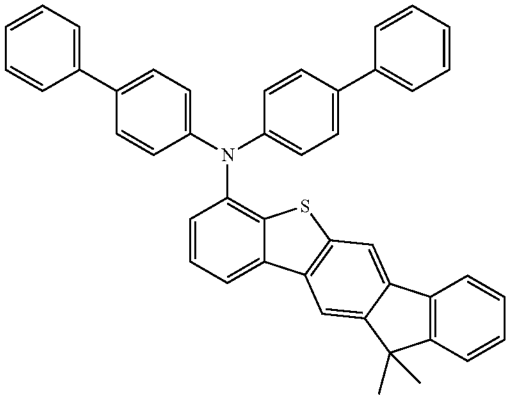
[2-165]
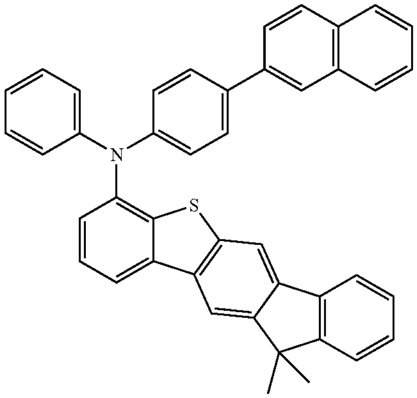
-continued
[2-166]
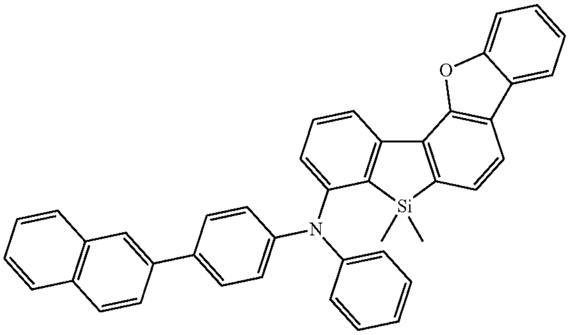
[2-167]
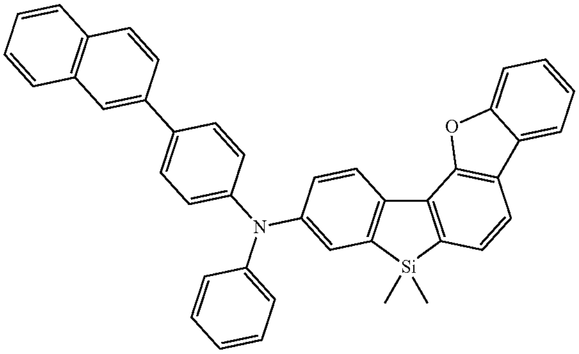
[2-168]
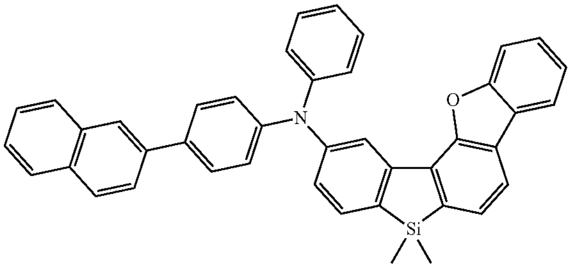
[2-169]
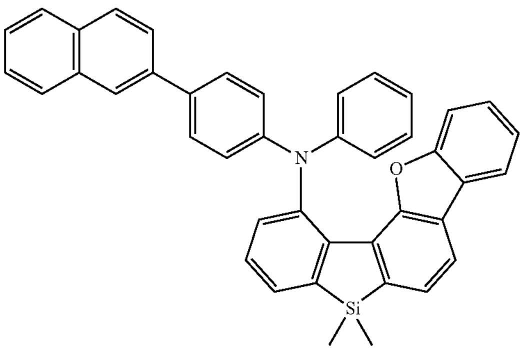

-continued
[2-170]
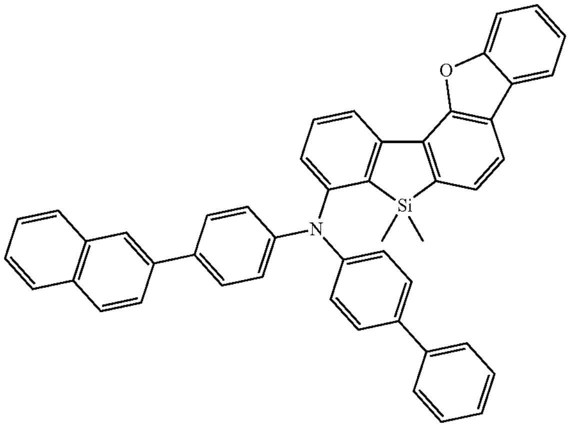
[2-171]
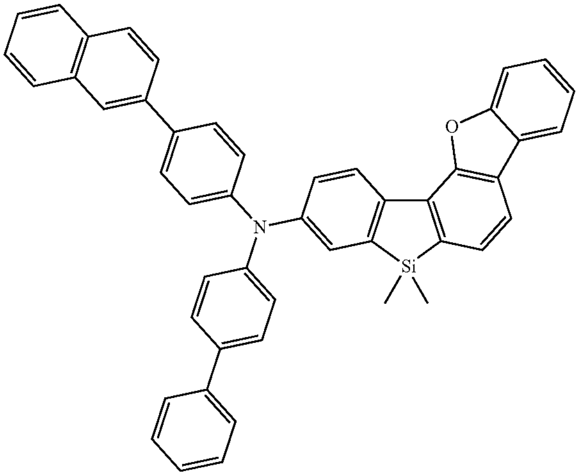
[2-172]
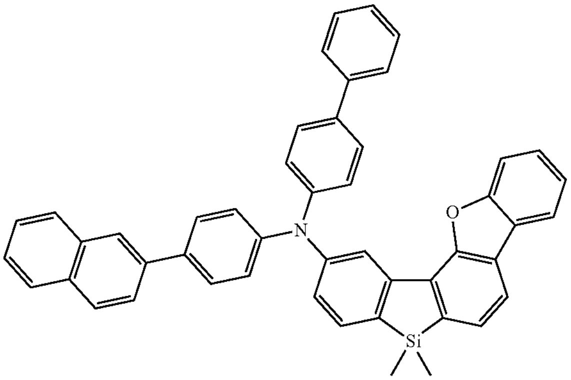
-continued
[2-173]
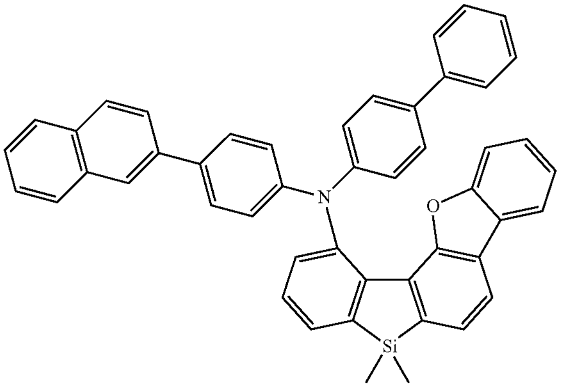
[2-174]
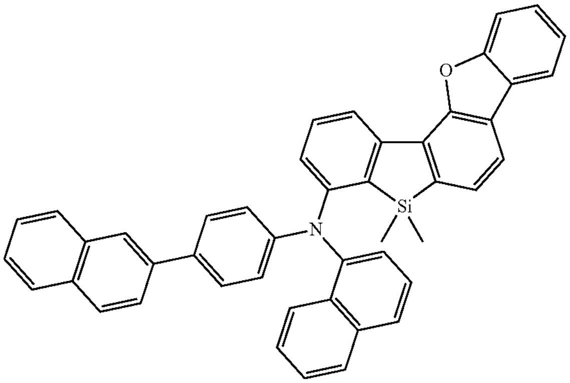
[2-175]
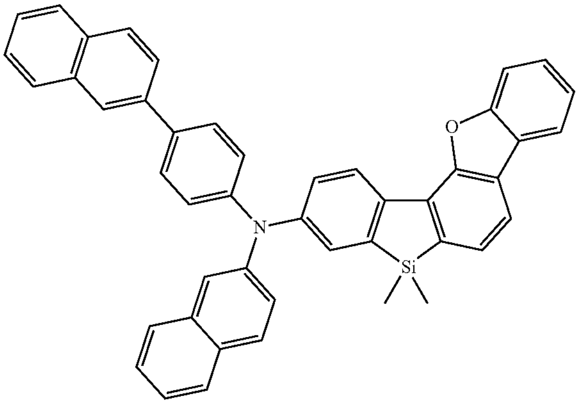
[2-176]
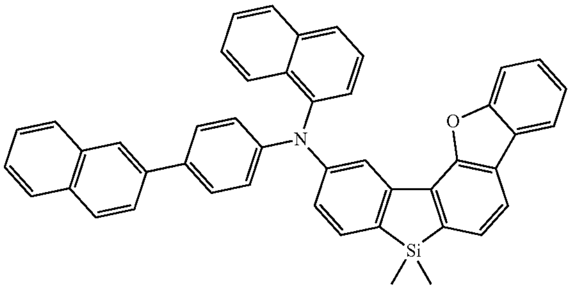

-continued
[2-177]
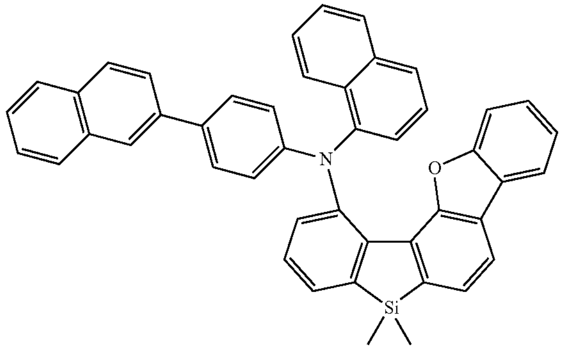
[2-178]
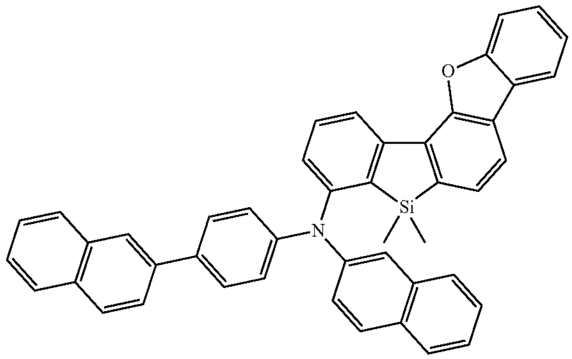
[2-179]
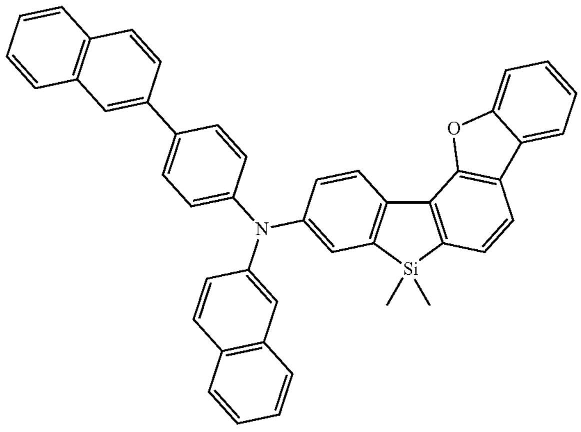
[2-180]
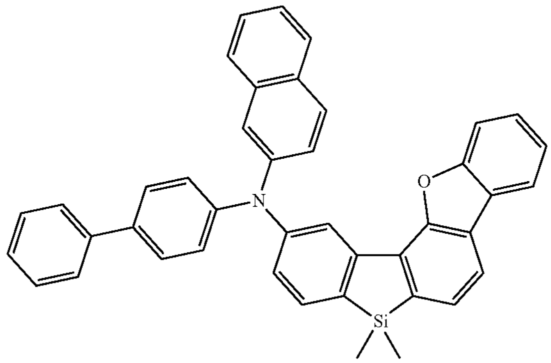
-continued
[2-181]
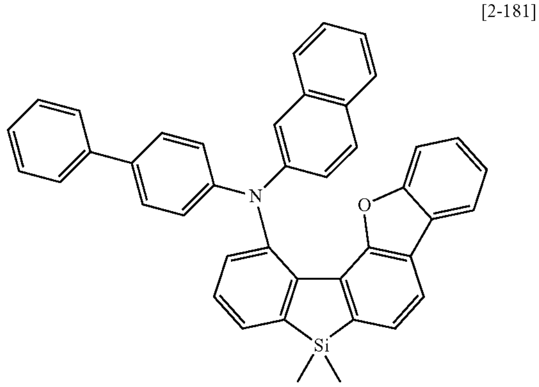
[2-182]
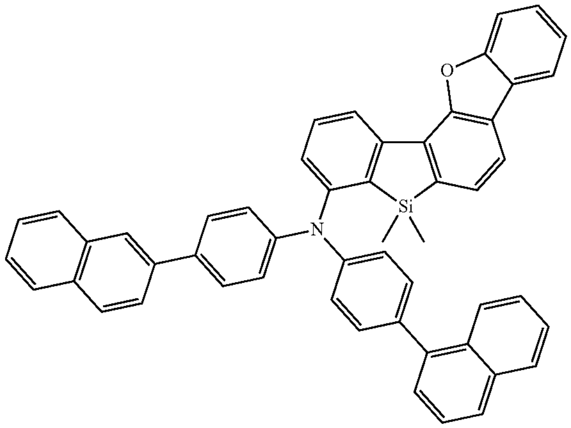
[2-183]
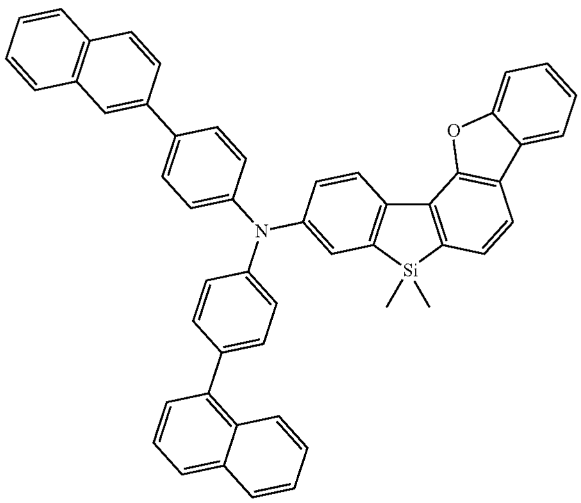

[2-184]
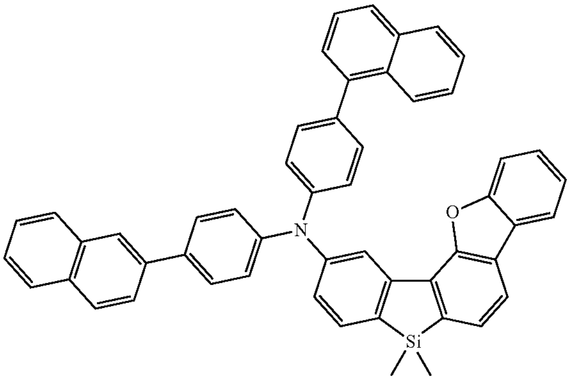
[2-185]
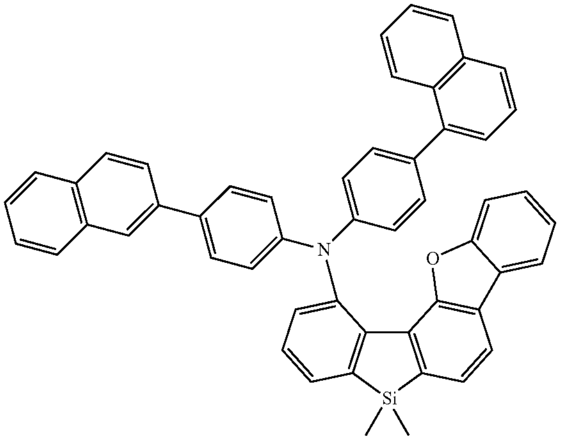
[2-186]
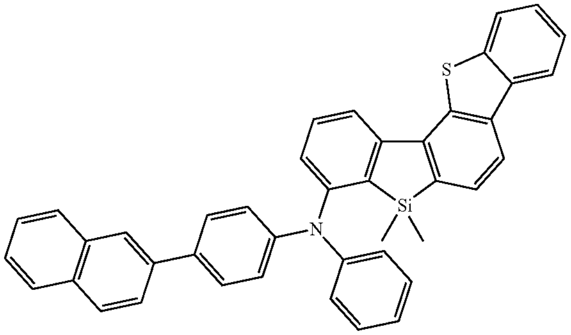
[2-187]
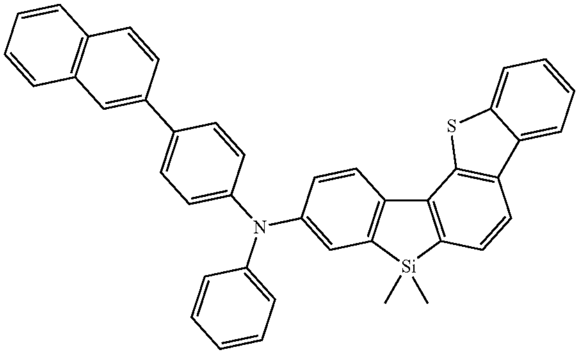
[2-188]
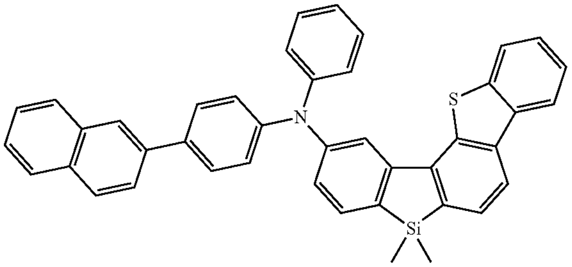
[2-189]
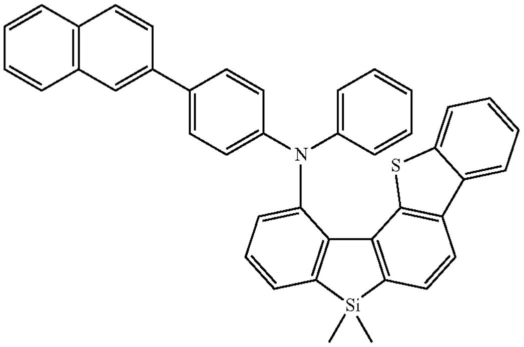
[2-190]
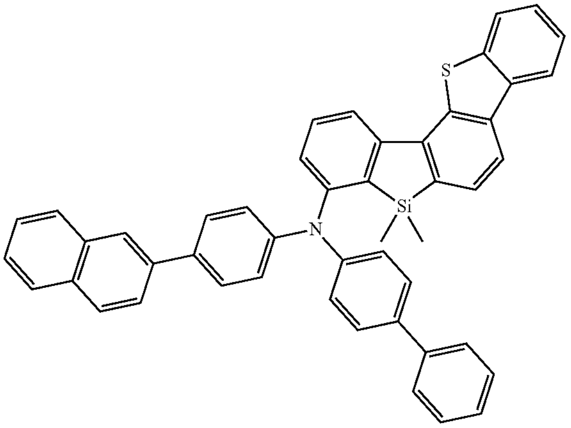
[2-191]
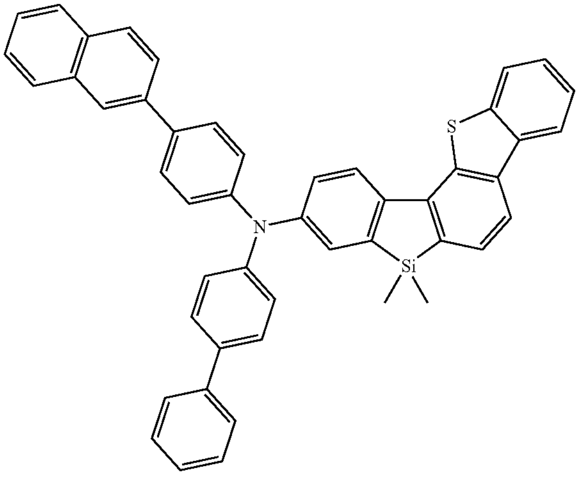

-continued
[2-192]
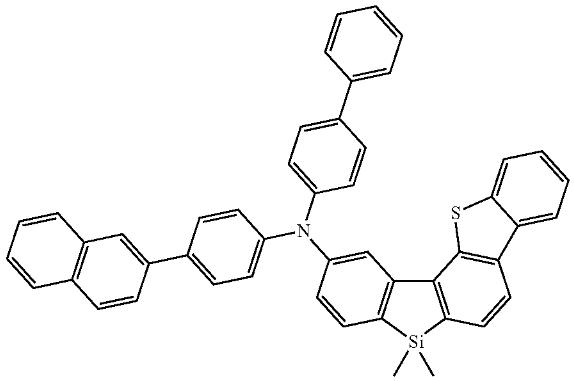
[2-193]
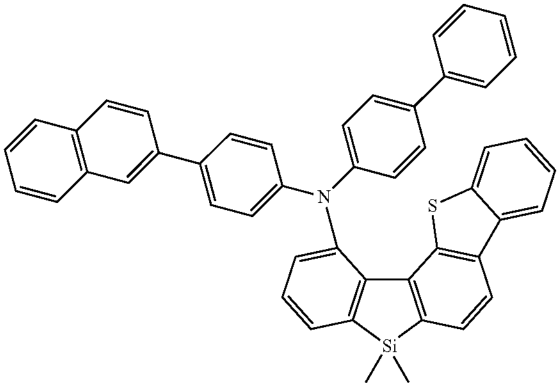
[2-194]
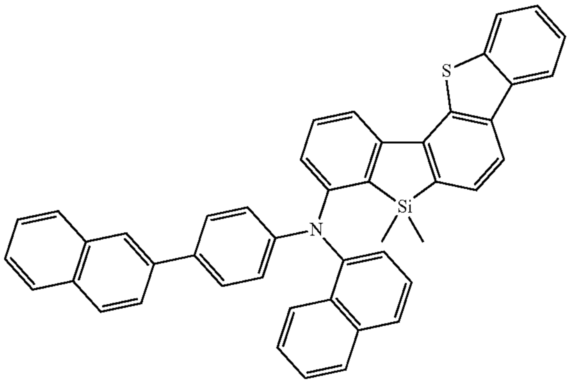
[2-195]
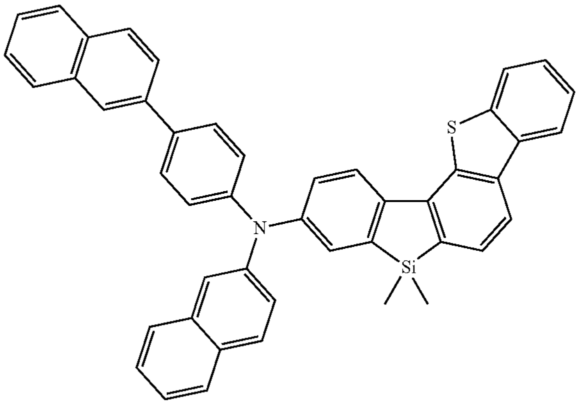
-continued
[2-196]
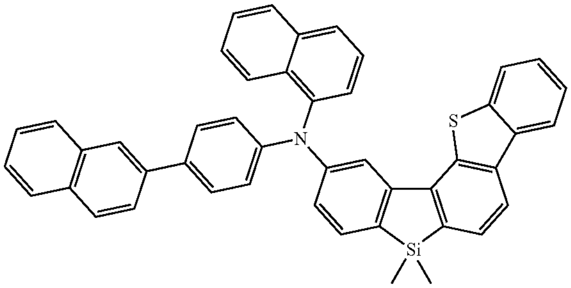
[2-197]
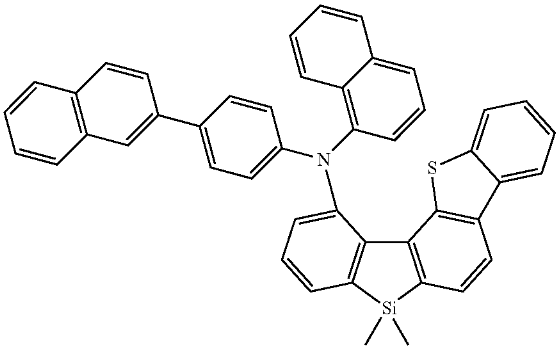
[2-198]
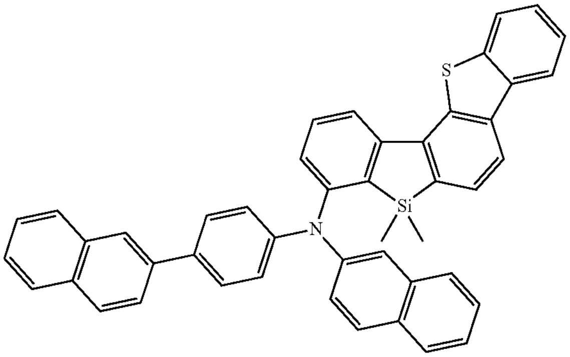
[2-199]
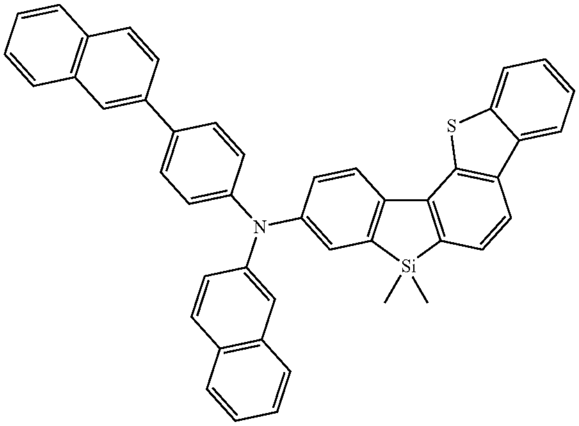

-continued
[2-200]
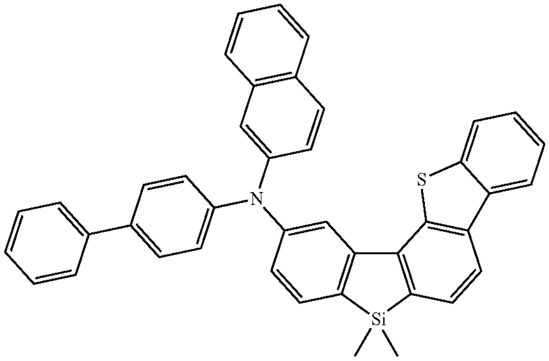
[2-201
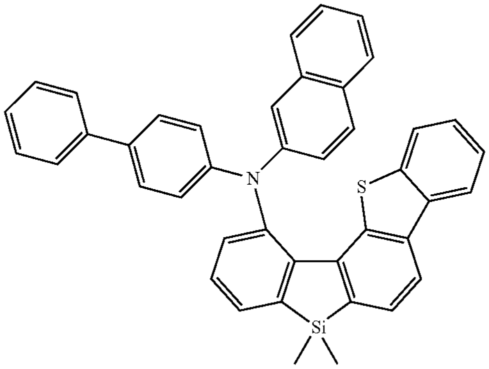
[2-202]
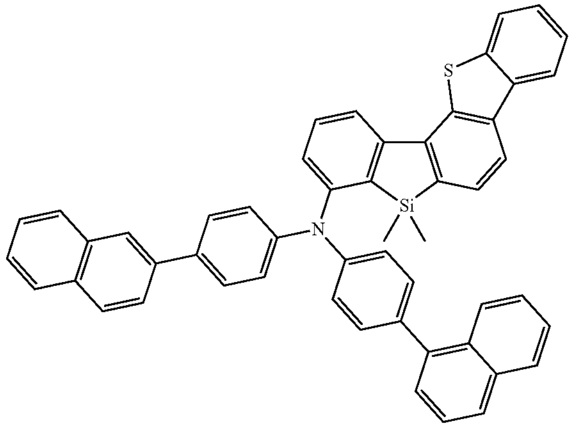
-continued
[2-203]
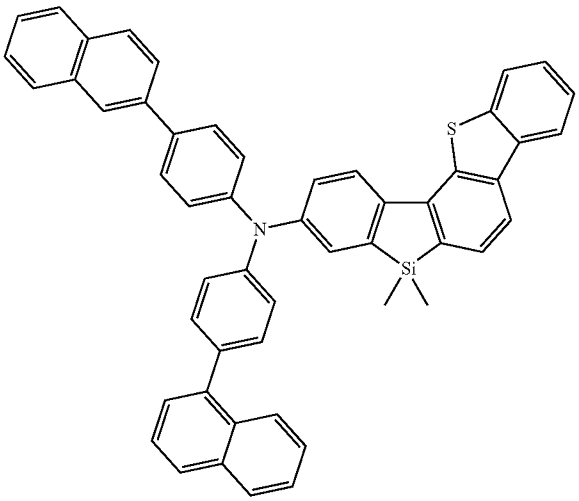
[2-204]
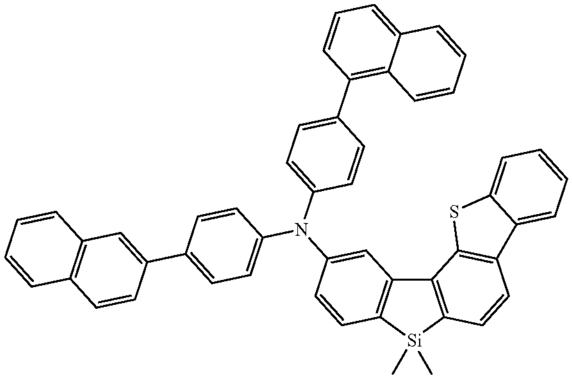
[2-205]
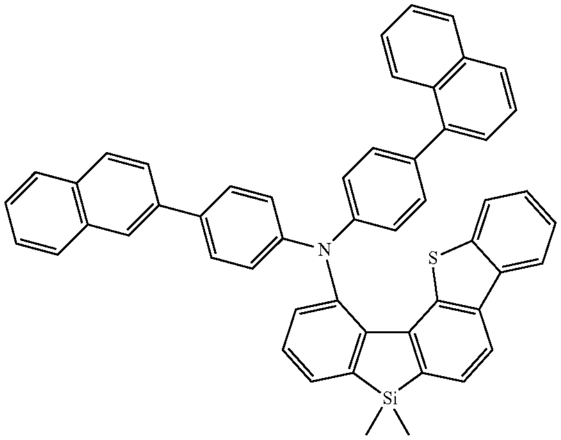
In an implementation, the composition for an organic optoelectronic device may include, e.g., a first compound represented by Chemical Formula 1a and a second compound represented by Chemical Formula 2I-C-2 or Chemical Formula 2II-F-2.

[Chemical Formula 1a]

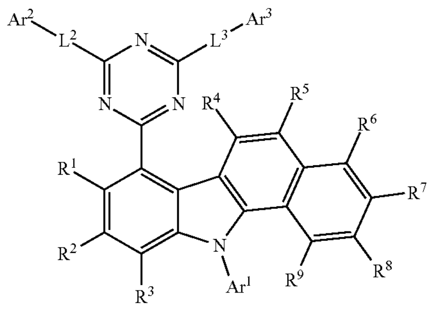

In Chemical Formula 1a, $L^2$ and $L^3$ may each independently be, e.g., a single bond, or a substituted or unsubstituted phenylene group.

$Ar^1$ may be, e.g., a substituted or unsubstituted phenyl group, or a substituted or unsubstituted biphenyl group.

$Ar^2$ and $Ar^3$ may each independently be, e.g., a substituted or unsubstituted phenyl group, a substituted or unsubstituted biphenyl group, a substituted or unsubstituted dibenzofuranyl group, or a substituted or unsubstituted dibenzothiophenyl group.

$R^1$ to $R^9$ may each independently be, e.g., hydrogen, deuterium, a substituted or unsubstituted C1 to C10 alkyl group, or a substituted or unsubstituted C6 to C12 aryl group.

In Chemical Formula 2I-C-2 and Chemical Formula 2II-F-2, $Y^1$ may be, e.g., O, S, or N—$R^b$.

$Y^2$ may be, e.g., C or Si.

$R^b$ may be, e.g., a substituted or unsubstituted phenyl group.

$R^{10}$ to $R^{13}$ and $R^{17}$ may each independently be, e.g., hydrogen, deuterium, a substituted or unsubstituted C1 to C10 alkyl group, or a substituted or unsubstituted C6 to C12 aryl group.

$R^{20}$ and $R^{21}$ may each independently be, e.g., a substituted or unsubstituted C1 to C10 alkyl group, or a substituted or unsubstituted C6 to C12 aryl group, $L^4$ may be, e.g., a single bond.

$L^5$ and $L^6$ may each independently be, e.g., a single bond or a substituted or unsubstituted phenylene group.

$Ar^3$ and Art may each independently be, e.g., a substituted or unsubstituted phenyl group, a substituted or unsubstituted biphenyl group, or a substituted or unsubstituted naphthyl group.

The first compound and the second compound may be included (e.g., mixed) in a weight ratio of, e.g., about 1:99 to about 99:1. Within the above range, bipolar characteristics may be implemented by adjusting an appropriate weight ratio using the electron transport capability of the first compound and the hole transport capability of the second compound, so that efficiency and life-span may be improved. Within the above range, the first compound and the second compound may be e.g., included in a weight ratio of about 90:10 to about 10:90, about 90:10 to about 20:80, about 90:10 to about 30:70, about 90:10 to about 40:60 or about 90:10 to about 50:50. In an implementation, the first compound and the second compound may be included in a weight ratio of about 60:40 to about 50:50, for example, about 50:50.

In an implementation, the first compound and the second compound may each be included as a host of an light emitting layer, e.g., a phosphorescent host.

The aforementioned composition for an organic optoelectronic device may be formed into a film by a dry film forming method such as chemical vapor deposition.

Hereinafter, an organic optoelectronic device including the aforementioned composition for an organic optoelectronic device is described.

The organic optoelectronic device may be a suitable device to convert electrical energy into photoenergy and vice versa without particular limitation, and may be, for example an organic photoelectric device, an organic light emitting diode, an organic solar cell, and an organic photoconductor drum.

Herein, an organic light emitting diode as one example of an organic optoelectronic device is described referring to drawings.

Figure 2:
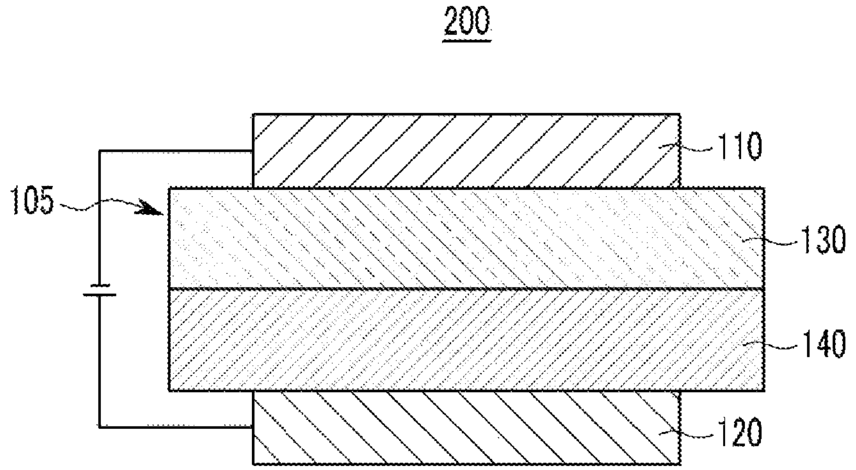

FIGS. 1 and 2 are cross-sectional views showing organic light emitting diodes according to embodiments.

Referring to FIG. 1, an organic light emitting diode 100 according to an embodiment may include an anode 120 and a cathode 110 facing each other and an organic layer 105 disposed between the anode 120 and cathode 110.

The anode 120 may be made of a conductor having a large work function to help hole injection, and may be, e.g., a metal, a metal oxide, or a conductive polymer. The anode 120 may be, e.g., a metal such as nickel, platinum, vanadium, chromium, copper, zinc, gold, or the like or an alloy thereof; a metal oxide such as zinc oxide, indium oxide, indium tin oxide (ITO), indium zinc oxide (IZO), or the like; a combination of a metal and an oxide such as ZnO and Al or $SnO_2$ and Sb; or a conductive polymer such as poly(3-methylthiophene), poly(3,4-(ethylene-1,2-dioxy)thiophene) (PEDOT), polypyrrole, or polyaniline.

The cathode 110 may be made of a conductor having a small work function to help electron injection, and may be, e.g., a metal, a metal oxide, or a conductive polymer. The cathode 110 may be, e.g., a metal such as magnesium, calcium, sodium, potassium, titanium, indium, yttrium, lithium, gadolinium, aluminum silver, tin, lead, cesium, barium, or the like, or an alloy thereof; or a multi-layer structure material such as LiF/Al, $LiO_2$/Al, LiF/Ca, or $BaF_2$/Ca.

The organic layer 105 may include the aforementioned composition for an organic optoelectronic device.

The organic layer 105 may include, e.g., the light emitting layer 130, and the light emitting layer 130 may include, e.g., the aforementioned composition for an organic optoelectronic device.

The light emitting layer 130 may include, e.g., the aforementioned composition for an organic optoelectronic device as a phosphorescent host.

In addition to the aforementioned host, the light emitting layer may further include one or more other suitable compounds.

The light emitting layer may further include a dopant. The dopant may be, e.g., a phosphorescent dopant. The dopant may be, e.g., a red, green or blue phosphorescent dopant. The dopant may be, e.g., a red phosphorescent dopant.

The composition for an organic optoelectronic device further including a dopant may be, e.g., a red light emitting composition.

A dopant is a material that emits light by being mixed in a small amount with a compound or composition for an organic optoelectronic device. The dopant may be a material such as a metal complex that emits light by multiple excitation into a triplet or more. The dopant may be, e.g., an inorganic, organic, or organic-inorganic compound, and may include one or two or more.

An example of the dopant may include a phosphorescent dopant, and examples of the phosphorescent dopant may include an organometallic compound including Ir, Pt, Os, Ti, Zr, Hf, Eu, Tb, Tm, Fe, Co, Ni, Ru, Rh, Pd, or a combination thereof. The phosphorescent dopant may be, e.g., a compound represented by Chemical Formula Z.

$L^7MX$ [Chemical Formula Z]

In Chemical Formula Z, M may be, e.g., a metal, and $L^1$ and X may each independently be, e.g., ligands forming a complex compound with M.

The M may be, e.g., Ir, Pt, Os, Ti, Zr, Hf, Eu, Tb, Tm, Fe, Co, Ni, Ru, Rh, Pd, or a combination thereof, and $L^7$ and X may be, e.g., a bidendate ligand.

The organic layer may further include an auxiliary layer in addition to the light emitting layer.

The auxiliary layer may be, e.g., a hole auxiliary layer 140.

Referring to FIG. 2, an organic light emitting diode 200 further includes a hole auxiliary layer 140 in addition to the light emitting layer 130. The hole auxiliary layer 140 may further increase hole injection and/or hole mobility and blocks electrons between the anode 120 and the light emitting layer 130.

The hole auxiliary layer 140 may include, e.g., a compound of Group A.

In an implementation, the hole auxiliary layer 140 may include a hole transport layer between the anode 120 and the light emitting layer 130 and a hole transport auxiliary layer between the light emitting layer 130 and the hole transport layer, and a compound of Group A may be included in the hole transport auxiliary layer.

[Group A]

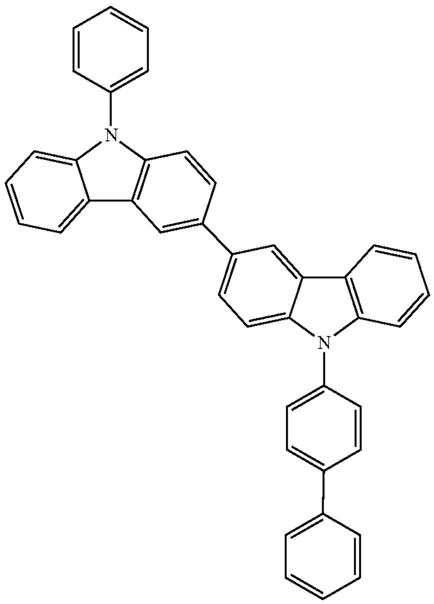

-continued

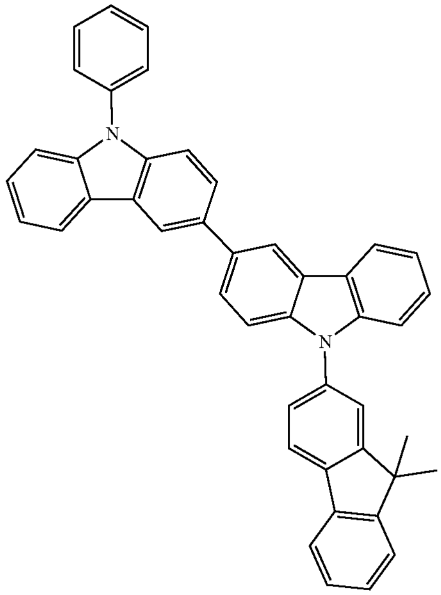

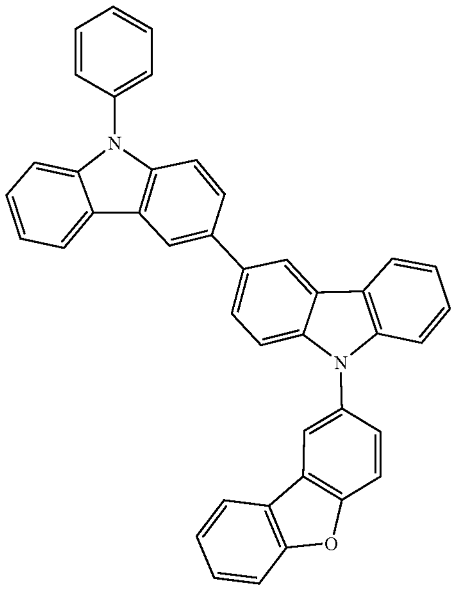

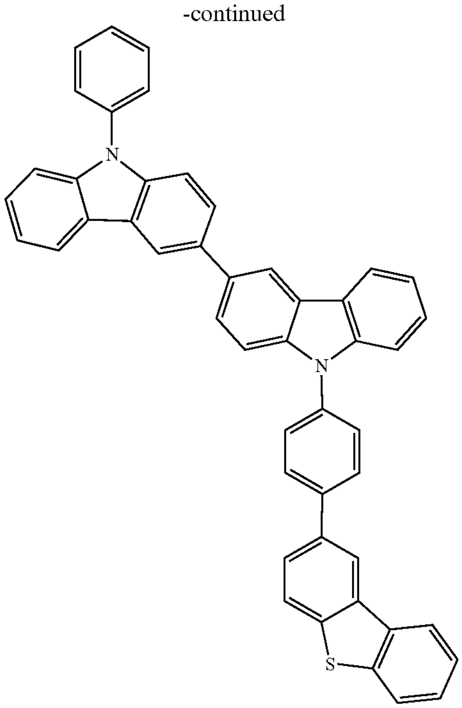
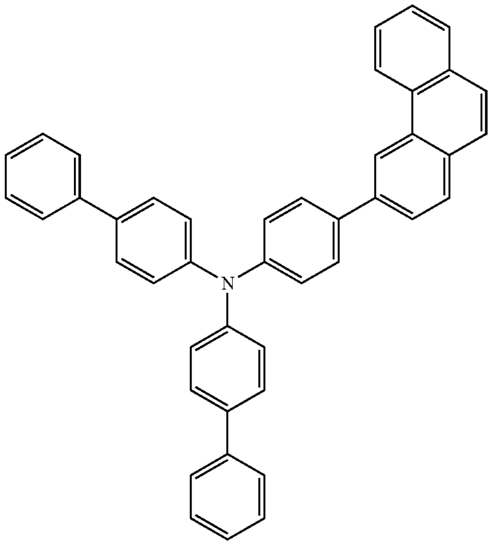
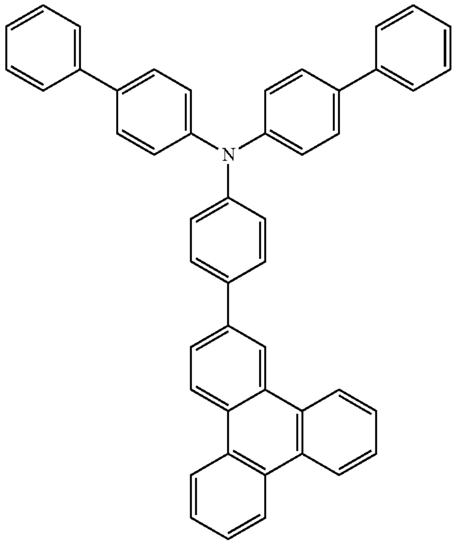
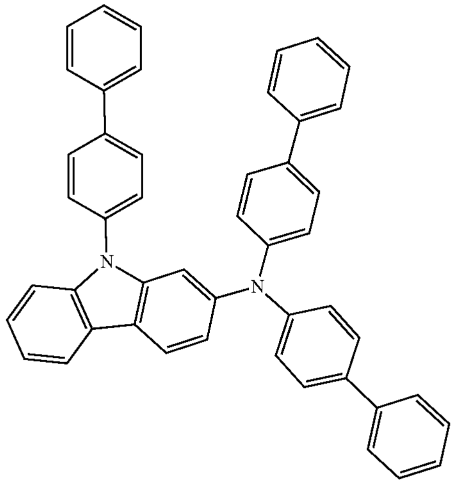
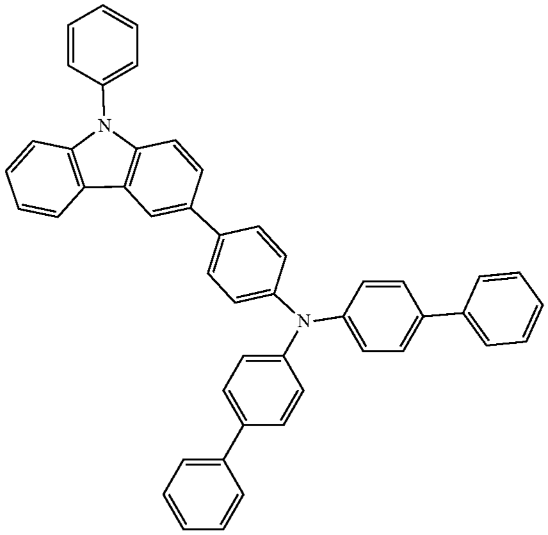

-continued
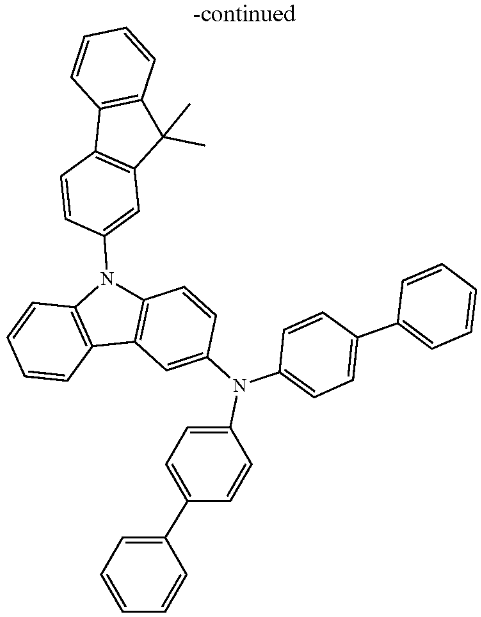
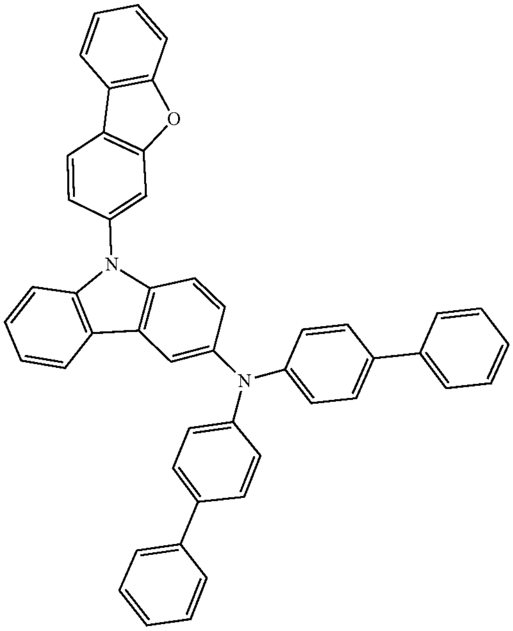
-continued
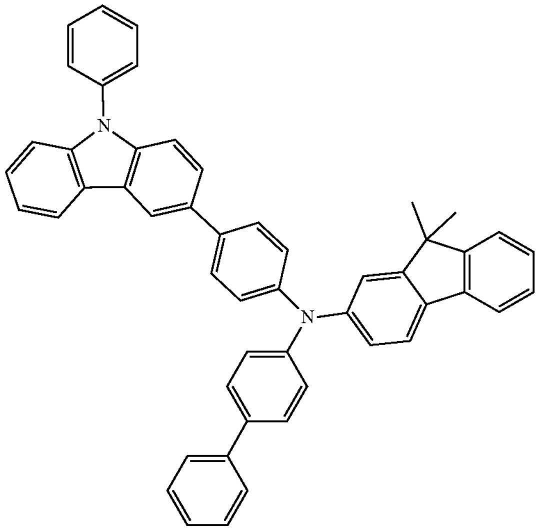
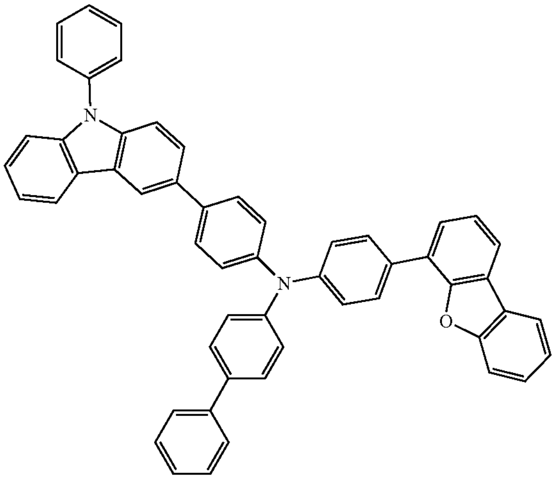
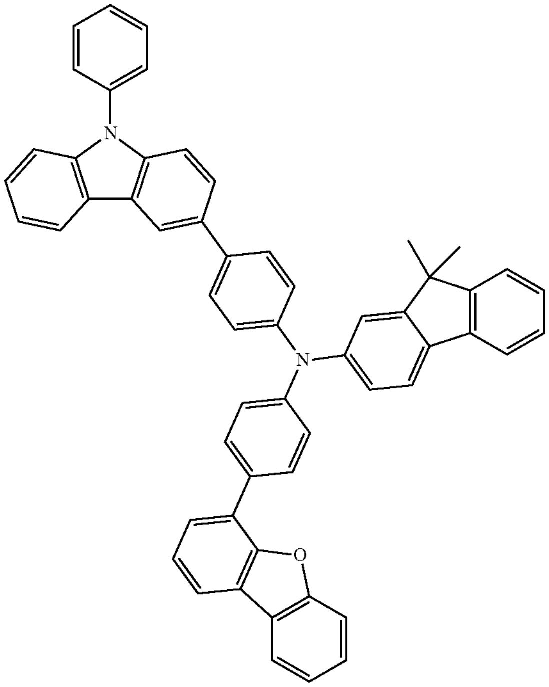

-continued
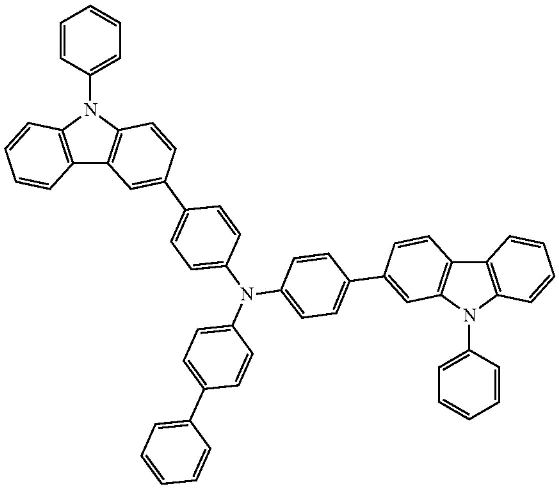
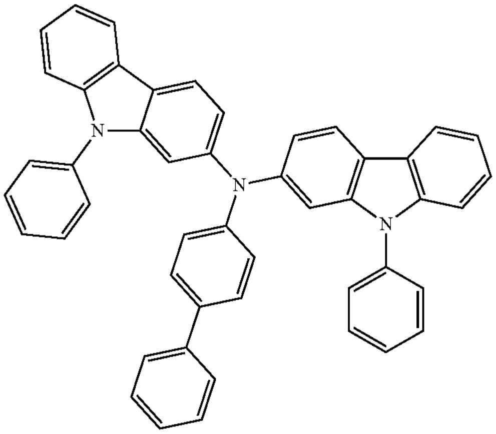
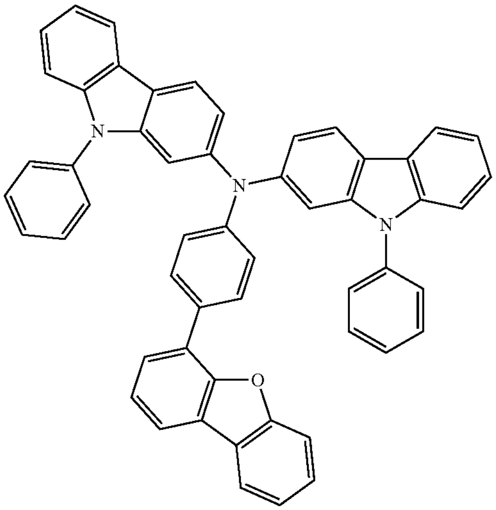
-continued
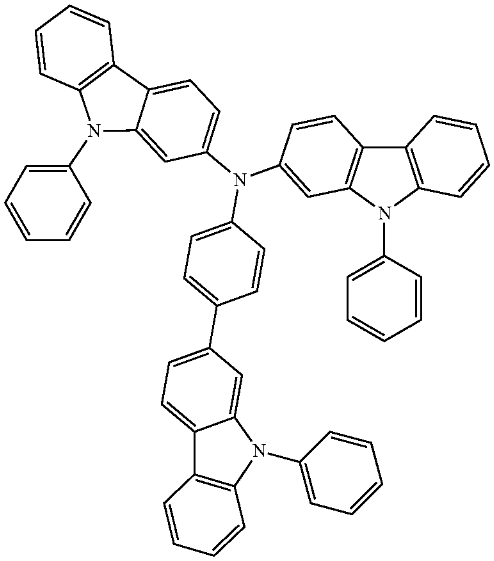
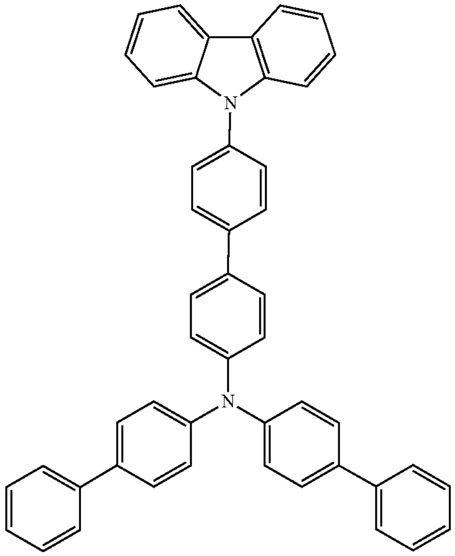
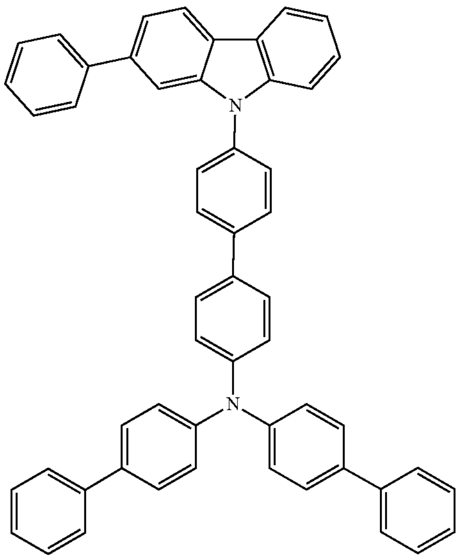

-continued
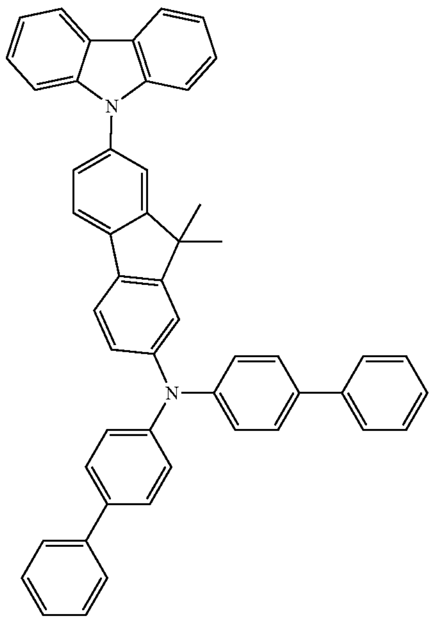
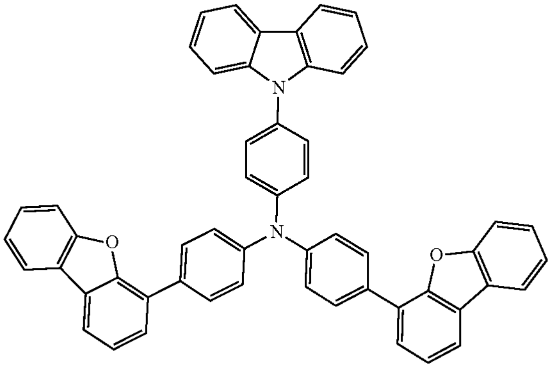
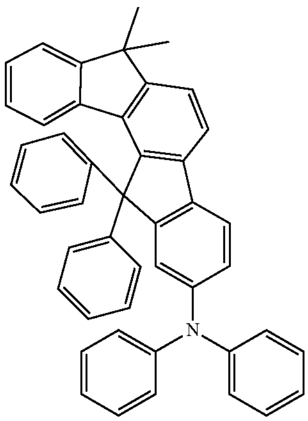
-continued
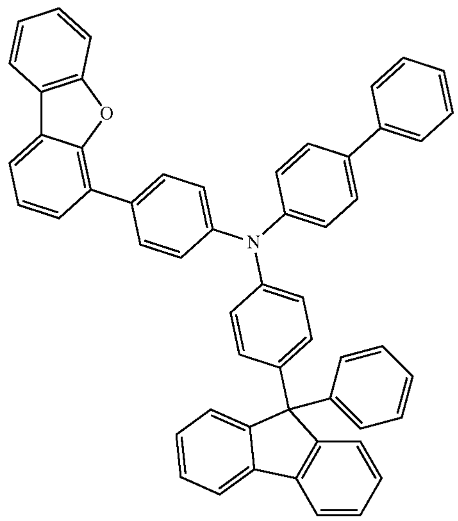
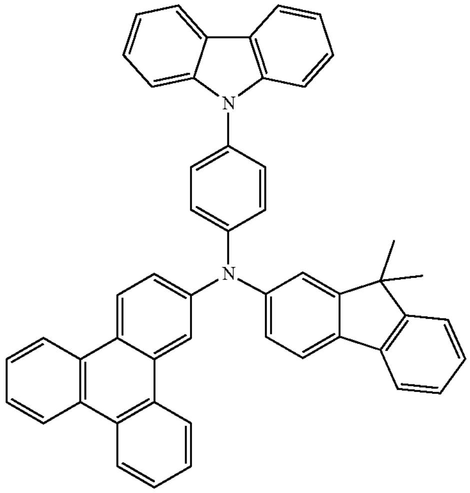
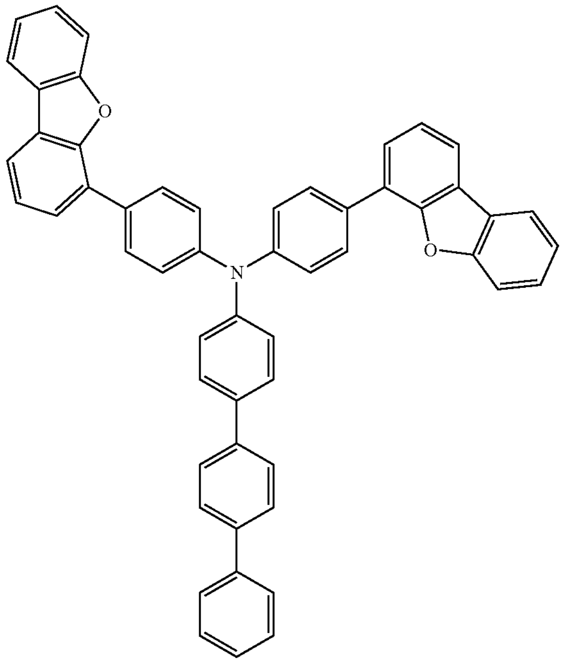

-continued
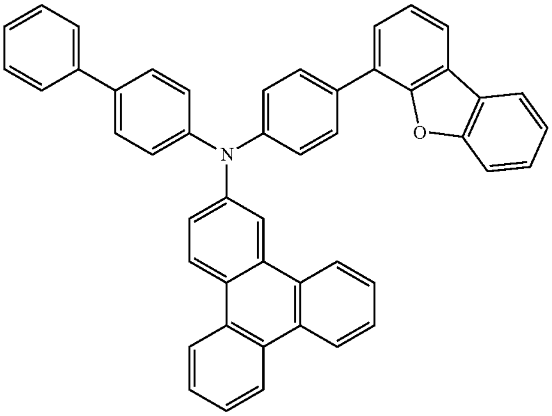
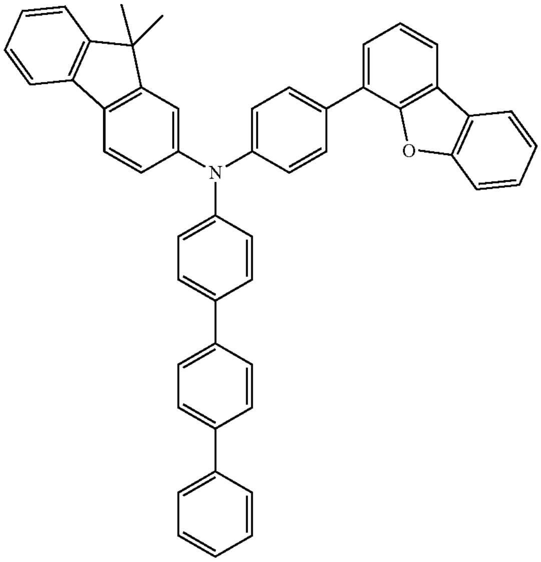
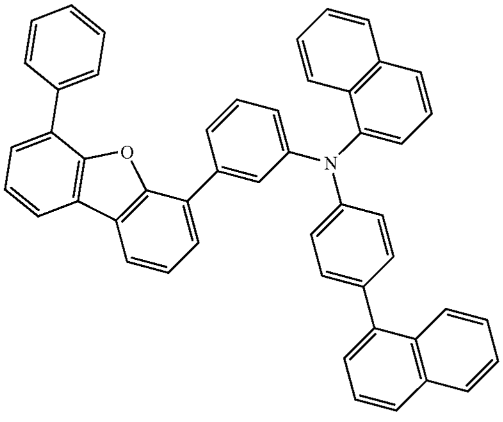
-continued
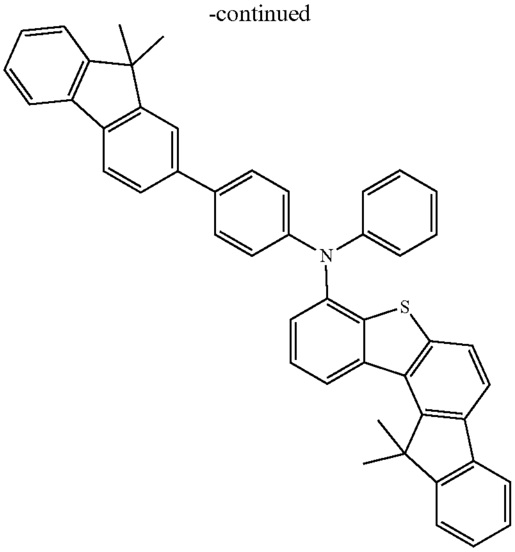
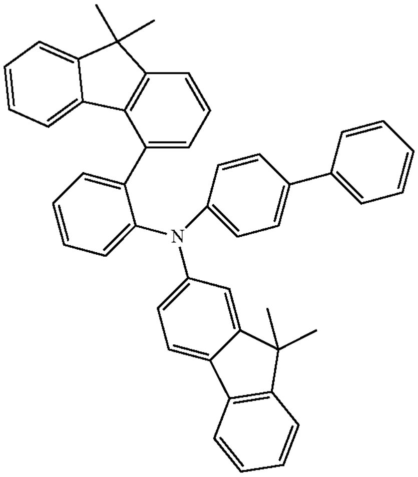
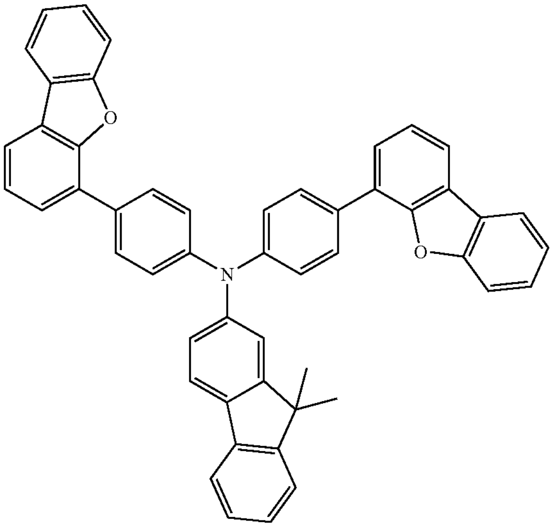

-continued
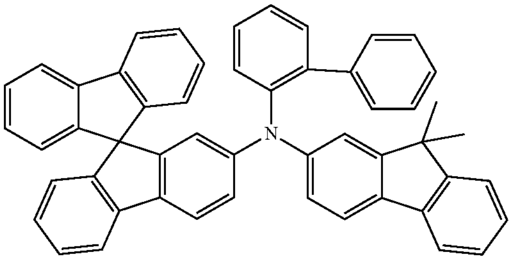
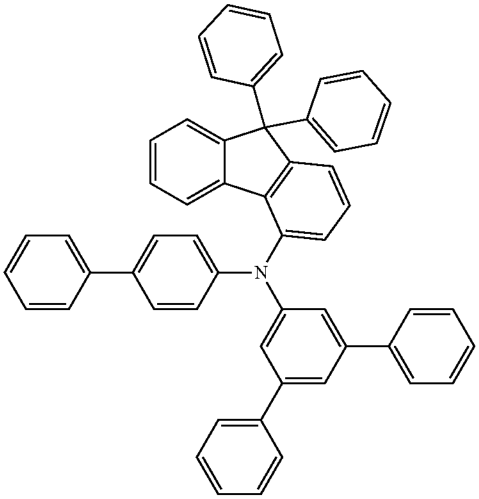
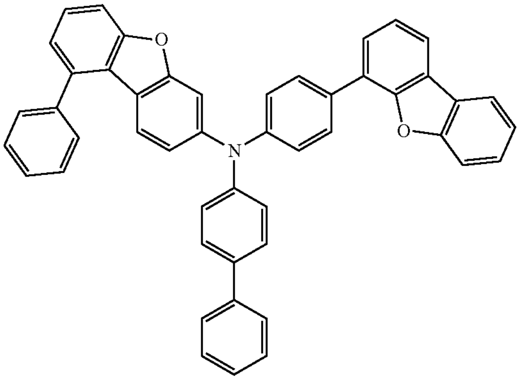
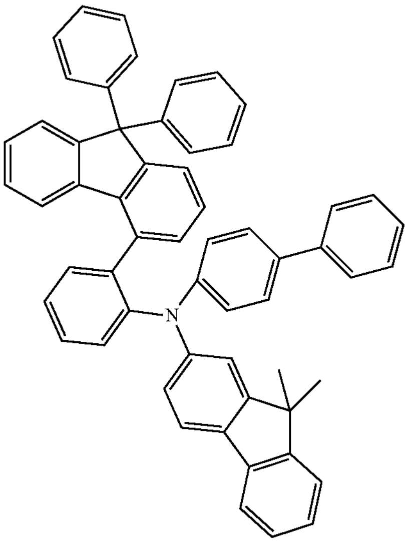
-continued
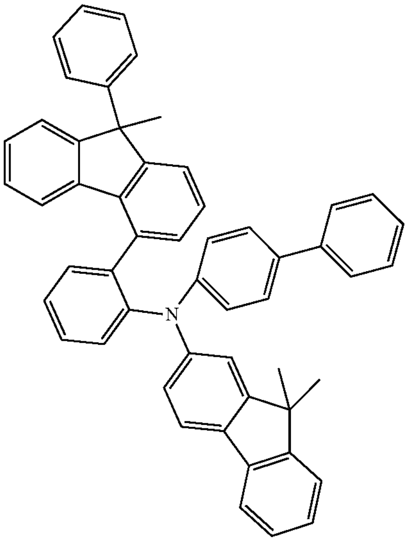
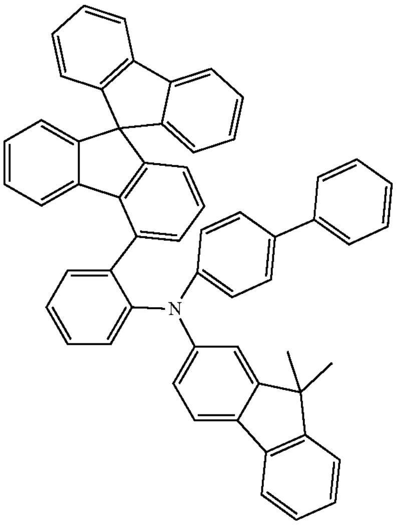
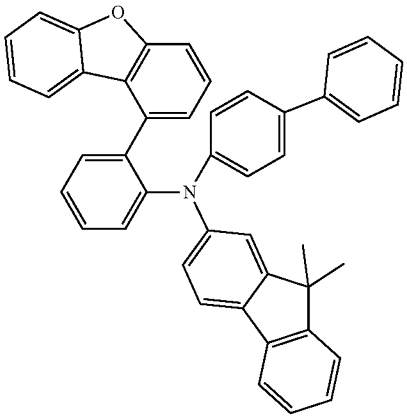

-continued
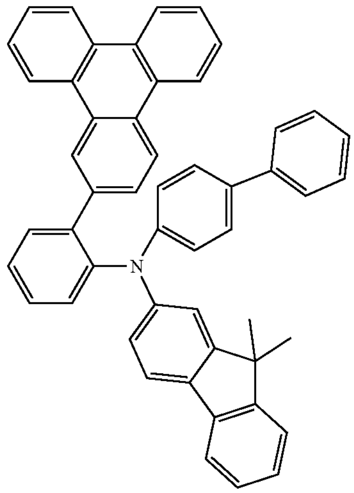
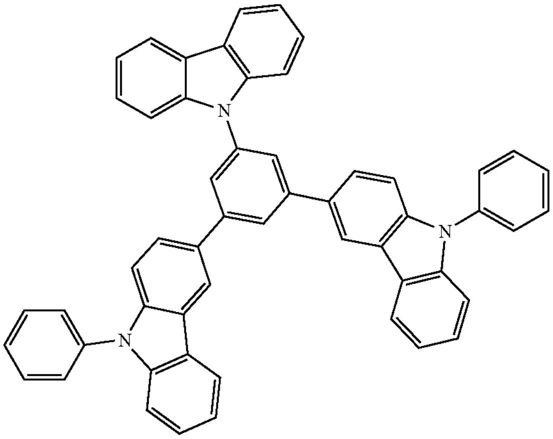
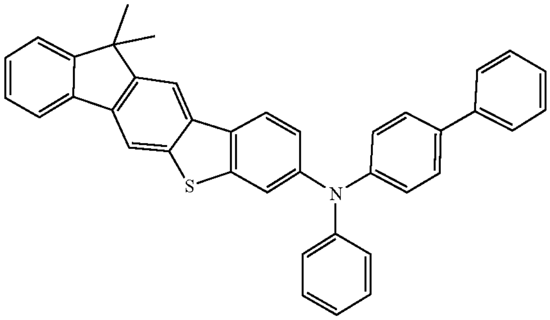
-continued
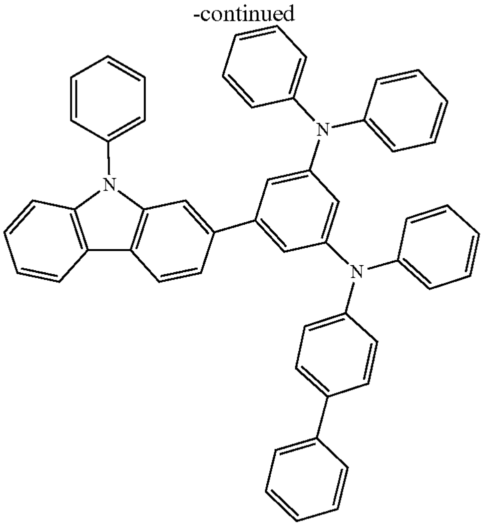
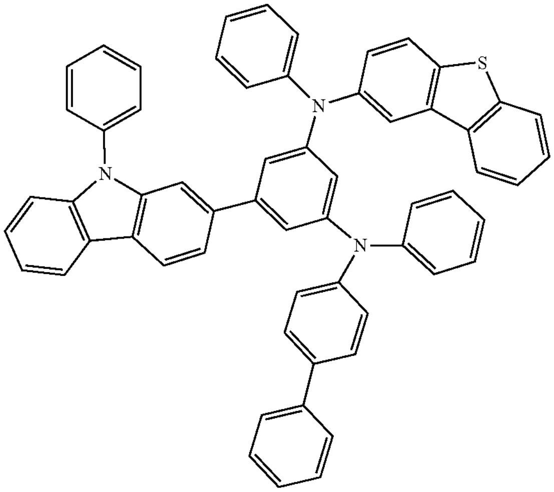
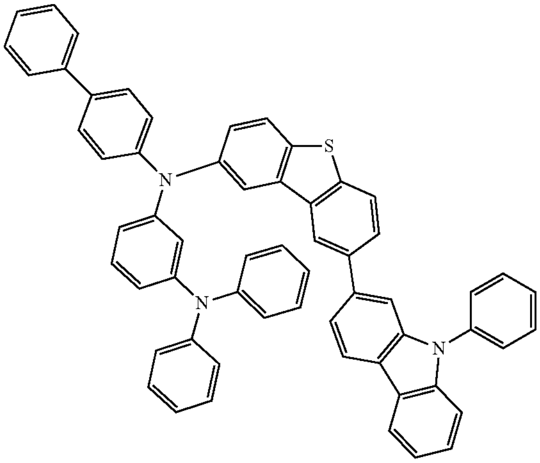

-continued
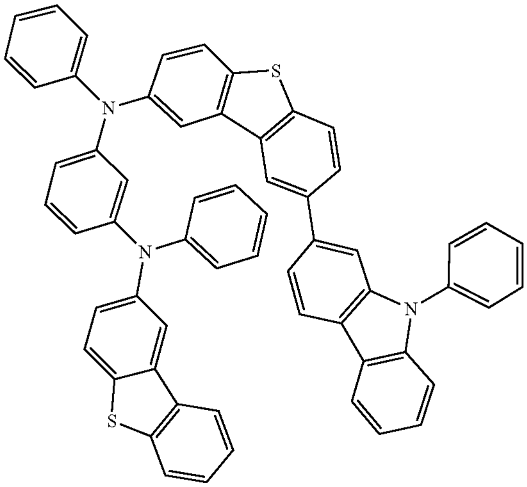
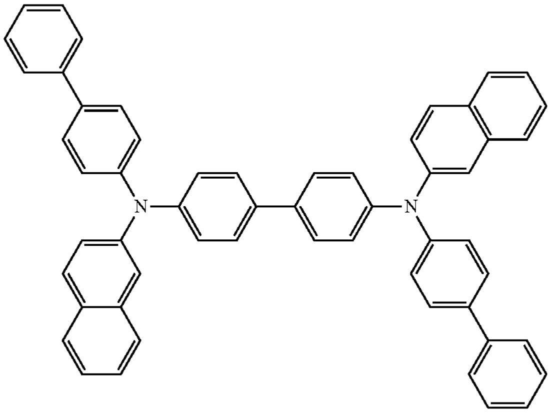
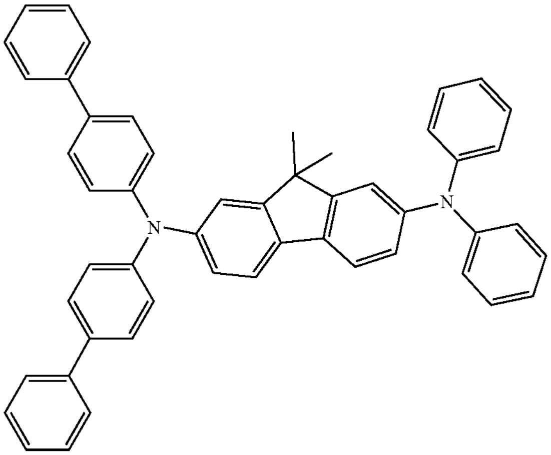
-continued
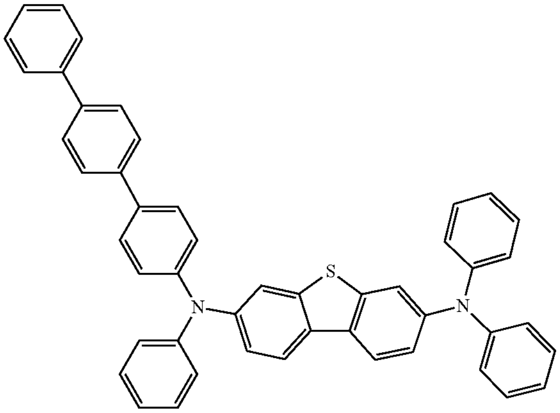
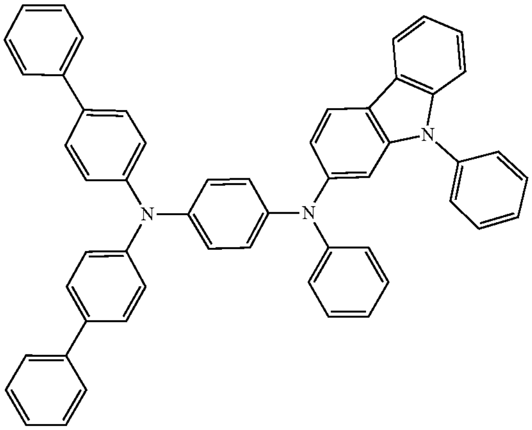
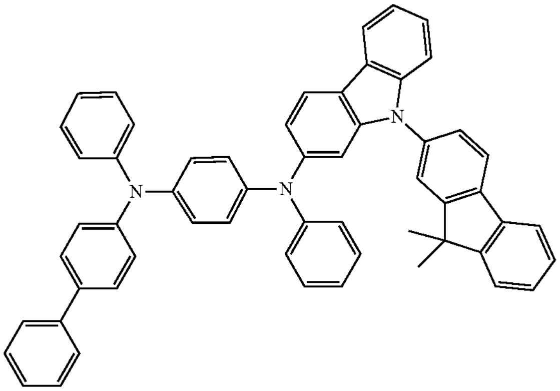
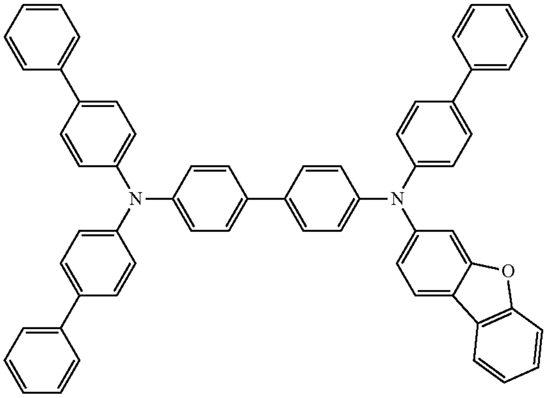

-continued
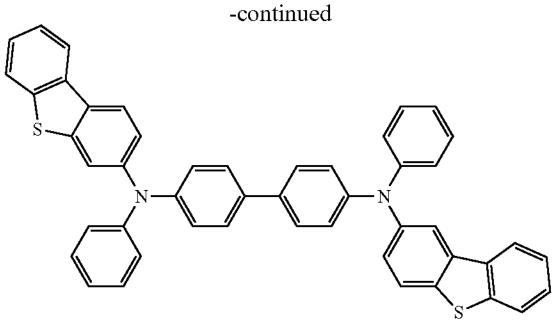
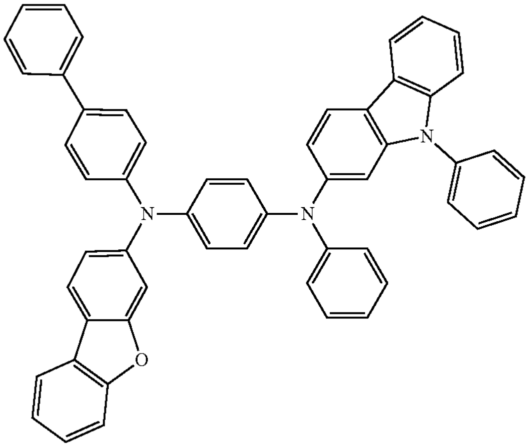
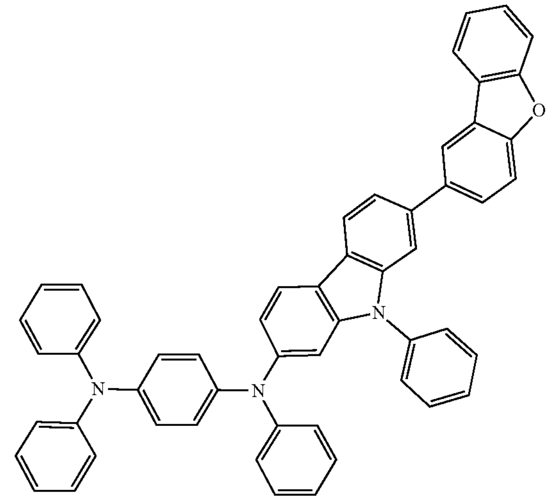
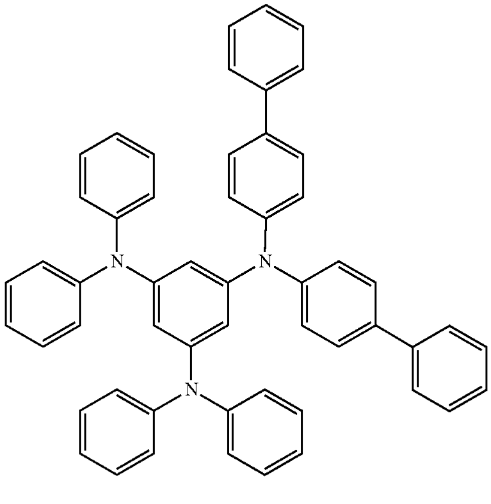
-continued
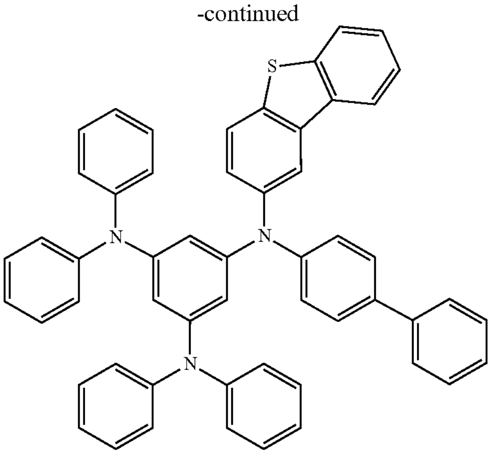
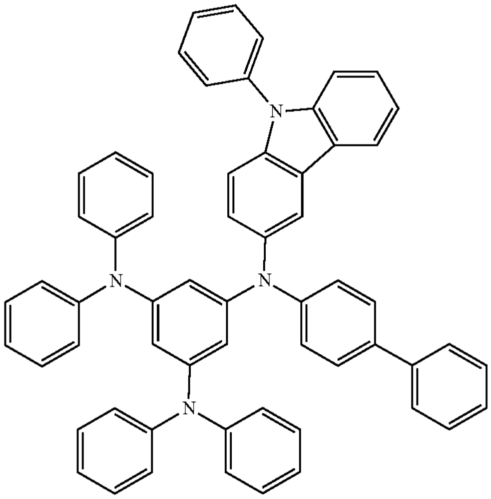
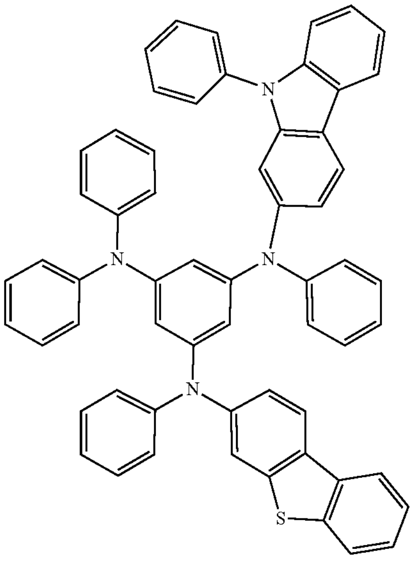

-continued
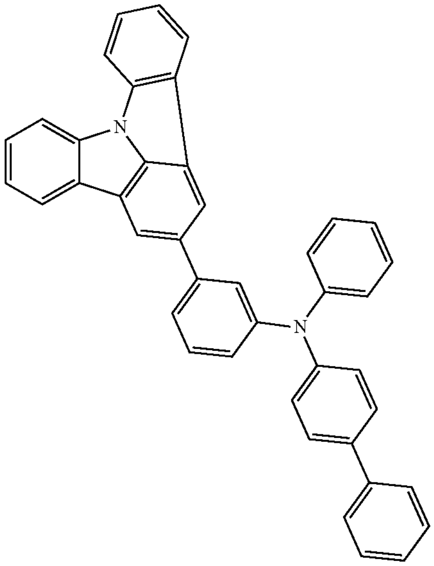
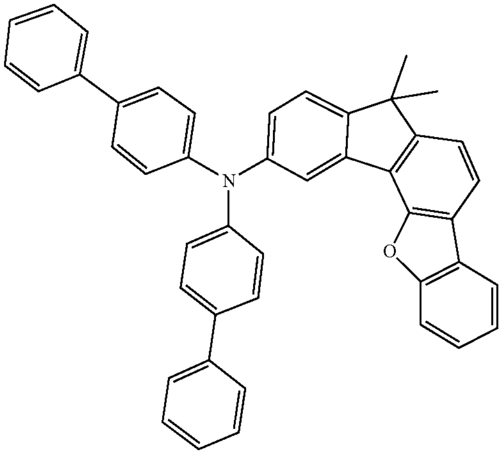
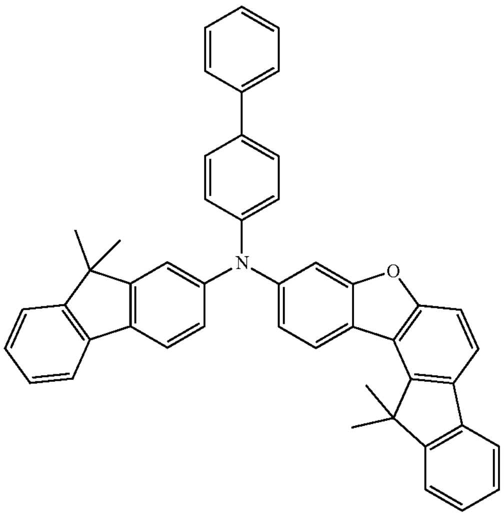
-continued
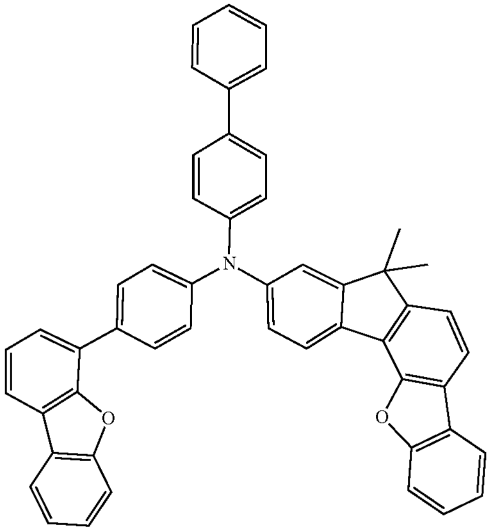
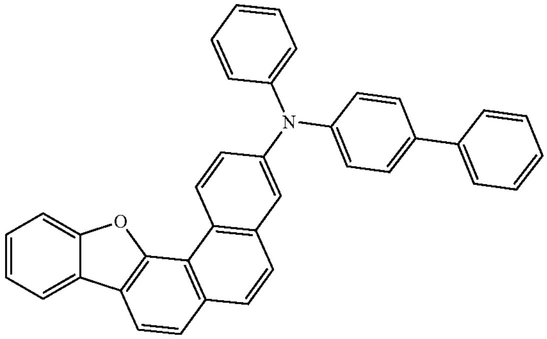
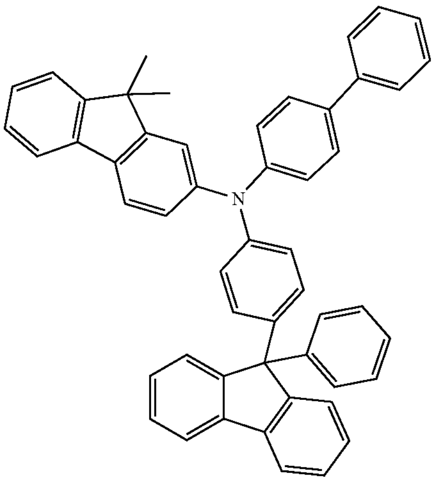

-continued
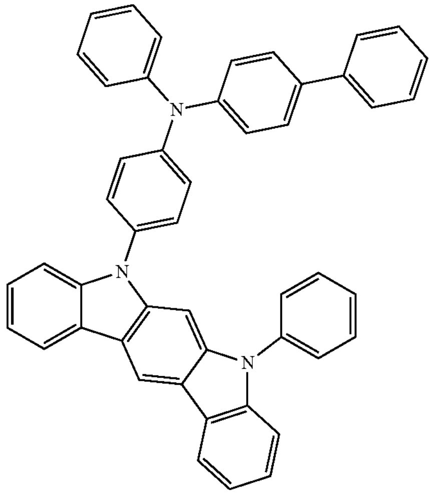
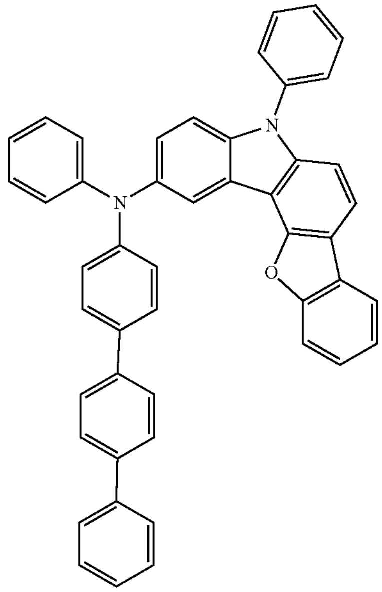
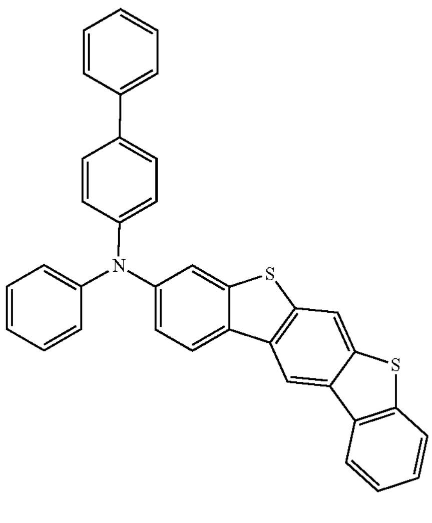
-continued
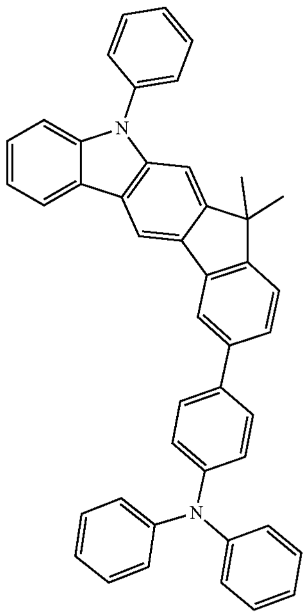
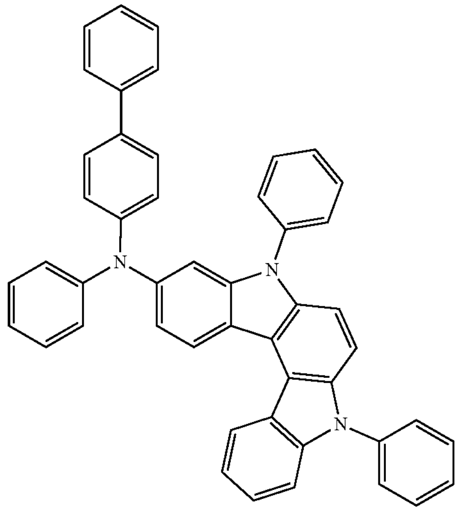
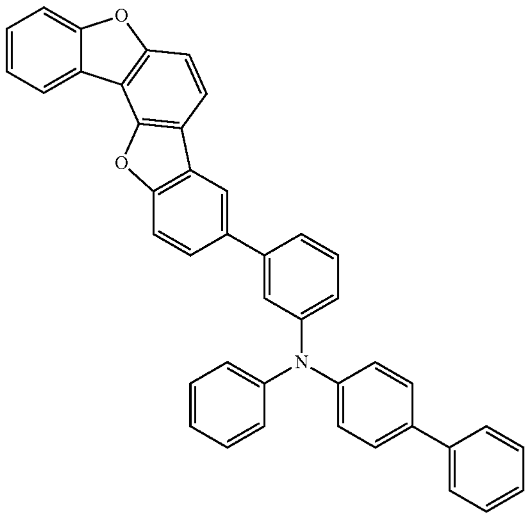
In the hole transport auxiliary layer, other suitable compounds may be used in addition to the compound.

In an implementation, an organic light emitting diode may further include an electron transport layer, an electron injection layer, or a hole injection layer as the organic layer 105.

The organic light emitting diodes 100 and 200 may be produced by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, starting materials and reactants used in examples and synthesis examples were purchased from Sigma-Aldrich Co. Ltd., TCI Inc., Tokyo chemical industry or P&H tech as far as there is no particular comment or were synthesized by suitable methods.

(Preparation of Compound for Organic Optoelectronic Device)

The compounds were synthesized through the following steps.

Synthesis of First Compound

Synthesis Example 1: Synthesis of Compound 1

[Reaction Scheme 1]

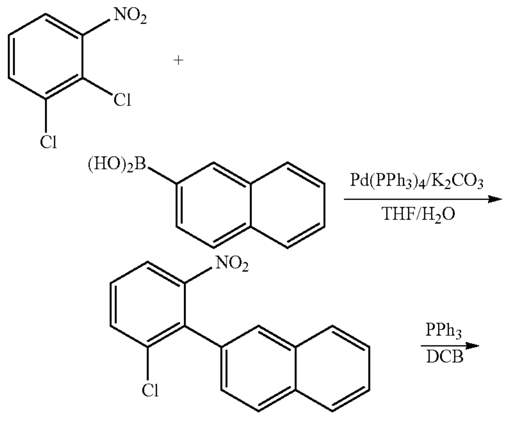

1-1a

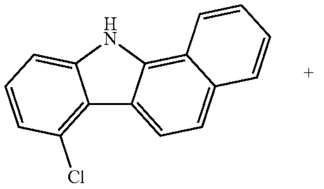

1-1b

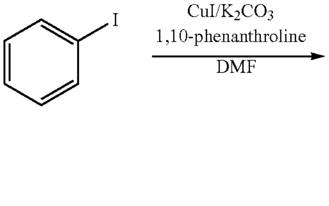

-continued

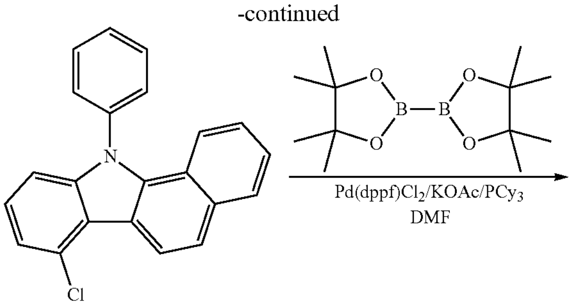

1-1c

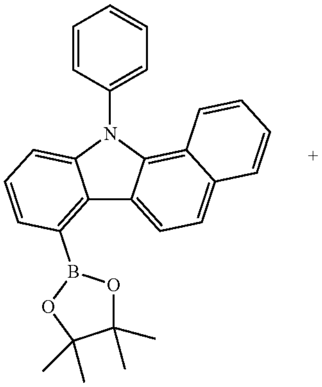

1-1d

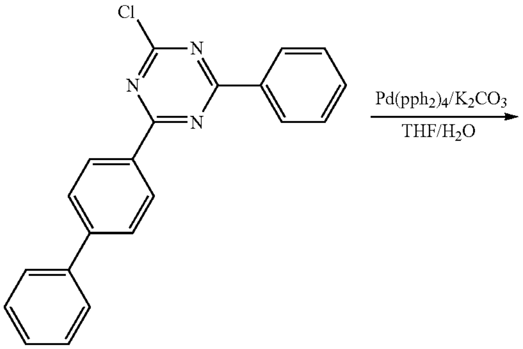

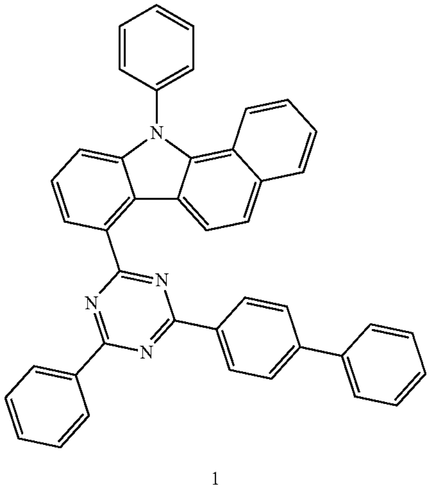

1

1st Step: Synthesis of Intermediate 1-1a 2,3-dichloronitro benzene (40 g, 209.5 mmol), 2-naphthalene boronic acid (36.05 g, 209.5 mmol), $K_2CO_3$ (57.9 g, 419 mmol), and $Pd(PPh_3)_4$ (12.1 g, 10.5 mmol) were put in a round-bottomed flask and dissolved in tetrahydrofuran (400 mL) and distilled water (150 mL) and then, stirred at 80° C. for 12 hours. When a reaction was completed, an aqueous layer was removed therefrom, and the residue was treated through column chromatography to obtain Intermediate 1-1a (39.9 g, Yield: 67%).

2nd Step: Synthesis of Intermediate 1-1b

Intermediate 1-1a (39 g, 137.8 mmol) and triphenylphosphine (180.7 g, 688.95 mmol) were put in a round-bottomed flask and dissolved in dichlorobenzene (400 mL) and then, stirred at 180° C. for 12 hours. When a reaction was completed, after removing the solvent, the residue was treated through chromatography to obtain Intermediate 1-1b (34 g, Yield: 98%).

3rd Step: Synthesis of Intermediate 1-1c

Intermediate 1-1b (34 g, 135.4 mmol) and iodobenzene (83 g, 406.29 mmol), CuI (5.3 g, 27.1 mmol), $K_2CO_3$ (28.1 g, 203. mmol), and 1,10-phenanthroline (5.03 g, 27.0 mmol) were put in a round-bottomed flask and dissolved in DMF (400 ml) and then, stirred at 180° C. for 12 hours. When a reaction was complete, after removing the solvent, the obtained product was extracted in dichloromethane, concentrated, and recrystallized with hexane to obtain Intermediate 1-1c (30 g, Yield: 68%).

4th Step: Synthesis of Intermediate 1-1d

Intermediate 1-1c (30 g, 91.7 mmol), bis(pinacolato) diboron (28 g, 110 mmol), $Pd(dppf)Cl_2$ (3.8 g, 4.6 mmol), tricyclohexylphosphine (0.8 g, 2.8 mmol), and potassium acetate (18 g, 183 mmol) were put in a round-bottomed flask and dissolved in DMF (400 mL) and then, stirred under reflux at 120° C. for 12 hours. When a reaction was completed, the mixture was poured into an excess of distilled water and then, stirred for 1 hour, and a solid produced therein was filtered and dissolved in dichloromethane and then, treated with $MgSO_4$ to remove moisture. Subsequently, the obtained product was silica filtered, a solvent was removed therefrom under a reduced pressure to obtain a solid, and the solid was recrystallized with EA and hexane to obtain Intermediate 1-1d (25 g, Yield: 65%).

5th Step: Synthesis of Compound 1

In a 1 L round-bottomed flask, Intermediate 1-1d (25 g, 59.64 mmol) was dissolved in 0.3 L of tetrahydrofuran (THF), and 2-([1,1'-biphenyl]-4-yl)-4-chloro-6-phenyl-1,3,5-triazine (20 g, 59.64 mmol), tetrakis(triphenylphosphine) palladium (3.6 g, 3.0 mmol), and potassium carbonate (20.6 g, 150 mmol) were added thereto and then, heated under reflux at 80° C. for 12 hours. When a reaction was completed, water was added to the reaction solution and then, stirred for 30 minutes and filtered, a solid obtained therefrom was dissolved in monochlorobenzene and then, treated with anhydrous magnesium sulfate to removed moisture therefrom, and filtered by using silica gel, and a filtrate therefrom was cooled down to ambient temperature and filtered. A solid obtained therefrom was repeatedly purified by using monochlorobenzene to obtain Compound 1 (25 g, Yield: 70%).

Synthesis Example 2: Synthesis of Compound 2

[Reaction Scheme 2]

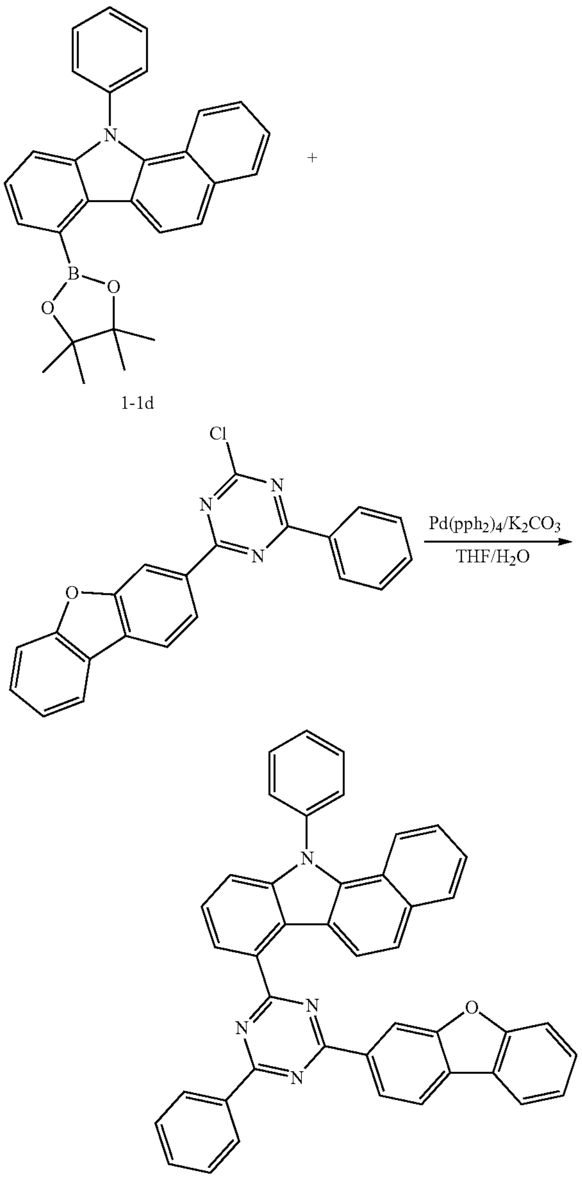

1-1d

2

In a 1 L round-bottomed flask, Intermediate 1-1d (10 g, 23.85 mmol) was dissolved in 0.15 L of tetrahydrofuran (THF), and a triazine intermediate (8.5 g, 23.85 mmol), tetrakis(triphenylphosphine) palladium (1.4 g, 1.2 mmol), and potassium carbonate (8.2 g, 60 mmol) were added thereto and then, heated under reflux at 80° C. for 12 hours. When a reaction was completed, water was added to the reaction solution and then, stirred for 30 minutes and filtered, a solid therefrom was dissolved in monochlorobenzene and then, treated with anhydrous magnesium sulfate to remove moisture therefrom, and filtered by using silica gel, and a filtrate therefrom was cooled down to ambient temperature and filtered. A solid obtained therefrom was repeatedly purified by using monochlorobenzene to obtain Compound 2 (11 g, Yield: 75%).

Comparative Synthesis Example 1: Synthesis of Compound B-1

[Reaction Scheme 3]

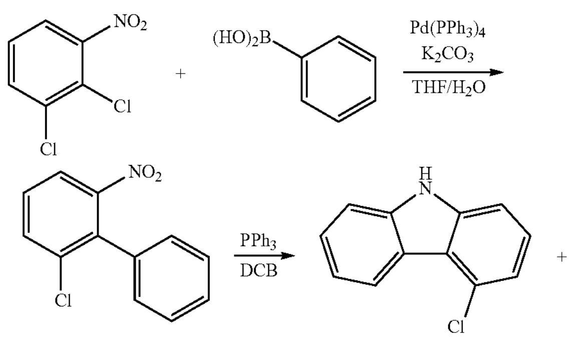

B-1-1a B-1-1b

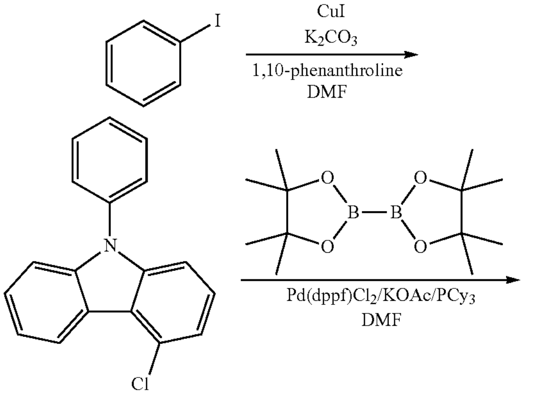

B-1-1c

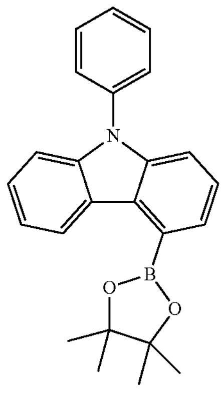

B-1-1

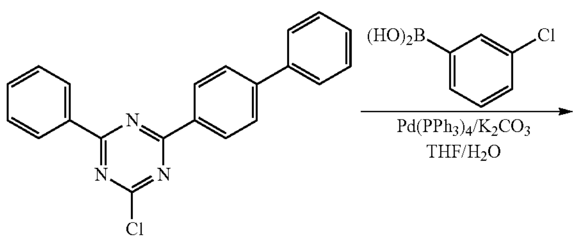

-continued

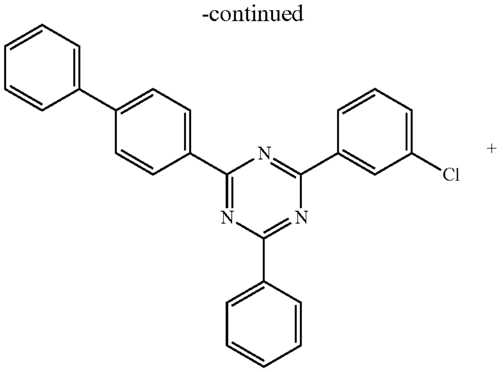

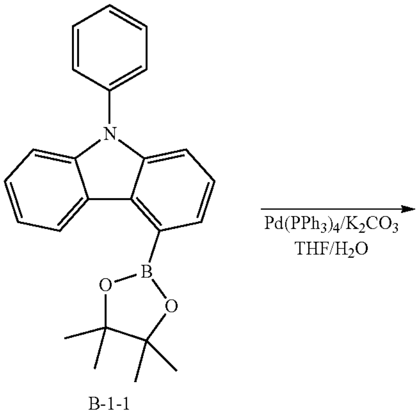

B-1-1

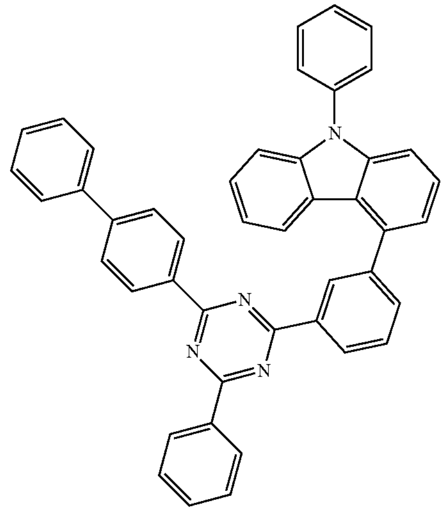

B-1

2,3-dichloronitro benzene (40 g, 209.5 mmol), phenyl boronic acid (25.6 g, 209.5 mmol), $K_2CO_3$ (57.9 g, 419 mmol), and $Pd(PPh_3)_4$ (12.1 g, 10.5 mmol) were put in a round-bottomed flask and dissolved in tetrahydrofuran (400 mL) and distilled water 1st Step: Synthesis of Intermediate B-1-1a (150 mL) and then, stirred at 80° C. for 12 hours. When a reaction was completed, an aqueous layer was removed therefrom, and the residue was treated through column chromatography to obtain Intermediate B-1-1a (39 g, Yield: 80%).

2nd Step: Synthesis of Intermediate B-1-1b

Intermediate B-1-1a (39 g, 166.9 mmol) and triphenylphosphine (218.9 g, 834.6 mmol) were put in a round-bottomed flask and dissolved in dichlorobenzene (400 mL) and then, stirred at 180° C. for 12 hours. When a reaction was completed, after removing the solvent therefrom, the obtained product was treated through chromatography to obtain Intermediate B-1-1b (28 g, Yield: 83%).

3rd Step: Synthesis of Intermediate B-1-1c

Intermediate B-1-1b (28 g, 138.9 mmol), iodobenzene (85 g, 416.6 mmol), CuI (5.3 g, 27.8 mmol), $K_2CO_3$ (28.9 g, 209.0 mmol), and 1,10-phenanthroline (5.03 g, 28.0 mmol) were put in a round-bottomed flask and dissolved in DMF (400 ml) and then, stirred at 180° C. for 12 hours. When a reaction was completed, after removing the solvent therefrom, the residue was extracted in dichloromethane, concentrated, and recrystallized with hexane to obtain Intermediate B-1-1c (30 g, Yield: 78%).

4th Step: Synthesis of Intermediate B-1-1

Intermediate B-1-1c (30 g, 91.7 mmol), bis(pinacolato) diboron (28 g, 110 mmol), Pd(dppf)$Cl_2$ (3.8 g, 4.6 mmol), tricyclohexylphosphine (0.8 g, 2.8 mmol) and potassium acetate (18 g, 183 mmol) were put in a round-bottomed flask and dissolved in DMF (400 mL) and then, stirred under reflux at 120° C. for 12 hours. When a reaction was completed, the mixture was poured into an excess of distilled water and then, stirred for 1 hour, and a solid produced therein was filtered and dissolved in dichloromethane and then, treated with $MgSO_4$ to remove moisture therefrom. Subsequently, the obtained product was silica-filtered and treated under a reduced pressure to obtain a solid, and the solid was recrystallized with EA and hexane to obtain Intermediate B-1-1 (26 g, Yield: 68%).

5th Step: Synthesis of Intermediate B-1-2

In a 1 L round-bottomed flask, 2-([1,1'-biphenyl]-4-yl)-4-chloro-6-phenyl-1,3,5-triazine (40 g, 116 mmol) was dissolved in 0.5 L of tetrahydrofuran (THF), and 3-chlorophenyl boronic acid (36 g, 209.5 mmol) and tetrakis (triphenylphosphine) palladium (12.1 g, 10.5 mmol) were added thereto and then, stirred. Then, potassium carbonate (57.9 g, 419 mmol) was added thereto and then, heated under reflux at 80° C. for 12 hours. When a reaction was completed, water was added to the reaction solution, and the mixture was extracted with dichloromethane (DCM), treated with anhydrous magnesium sulfate to remove moisture therefrom, and concentrated under a reduced pressure. The obtained reactant was separated and purified through flash column chromatography to obtain 38 g of Intermediate B-1-2.

6th Step: Synthesis of Compound B-1

In a 1 L round-bottomed flask, Intermediate B-1-1 (26 g, 62.02 mmol) was dissolved in 0.3 L of tetrahydrofuran (THF), and Intermediate B-1-2 (26 g, 62.02 mmol), tetrakis (triphenylphosphine) palladium (3.6 g, 3.1 mmol), and potassium carbonate (21.4 g, 155 mmol) were added thereto and then, heated under reflux at 80° C. for 12 hours. When a reaction was completed, water was added to the reaction solution and then, stirred for 30 minutes and filtered, a solid therefrom was dissolved in monochlorobenzene, treated with anhydrous magnesium sulfate to remove moisture, and filtered by using silica gel, and a filtrate therefrom was cooled down to ambient temperature and filtered. A solid obtained therefrom was repeatedly purified by using monochlorobenzene to obtain Compound B-1 (38.9 g, Yield: 69%).

Comparative Synthesis Example 2: Synthesis of Compound B-2

[Reaction Scheme 4]

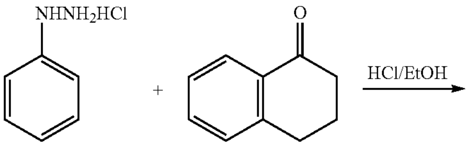

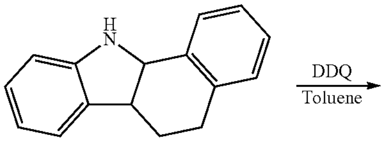

B-2-1

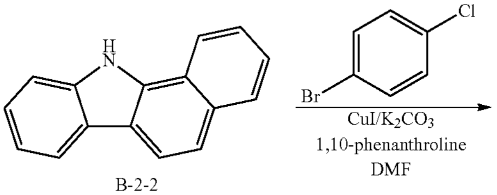

B-2-2

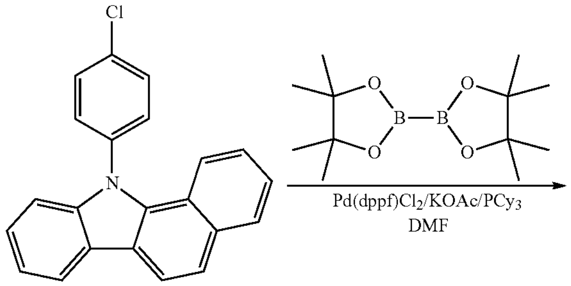

B-2-3

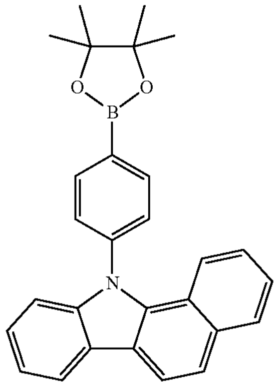

B-2-4

-continued

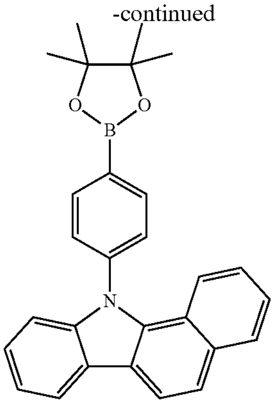

B-2-4

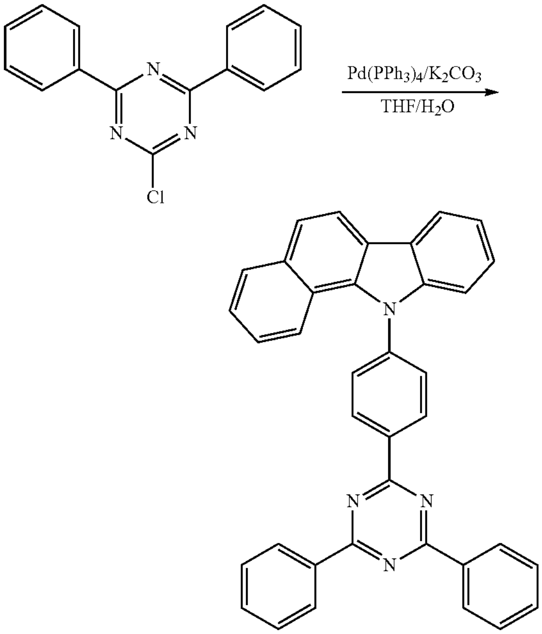

B-2

Phenylhydrazine hydrochloride (70 g, 484.1 mmol) and 3,4-dihydro-2H-naphthalen-1-one (71 g, 484.1 mmol) were put in a round bottomed flask and dissolved in ethanol (1,200 mL), and hydrochloric acid (60 mL) was slowly added thereto and then, stirred at 90° C. for 12 hours. When a reaction was completed, after removing the solvent under a reduced pressure, the residue was extracted with an excess of EA. After 1st Step: Synthesis of Intermediate B-2-1 removing an organic solvent therefrom under a reduced pressure, the obtained product was stirred in a small amount of methanol and then, filtered to obtain Intermediate B-2-1 (70 g, Yield: 65%).

2nd Step: Synthesis of Intermediate B-2-2

Intermediate B-2-1 (70 g, 316.3 mmol) and 2,3-dichloro-5,6-dicyano-1,4-benzoquinone (DDQ, 108 g, 474.5 mmol) were put in a round bottomed flask and dissolved in toluene (600 mL) and then, stirred at 80° C. for 12 hours. When a reaction was completed, after removing the reaction solvent therefrom, the residue was treated through column chromatography to obtain Intermediate B-2-2 (30 g, Yield: 44%).

3rd Step: Synthesis of Intermediate B-2-3

Intermediate B-2-2 (30 g, 138.1 mmol), 1-bromo-4-chloro-benzene (39.7 g, 207.1 mmol), CuI (2.63 g, 13.81 mmol), $K_2CO_3$ (28.6 g, 207.1 mmol), and 1,10-phenanthroline (2.49 g, 13.8 mmol) were put in a round bottomed flask and dissolved in DMF (400 mL) and then, stirred at 180° C. for 18 hours, and when a reaction was completed, after removing the reaction solvent under a reduced pressure, the residue was extracted with dichloromethane and filtered with silica gel. After the filtering, a solvent therein was concentrated, and the obtained product was recrystallized with hexane to Intermediate B-2-3 (27 g, Yield: 70%).

4th Step: Synthesis of Intermediate B-2-4

Intermediate B-2-3 (27 g, 82.4 mmol), bis(pinacolato) diboron (25.1 g, 98.8 mmol), $Pd(dppf)Cl_2$ (3.4 g, 4.1 mmol), tricyclohexylphosphine (3.5 g, 12.4 mmol), and potassium acetate (20.2 g, 206 mmol) were put in a round bottomed flask and dissolved in DMF (350 mL) and then, stirred under reflux at 120° C. for 12 hours. When a reaction was completed, the mixture was poured into an excess of distilled water and then, stirred for 1 hour, and a solid produced therein was filtered and dissolved in DCM and then, treated with $MgSO_4$ to remove moisture and filtered with silica gel. The filtered solvent was removed under a reduced pressure, and a solid therefrom was recrystallized with EA/hexane to obtain Intermediate B-53-4 (23 g, Yield: 67%).

5th Step: Synthesis of Compound B-2

In a 1 L round-bottomed flask, Intermediate B-2-4 (23 g, 54.85 mmol) was dissolved in 200 mL of tetrahydrofuran (THF), and 2-chloro-4,6-diphenyl-1,3,5-triazine (14.7 g, 54.85 mmol), tetrakis(triphenylphosphine) palladium (3.17 g, 0.05 mmol), and potassium carbonate (19 g, 138 mmol) were added thereto and then, heated under reflux at 80° C. for 12 hours. When a reaction was completed, water was added to the reaction solution and then, stirred for 30 minutes, and a solid obtained therefrom was dissolved in monochlorobenzene, treated with anhydrous magnesium sulfate to remove moisture, and filtered by using silica gel, and a filtrate therefrom was cooled down to ambient temperature and filtered. The obtained solid was repeatedly purified by using monochlorobenzene to obtain Compound B-2 (20 g, Yield: 70%).

Synthesis of Second Compound

Synthesis Example 3: Synthesis of Compound A-85

[Reaction Scheme 5]

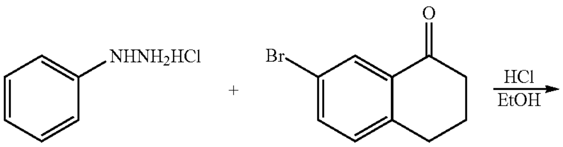

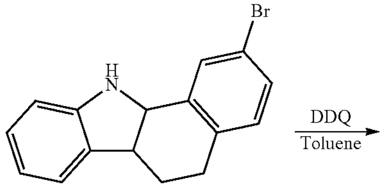

2-1a

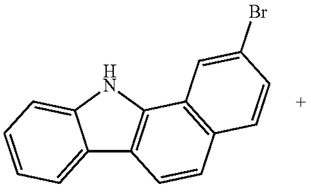

2-1b

-continued

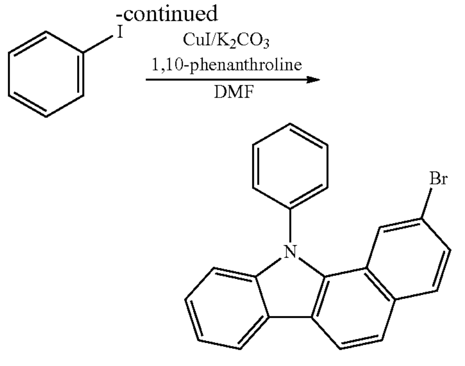

2-1c

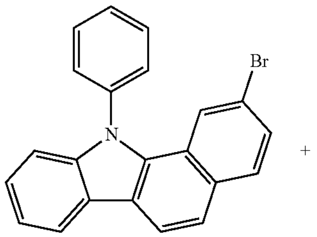

2-1c

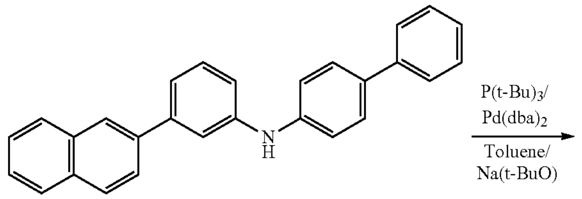

2-1d

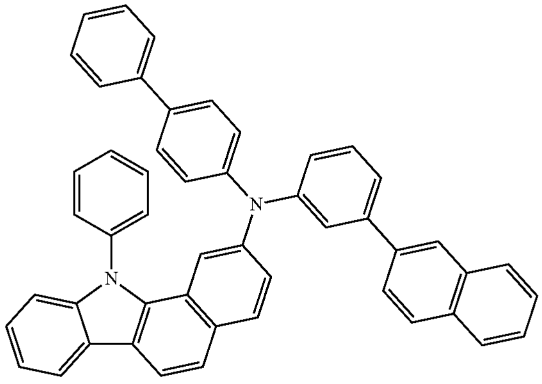

A-85

1st Step: Synthesis of Intermediate 2-1a

Phenylhydrazinehydrochloride (70.0 g, 484.1 mmol) and 7-bromo-3,4-dihydro-2H-naphthalen-1-one (108.9 g, 484.1 mmol) were put in a round bottomed flask and dissolved in ethanol (1200 ml). Subsequently, 60 mL of hydrochloric acid was slowly added thereto in a dropwise fashion at ambient temperature and then, stirred at 90° C. for 12 hours. When a reaction was completed, the solvent was removed therefrom under a reduced pressure, and the residue was extracted with an excess of EA. After removing an organic solvent therefrom under a reduced pressure, the obtained product was stirred in a small amount of methanol and then, filtered to obtain 95.2 g (66%) of Intermediate 2-1a.

2nd Step: Synthesis of Intermediate 2-1b

Intermediate 2-1a (95.2 g, 319.3 mmol) and 2,3-dichloro-5,6-dicyano-1,4-benzoquinone (108.7 g, 478.9 mmol) were put in a round-bottomed flask and dissolved in 600 ml of toluene. The solution was stirred at 80° C. for 12 hours. When a reaction was completed, after removing the reaction solvent, the residue was treated through column chromatography to obtain 41.3 g (44%) of Intermediate 2-1b.

3rd Step: Synthesis of Intermediate 2-1c

Intermediate 2-1b (41.3 g, 139.0 mmol), iodobenzene (199.2 g, 976.0 mmol), CuI (5.31 g, 28.0 mmol), $K_2CO_3$ (28.9 g, 209.0 mmol), and 1,10-phenanthroline (5.03 g, 28.0 mmol) were put in a round-bottomed flask and dissolved in 500 ml of DMF. The obtained solution was stirred at 180° C. for 12 hours. When a reaction was completed, after removing the reaction solvent under a reduced pressure, the residue was dissolved in dichloromethane and silica gel-filtered. After concentrating the dichloromethane, the obtained product was recrystallized with hexane to obtain 39.0 g (75%) of Intermediate 2-1c.

4th Step: Synthesis of Compound A-85

5.0 g (13.46 mmol) of Intermediate 2-1c, 4.41 g (13.46 mmol) of an amine intermediate 2-1d, 1.94 g (20.19 mmol) of sodium t-butoxide, and 0.54 g (1.35 mmol) of tri-tert-butylphosphine were dissolved in 100 ml of toluene, and 0.37 g (0.4 mmol) of $Pd(dba)_2$ was added thereto and then, stirred under reflux for 12 hours under a nitrogen atmosphere. When a reaction was completed, the resultant was extracted with toluene and distilled water, an organic layer therefrom was dried with anhydrous magnesium sulfate and filtered, and a filtrate therefrom was concentrated under a reduced pressure. A product therefrom was purified with n-hexane/dichloromethane (in a volume ratio of 2:1) through silica gel column to obtain 6.4 g (Yield: 82.0%) of Compound A-85.

Synthesis Example 4: Synthesis of Compound 2-92

[Reaction Scheme 6]

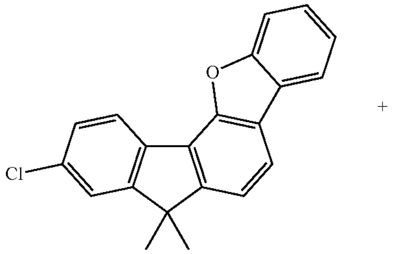

2-92a

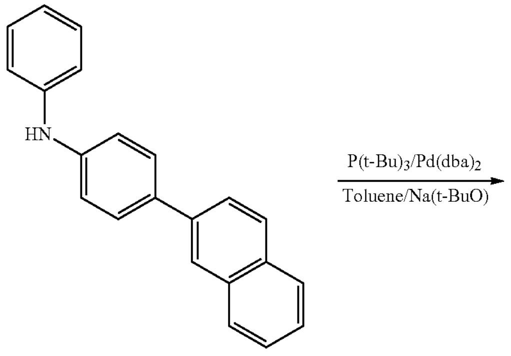

2-92b

-continued

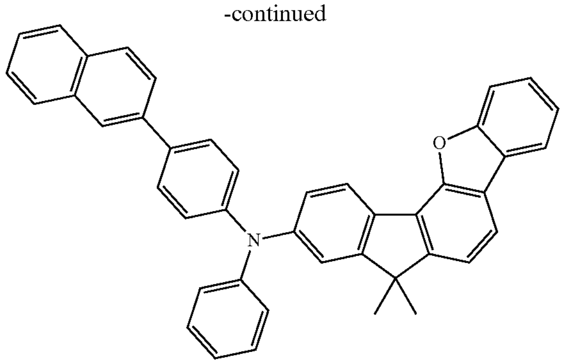

2-92

$1^{st}$ Step: Synthesis of Intermediate 2-92a

Intermediate 2-92a was synthesized as described in KR10-1423173 B1.

$2^{nd}$ Step: Synthesis of Compound 2-92

5.0 g (16.93 mmol) of Intermediate 2-92a, 5.4 g (16.93 mmol) of an amine intermediate 2-92b, 2.44 g (25.39 mmol) of sodium t-butoxide, and 0.68 g (1.69 mmol) of tri-tert-butylphosphine were dissolved in 100 ml of toluene, and 0.47 g (0.51 mmol) of $Pd(dba)_2$ was added thereto and then, stirred under reflux for 12 hours under a nitrogen atmosphere. When a reaction was completed, the resultant was extracted with toluene and distilled water, an organic layer therefrom was dried with anhydrous magnesium sulfate and filtered, and a filtrate therefrom was concentrated under a reduced pressure. A product therefrom was purified with n-hexane/dichloromethane (in a volume ratio of 2:1) through silica gel column chromatography to obtain 8.2 g (Yield: 84.0%) of Compound 2-92.

(Manufacture of Organic Light Emitting Diode)

Example 1

ITO/Compound A (1% NDP-9 doping, 1,400 Å)/Compound B (600 Å)/EML [98 wt % of host (Compound 1 50%: Compound A-85 50%=50:50): 2 wt % of [$Ir(piq)_2acac$]] (400 Å)/Compound C (50 Å)/Compound D: Liq (300 Å)/LiQ (15 Å)/Al (1,200 Å).

Compound A: N-(biphenyl-4-yl)-9,9-dimethyl-N-(4-(9-phenyl-9H-carbazol-3-yl)phenyl)-9H-fluoren-2-amine Compound B: N,N-di([1,1'-biphenyl]-4-yl)-7,7-dimethyl-7H-fluoreno [4,3-b]benzofuran-10-amine Compound C: 2-(3-(3-(9,9-dimethyl-9H-fluoren-2-yl) phenyl)phenyl)-4,6-diphenyl-1,3,5-triazine Compound D: 8-(4-(4,6-di(naphthalen-2-yl)-1,3,5-triazin-2-yl)phenyl) quinoline

Examples 2 to 4 and Comparative Examples 1 and 2

Diodes of Examples 2 to 4 and Comparative Examples 1 and 2 were manufactured in the same manner as in Example 1, except that the host was changed as described in Table 1.

Evaluation: Increase Effect of Life-Span

Life-span characteristics of the organic light emitting diodes according to Examples 1 to 4 and Comparative Examples 1 and 2 were evaluated. Specific measuring methods are as follows, and the results are shown in Table 1.

(1) Measurement of Life-Span

T90 life-spans of the diodes according to Examples 1 to 4, and Comparative Examples 1 and 2 were measured as a time when their luminance decreased down to 90% relative to the initial luminance (cd/$m^2$) after emitting light with 24,000 cd/$m^2$ as the initial luminance (cd/$m^2$) and measuring their luminance decreases depending on a time with a Polanonix life-span measurement system.

(2) Calculation of T90 Life-Span Ratio (%)

T90 life-span ratios based on the T90 life-span of Comparative Example 1 were evaluated.

TABLE 1

| | First host | Second host | First host:Second host (wt:wt) | Dopant ratio (wt %) | T90 life-span ratio (%) | Color coordinate (CIEx) |
|---|---|---|---|---|---|---|
| Example 1 | 1 | A-85 | 50:50 | 2 | 180 | 0.682 |
| Example 2 | 1 | 2-92 | 50:50 | 2 | 160 | 0.683 |
| Example 3 | 2 | A-85 | 50:50 | 2 | 200 | 0.683 |
| Example 4 | 2 | 2-92 | 50:50 | 2 | 180 | 0.684 |
| Comparative Example 1 | B-1 | A-85 | 50:50 | 2 | 100 | 0.680 |
| Comparative Example 2 | B-2 | A-85 | 50:50 | 2 | 50 | 0.680 |

Referring to Table 1, the composition according to the Examples had a significantly improved life-span compared with the composition according to the Comparative Examples. In an implementation, when a compound in which triazine is bound at a specific position of the fused benzocarbazole is applied to a composition as a first compound, a stable charge balance may be obtained, so that the emission wavelength of the dopant may become relatively long.

One or more embodiments may provide a composition for an organic optoelectronic device capable of implementing an organic optoelectronic device having high efficiency and a long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for an organic optoelectronic device, the composition comprising:

a first compound represented by Chemical Formula 1, and a second compound represented by Chemical Formula 2:

[Chemical Formula 1]

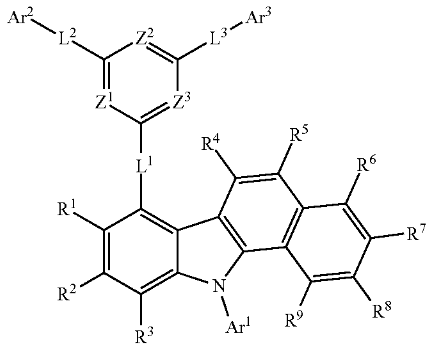

wherein:

in Chemical Formula 1, $Z^1$ to $Z^3$ are each independently N or $CR^a$, at least two of $Z^1$ to $Z^3$ being N, $R^a$ and $R^1$ to $R^9$ are each independently hydrogen, deuterium, a substituted or unsubstituted C1 to C30 alkyl group, a substituted or unsubstituted C6 to C30 aryl group, or a substituted or unsubstituted C2 to C30 heterocyclic group, $L^1$ is a single bond or a substituted or unsubstituted phenylene group, $L^2$ and $L^3$ are each independently a single bond, a substituted or unsubstituted phenylene group, a substituted or unsubstituted biphenylene group, a substituted or unsubstituted terphenylene group, or a substituted or unsubstituted naphthylene group, $Ar^1$ is a substituted or unsubstituted C6 to C30 aryl group, and $Ar^2$ and $Ar^3$ are each independently a substituted or unsubstituted phenyl group, a substituted or unsubstituted biphenyl group, a substituted or unsubstituted naphthyl group, a substituted or unsubstituted terphenyl group, a substituted or unsubstituted dibenzofuranyl group, a substituted or unsubstituted dibenzothiophenyl group, a substituted or unsubstituted dibenzosilolyl group, a substituted or unsubstituted benzonaphthofuranyl group, or a substituted or unsubstituted benzonaphthothiophenyl group;

[Chemical Formula 2]

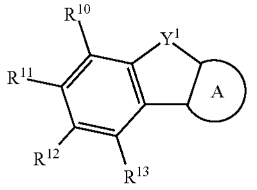

in Chemical Formula 2, $Y^1$ is O, S, or N—$R^b$, $R^b$ and $R^{10}$ to $R^{13}$ are each independently hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, and A is a ring of Group I or Group II,

[Group I]

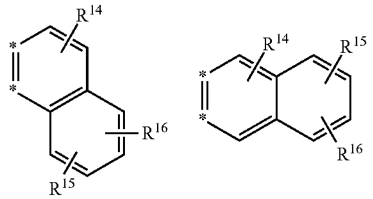

[Group II]

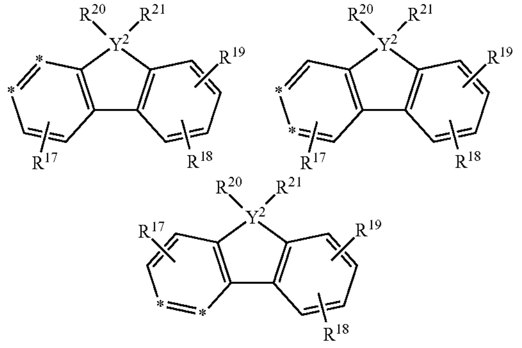

in Group I and Group II, each * is a linking carbon, $Y^2$ is C or Si, $R^{14}$ to $R^{19}$ are each independently hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, $R^{20}$ and $R^{21}$ are each independently a substituted or unsubstituted C1 to C30 alkyl group, or a substituted or unsubstituted C6 to C30 aryl group, and in Chemical Formula 2 and Groups I and II, at least one of $R^{10}$ to $R^{19}$ is a group represented by Chemical Formula a,

[Chemical Formula a]

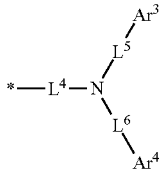

in Chemical Formula a, $L^4$ to $L^6$ are each independently a single bond or a substituted or unsubstituted C6 to C30 arylene group, $Ar^3$ and $Ar^4$ are each independently a substituted or unsubstituted amine group, a substituted or unsubstituted C6 to C30 aryl group, or a substituted or unsubstituted C2 to C30 heterocyclic group, and

* is a linking point; and

"substituted" refers to replacement of at least one hydrogen of a substituent or a compound by deuterium, a C1 to C5 alkyl group, a C6 to C18 aryl group, a cyano group, or a combination thereof.
2. The composition as claimed in claim 1, wherein: moieties *-$L^2$-$Ar^2$ and *-$L^3$-$Ar^3$ in Chemical Formula 1 are each independently a moiety of Group X:
[Group X]
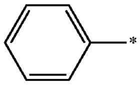
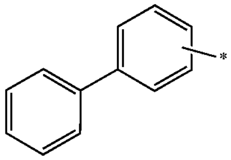
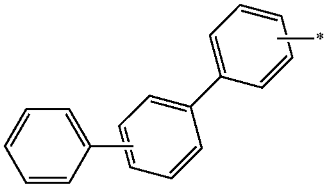
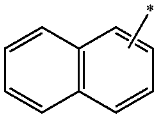
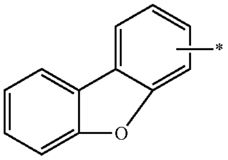
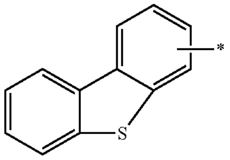
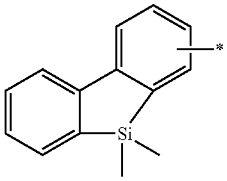
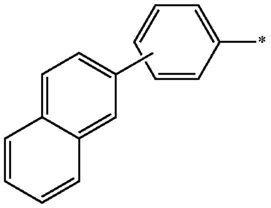
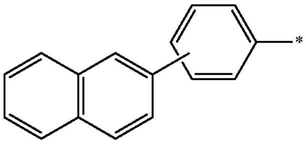
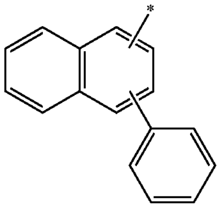
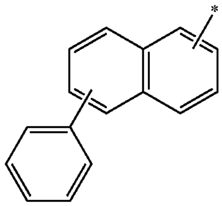
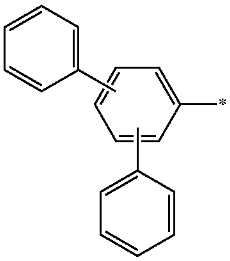
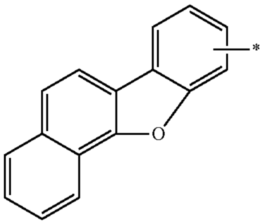
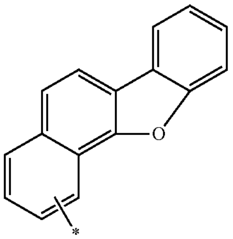
-continued
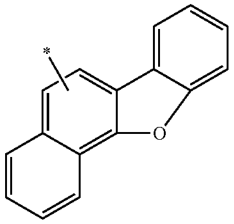
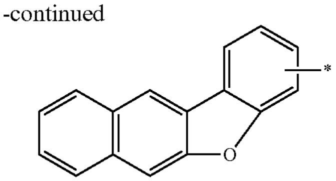
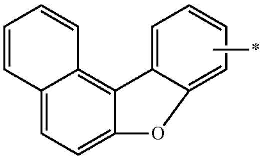
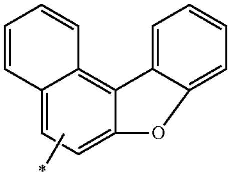
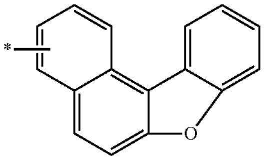
in Group X, * is a linking point.
3. The composition as claimed in claim 1, wherein the first compound is a compound of Group 1:
[Group 1]
[1]
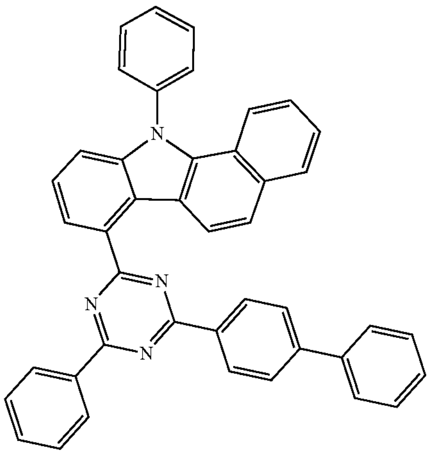
[2]
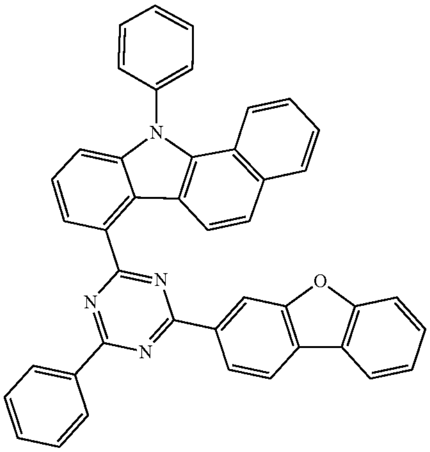

-continued
[3]
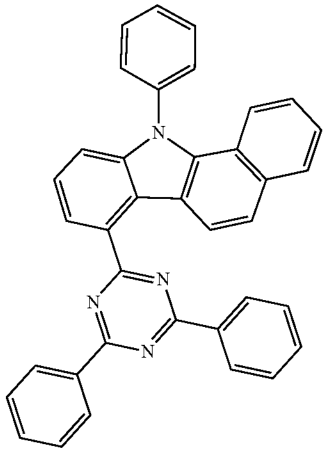
[4]
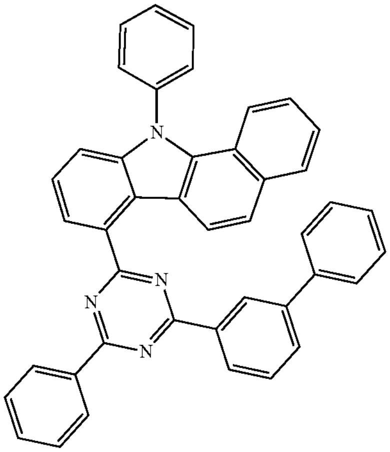
[5]
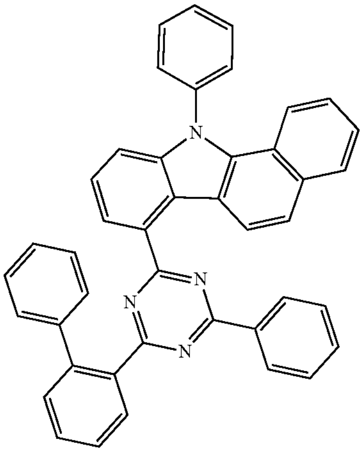
-continued
[6]
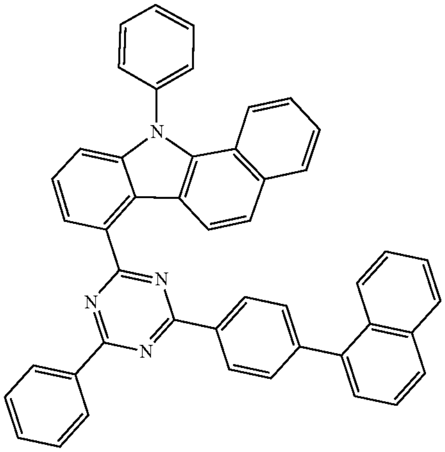
[7]
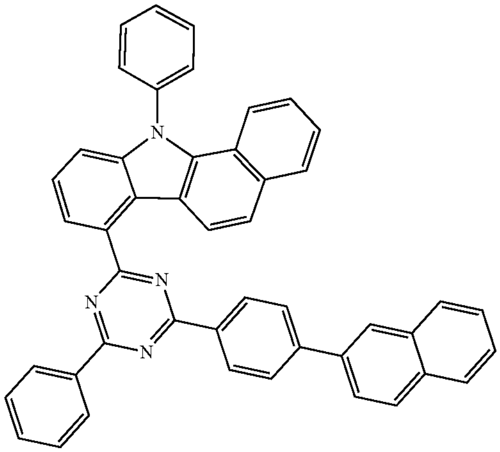
[8]
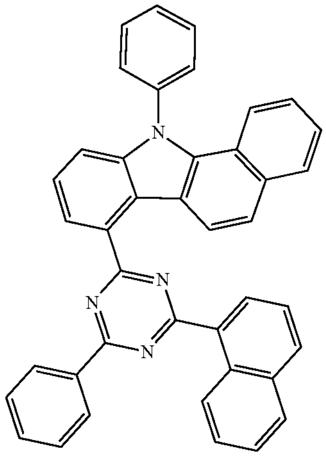

-continued
[9]
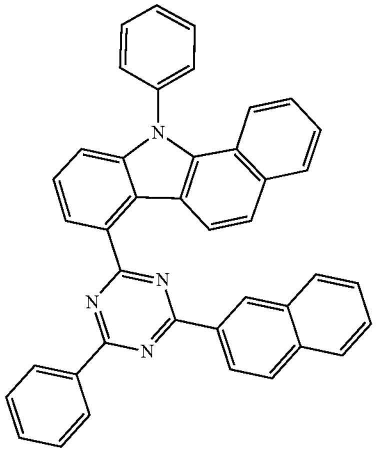
[10]
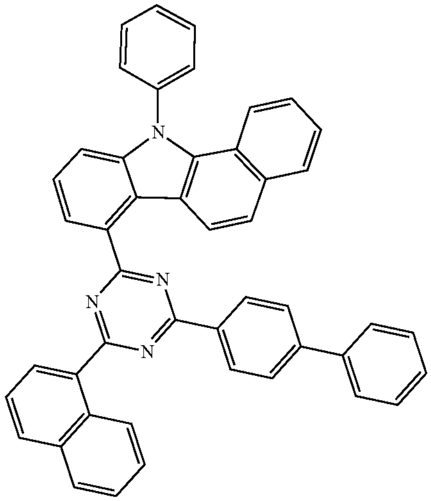
[11]
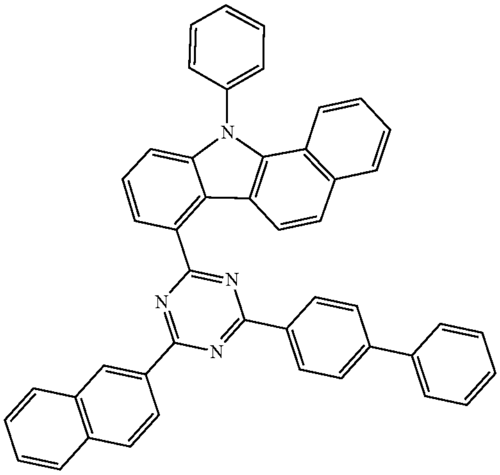
-continued
[12]
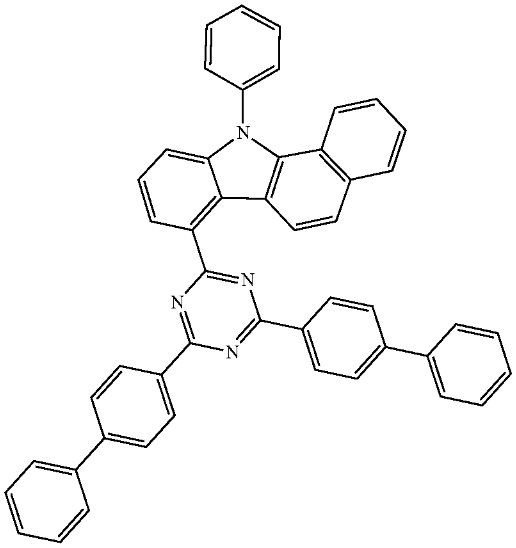
[13]
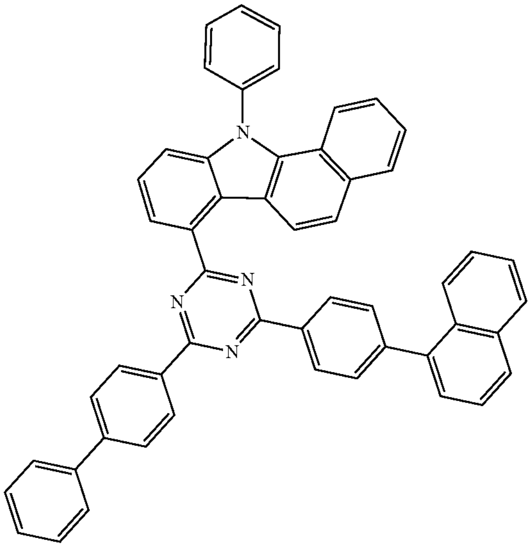
[14]
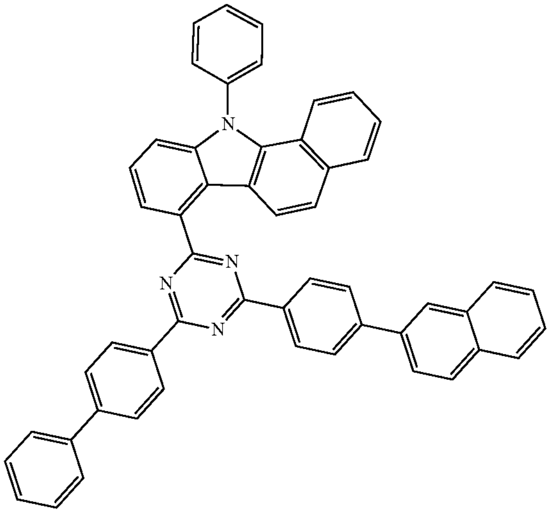

-continued
[15]
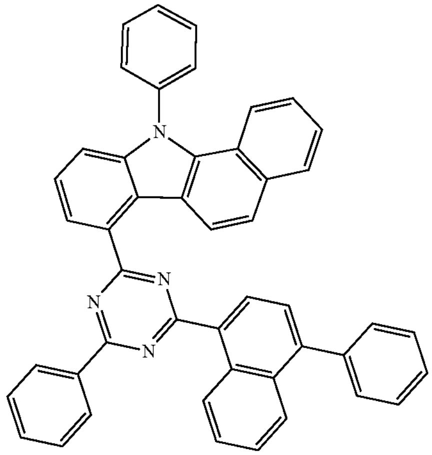
[16]
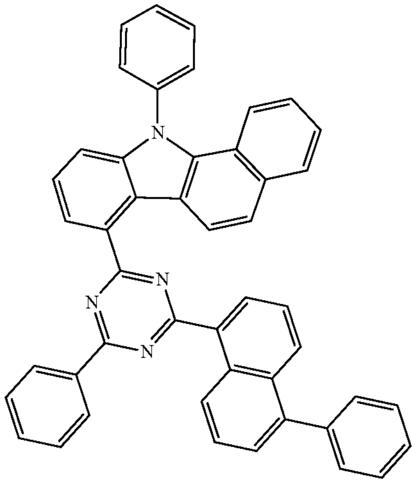
[17]
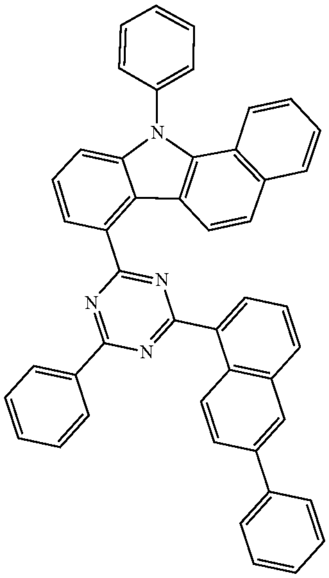
-continued
[18]
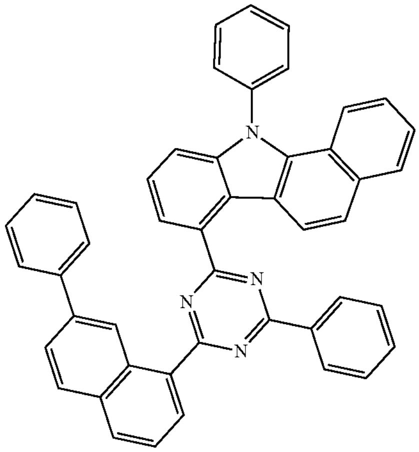
[19]
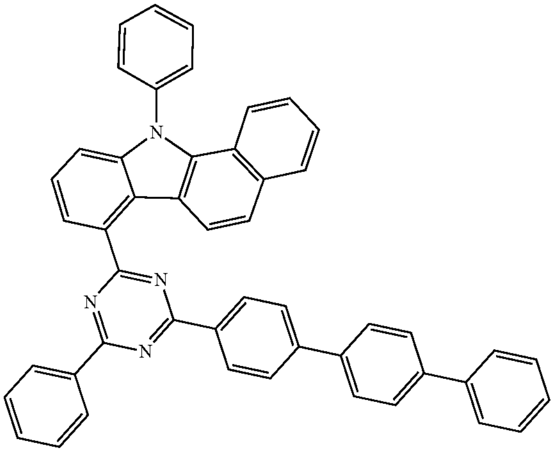
[20]
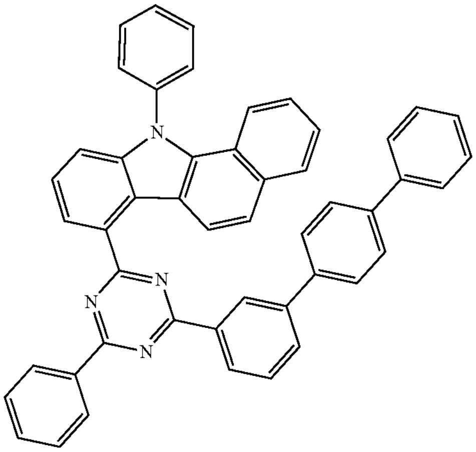

-continued
[21]
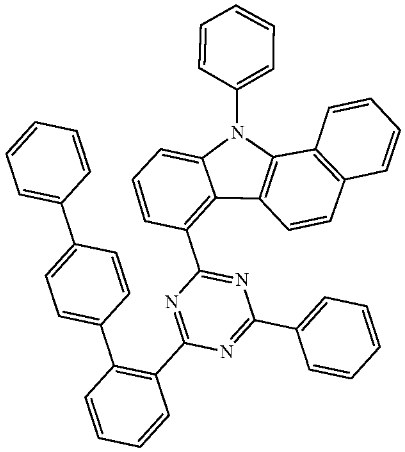
[22]
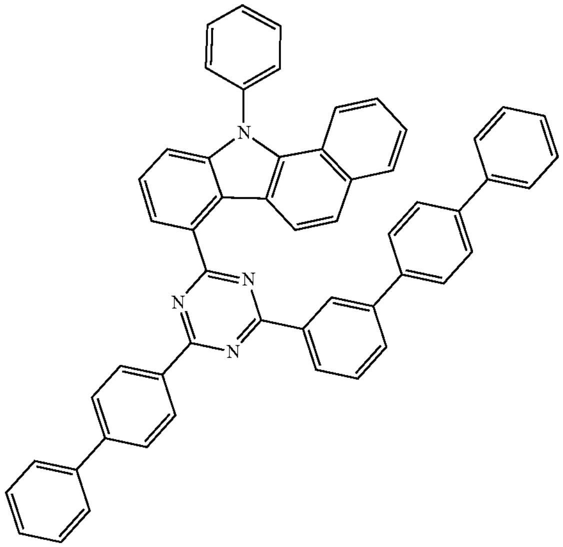
[23]
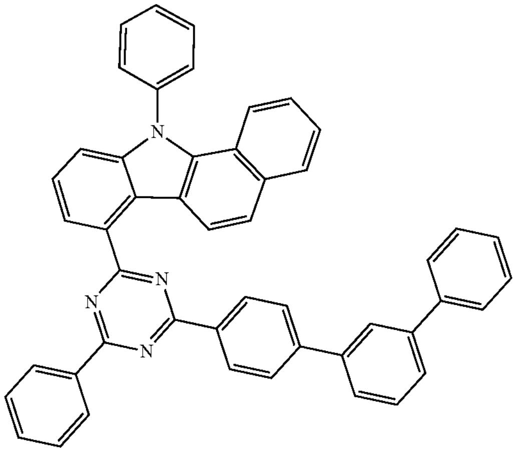
-continued
[24]
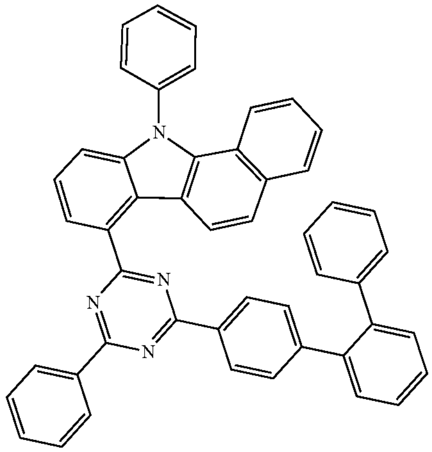
[25]
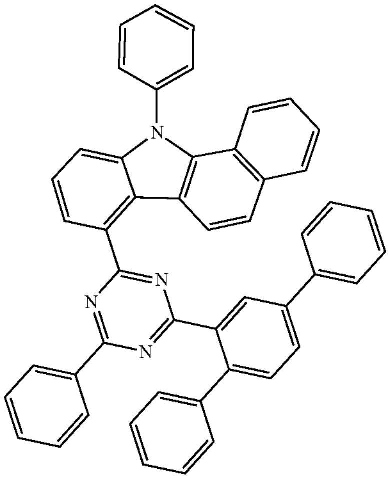
[26]
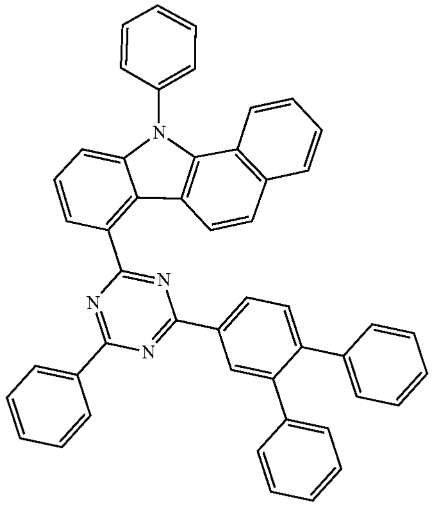

-continued
[27]
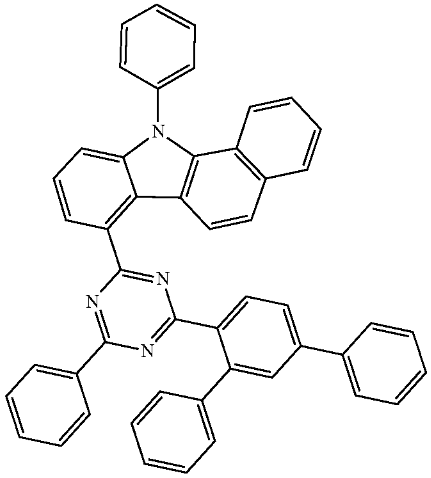
[28]
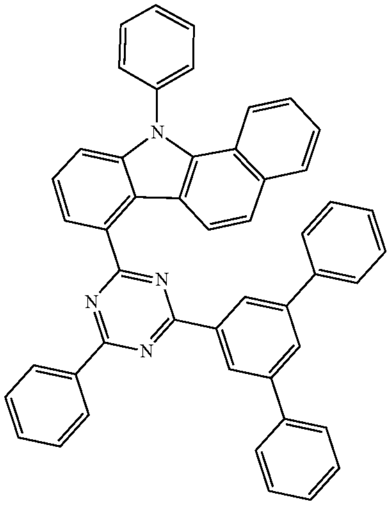
[29]
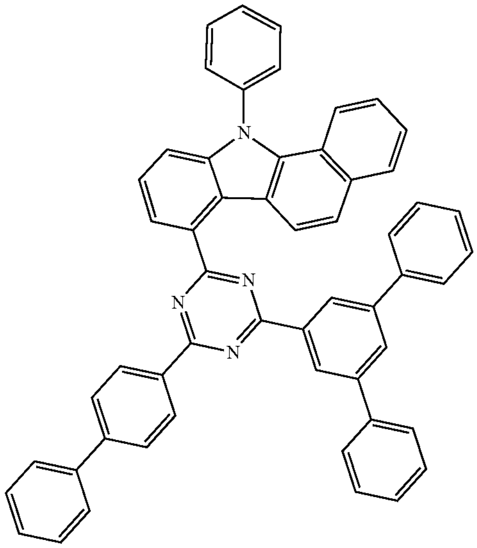
-continued
[30]
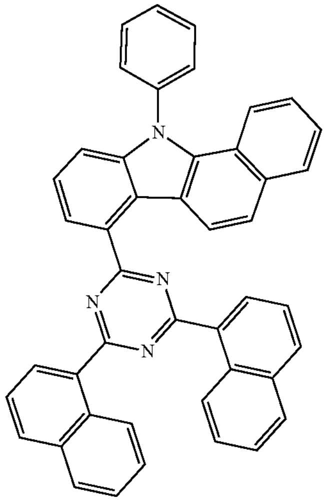
[31]
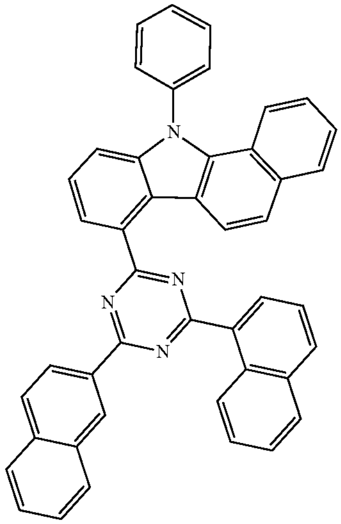
[32]
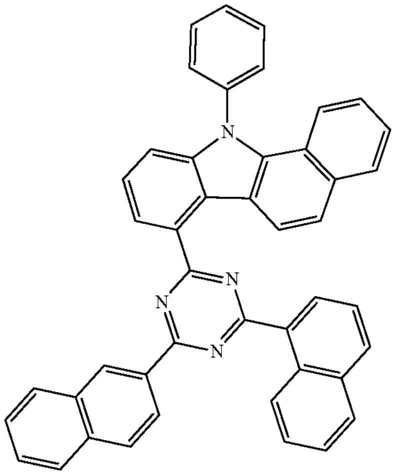

-continued
[33]
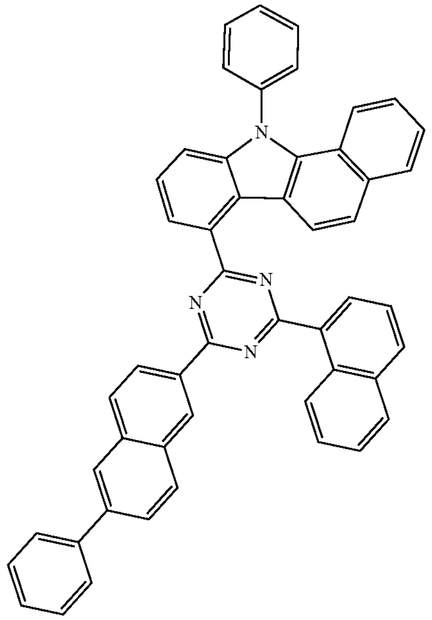
[34]
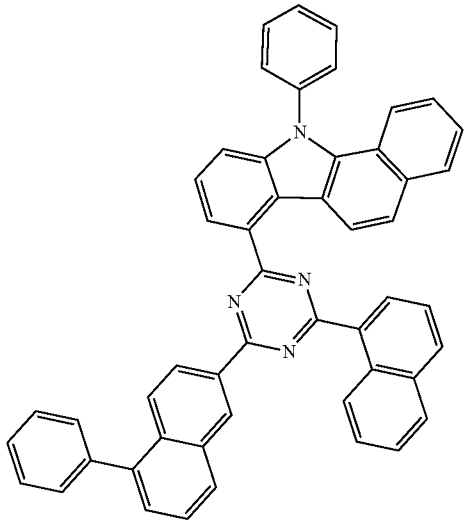
[35]
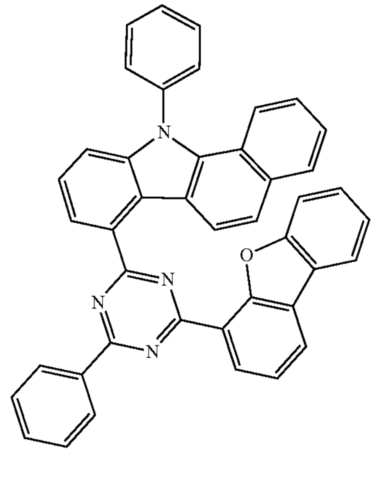
-continued
[36]
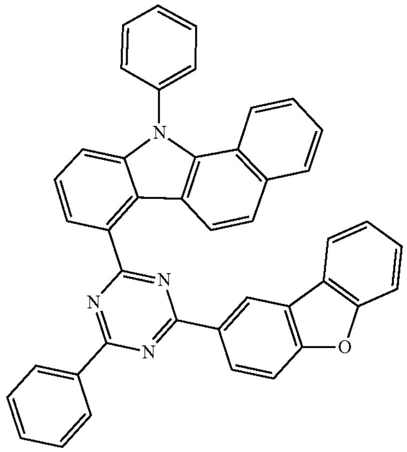
[37]
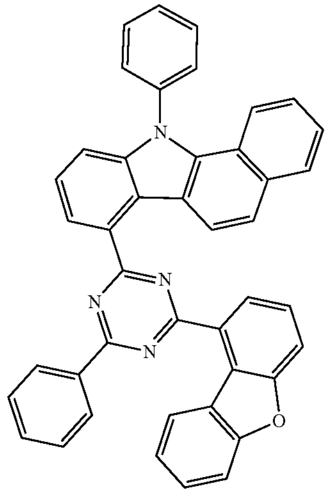
[38]
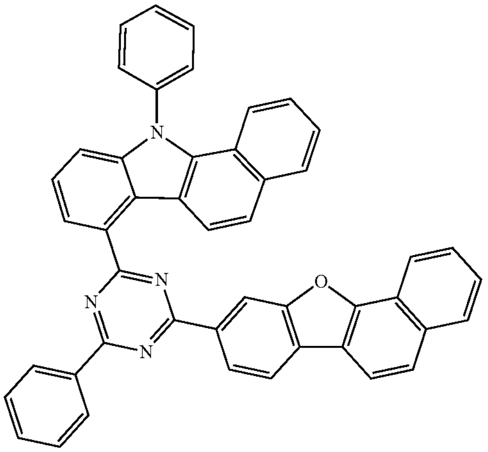

-continued
[39]
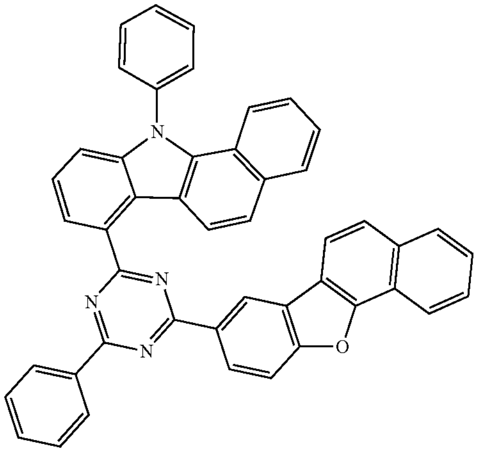
[40]
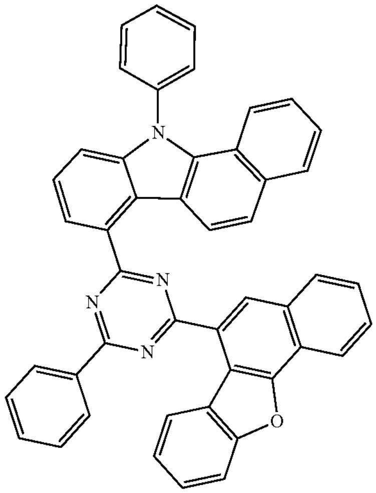
[41]
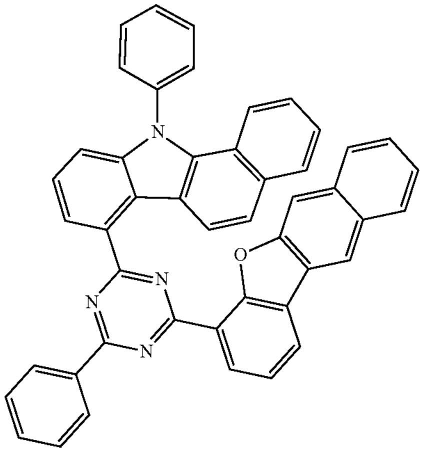
-continued
[42]
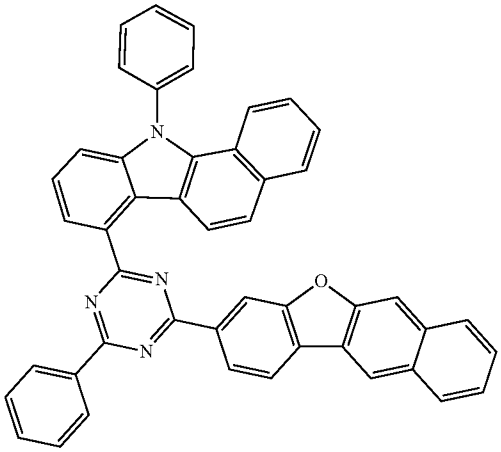
[43]
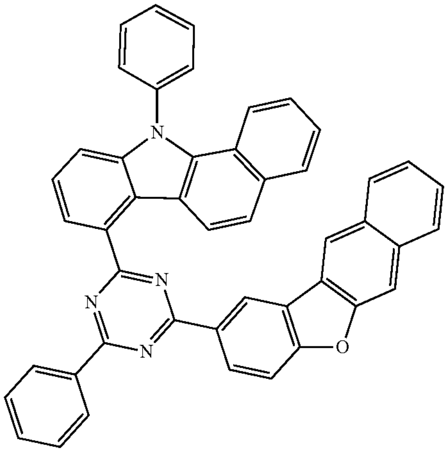
[44]
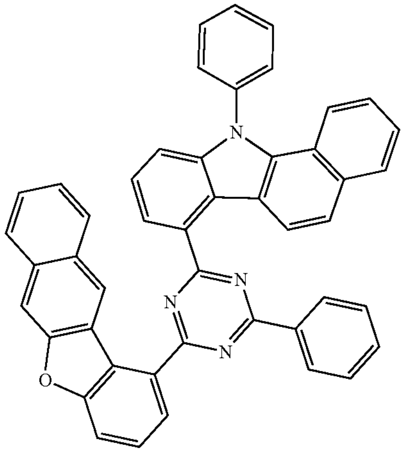

[45]
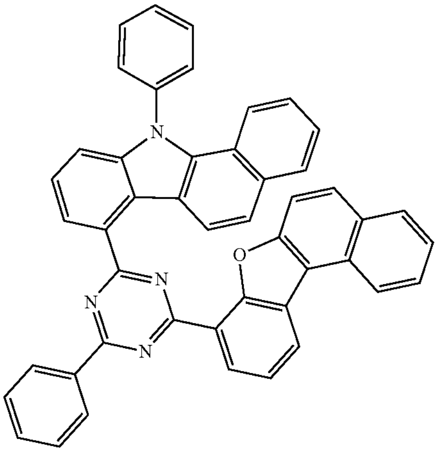
[46]
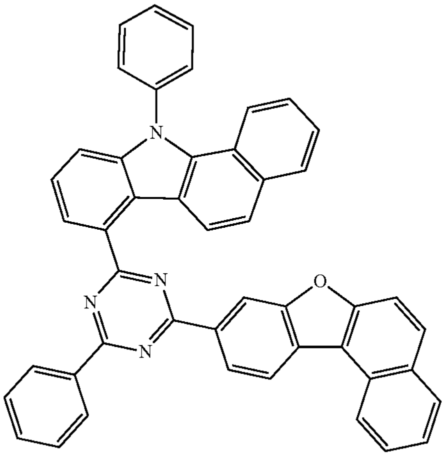
[47]
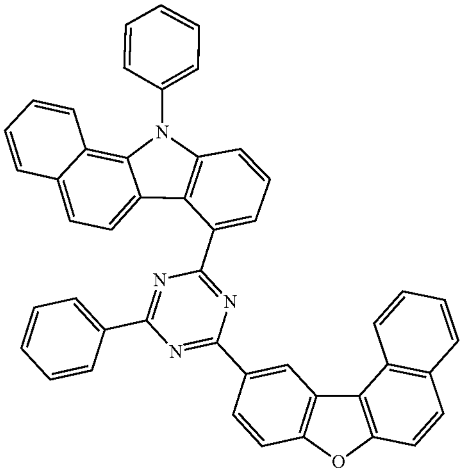
[48]
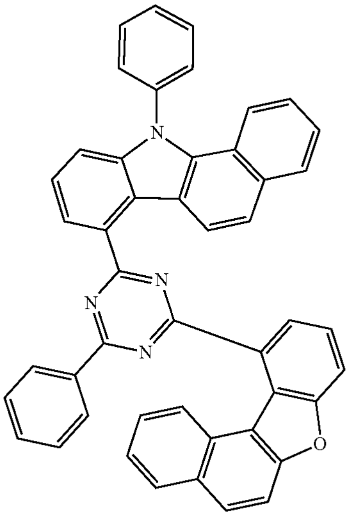
[49]
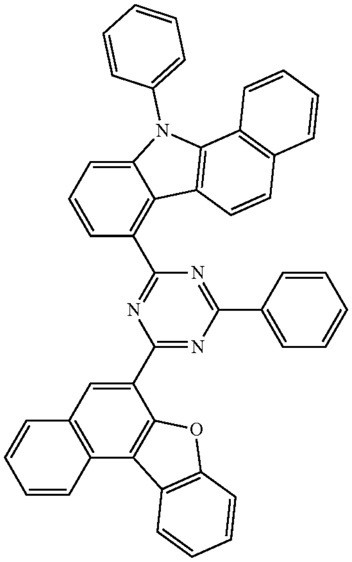
[50]
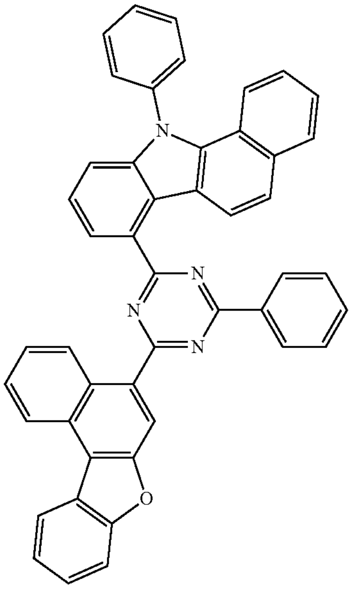

-continued

[51]

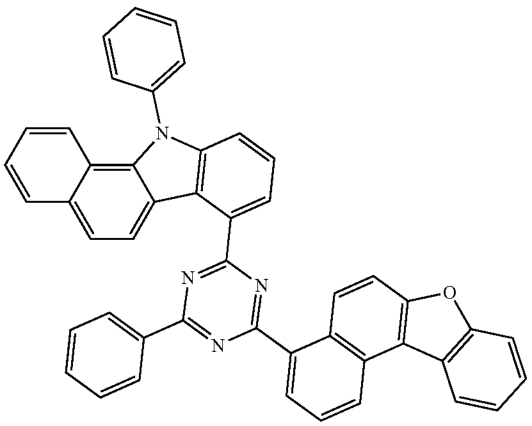

[52]

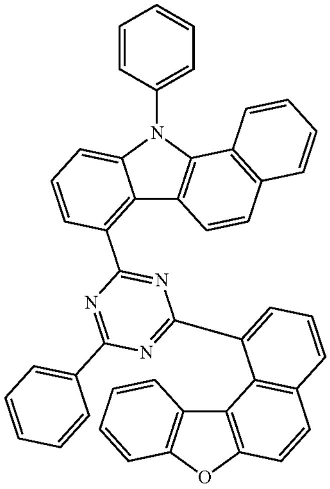

.

4. The composition as claimed in claim 1, wherein:

the second compound is represented by one of Chemical Formula 2I-A to Chemical Formula 2I-F:

[Chemical Formula 2I-A]

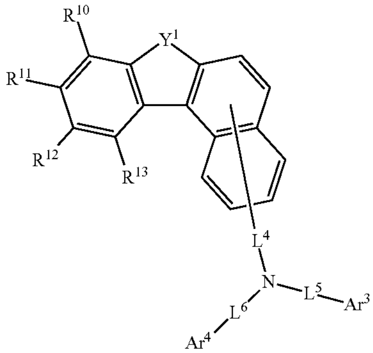

-continued

[Chemical Formula 2I-B]

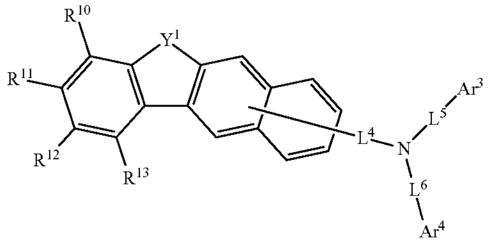

[Chemical Formula 2I-C]

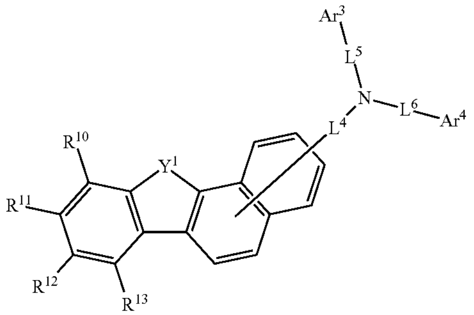

[Chemical Formula 2I-D]

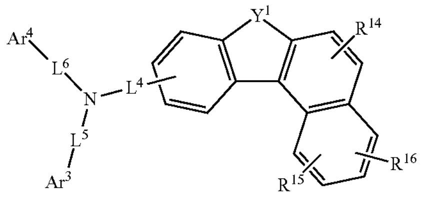

[Chemical Formula 2I-E]

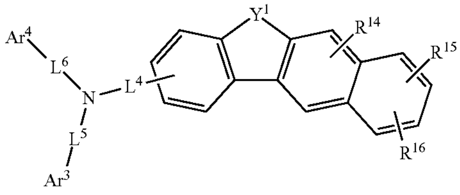

[Chemical Formula 2I-F]

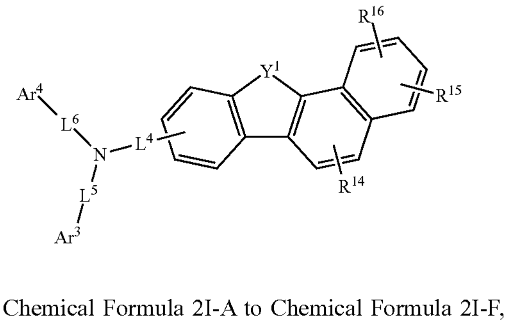

in Chemical Formula 2I-A to Chemical Formula 2I-F, $Y^1$ is O, S, or N—Rh, $R^b$ and $R^{10}$ to $R^{16}$ are each independently hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, $L^4$ to $L^6$ are each independently a single bond or a substituted or unsubstituted C6 to C30 arylene group, and $Ar^3$ and $Ar^4$ are each independently a substituted or unsubstituted amine group, a substituted or unsubstituted C6 to C30 aryl group, or a substituted or unsubstituted C2 to C30 heterocyclic group.

5. The composition as claimed in claim 4, wherein the second compound is represented by one of Chemical Formula 2I-A-1 to Chemical Formula 2I-A-6, Chemical Formula 2I-B-1 to Chemical Formula 2I-B-6, Chemical Formula 2I-C-1 to Chemical Formula 2I-C-6, Chemical Formula 2I-D-1 to Chemical Formula 2I-D-4, Chemical Formula 2I-E-1 to Chemical Formula 2I-E-4, or Chemical Formula 2I-F-1 to Chemical Formula 2I-F-4:

[Chemical Formula 2I-A-1]

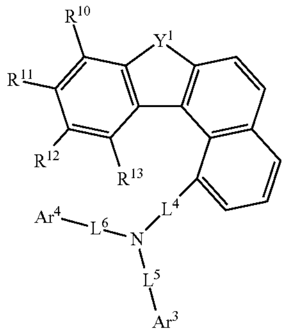

[Chemical Formula 2I-A-2]

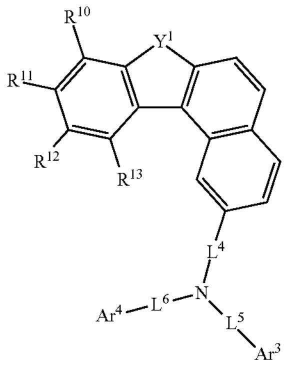

[Chemical Formula 2I-A-3]

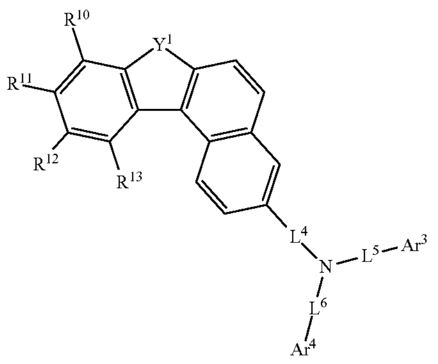

-continued

[Chemical Formula 2I-A-4]

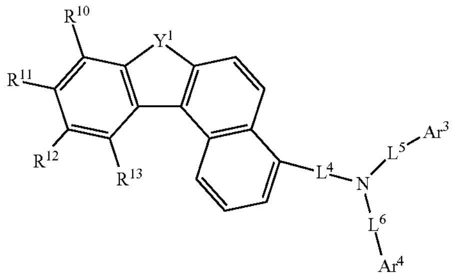

[Chemical Formula 2I-A-5]

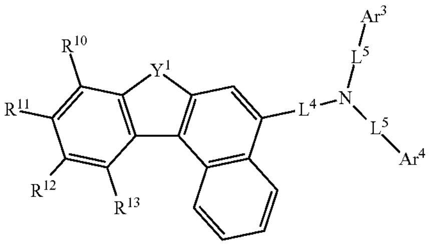

[Chemical Formula 2I-A-6]

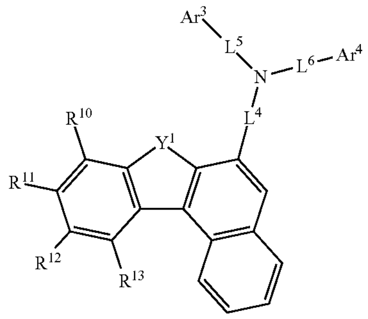

[Chemical Formula 2I-B-1]

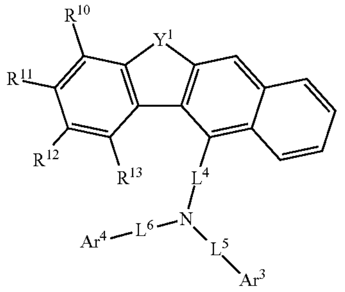

[Chemical Formula 2I-B-2]

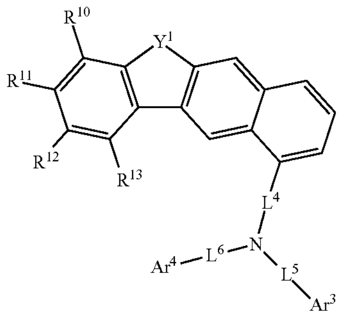

-continued
[Chemical Formula 2I-B-3]
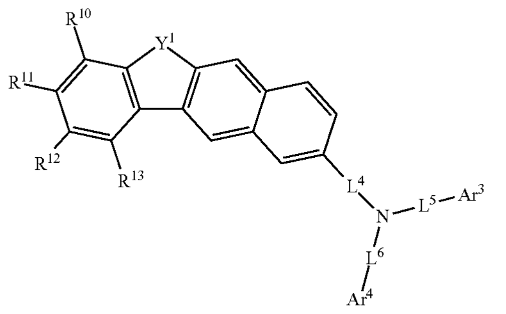
[Chemical Formula 2I-B-4]
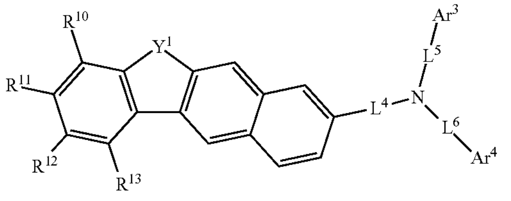
[Chemical Formula 2I-B-5]
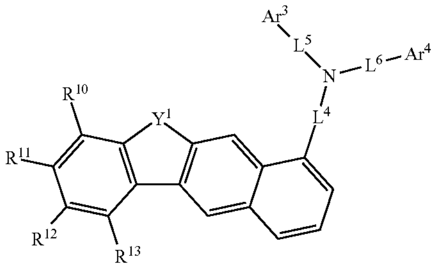
[Chemical Formula 2I-B-6]
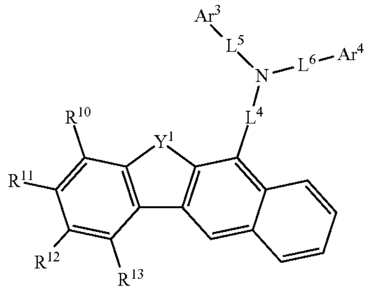
[Chemical Formula 2I-C-1]
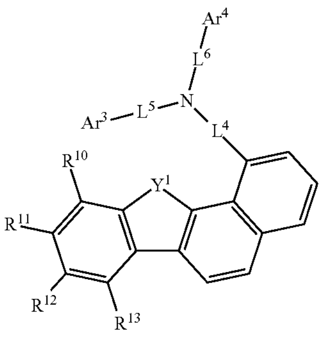
-continued
[Chemical Formula 2I-C-2]
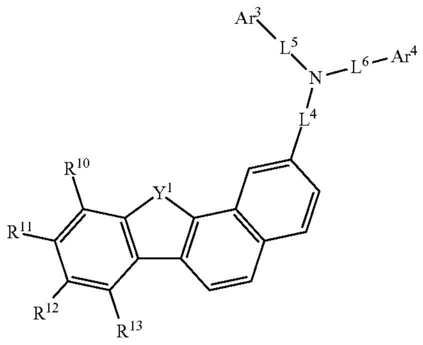
[Chemical Formula 2I-C-3]
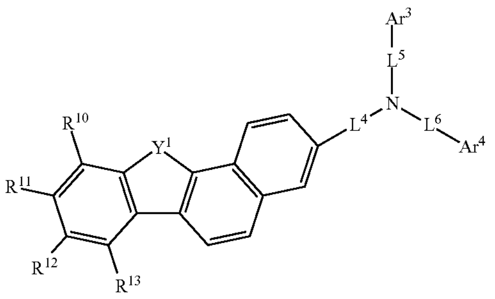
[Chemical Formula 2I-C-4]
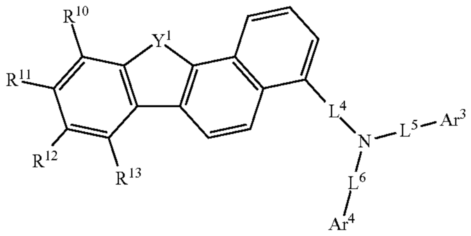
[Chemical Formula 2I-C-5]
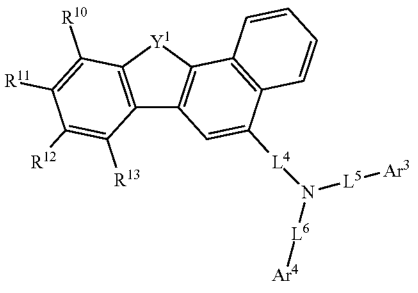
[Chemical Formula 2I-C-6]
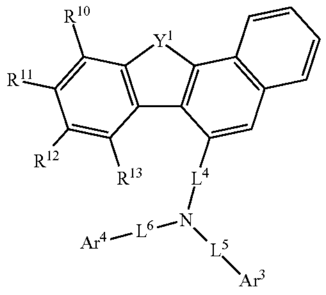

-continued
[Chemical Formula 2I-D-1]
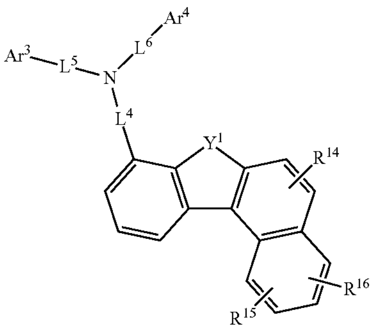
[Chemical Formula 2I-D-2]
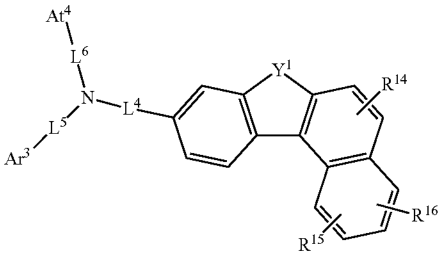
[Chemical Formu;a 2I-D-3]
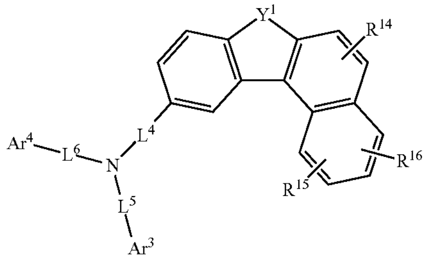
[Chemical Formula 2I-D-4]
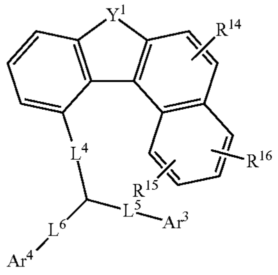
[Chemical Formula 2I-E-1]
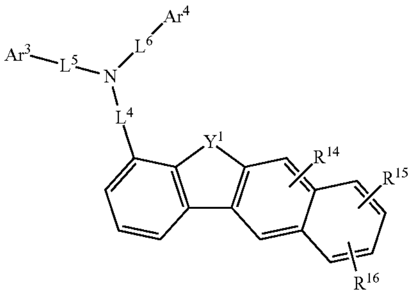
-continued
[Chemical Formula 2I-E-2]
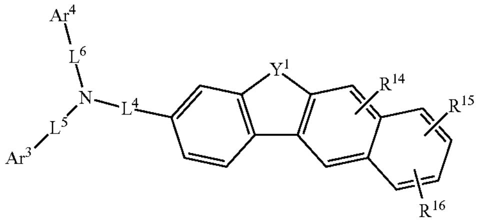
[Chemical Formula 2I-E-3]
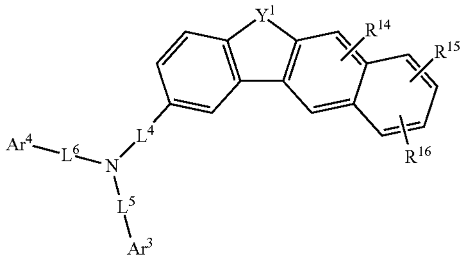
[Chemical Formula 2I-E-4]
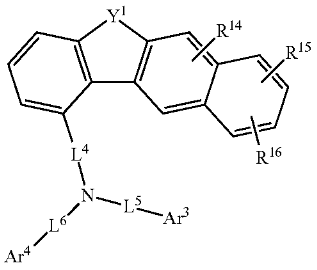
[Chemical Formula 2I-F-1]
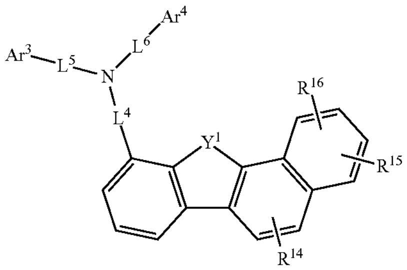
[Chemical Formula 2I-F-2]
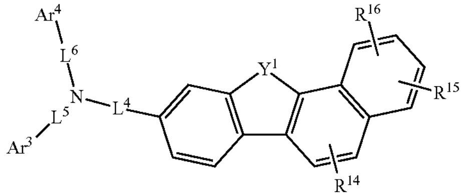

-continued

[Chemical Formula 2I-F-3]

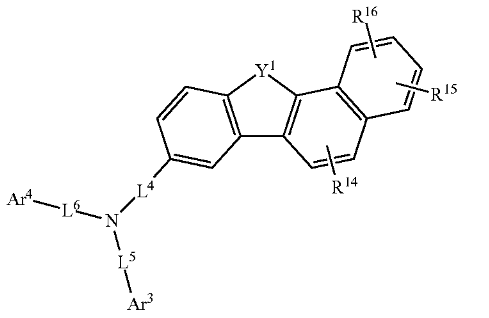

[Chemical Formula 2I-F-4]

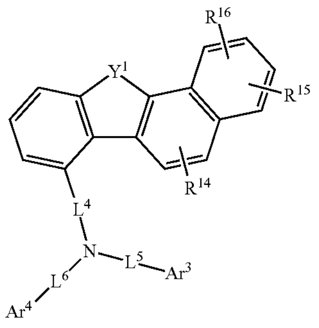

in Chemical Formula 2I-A-1 to Chemical Formula 2I-A-6, Chemical Formula 2I-B-1 to Chemical Formula 2I-B-6, Chemical Formula 2I-C-1 to Chemical Formula 2I-C-6, Chemical Formula 2I-D-1 to Chemical Formula 2I-D-4, Chemical Formula 2I-E-1 to Chemical Formula 2I-E-4, and Chemical Formula 2I-F-1 to Chemical Formula 2I-F-4, $Y^1$, $L^4$ to $L^6$, $Ar^3$, $Ar^4$, and $R^{10}$ to $R^{16}$ are defined same as those of Chemical Formula 2I-A to Chemical Formula 2I-F.

6. The composition as claimed in claim 4, wherein, in Chemical Formula 2I-A to Chemical Formula 2I-F:

$Y^1$ is N—$R^b$, $R^b$ is a substituted or unsubstituted phenyl group, a substituted or unsubstituted biphenyl group, or a substituted or unsubstituted naphthyl group, $R^{10}$ to $R^{16}$ are each independently hydrogen, deuterium, a substituted or unsubstituted C1 to C10 alkyl group, or a substituted or unsubstituted C6 to C12 aryl group, $L^4$ is a single bond, a substituted or unsubstituted phenylene group, or a substituted or unsubstituted naphthylene group, $L^5$ and $L^6$ are each independently a single bond, a substituted or unsubstituted phenylene group, or a substituted or unsubstituted biphenylene group, and $Ar^3$ and $Ar^4$ are each independently a substituted or unsubstituted amine group, a substituted or unsubstituted phenyl group, a substituted or unsubstituted biphenyl group, a substituted or unsubstituted naphthyl group, a substituted or unsubstituted terphenyl group, a substituted or unsubstituted anthracenyl group, a substituted or unsubstituted phenanthrenyl group, or a substituted or unsubstituted triphenylene group.

7. The composition as claimed in claim 1, wherein the second compound is represented by one of Chemical Formula 2II-A to Chemical Formula 2II-L:

[Chemical Formula 2II-A]

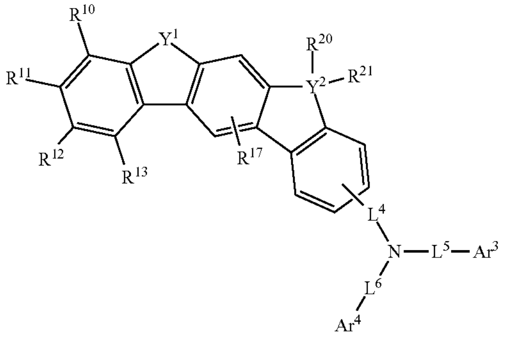

[Chemical Formula 2II-B]

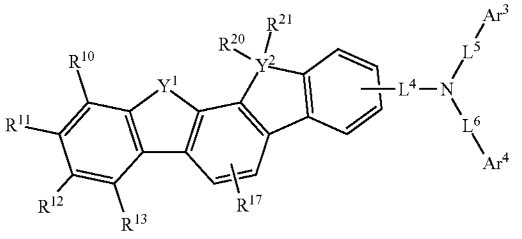

[Chemical Formula 2II-C]

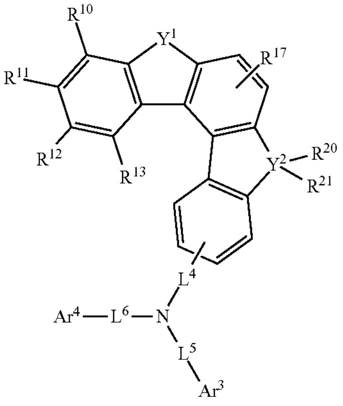

[Chemical Formula 2II-D]

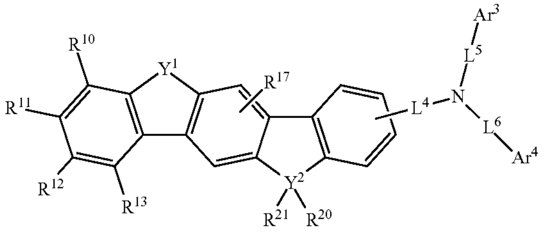

-continued

[Chemical Formula 2II-E]

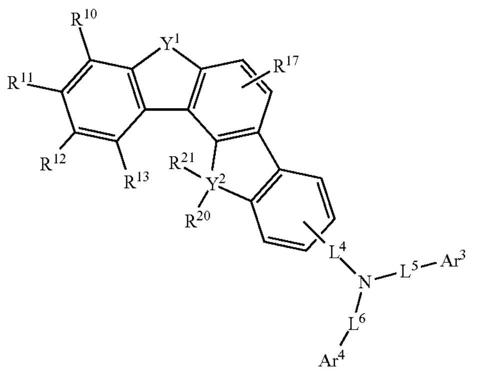

[Chemical Formula 2II-F]

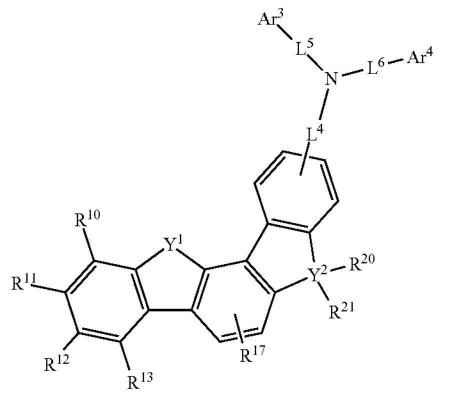

[Chemical Formula 2II-G]

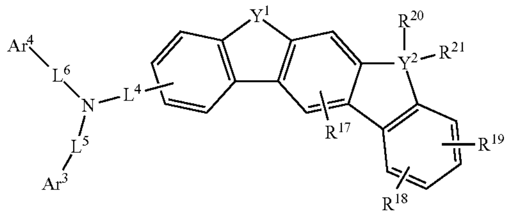

[Chemical Formula 2II-H]

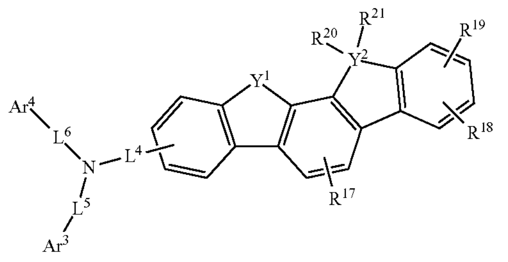

[Chemical Formula 2II-I]

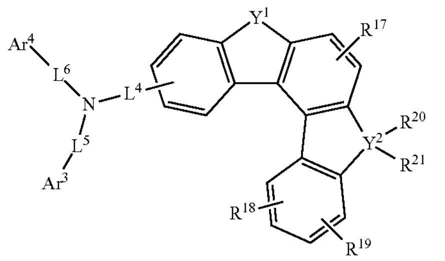

-continued

[Chemical Formula 1II-J]

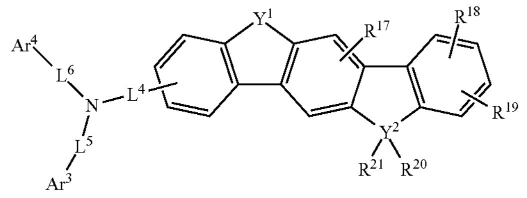

[Chemical Formula 2II-K]

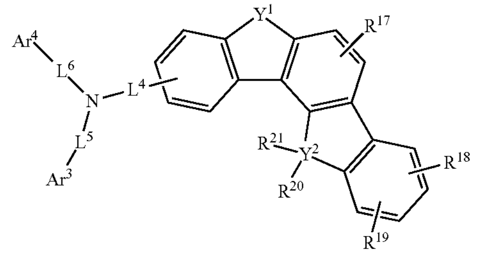

[Chemical Formula 2II-L]

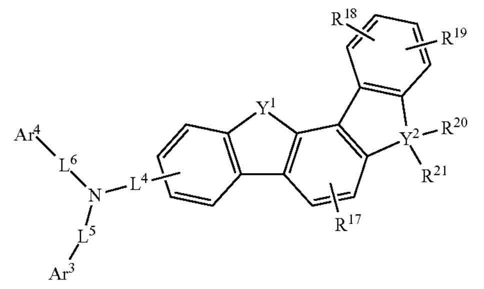

in Chemical Formula 2II-A to Chemical Formula 2II-L, $Y^1$ is O, S, or N—$R^b$, $Y^2$ is C or Si, $R^b$, $R^{10}$ to $R^{13}$, and $R^{17}$ to $R^{19}$ are each independently hydrogen, deuterium, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, $R^{20}$ and $R^{21}$ are each independently a substituted or unsubstituted C1 to C30 alkyl group, or a substituted or unsubstituted C6 to C30 aryl group, $L^4$ to $L^6$ are each independently a single bond, or a substituted or unsubstituted C6 to C30 arylene group, and $Ar^3$ and $Ar^4$ are each independently a substituted or unsubstituted C6 to C30 aryl group, or a substituted or unsubstituted C2 to C30 heterocyclic group.

8. The composition as claimed in claim 7, wherein the second compound is represented by Chemical Formula 2II-A-2, Chemical Formula 2II-A-3, Chemical Formula 2II-B-2, Chemical Formula 2II-B-3, Chemical Formula 2II-C-2, Chemical Formula 2II-C-3, Chemical Formula 2II-D-2, Chemical Formula 2II-D-3, Chemical Formula 2II-E-2, Chemical Formula 2II-E-3, Chemical Formula 2II-F-1, Chemical Formula 2II-F-2, Chemical Formula 2II-F-3, Chemical Formula 2II-F-4, Chemical Formula 2II-G-1, Chemical Formula 2II-H-1, Chemical Formula 2II-I-1, Chemical Formula 2II-J-1, Chemical Formula 2II-K-1, Chemical Formula 2II-L-1, Chemical Formula 2II-L-2, Chemical Formula 2II-L-3, or Chemical Formula 2II-L-4:

-continued
[Chemical Formula 2II-A-2]
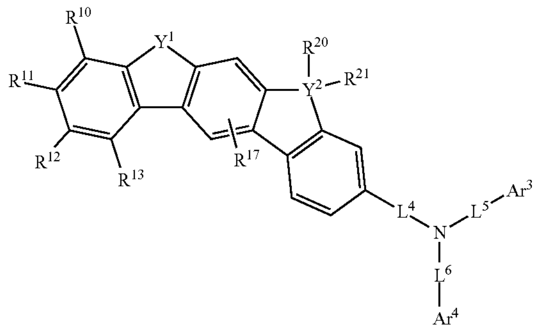
[Chemical Formula 2II-A-3]
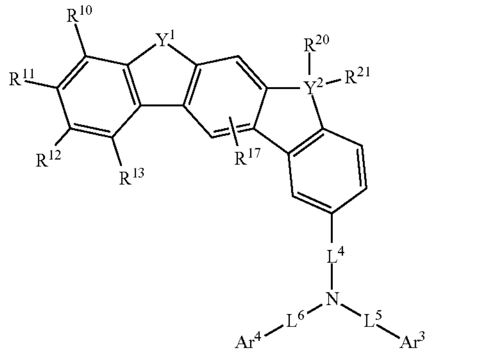
[Chemical Formula 2II-B-2]
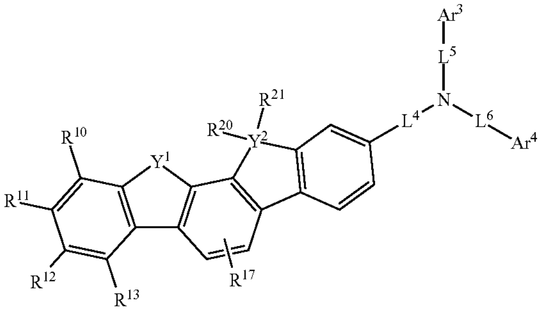
[Chemical Formula 2II-B-3]
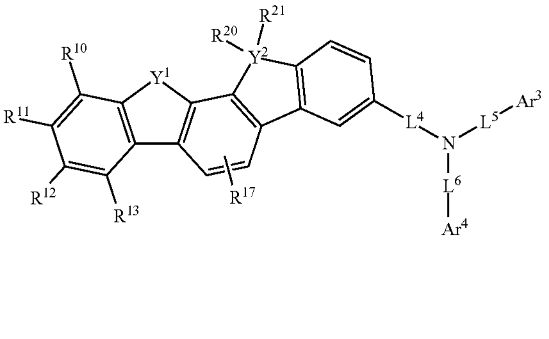
[Chemical Formula 2II-C-2]
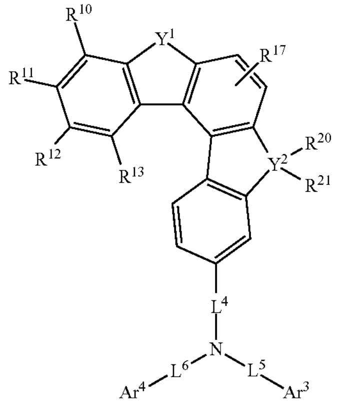
[Chemical Formula 2II-C-3]
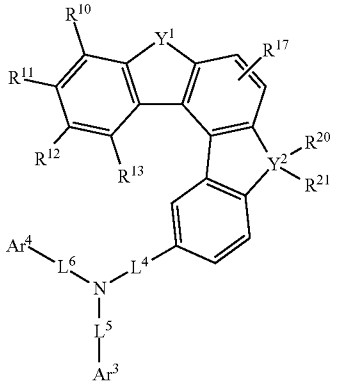
[Chemical Formula 2II-D-2]
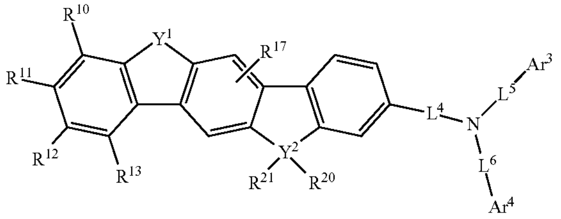
[Chemical Formula 2II-D-3]
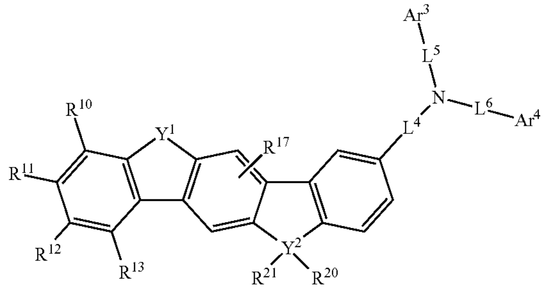

-continued
[Chemical Formula 2II-E-2]
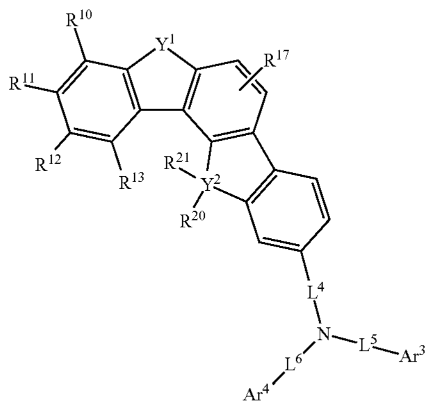
[Chemical Formula 2II-E-3]
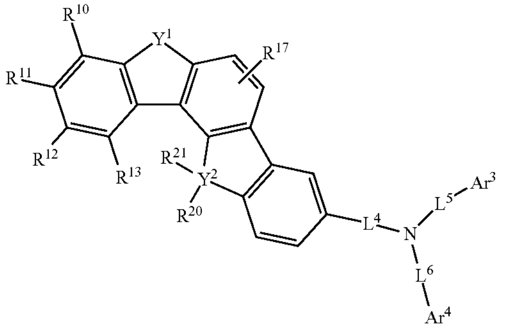
[Chemical Formula 2II-F-1]
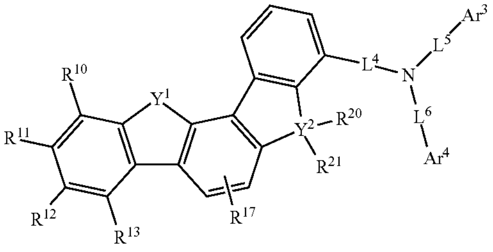
[Chemical Formula 2II-F-2]
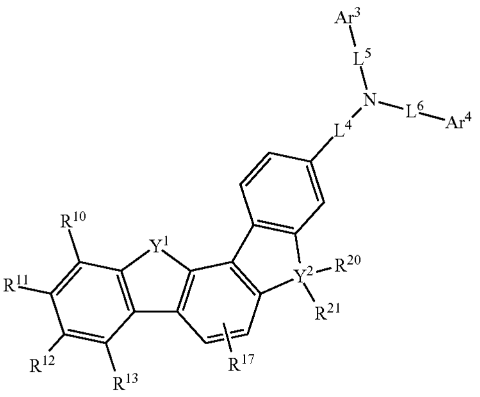
-continued
[Chemical Formula 2II-F-3]
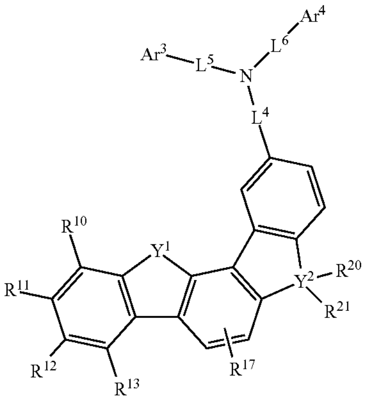
[Chemical Formula 2II-F-4]
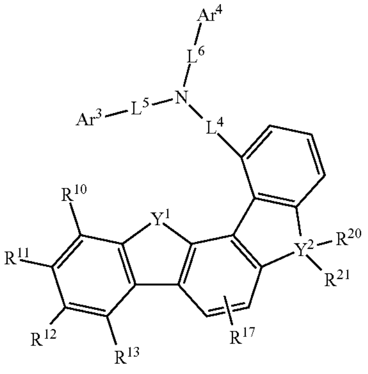
[Chemical Formula 2II-G-1]
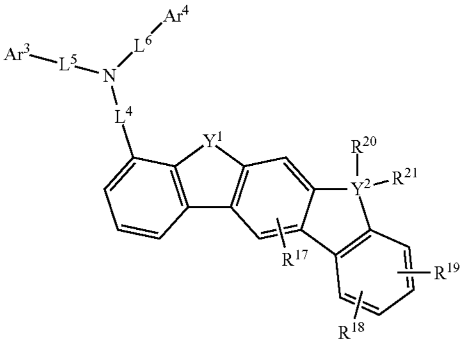
[Chemicall Formula 2II-H-1]
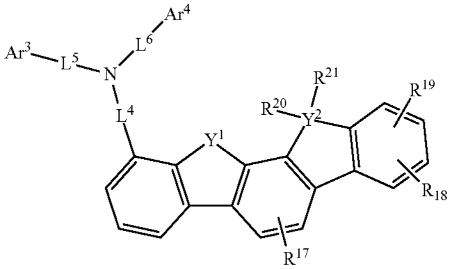

-continued

[Chemical Formula 2II-I-1]

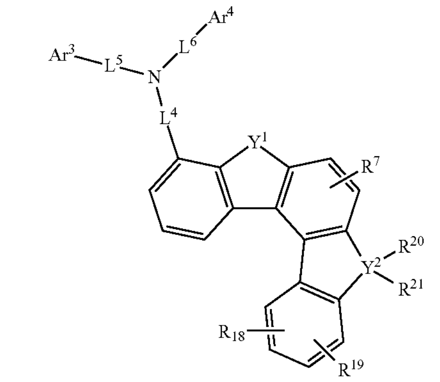

[Chemical Formula 2II-J-1]

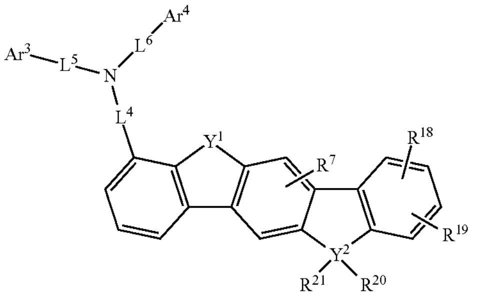

[Chemical Formula 2II-K-1]

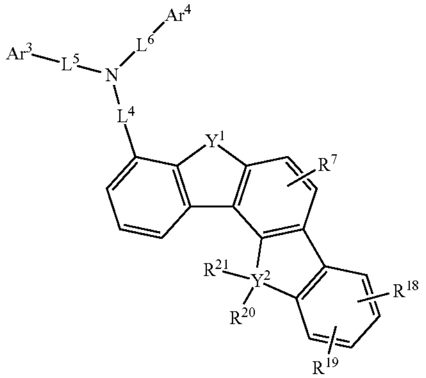

[Chemical Formla 2II-L-1]

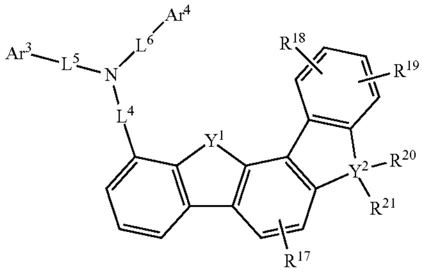

-continued

[Chemical Formula 2II-L-2]

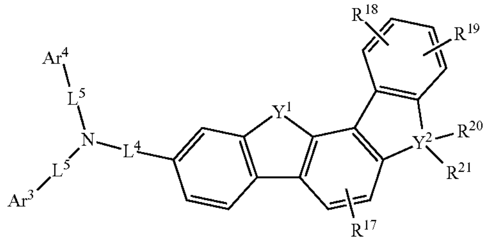

[Chemical Formula 2II-L-3]

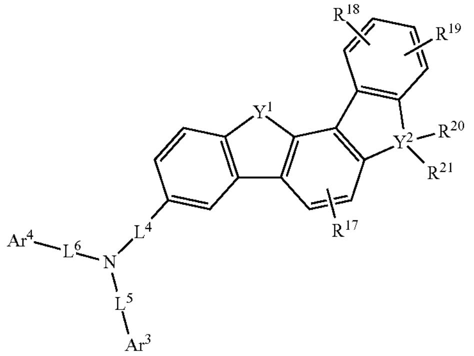

[Chemical Formula 2II-L-4]

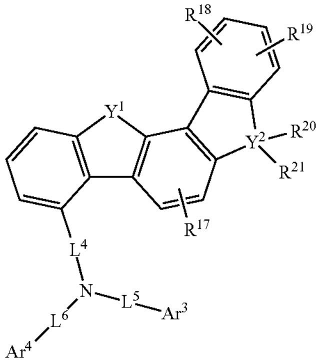

in Chemical Formula 2II-A-1 to Chemical Formula 2II-A-4, Chemical Formula 2II-B-1 to Chemical Formula 2II-B-4, Chemical Formula 2II-C-1 to Chemical Formula 2II-C-4, Chemical Formula 2II-D-1 to Chemical Formula 2II-D-4, Chemical Formula 2II-E-1 to Chemical Formula 2II-E-4, Chemical Formula 2II-F-1 to Chemical Formula 2II-F-4, Chemical Formula 2II-G-1 to Chemical Formula 2I I-G-4, Chemical Formula 2II-H-1 to Chemical Formula 2II-H-4, Chemical Formula 2II-I-1 to Chemical Formula 2II-I-4, Chemical Formula 2II-J-1 to Chemical Formula 2II-J-4, Chemical Formula 2II-K-1 to Chemical Formula 2II-K-4, and Chemical Formula 2II-L-1 to Chemical Formula 2II-L-4, $Y^1$, $Y^2$, $L^4$ to $L^6$, $Ar^3$, $Ar^4$, and $R^{10}$ to $R^{13}$, and $R^{17}$ to $R^{21}$ are defined the same as those of Chemical Formula 2II-A to Chemical Formula 2II-L.

9. The composition as claimed in claim 4 wherein, in Chemical Formula 2I-A to Chemical Formula 2I-F:

$Y^1$ is N—$R^b$, $R^b$ is a substituted or unsubstituted phenyl group, a substituted or unsubstituted biphenyl group, or a substituted or unsubstituted naphthyl group, $R^{10}$ to $R^{16}$ are each independently hydrogen, deuterium, a substituted or unsubstituted C1 to C10 alkyl group, or a substituted or unsubstituted C6 to C12 aryl group, $L^4$ is a single bond, a substituted or unsubstituted phenylene group, or a substituted or unsubstituted naphthylene group, $L^5$ and $L^6$ are each independently a single bond, a substituted or unsubstituted phenylene group, or a substituted or unsubstituted biphenylene group, and $Ar^3$ and $Ar^4$ are each independently a substituted or unsubstituted phenyl group, a substituted or unsubstituted biphenyl group, a substituted or unsubstituted naphthyl group, a substituted or unsubstituted terphenyl group, a substituted or unsubstituted fluorenyl group, a substituted or unsubstituted anthracenyl group, a substituted or unsubstituted phenanthrenyl group, a substituted or unsubstituted triphenylene group, a substituted or unsubstituted carbazolyl group, a substituted or unsubstituted dibenzofuranyl group, a substituted or unsubstituted dibenzothiophenyl group, a substituted or unsubstituted benzofuranfluorenyl group, or a substituted or unsubstituted benzothiophenefluorenyl group.

10. The composition as claimed in claim 1, wherein the second compound is a compound of Group 2:

[Group 2]

A-1

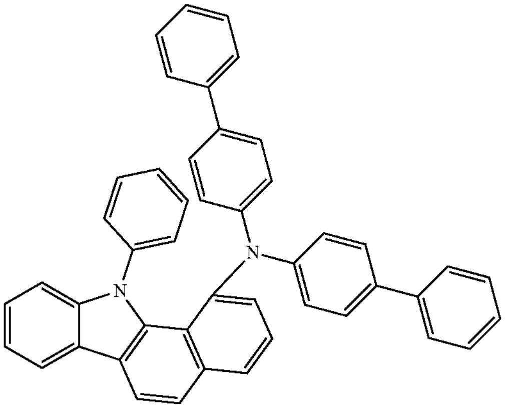

A-2

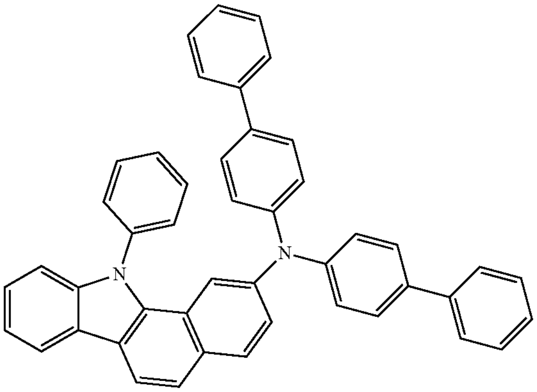

-continued

A-3

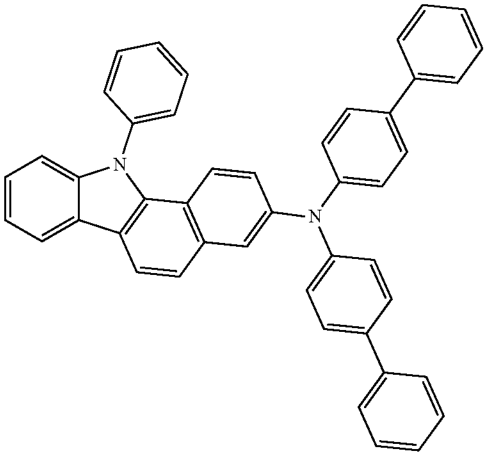

A-4

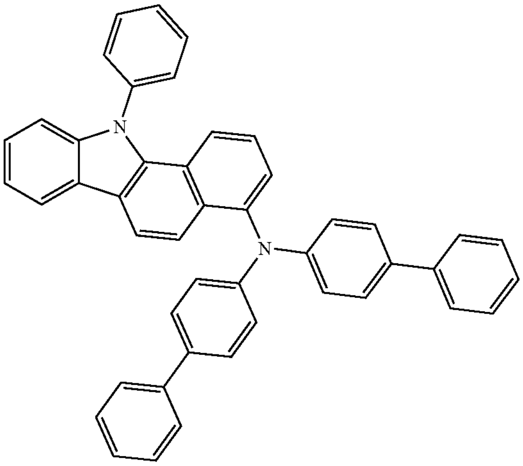

A-5

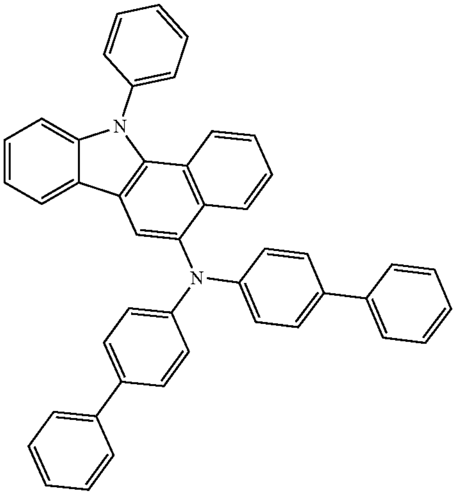

-continued
A-6
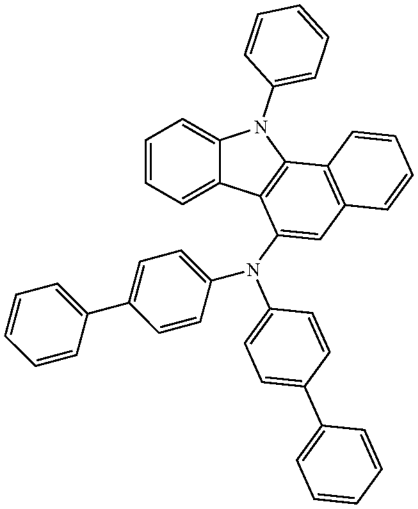
A-7
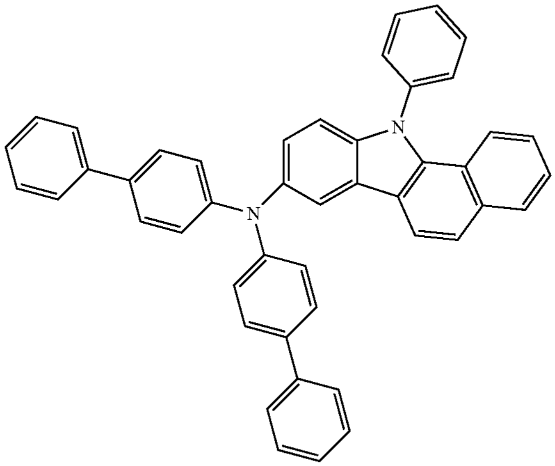
A-8
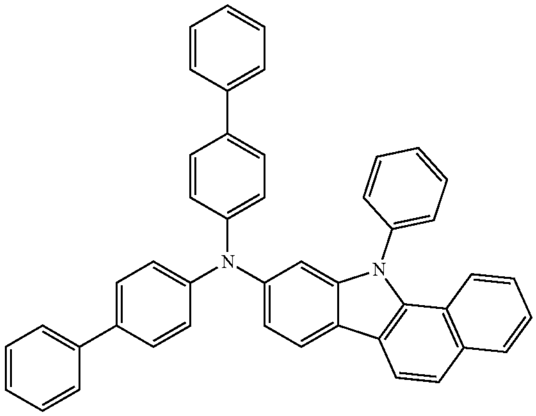
-continued
A-9
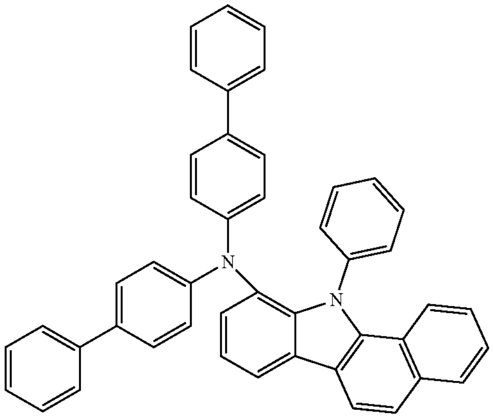
A-10
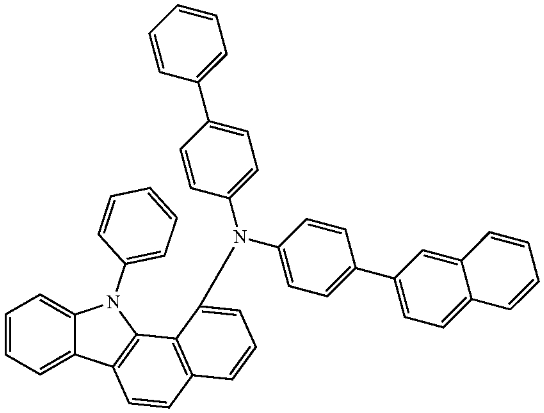
A-11
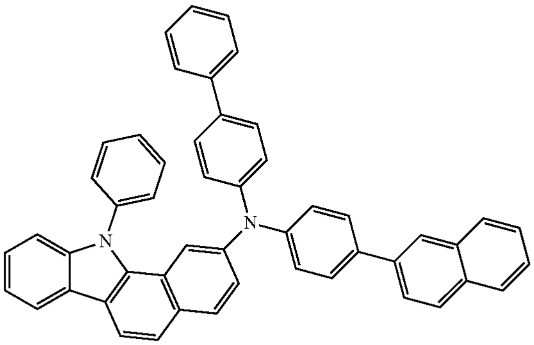

A-12
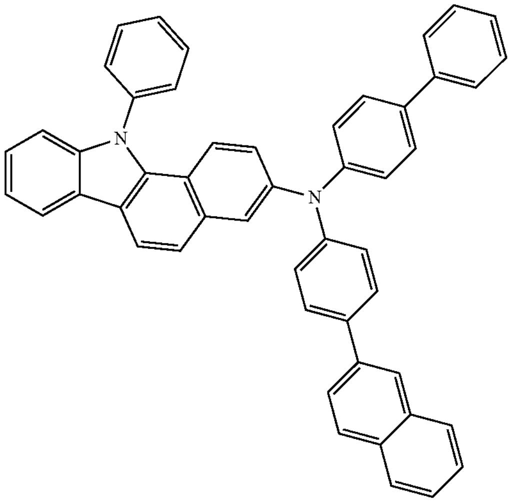
A-13
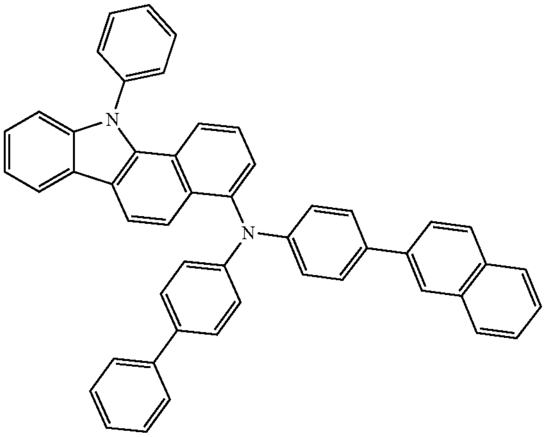
A-14
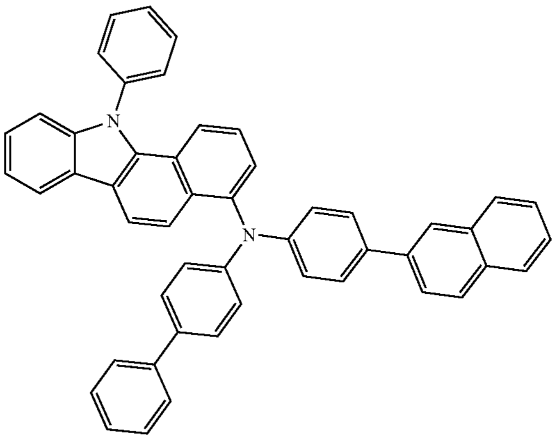
A-15
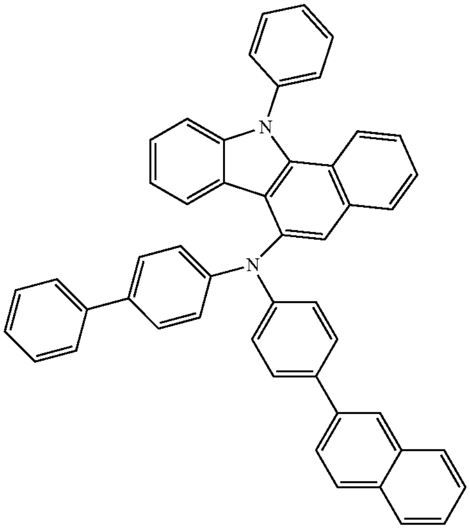
A-16
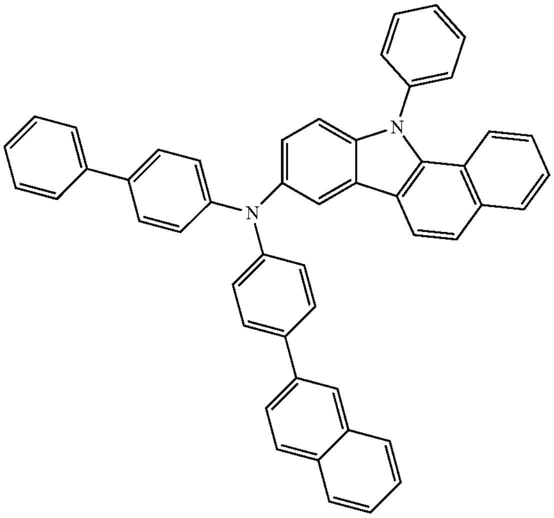
A-17
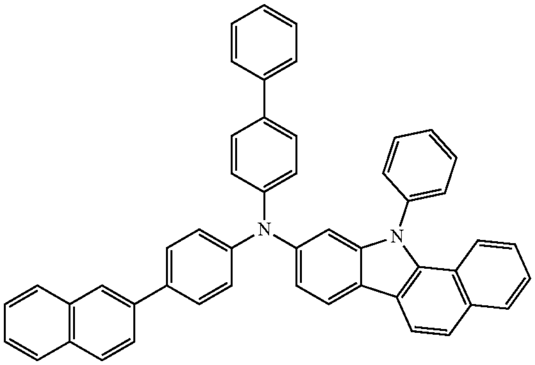

-continued
A-18
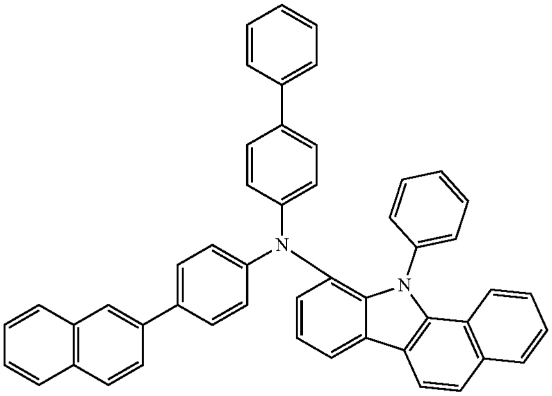
A-19
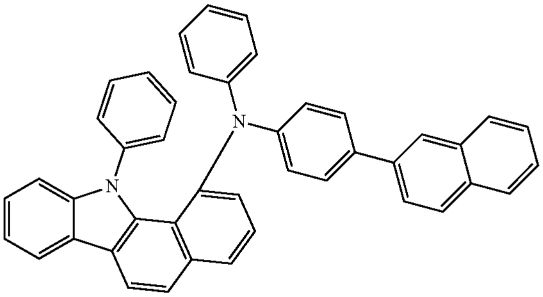
A-20
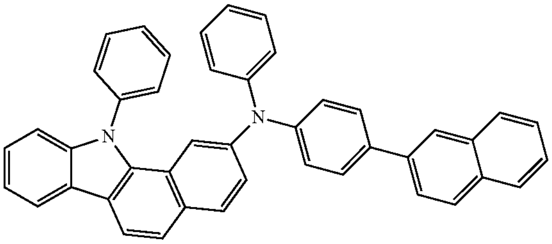
A-21
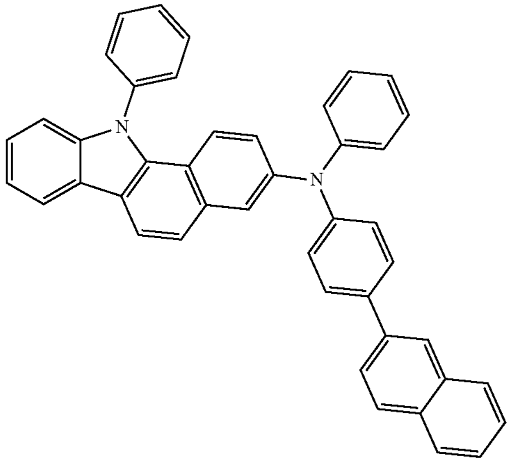
-continued
A-22
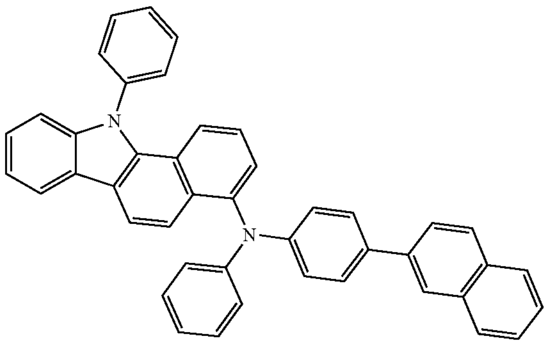
A-23
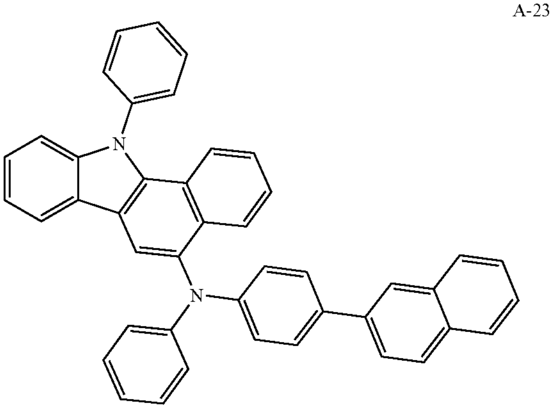
A-24
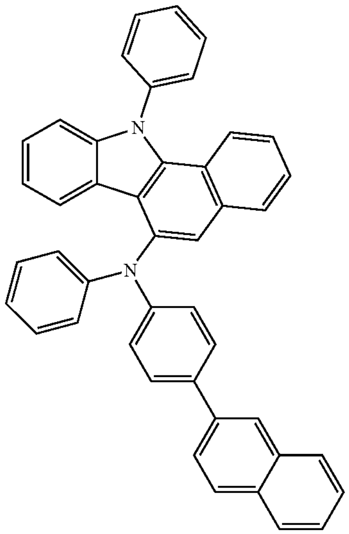

-continued
A-25
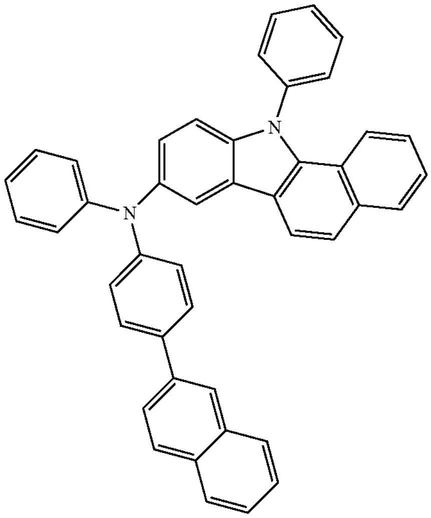
A-26
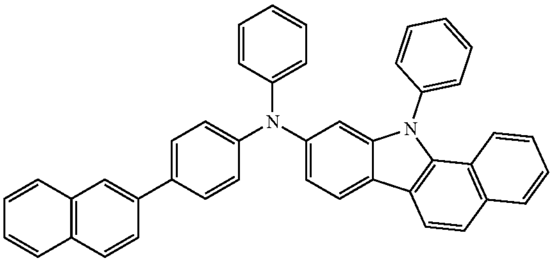
A-27
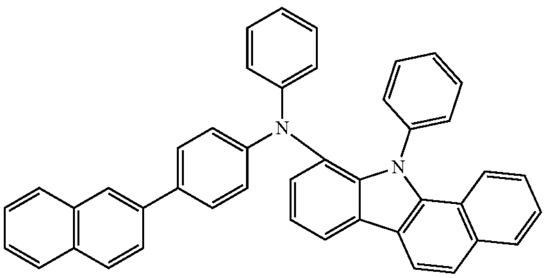
A-28
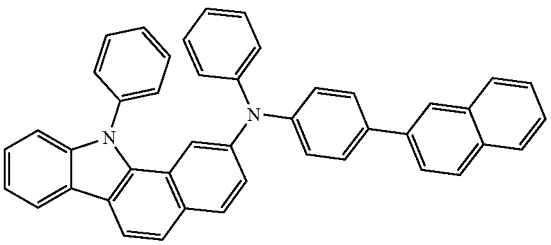
-continued
A-45
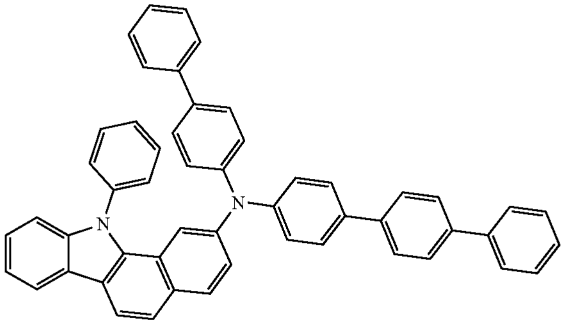
A-46
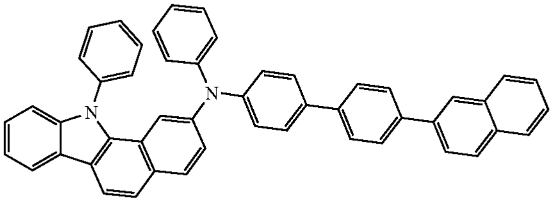
A-47
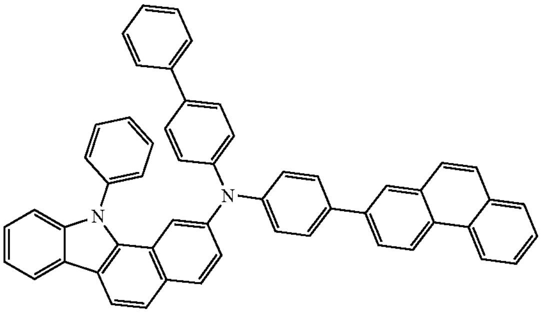
A-48
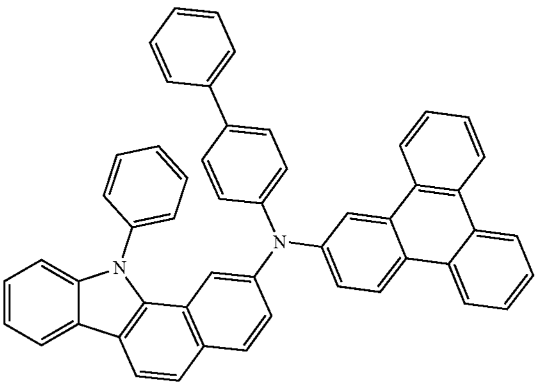

-continued
A-49
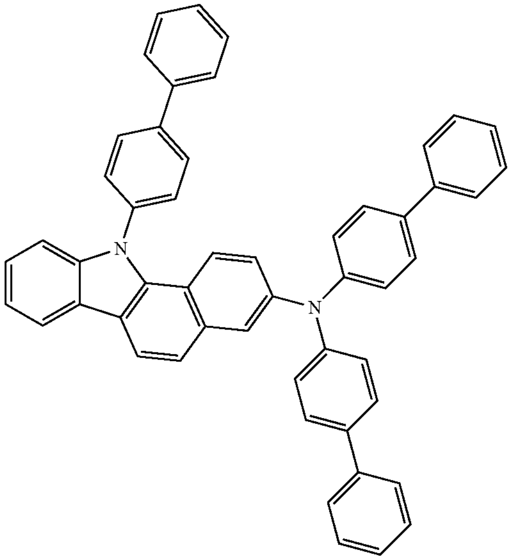
A-50
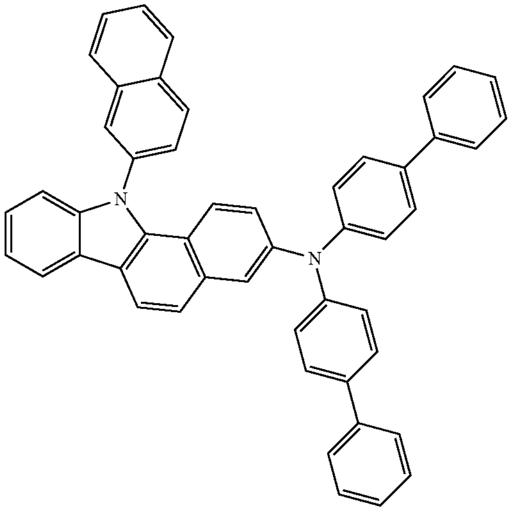
A-51
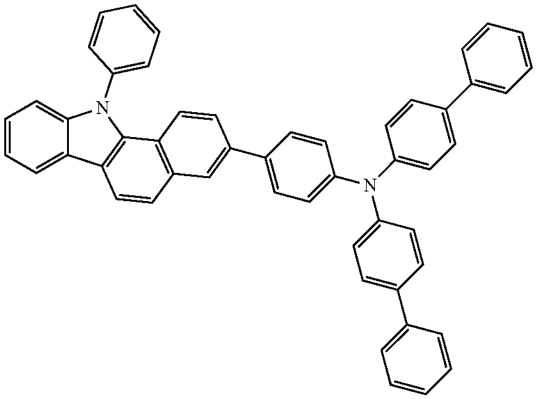
-continued
A-52
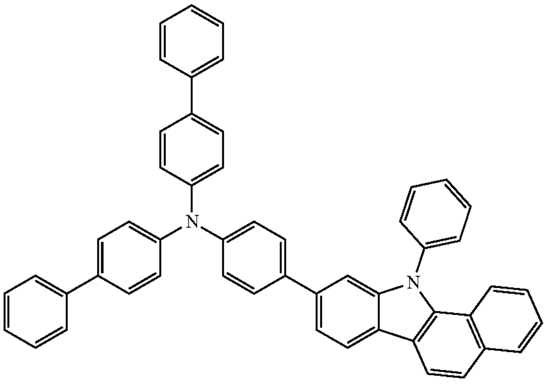
A-53
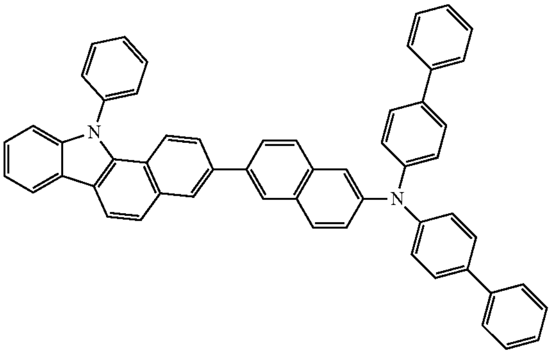
A-54
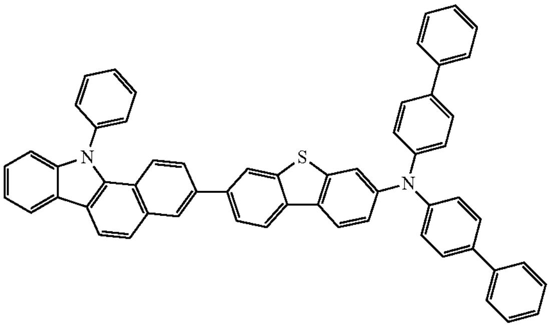
A-55
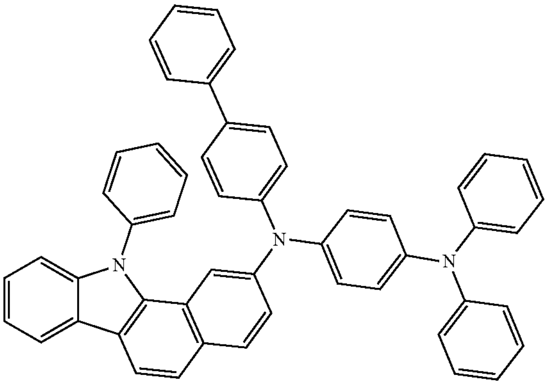

-continued
A-56
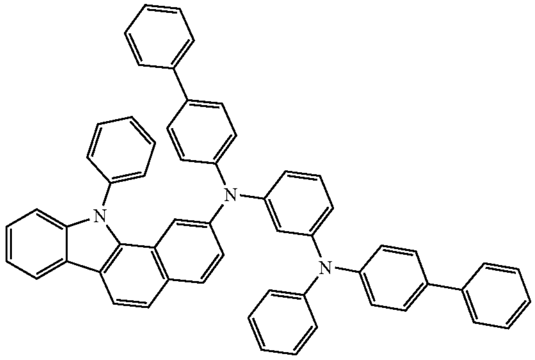
A-57
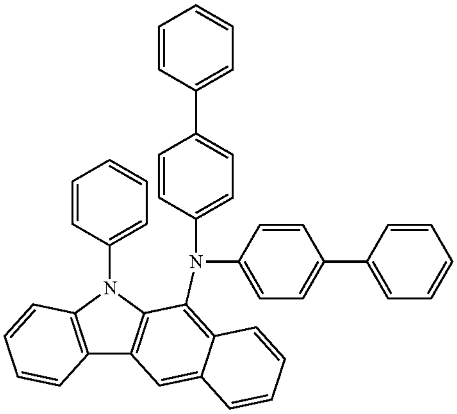
A-58
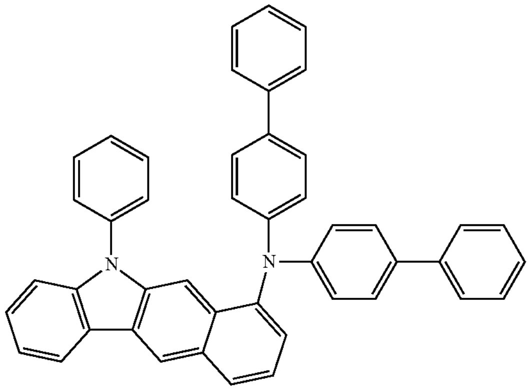
A-59
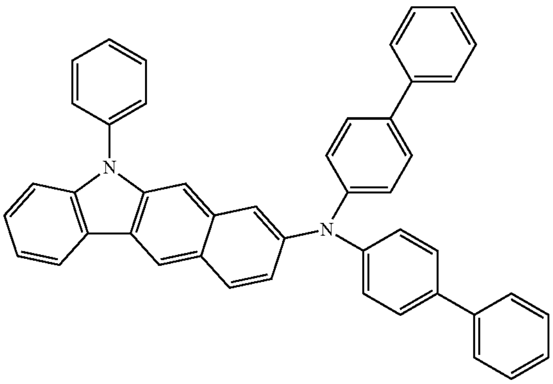
-continued
A-60
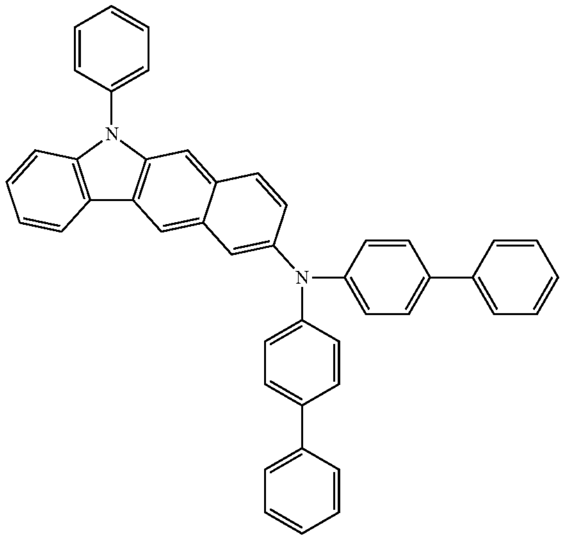
A-61
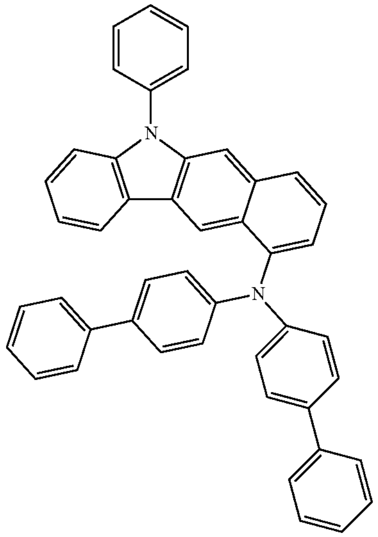
A-62
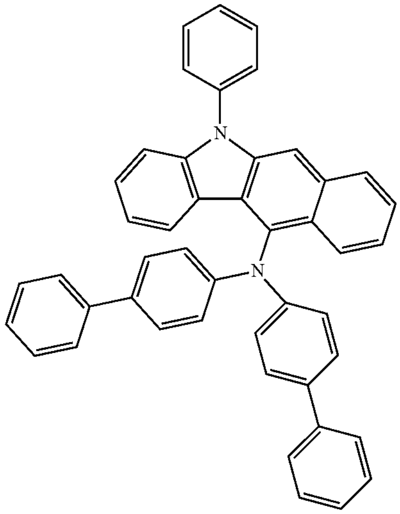

-continued
A-63
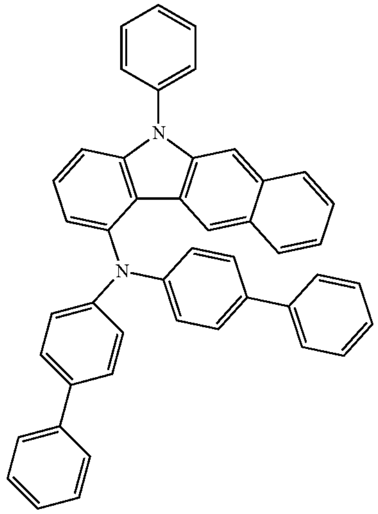
A-64
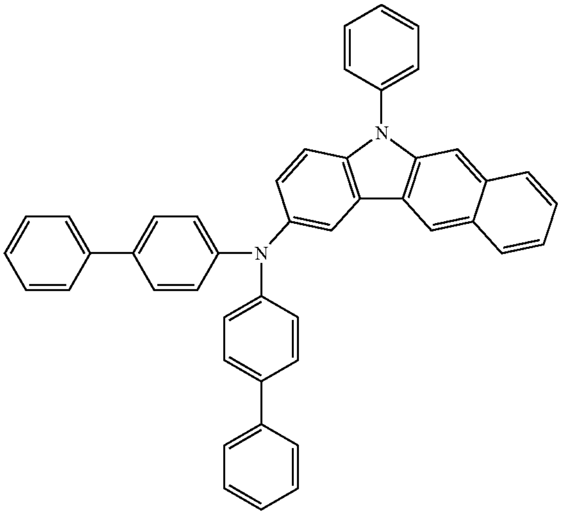
A-65
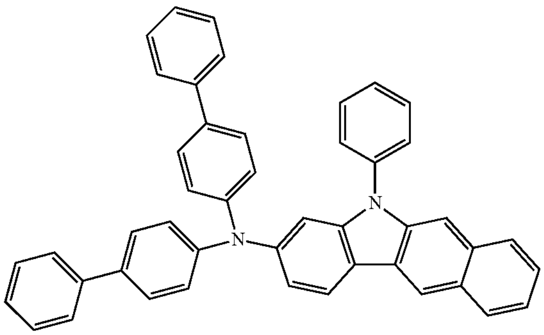
-continued
A-66
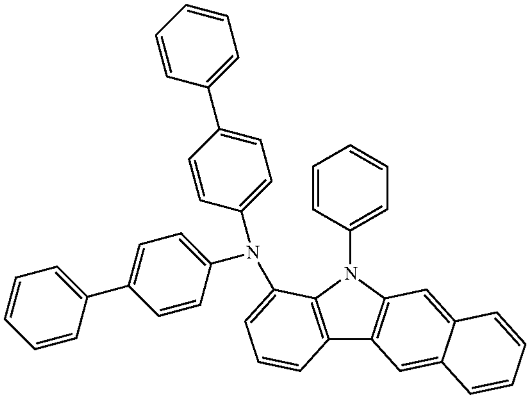
A-67
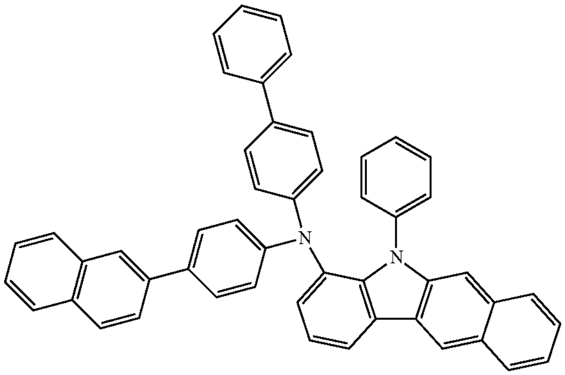
A-69
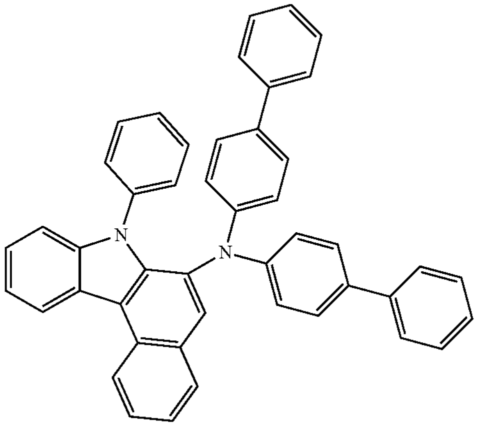

-continued
A-70
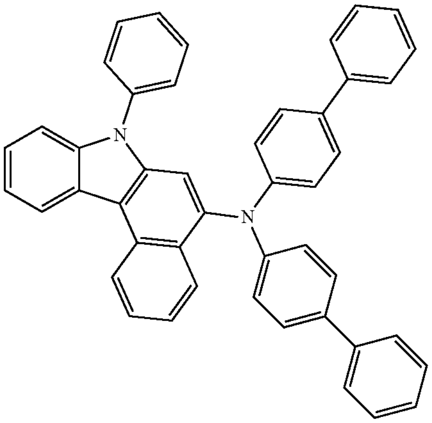
A-71
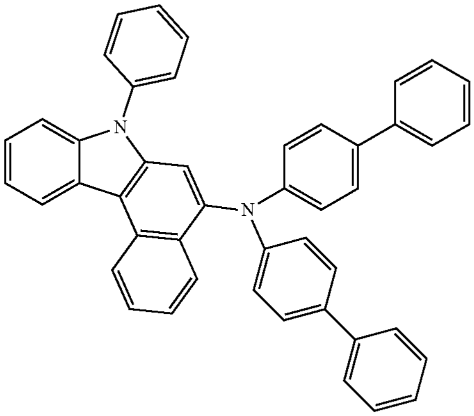
A-72
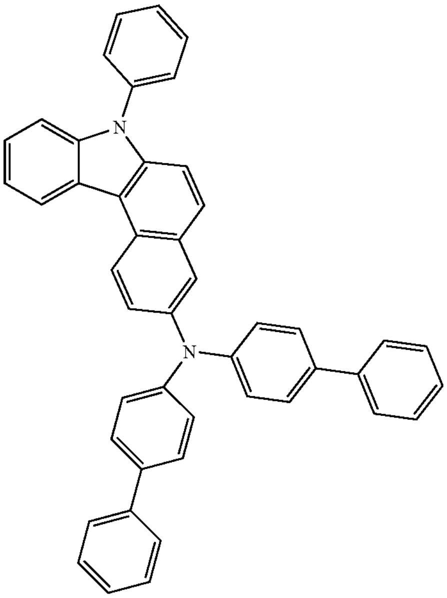
-continued
A-73
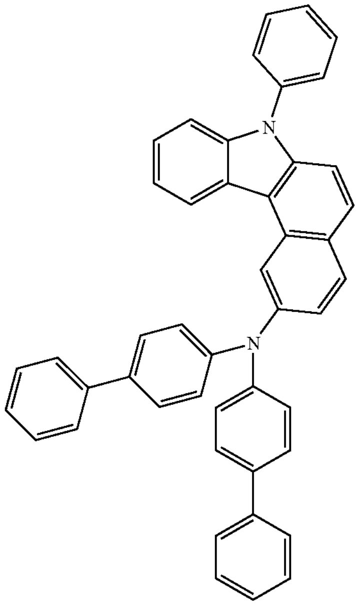
A-74
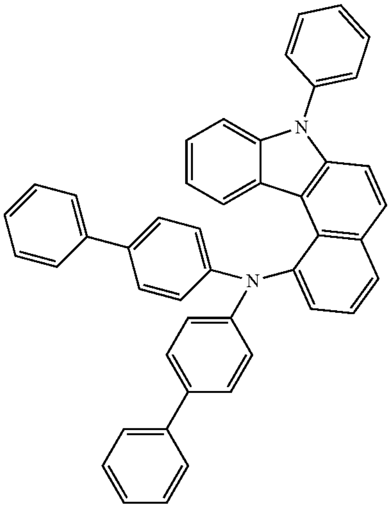
A-75
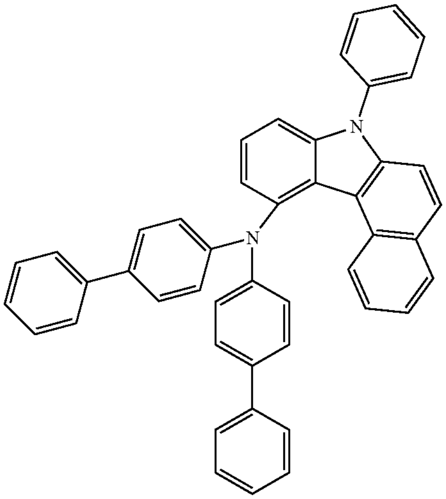

-continued
A-76
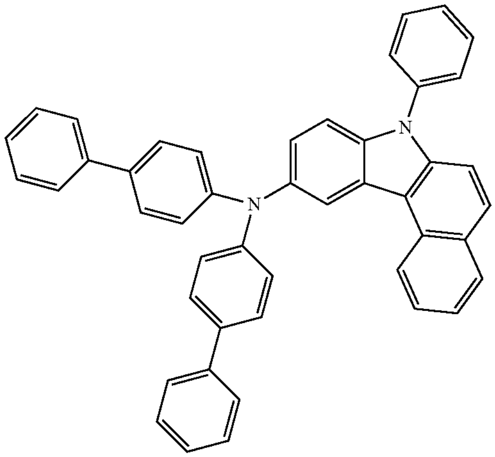
A-77
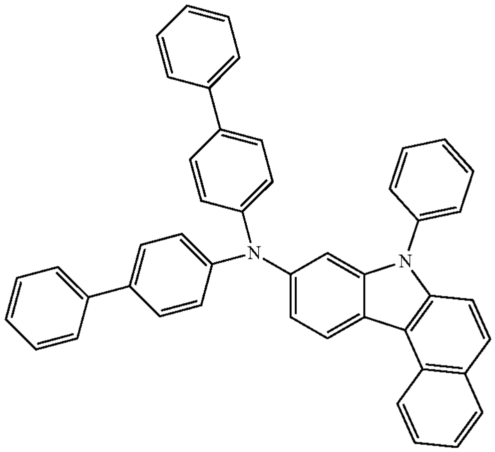
A-78
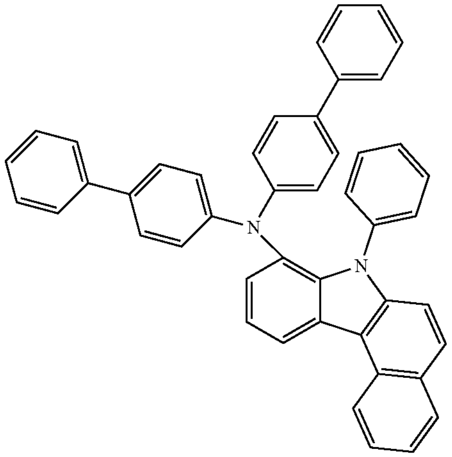
-continued
A-79
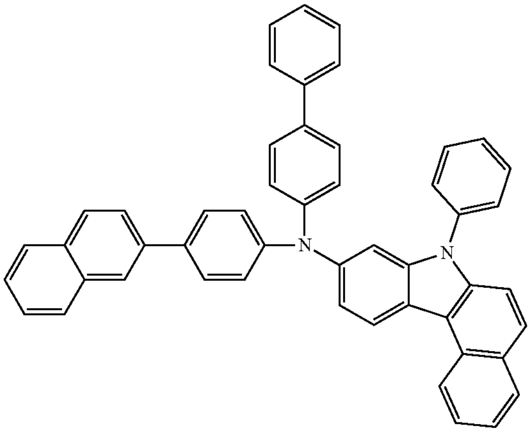
A-80
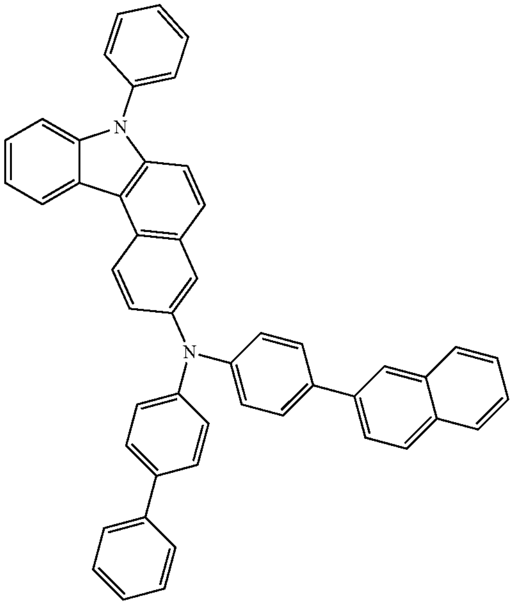
A-81
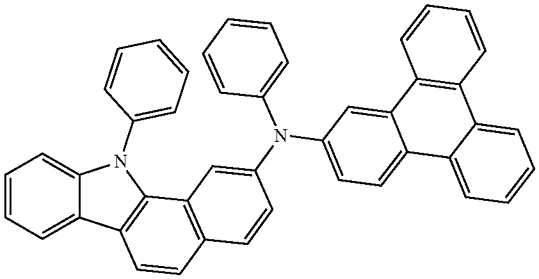

-continued
A-82
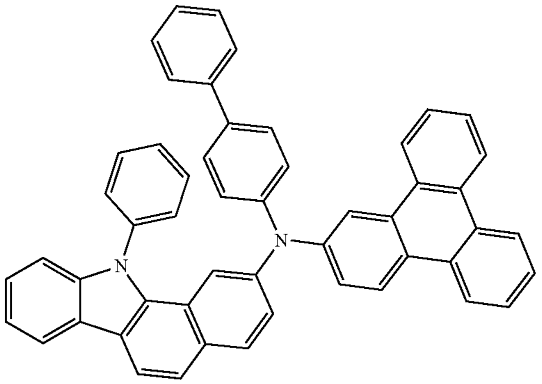
A-83
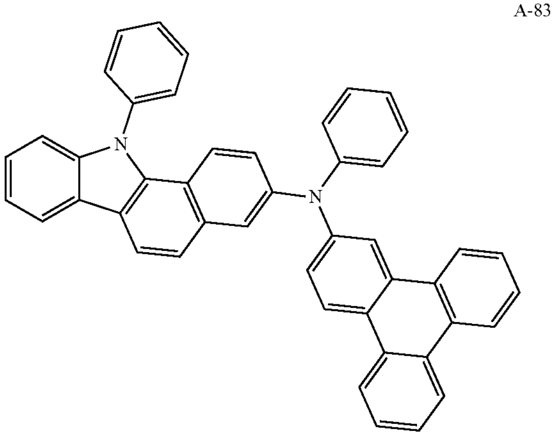
A-84
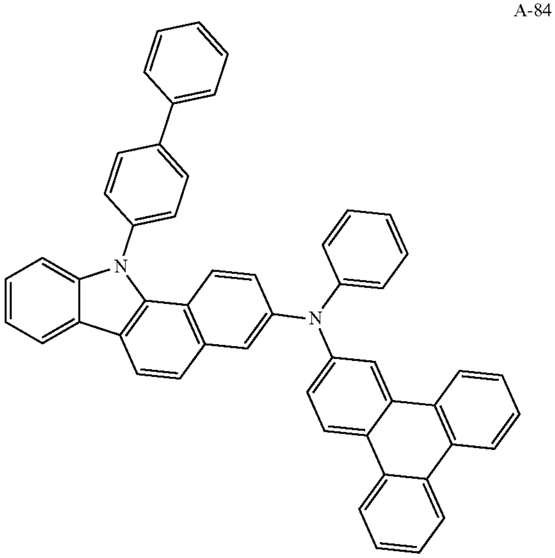
-continued
A-85
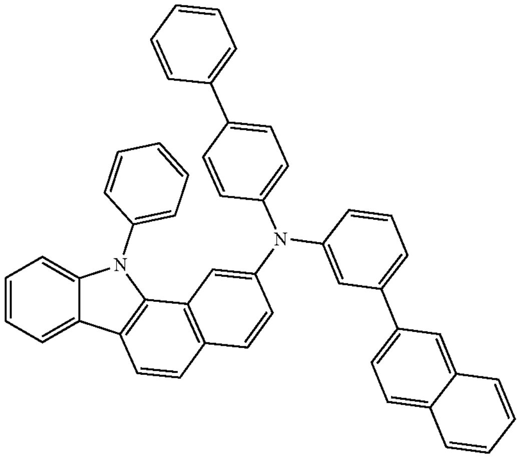
[2-1]
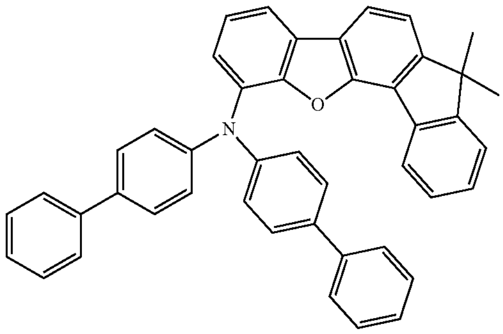
[2-2]
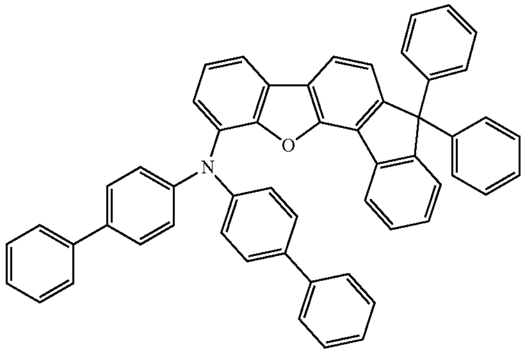
[2-3]
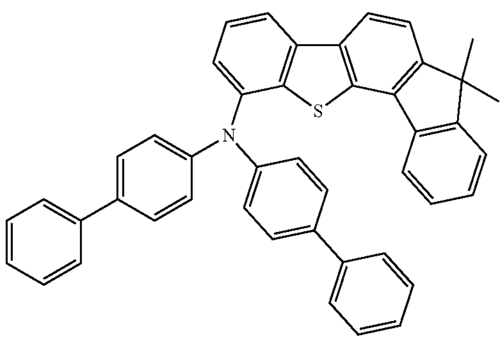

-continued
[2-4]
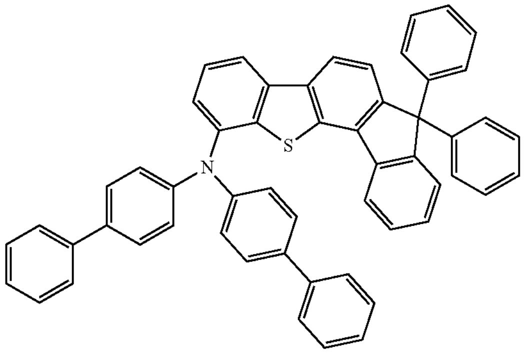
[2-5]
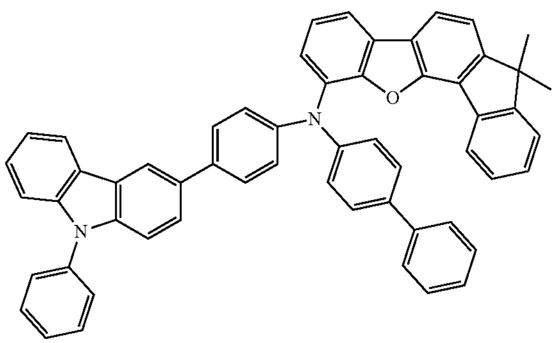
[2-6]
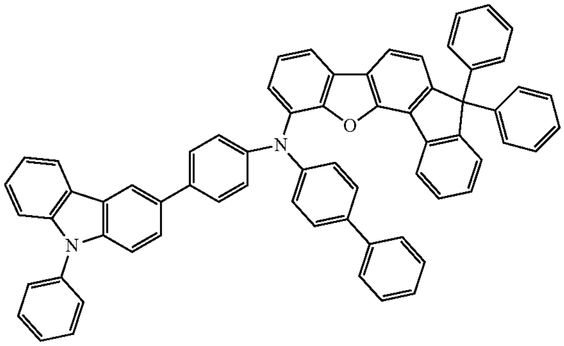
[2-7]
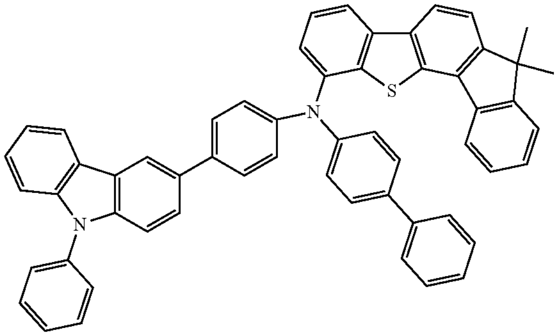
-continued
[2-8]
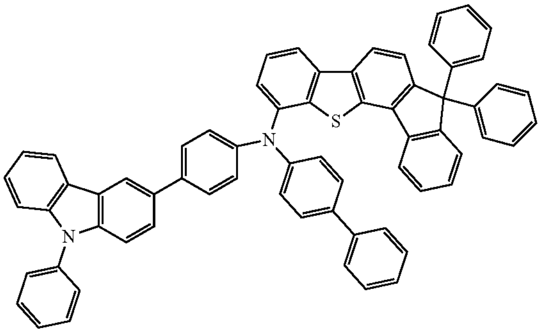
[2-9]
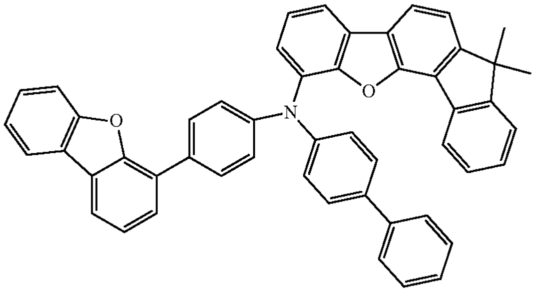
[2-10]
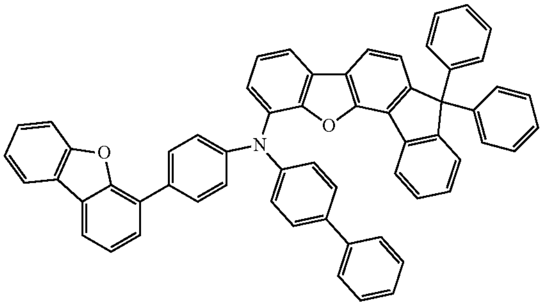
[2-11]
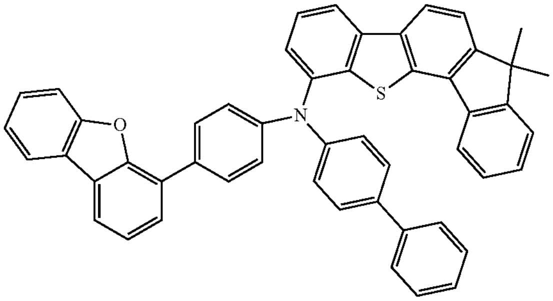

-continued
[2-12]
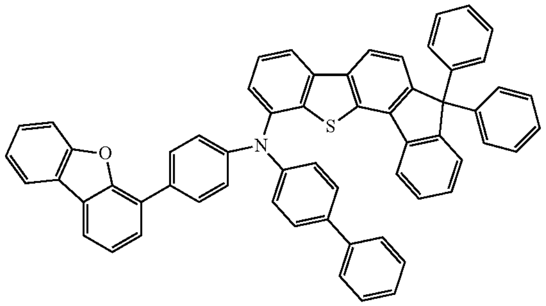
[2-13]
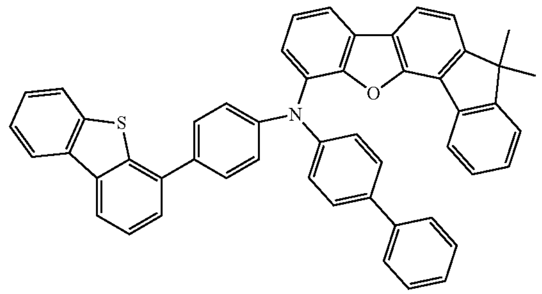
[2-14]
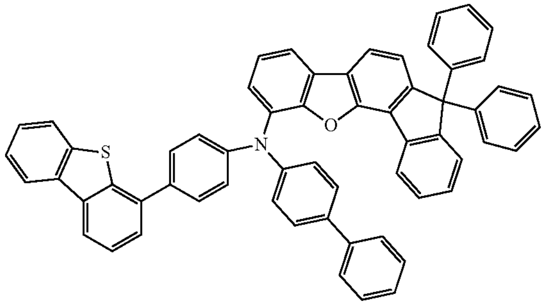
[2-15]
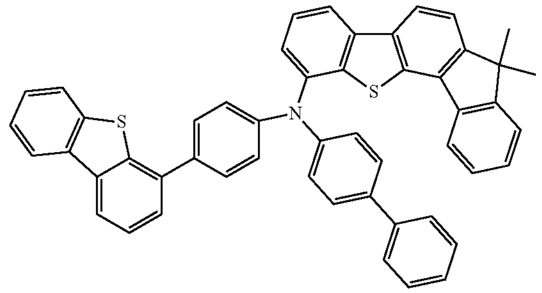
[2-16]
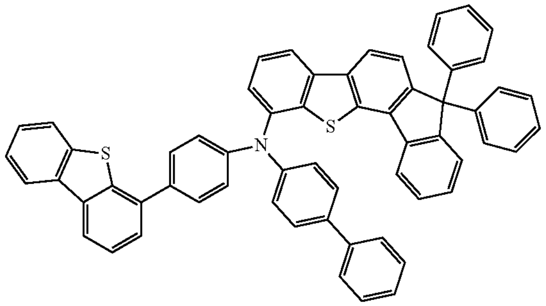
-continued
[2-17]
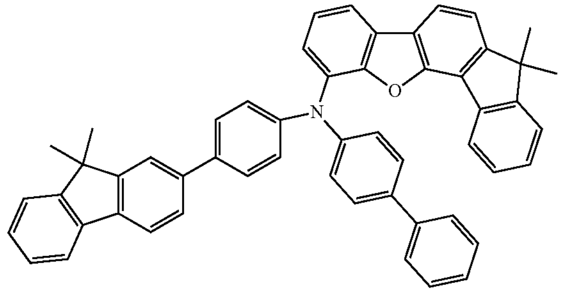
[2-18]
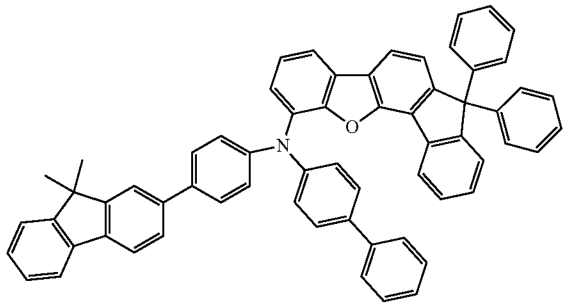
[2-19]
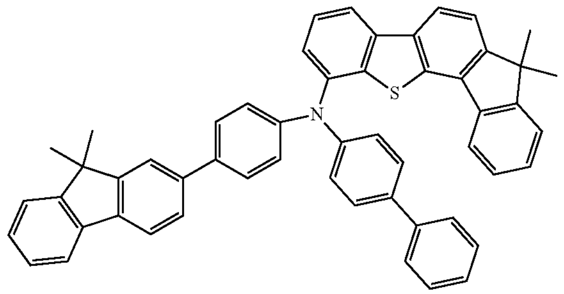
[2-20]
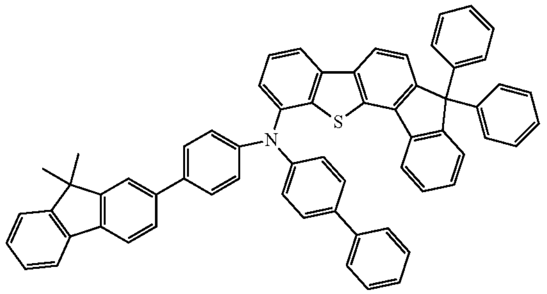

-continued
[2-21]
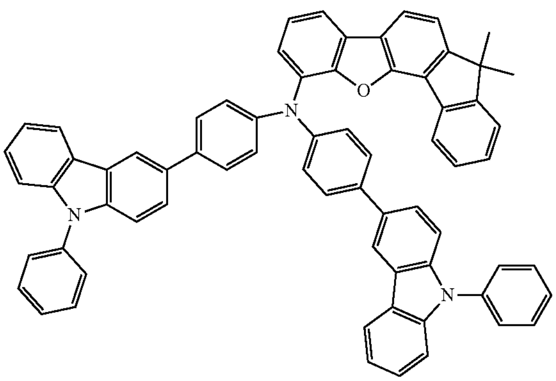
[2-22]
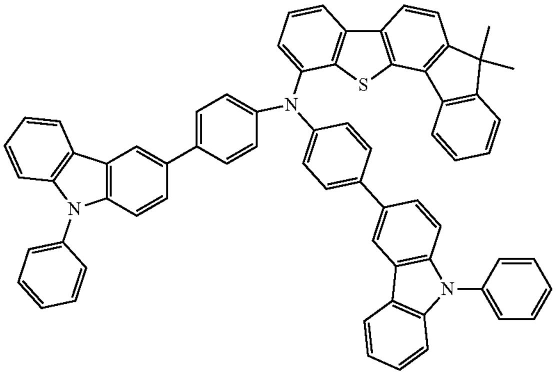
[2-23]
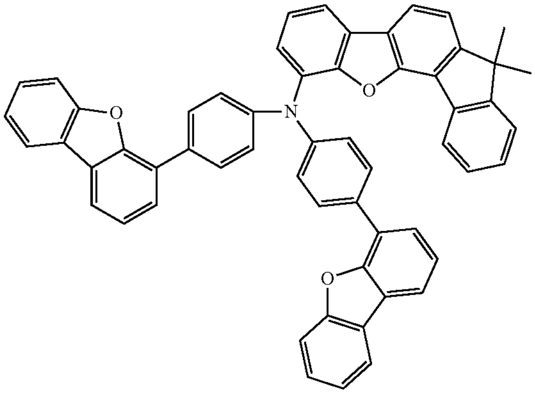
[2-24]
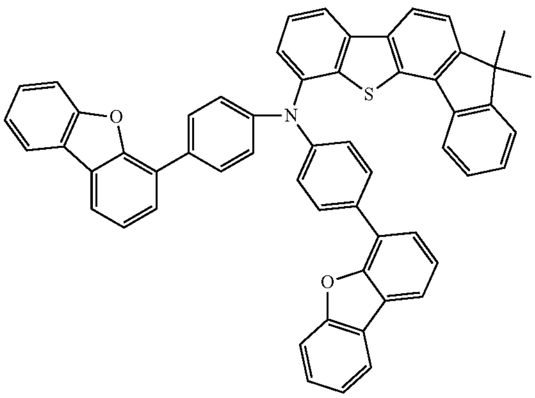
-continued
[2-25]
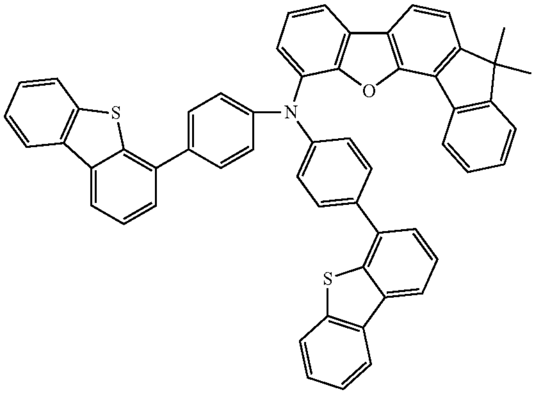
[2-26]
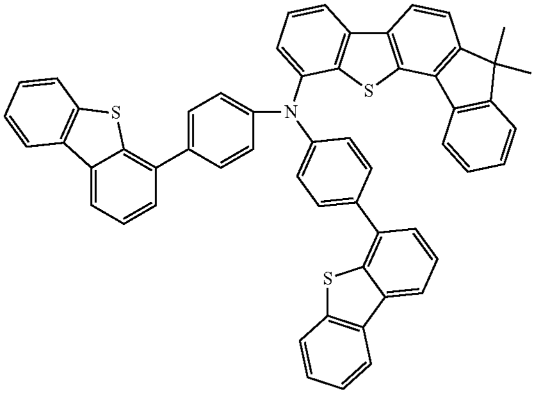
[2-27]
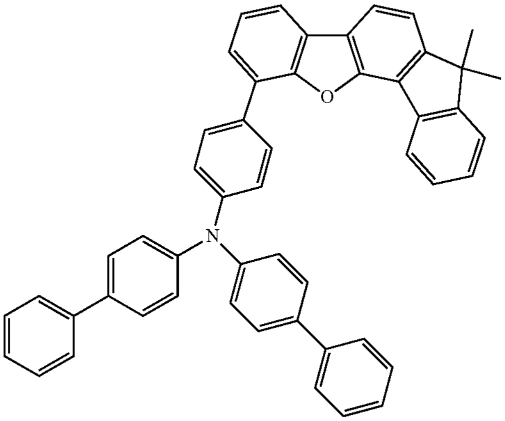

-continued
[2-28]
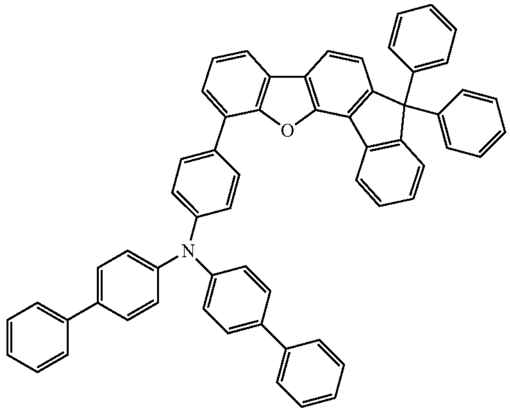
[2-29]
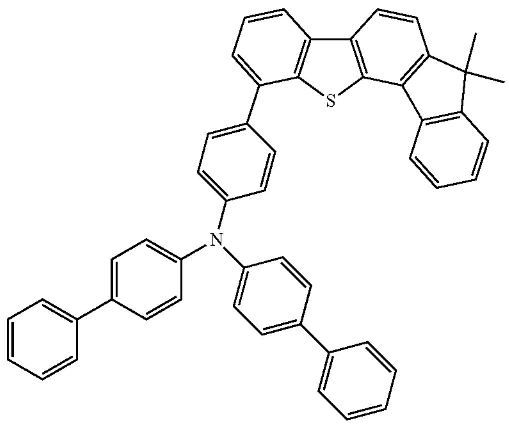
[2-30]
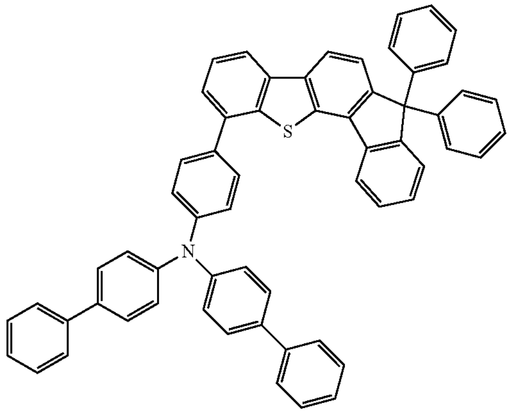
-continued
[2-31]
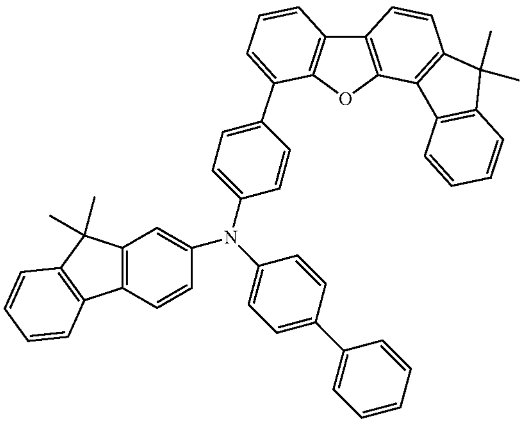
[2-32]
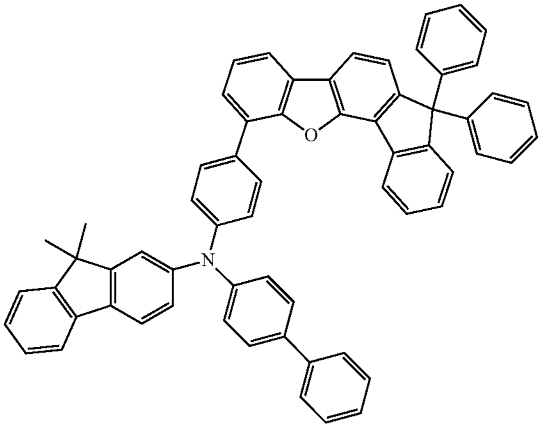
[2-33]
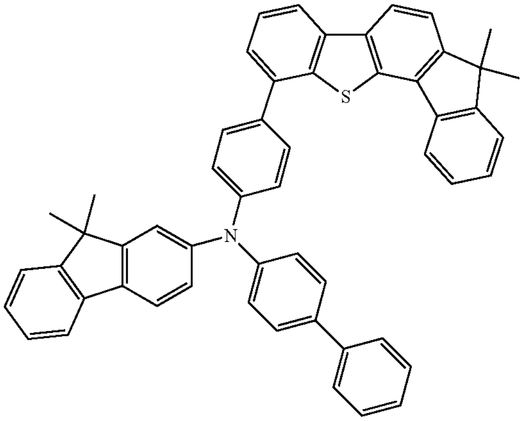

-continued
[2-34]
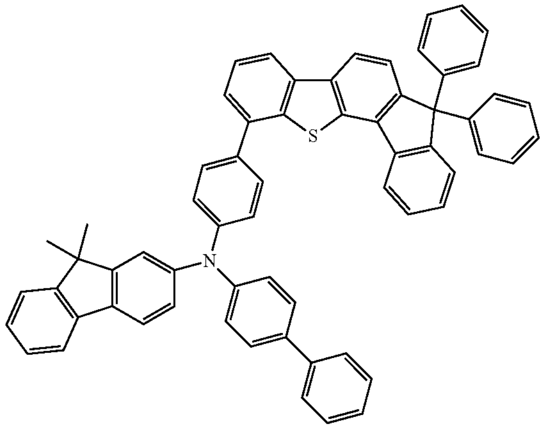
[2-35]
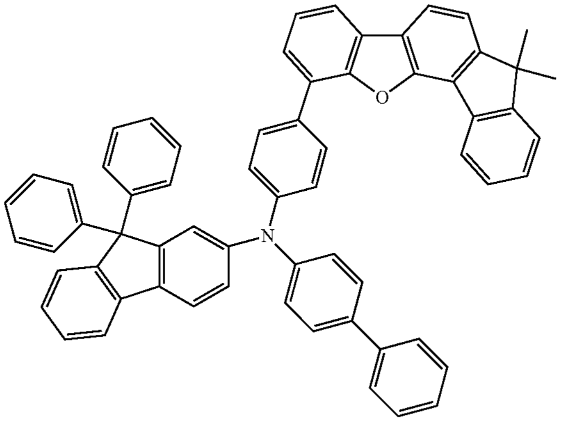
[2-36]
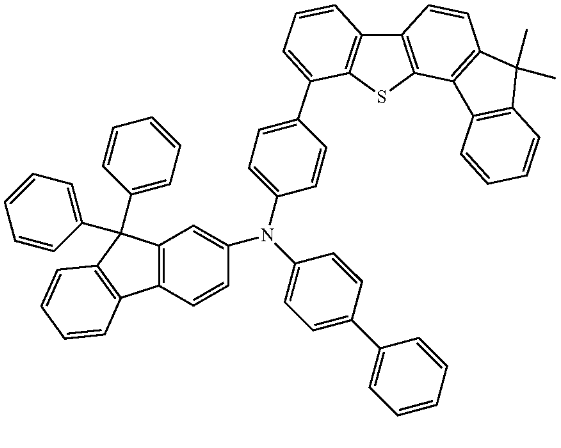
-continued
[2-37]
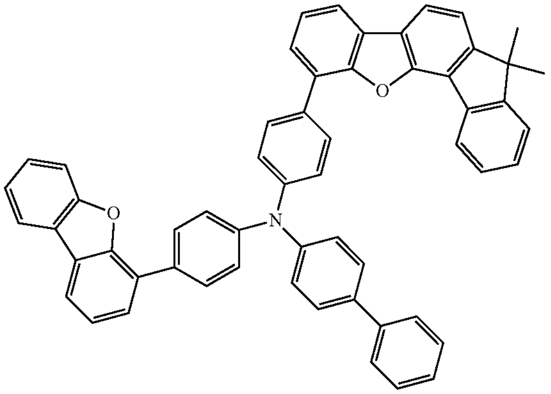
[2-38]
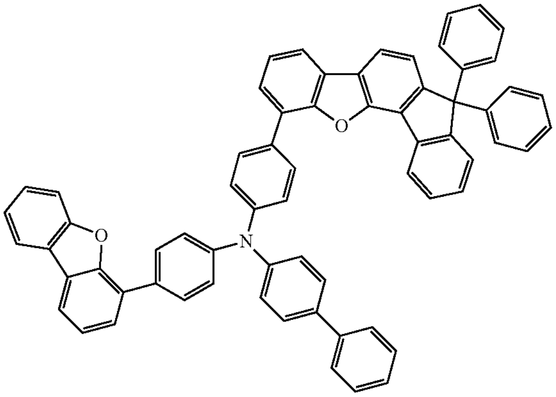
[2-39]
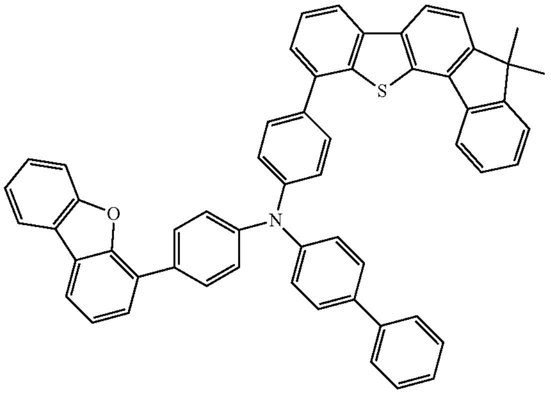

-continued
[2-40]
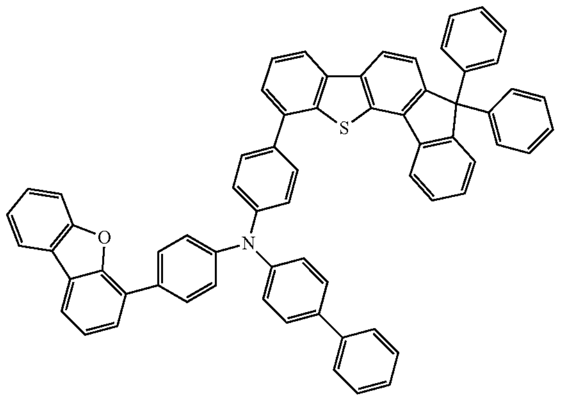
[2-41]
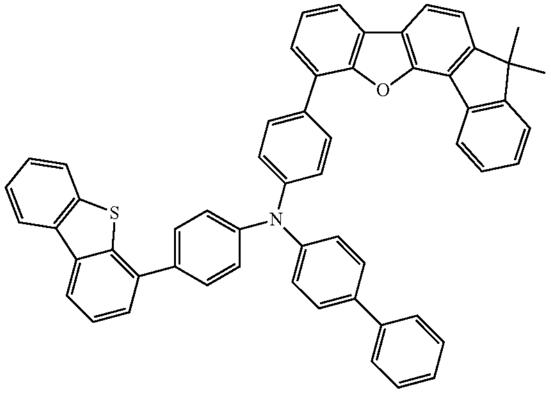
[2-42]
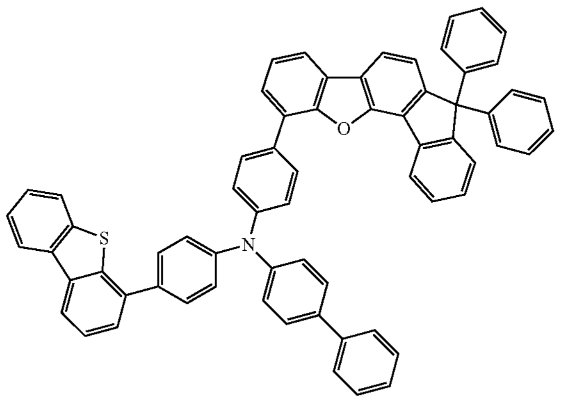
[2-43]
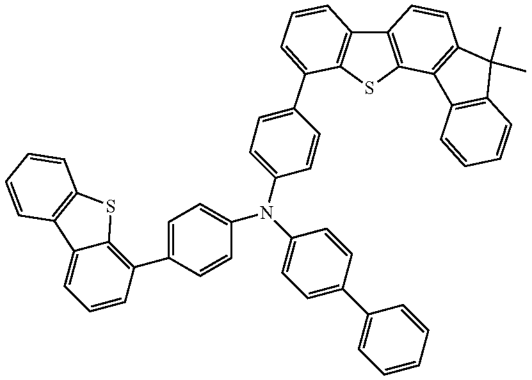
-continued
[2-44]
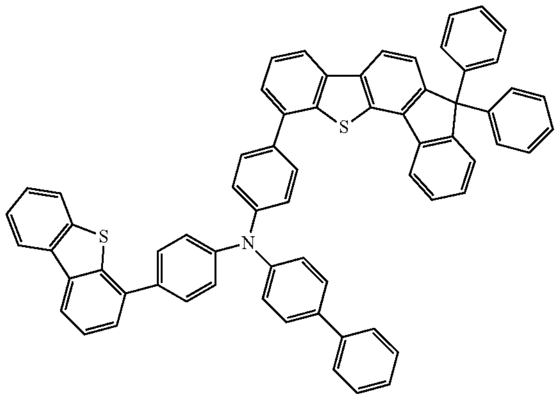
[2-45]
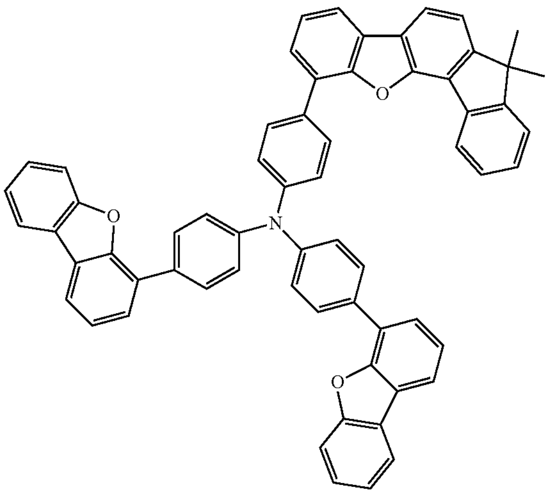
[2-46]
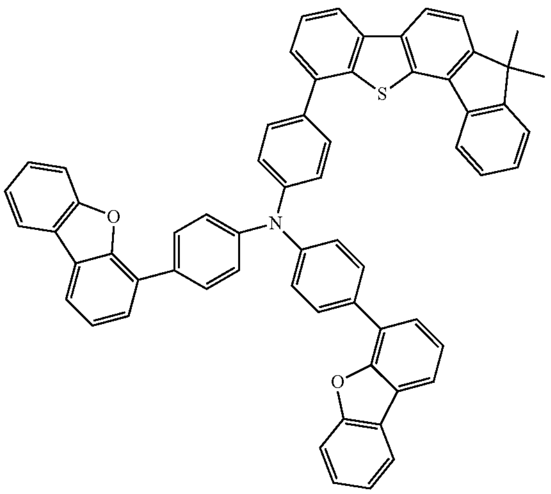

-continued
[2-47]
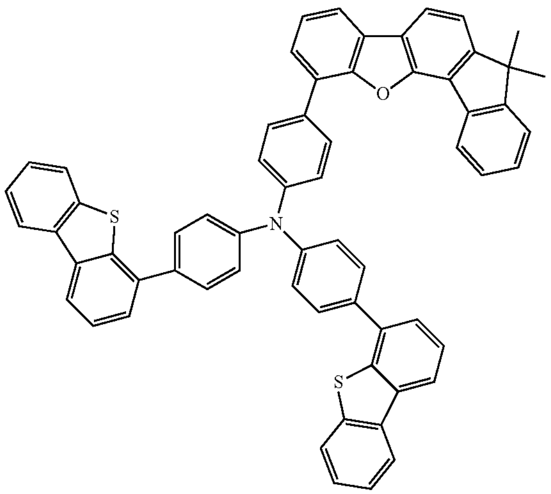
[2-48]
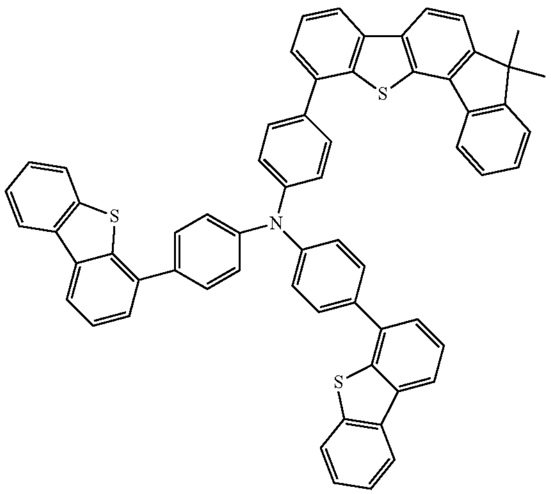
[2-49]
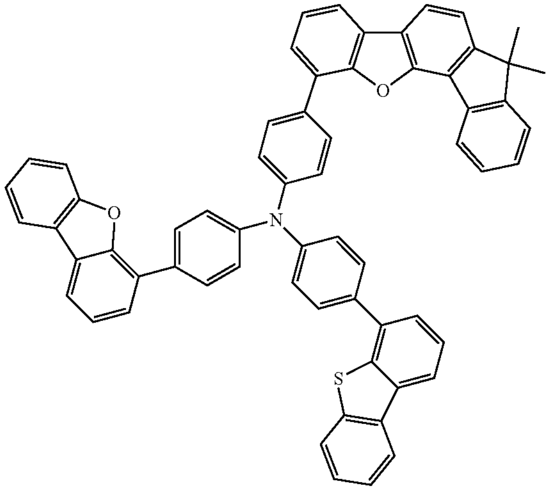
-continued
[2-50]
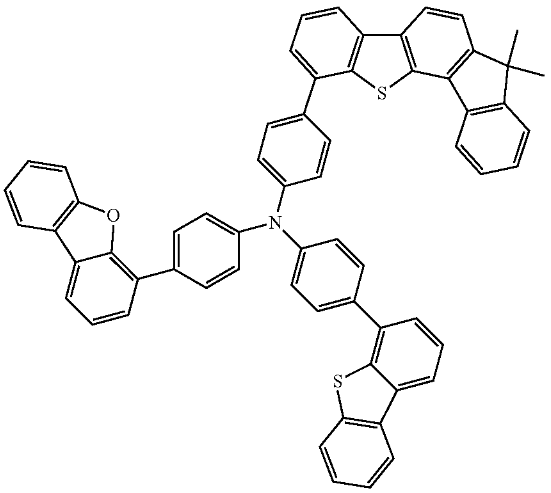
[2-51]
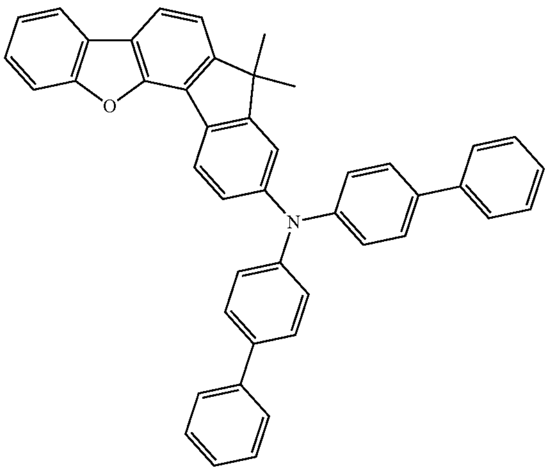
[2-52]
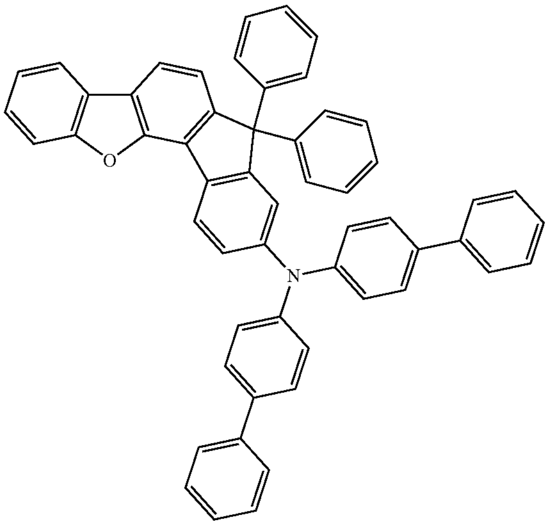

-continued
[2-53]
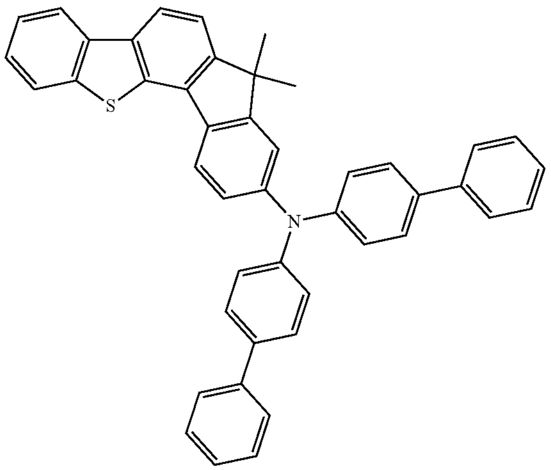
[2-54]
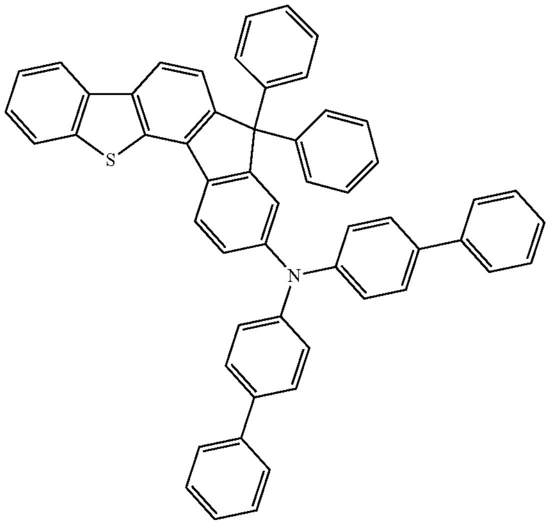
[2-55]
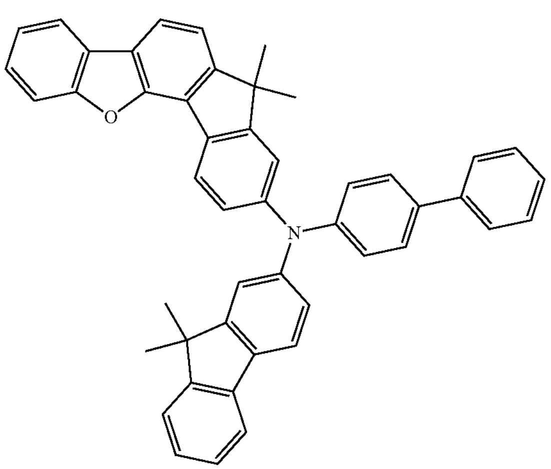
-continued
[2-56]
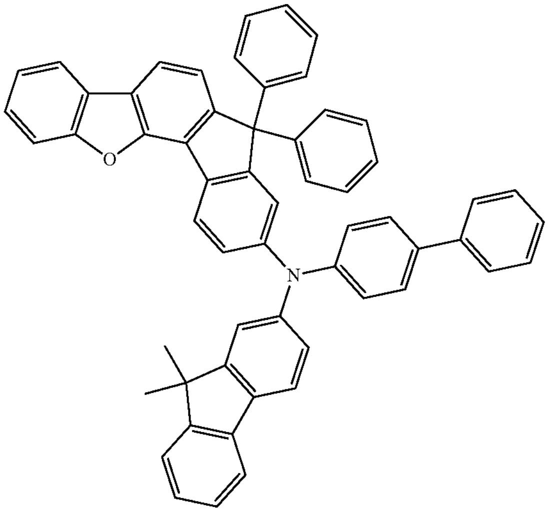
[2-57]
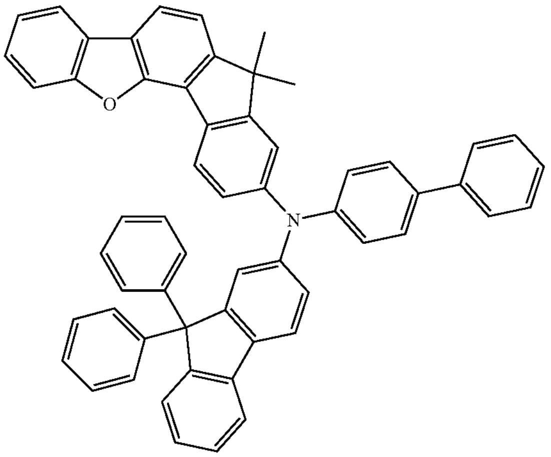
[2-58]
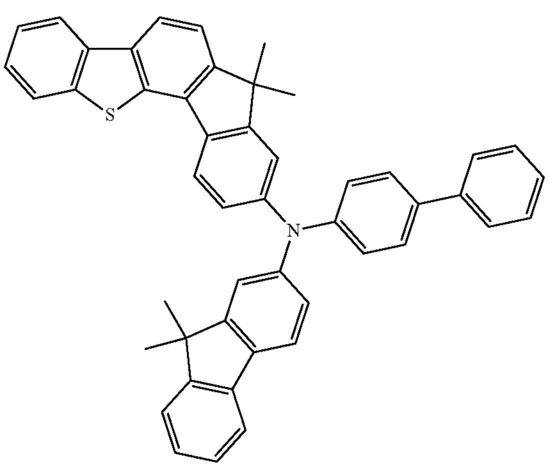

-continued
[2-59]
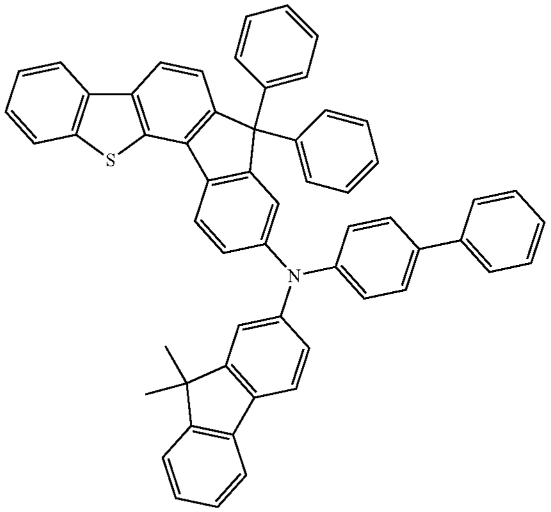
[2-60]
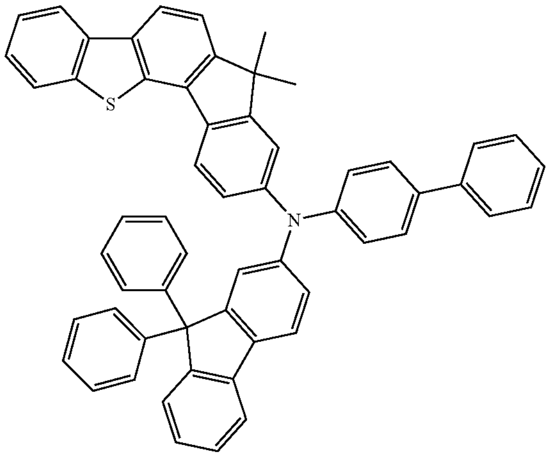
[2-61]
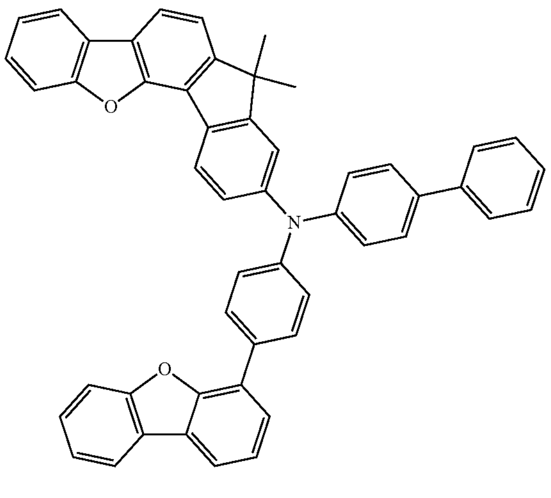
-continued
[2-62]
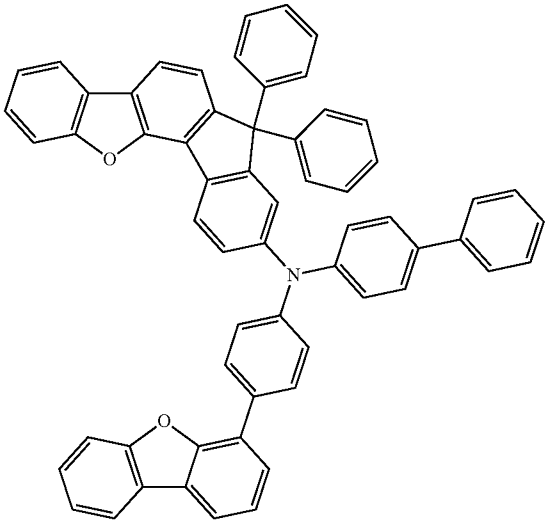
[2-63]
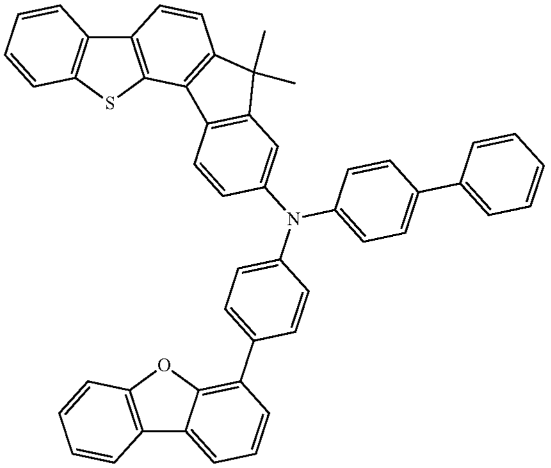
[2-64]
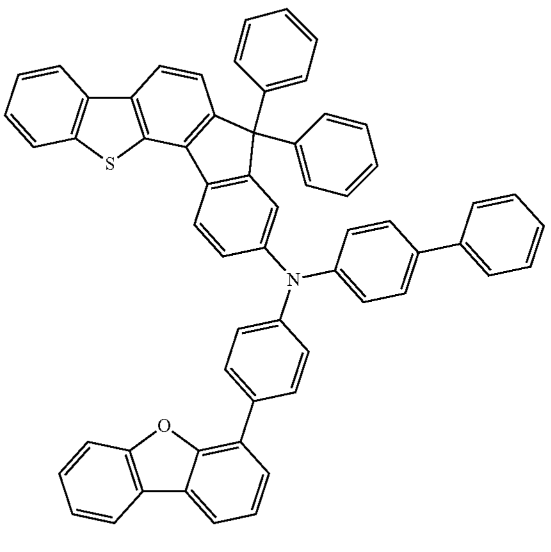

-continued
[2-65]
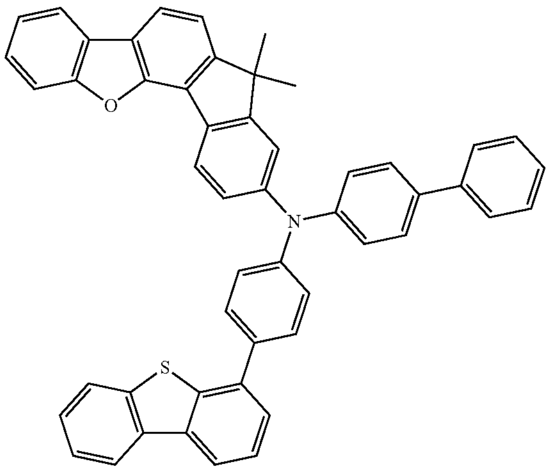
[2-66]
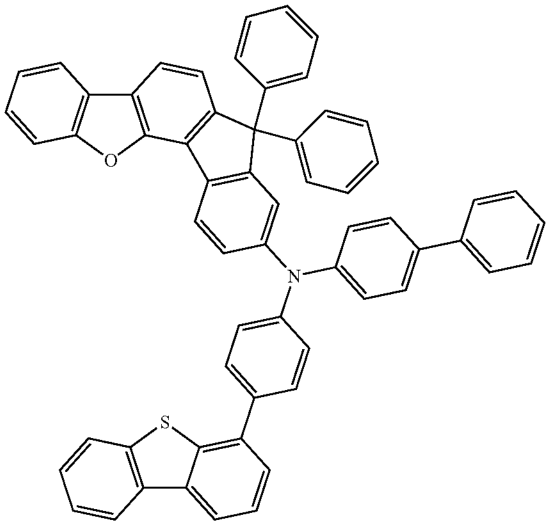
[2-67]
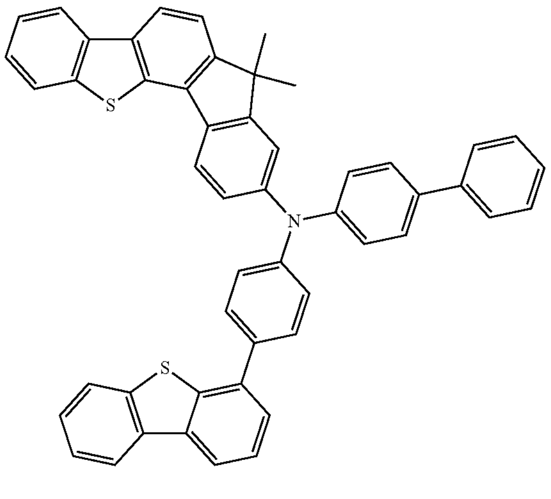
-continued
[2-68]
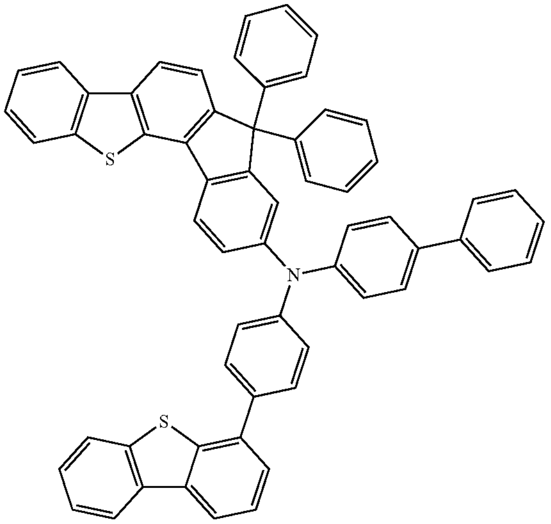
[2-69]
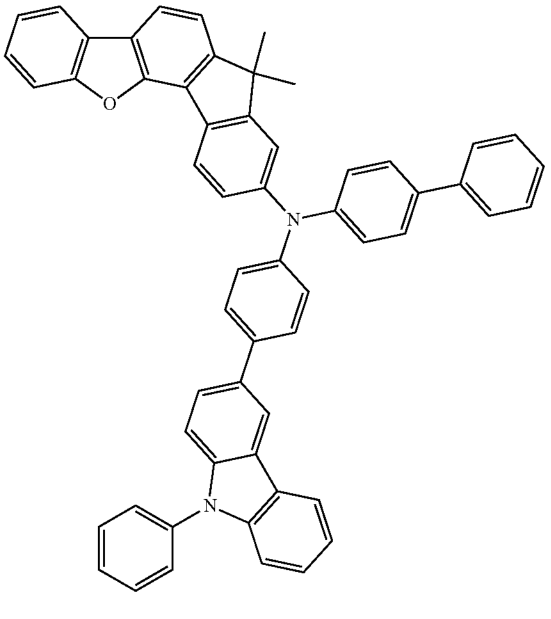

-continued
[2-70]
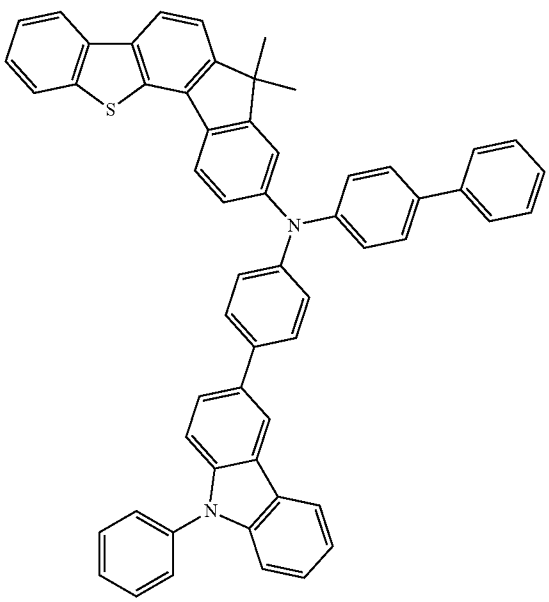
[2-71]
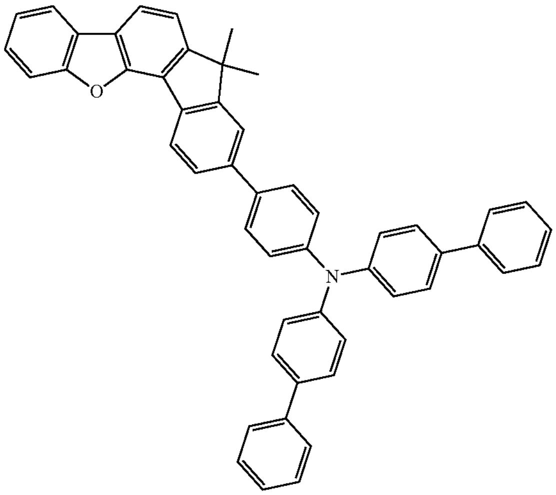
[2-72]
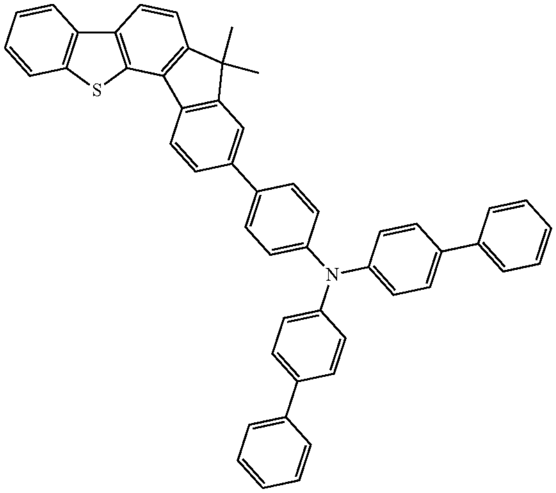
-continued
[2-73]
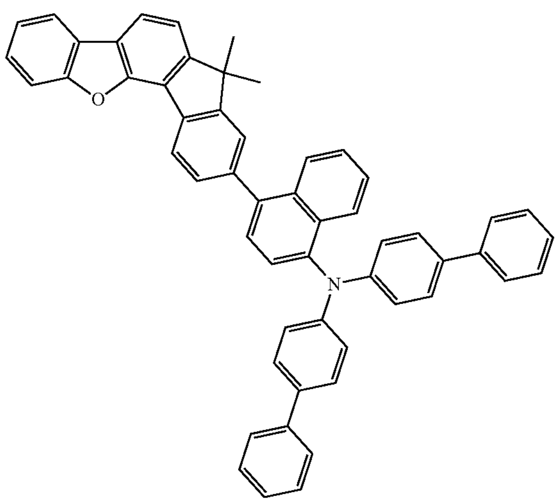
[2-74]
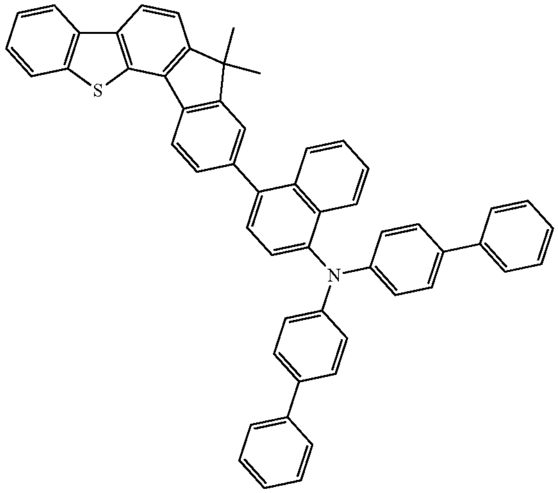
[2-75]
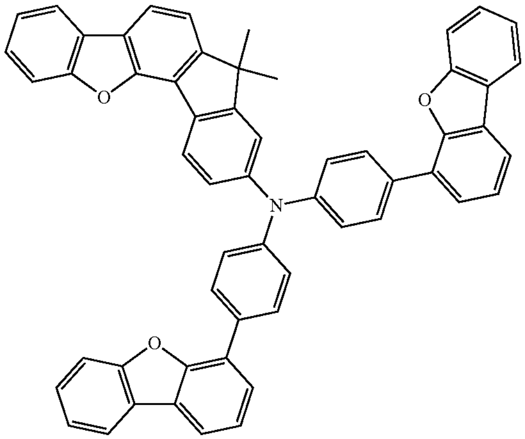

-continued
[2-76]
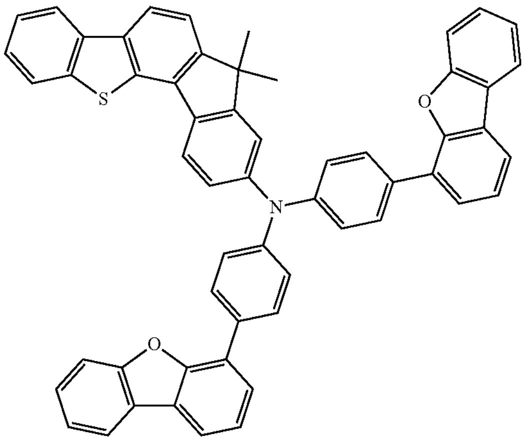
[2-77]
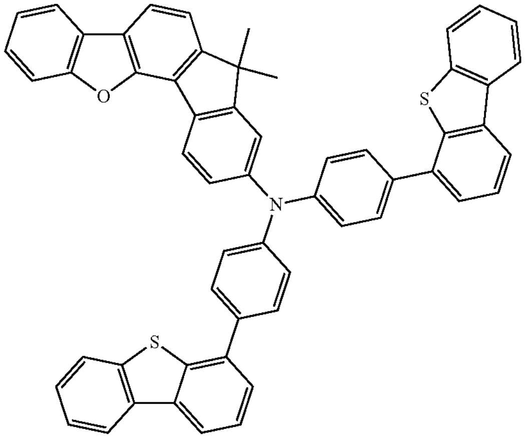
[2-78]
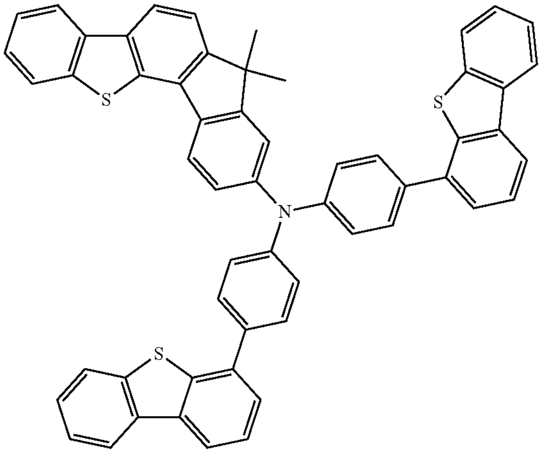
-continued
[2-79]
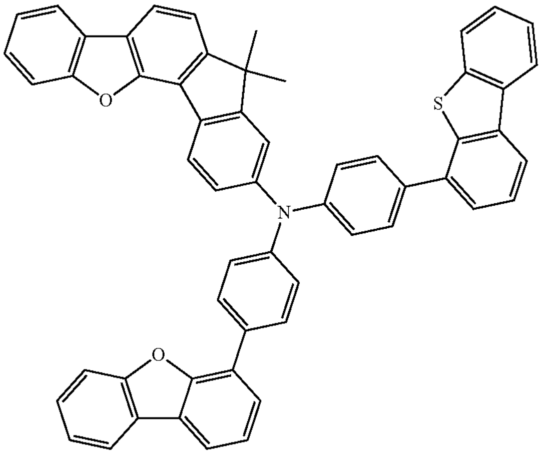
[2-80]
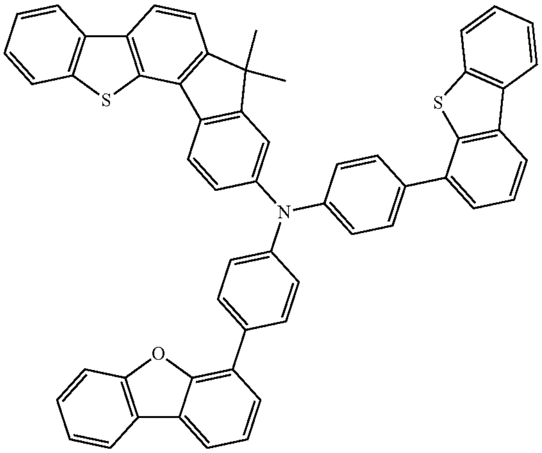
[2-81]
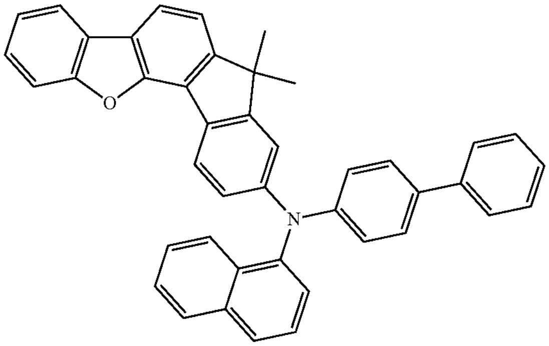

-continued
[2-82]
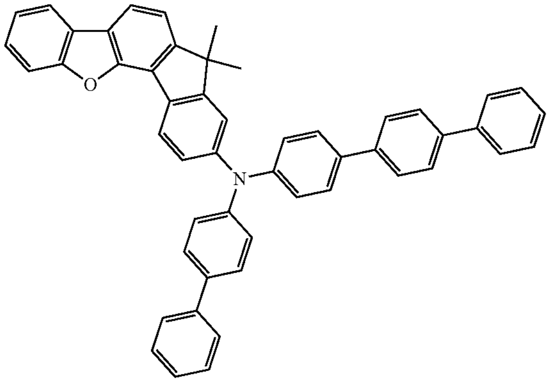
[2-83]
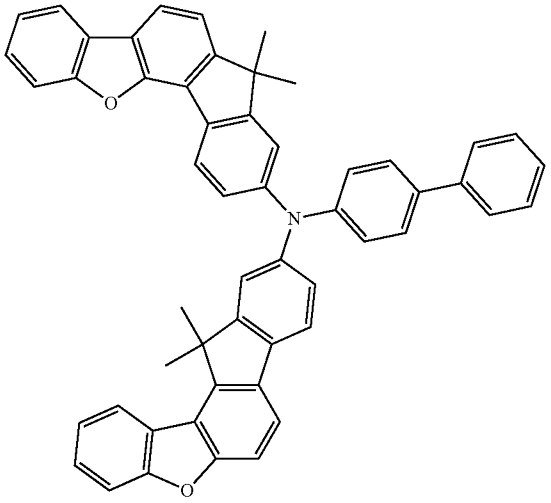
[2-84]
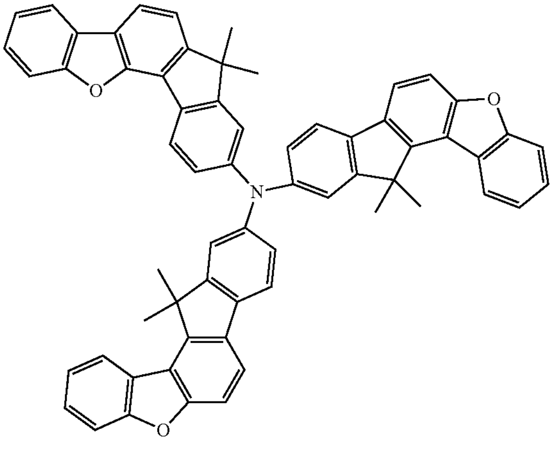
-continued
[2-85]
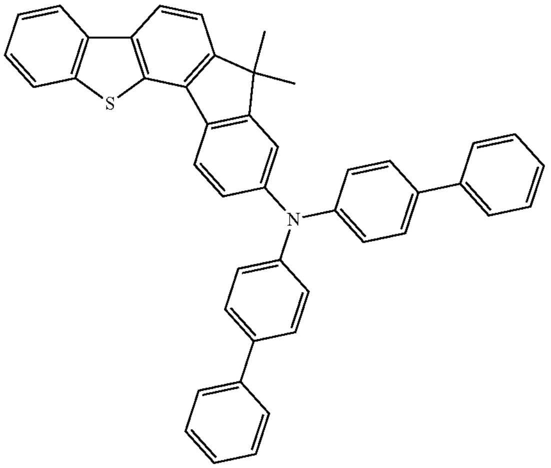
[2-86]
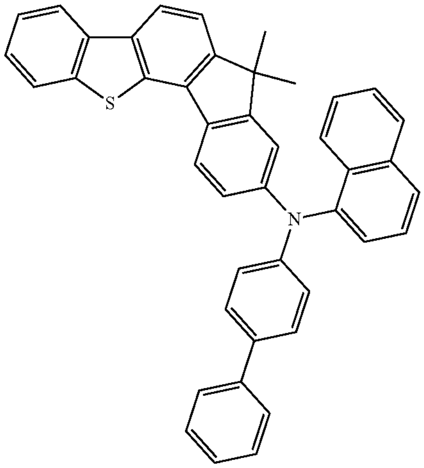
[2-87]
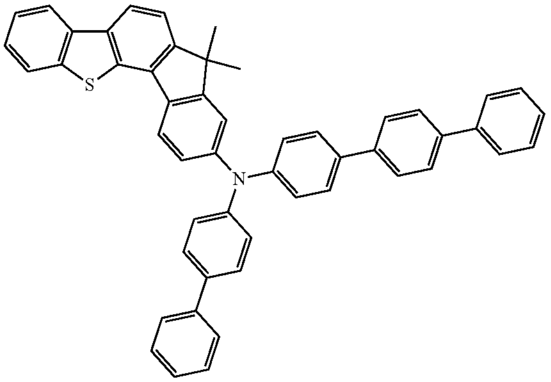

-continued
[2-88]
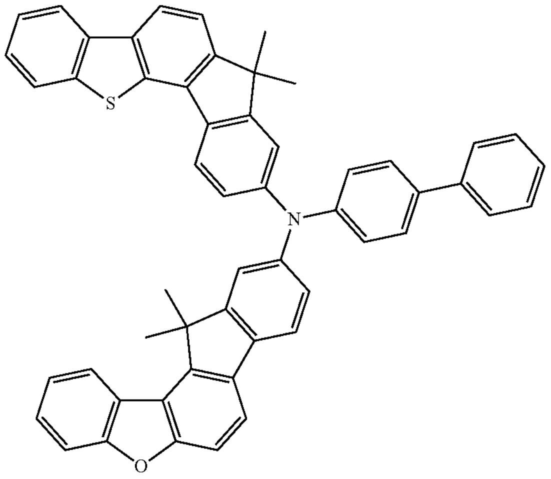
[2-89]
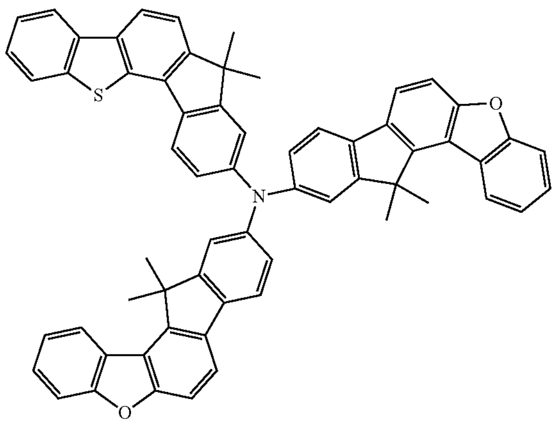
[2-90]
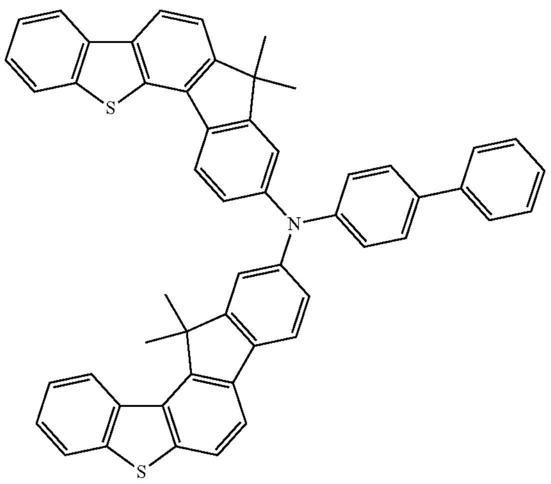
-continued
[2-91]
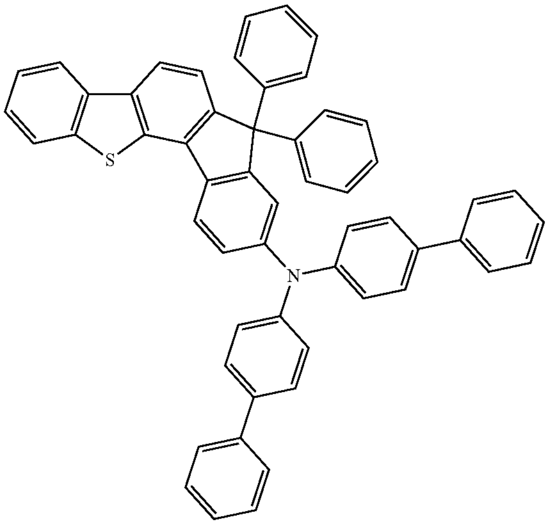
[2-92]
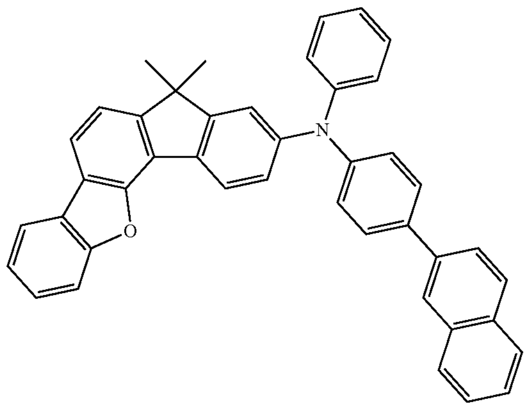
[2-93]
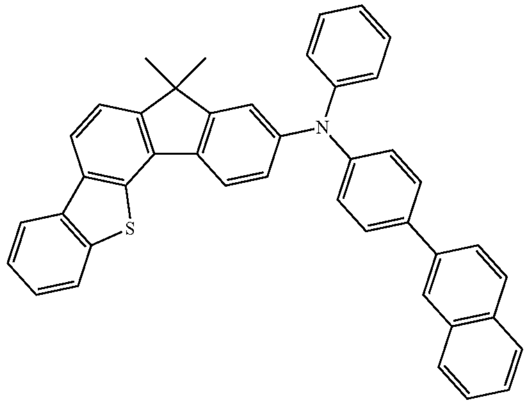

-continued
[2-94]
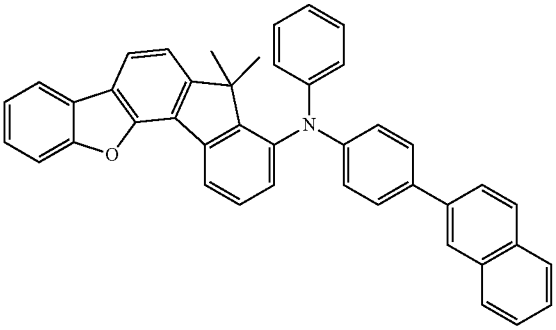
[2-05]
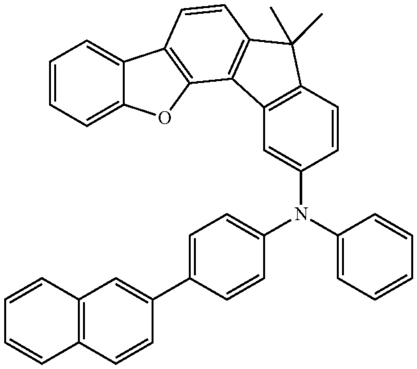
[2-96]
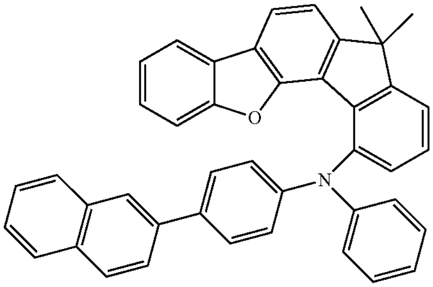
[2-97]
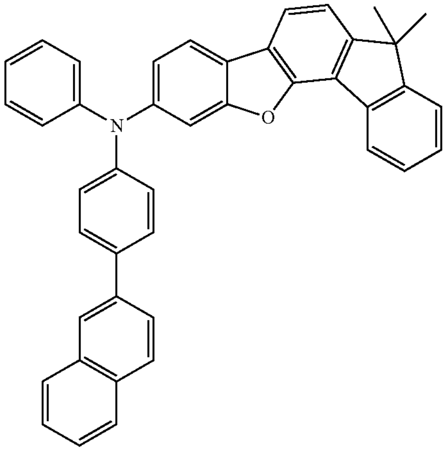
-continued
[2-98]
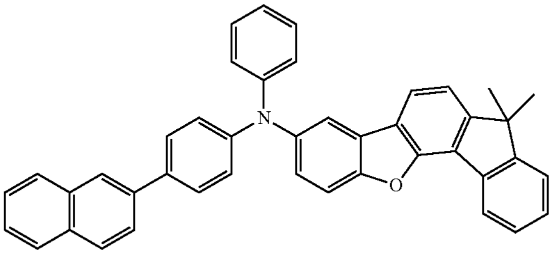
[2-99]
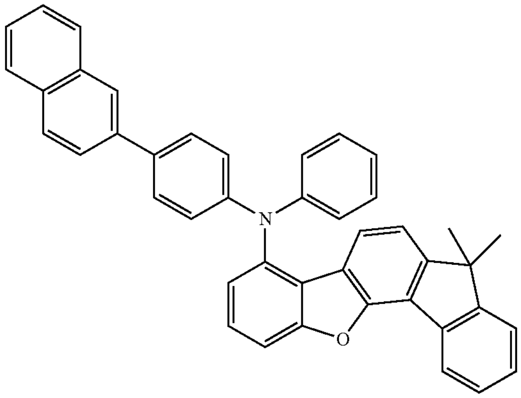
[2-100]
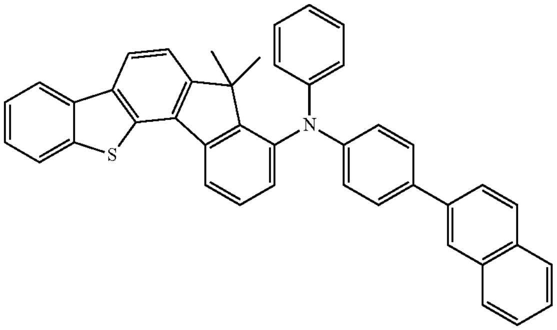
[2-101]
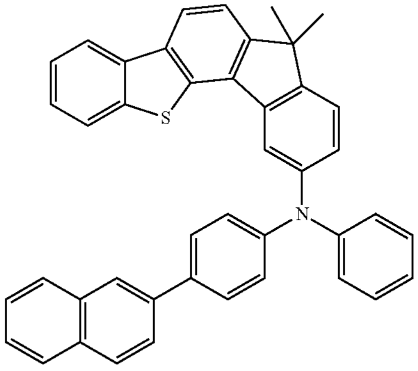

-continued
[2-102]
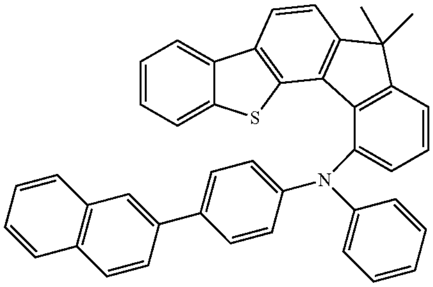
[2-103]
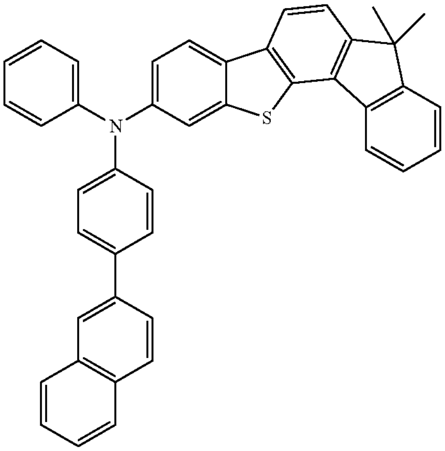
[2-104]
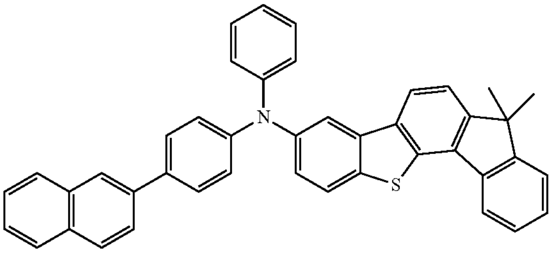
[2-105]
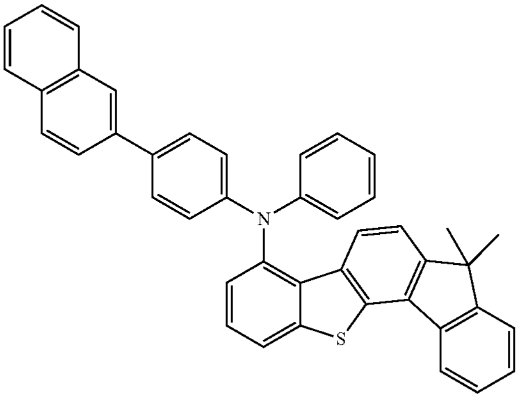
-continued
[2-106]
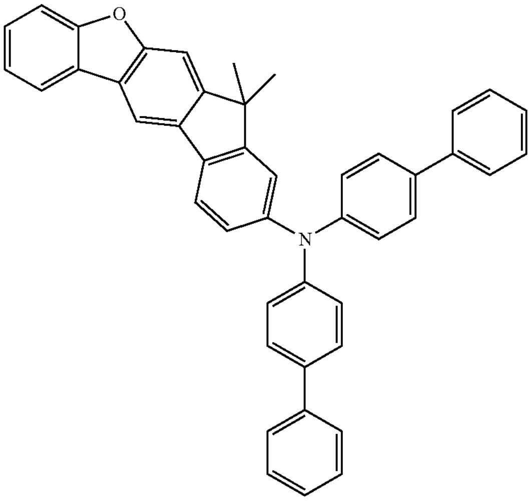
[2-107]
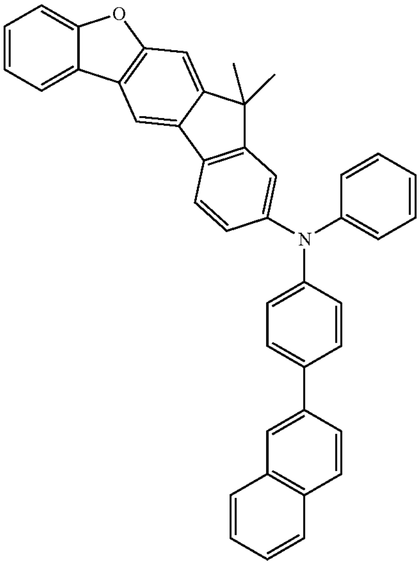
[2-108]
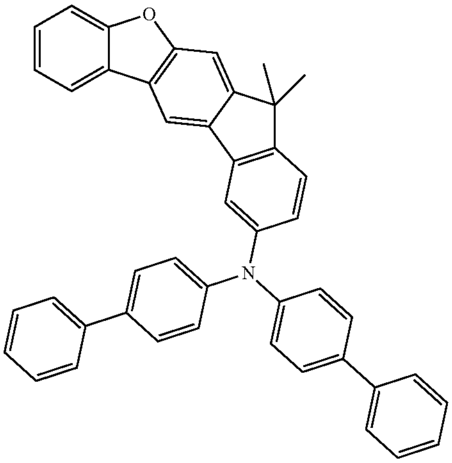

-continued
[2-109]
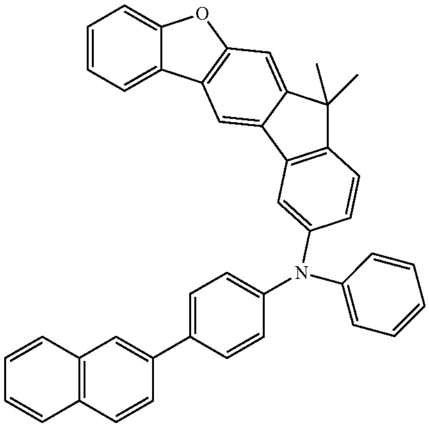
[2-110]
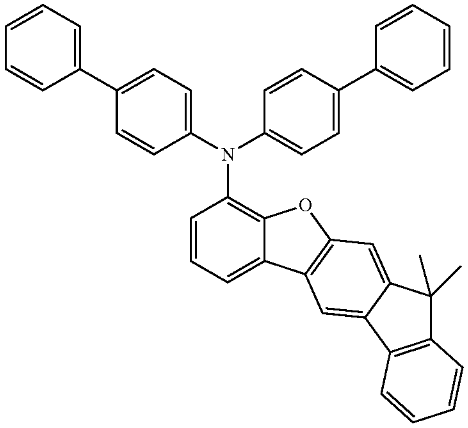
[2-111]
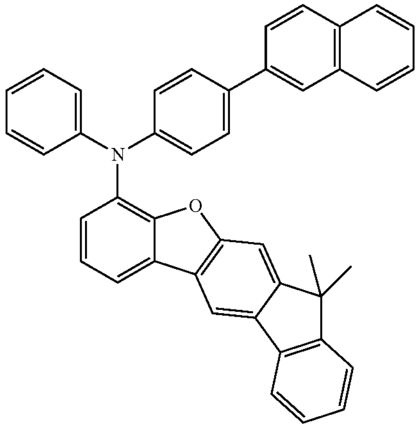
-continued
[2-112]
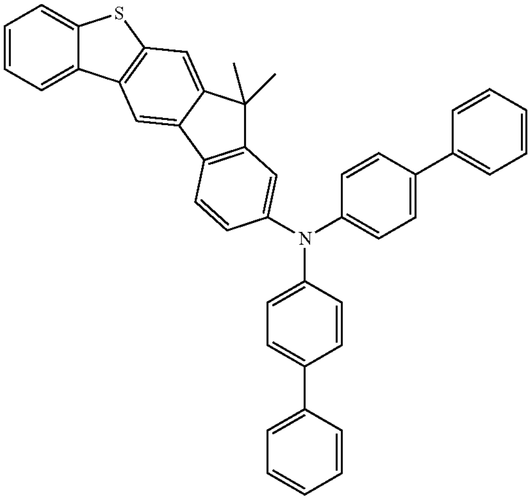
[2-113]
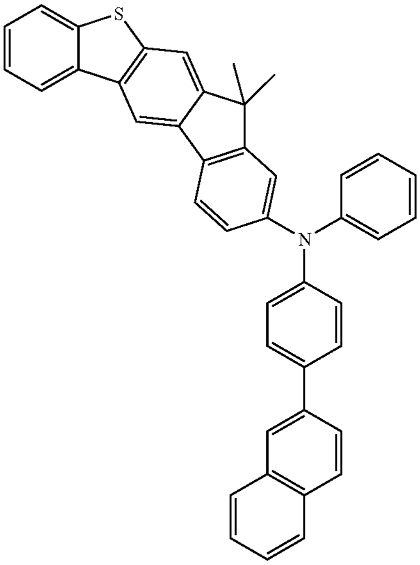
[2-114]
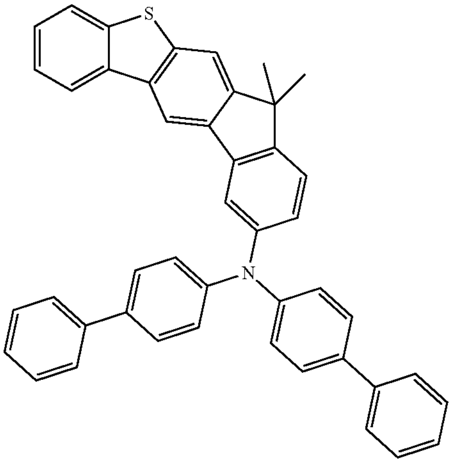

-continued
[2-115]
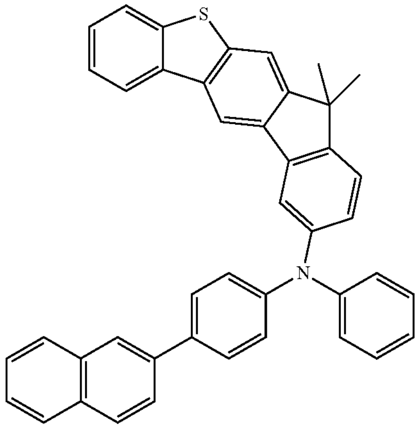
[2-116]
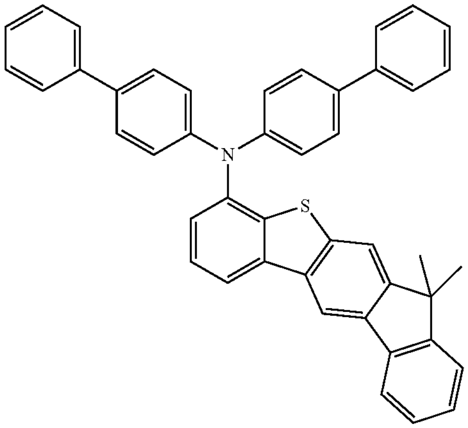
[2-117]
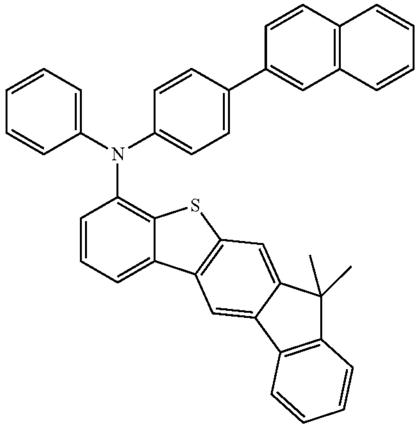
-continued
[2-118]
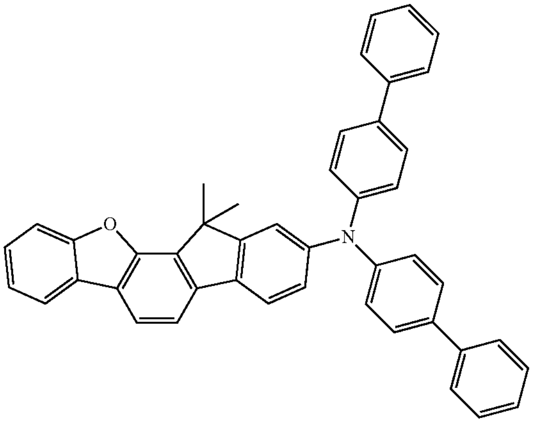
[2-119]
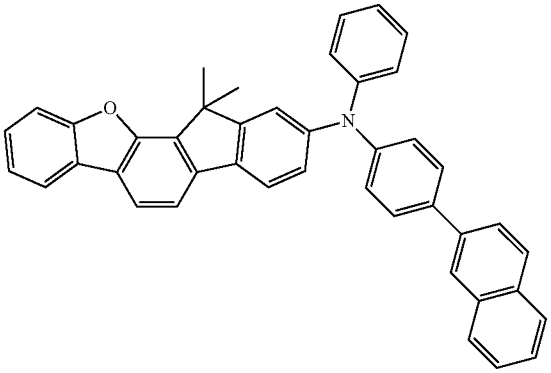
[2-120]
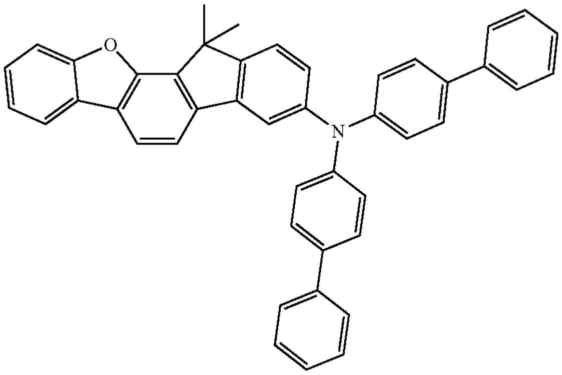

-continued
[2-121]
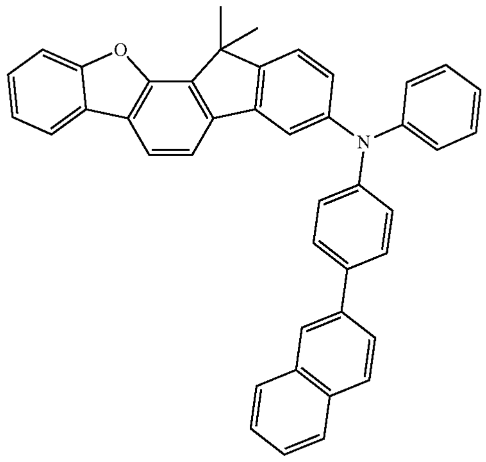
[2-122]
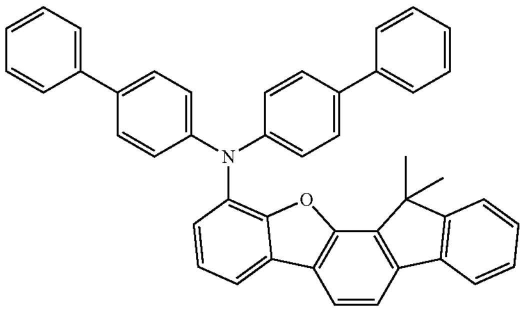
[2-123]
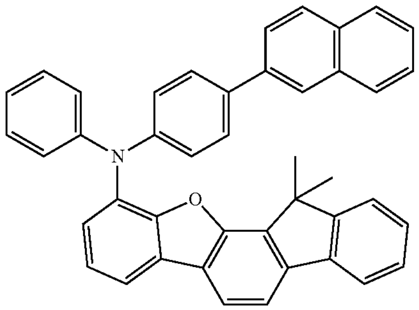
[2-124]
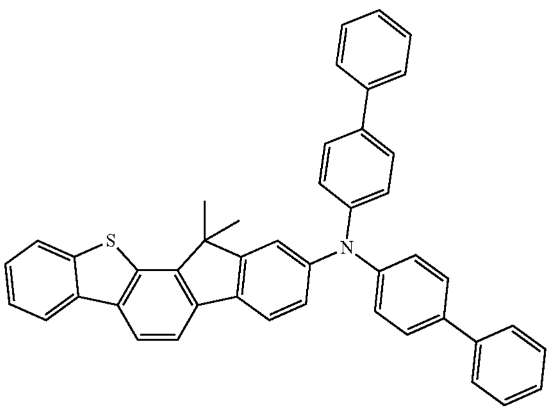
-continued
[2-125]
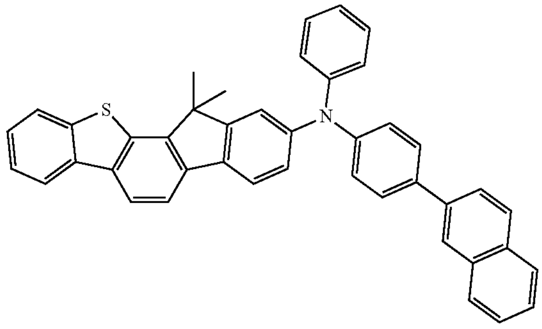
[2-126]
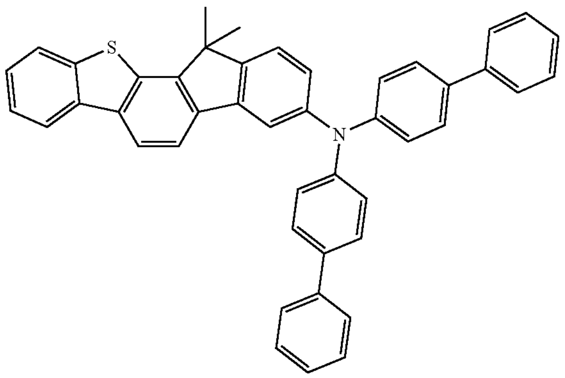
[2-127]
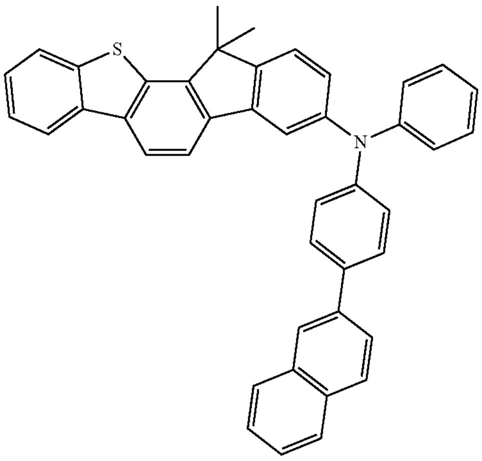
[2-128]
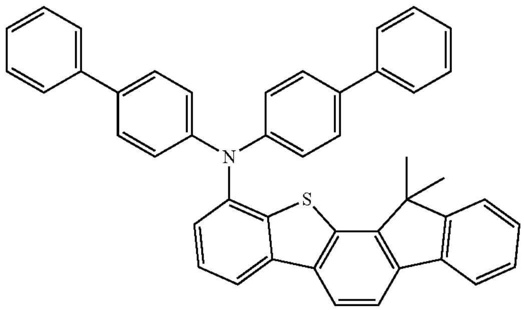

-continued
[2-129]
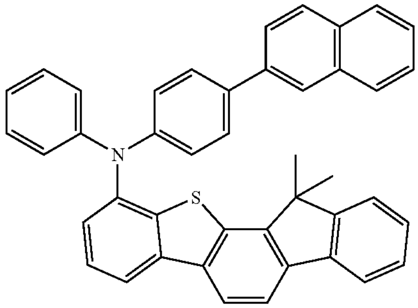
[2-130]
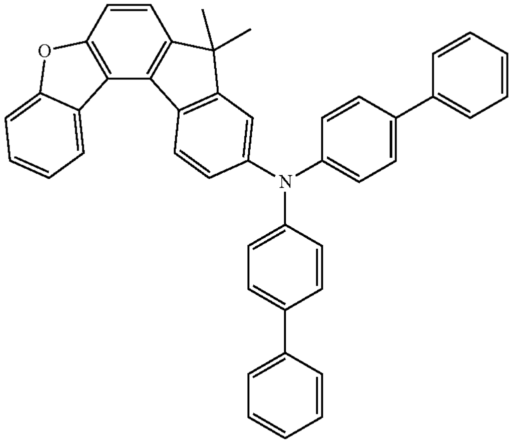
[2-131]
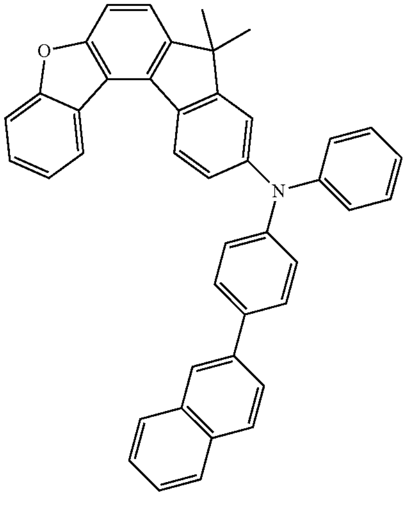
-continued
[2-132]
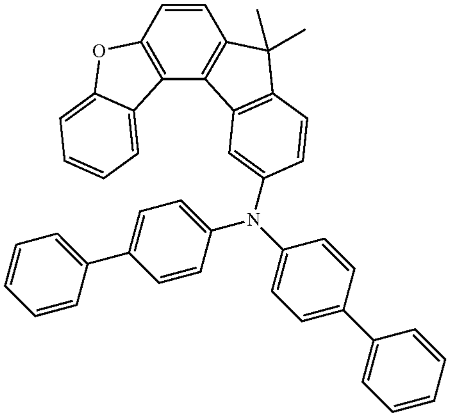
[2-133]
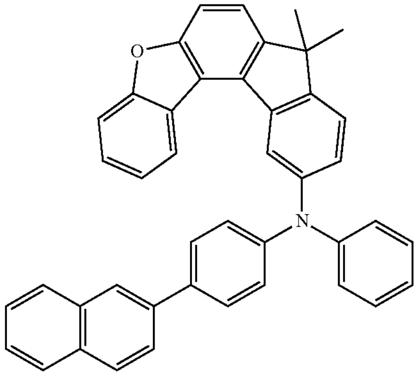
[2-134]
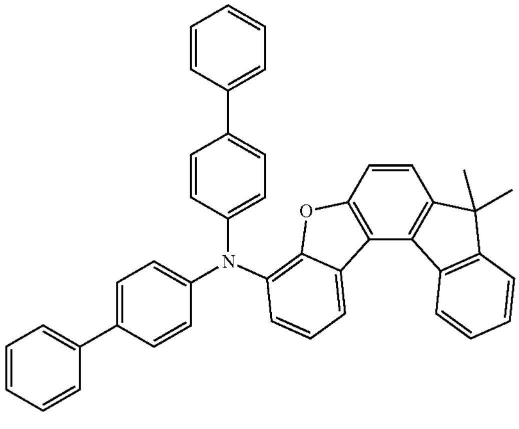

-continued
[2-135]
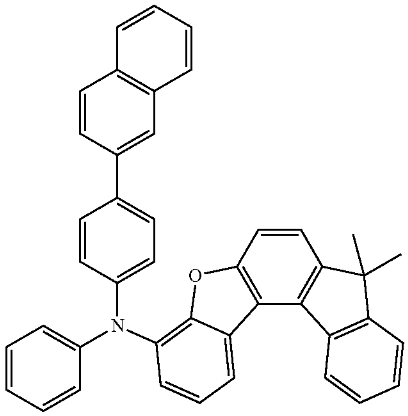
[2-136]
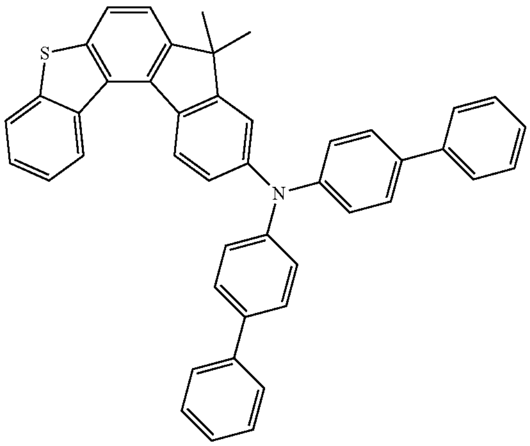
[2-137]
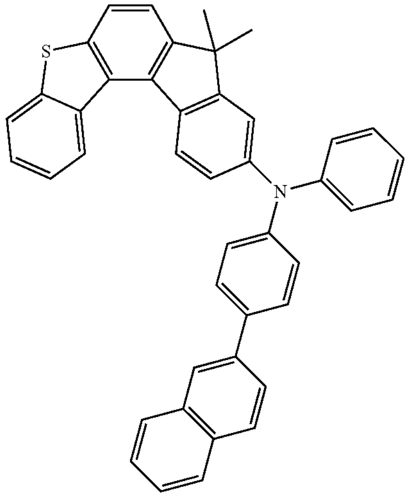
-continued
[2-138]
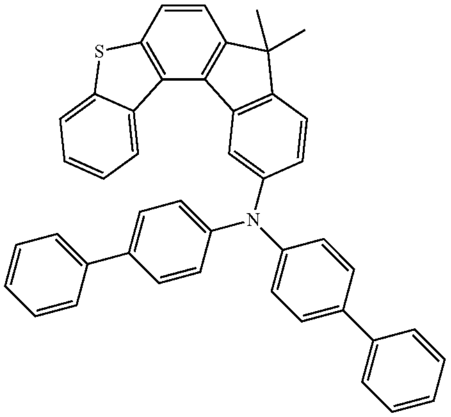
[2-139]
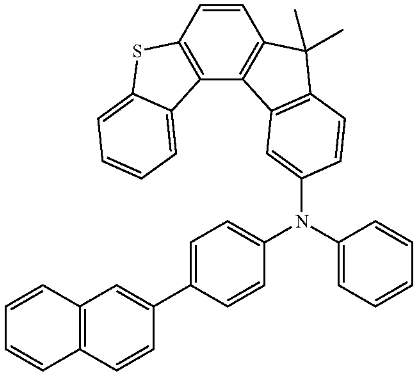
[2-140]
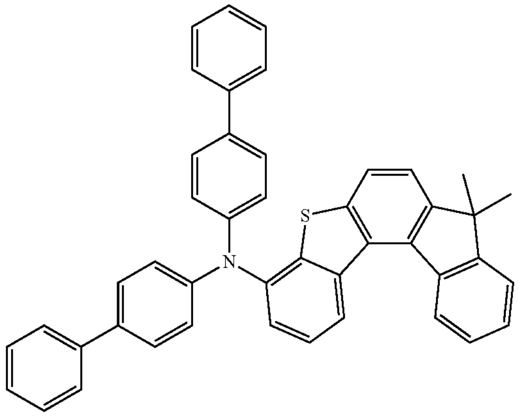

-continued
[2-141]
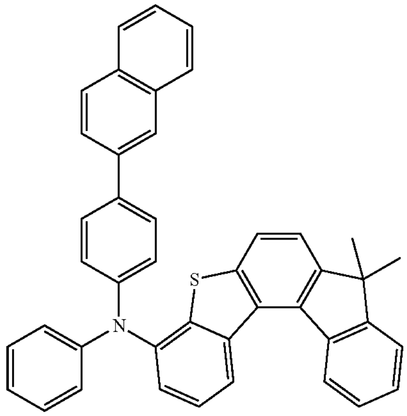
[2-142]
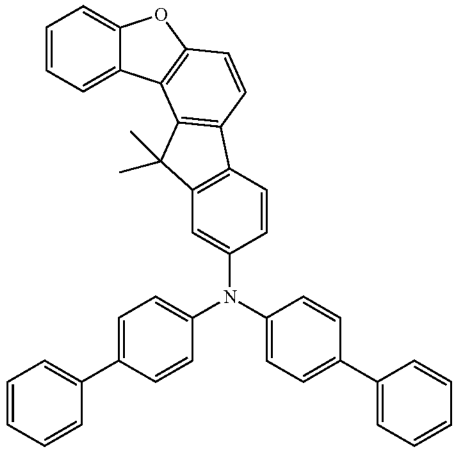
[2-143]
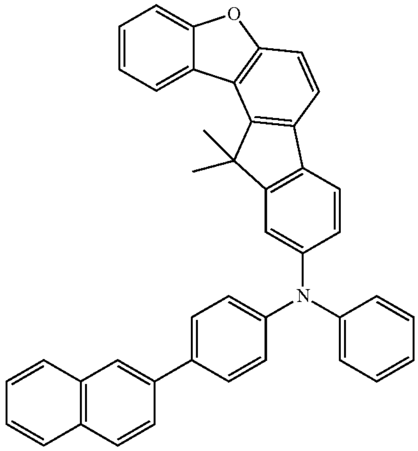
-continued
[2-144]
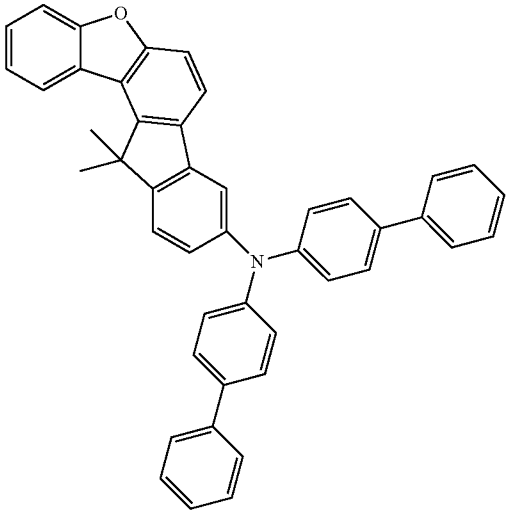
[2-145]
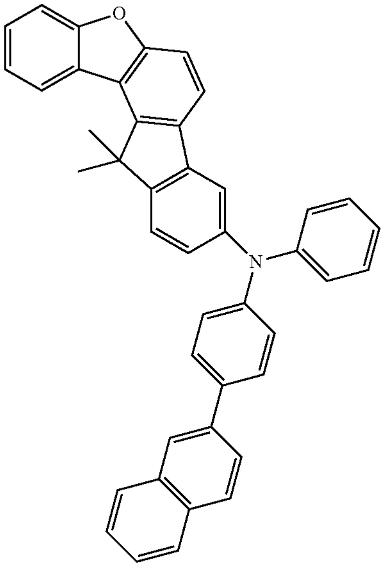
[2-146]
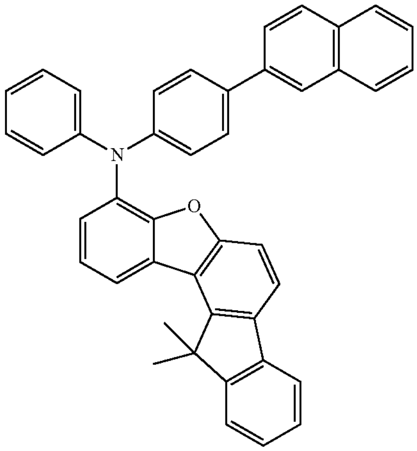

-continued
[2-147]
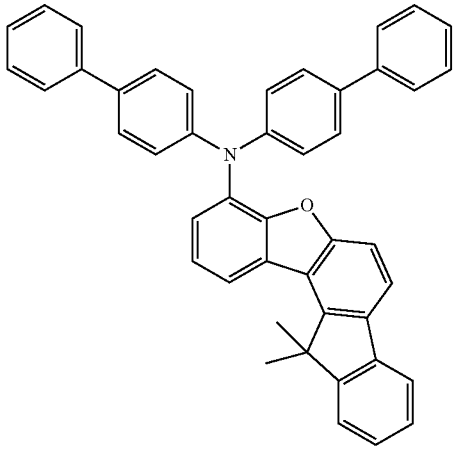
[2-148]
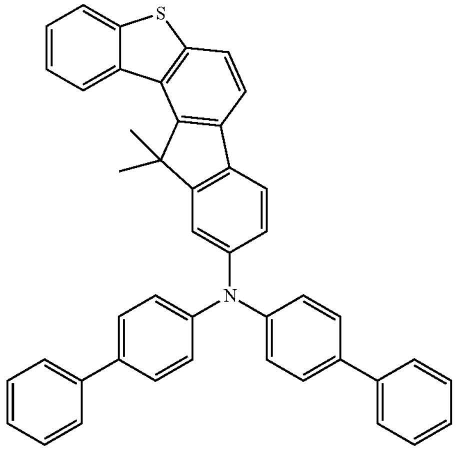
[2-149]
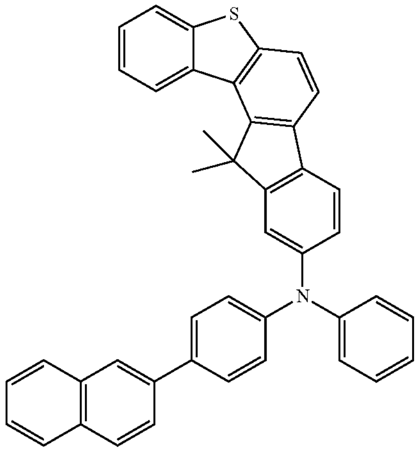
-continued
[2-150]
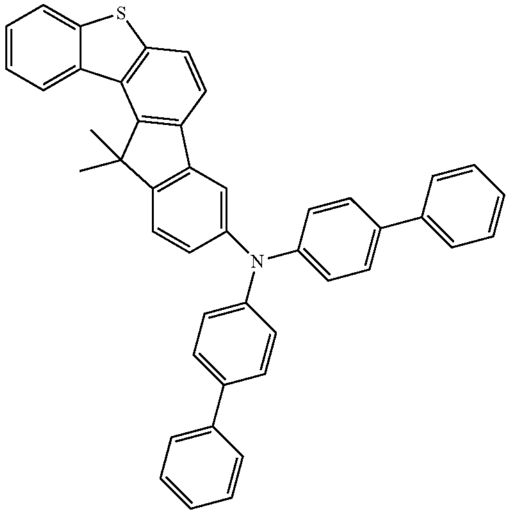
[2-151]
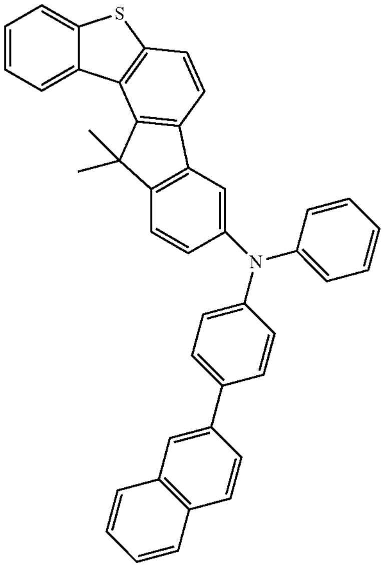
[2-152]
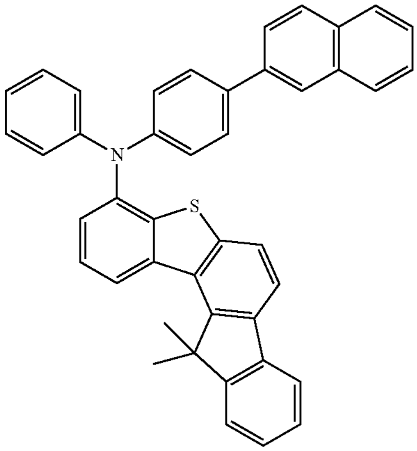

-continued
[2-153]
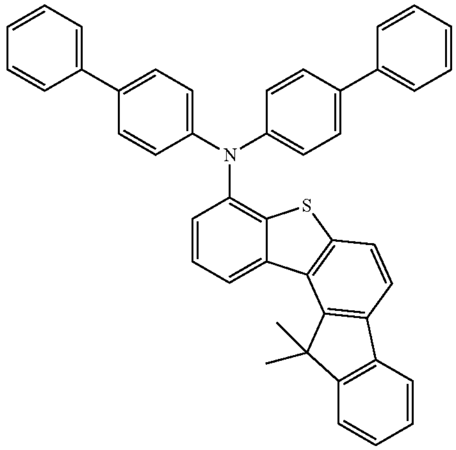
[2-154]
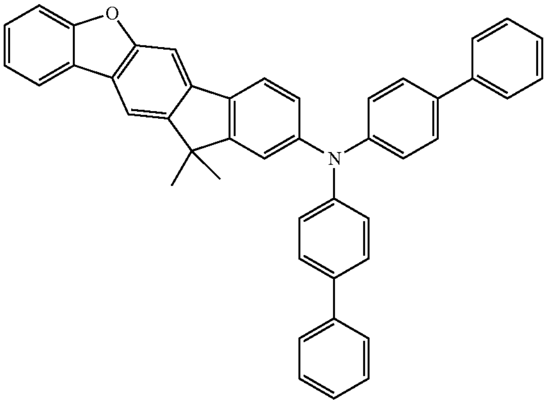
[2-155]
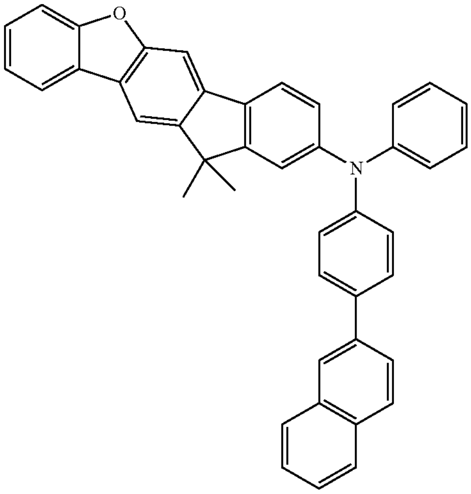
-continued
[2-156]
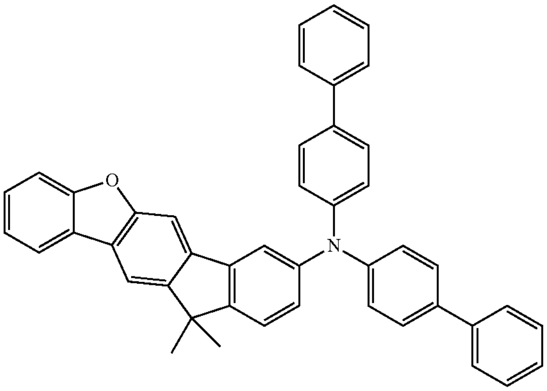
[2-157]
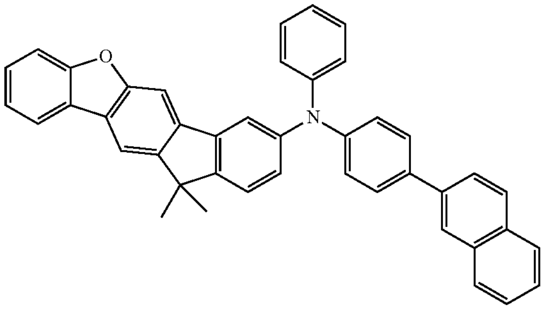
[2-158]
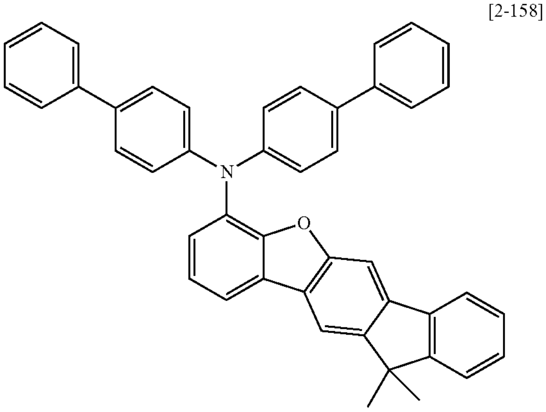
[2-159]
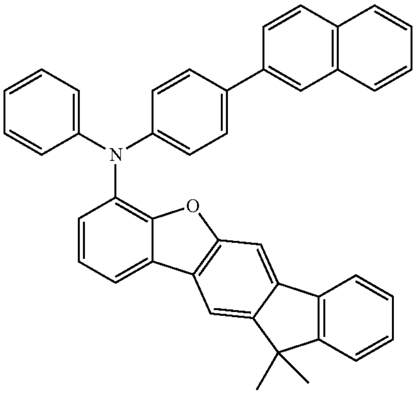

-continued
[2-160]
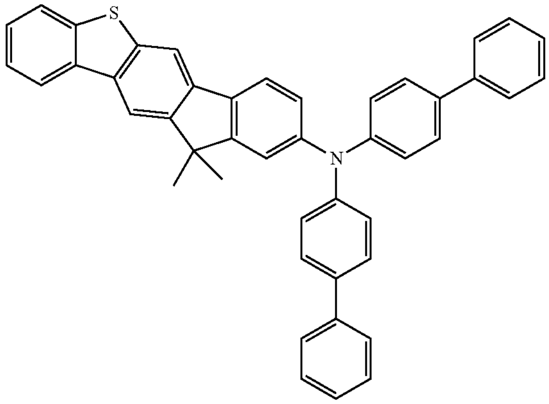
[2-161]
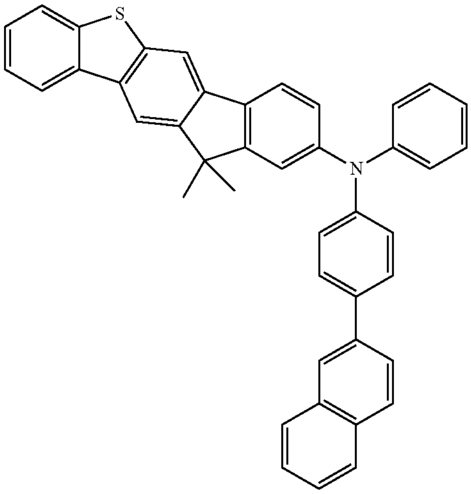
[2-162]
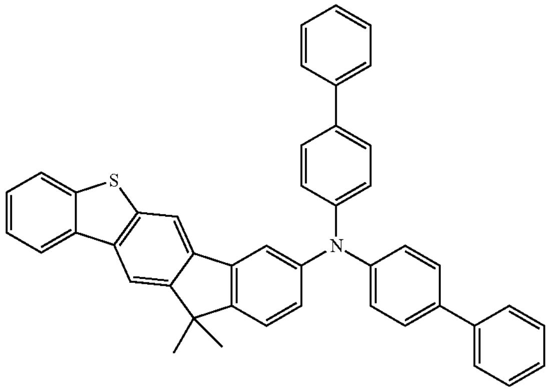
-continued
[2-163]
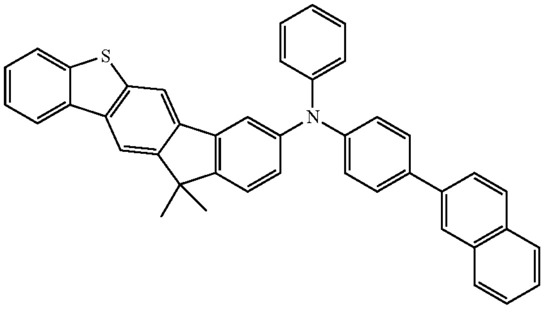
[2-164]
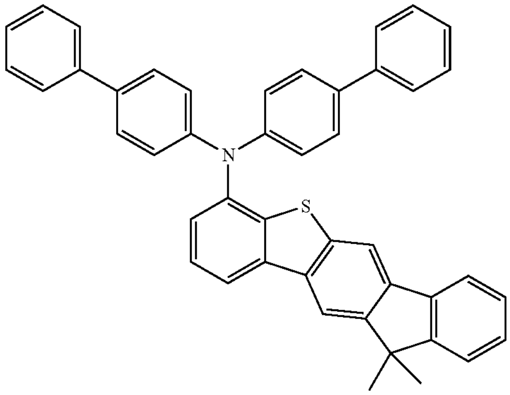
[2-165]
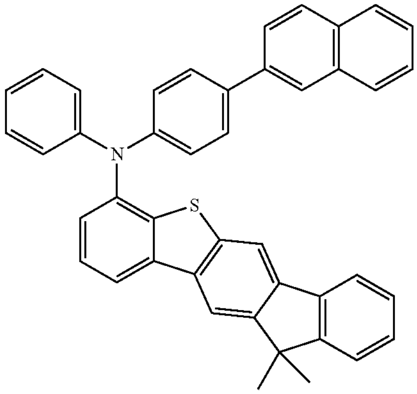
[2-166]
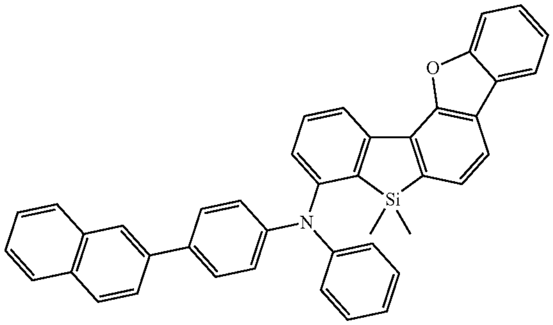

-continued
[2-167]
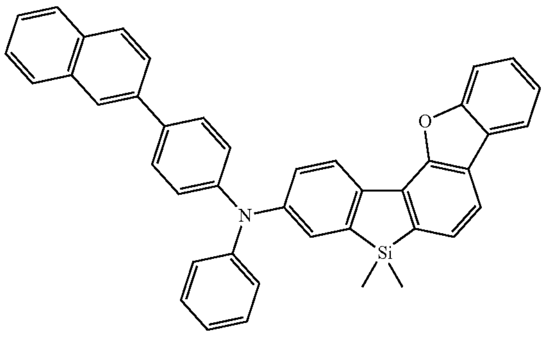
[2-168]
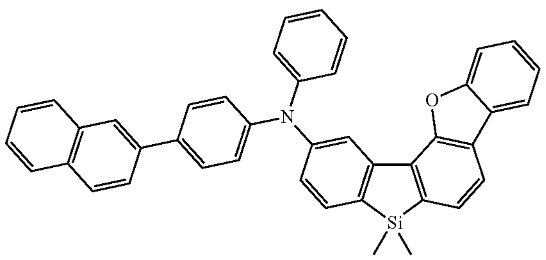
[2-169]
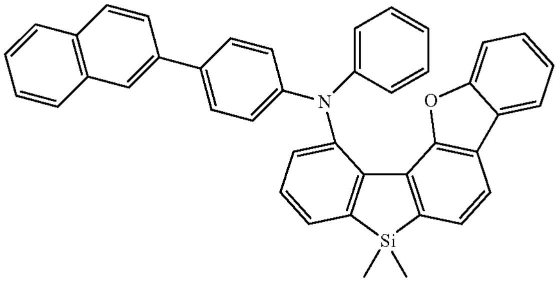
[2-170]
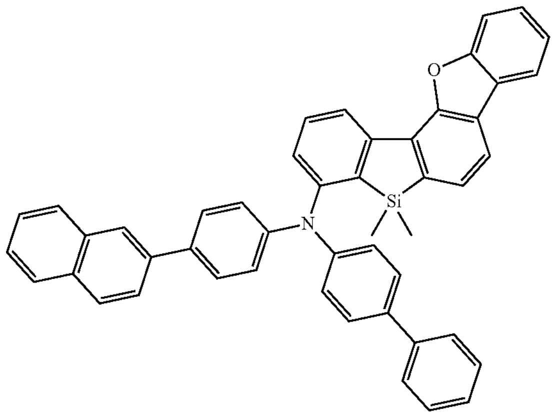
-continued
[2-171]
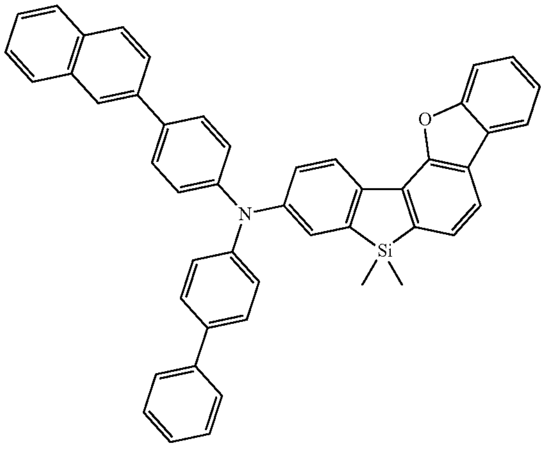
[2-172]
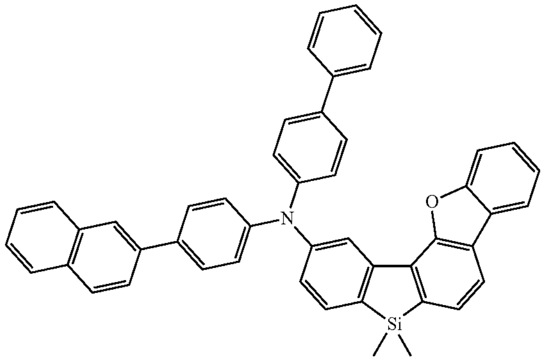
[2-173]
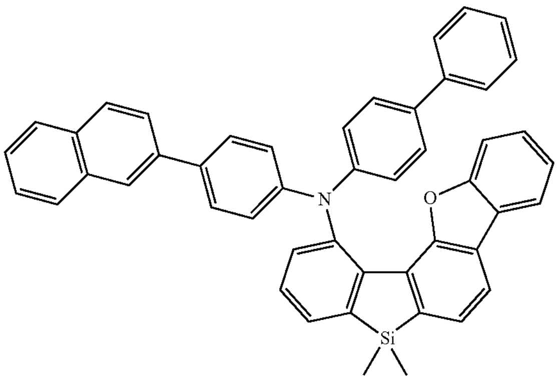
[2-174]
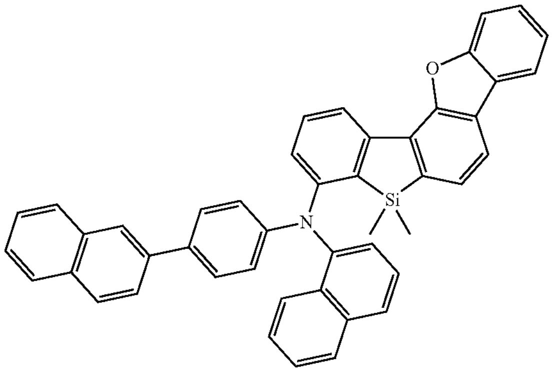

[2-175]
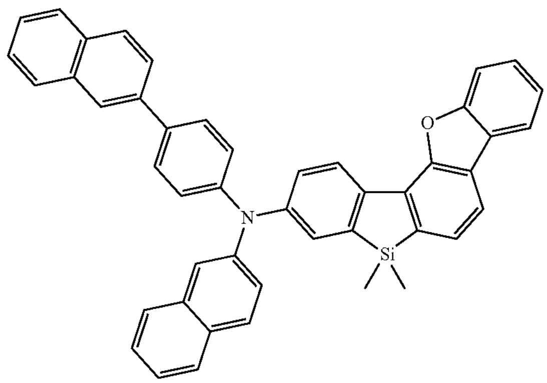
[2-176]
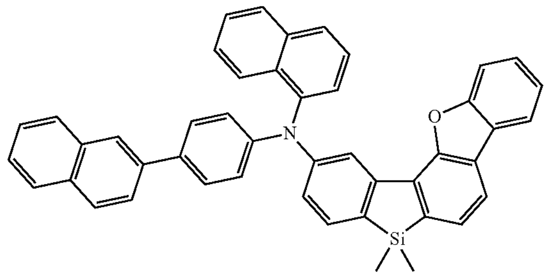
[2-177]
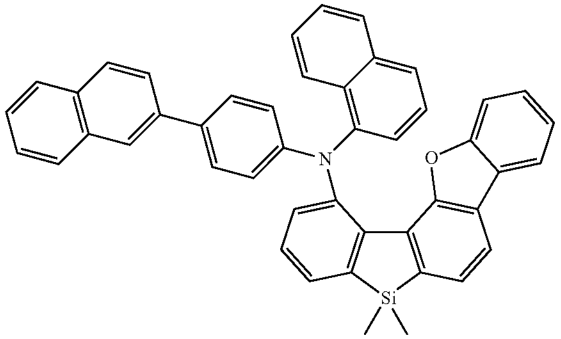
[2-178]
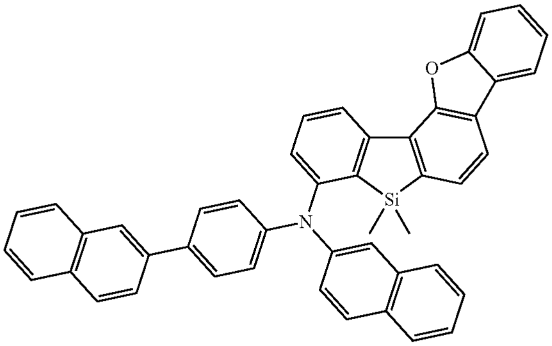
[2-179]
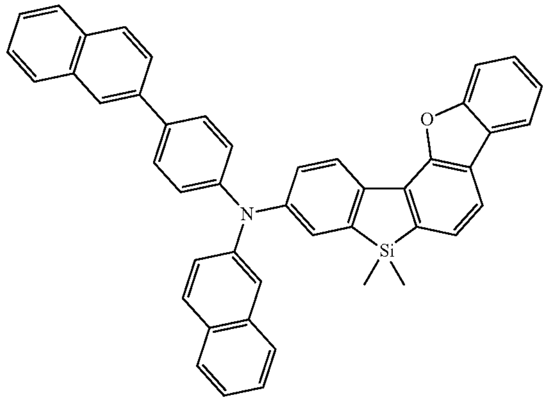
[2-180]
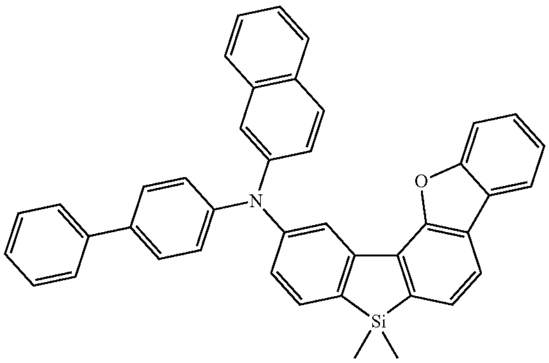
[2-181]
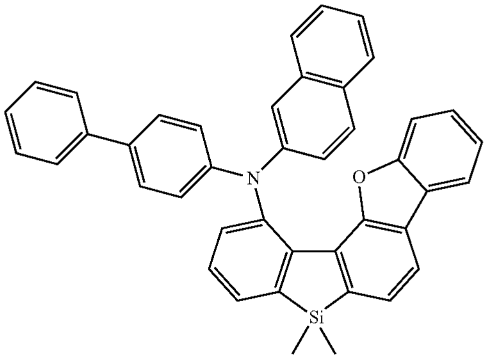
[2-182]
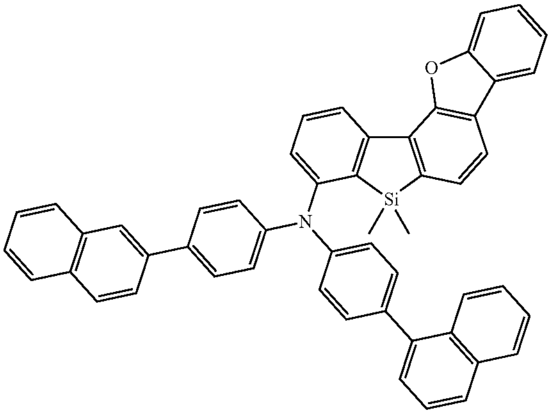

-continued
[2-183]
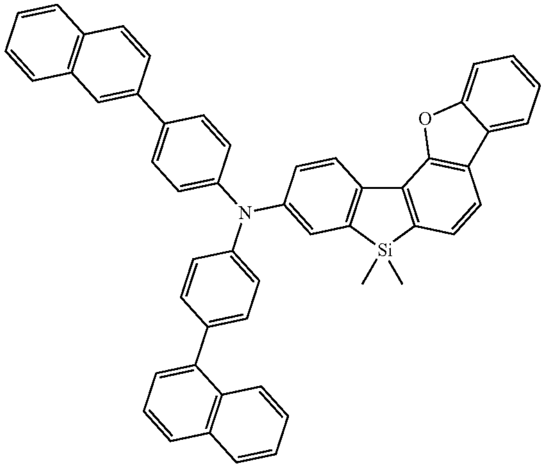
[2-184]
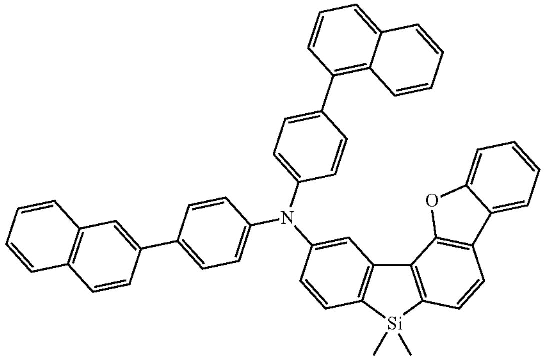
[2-185]
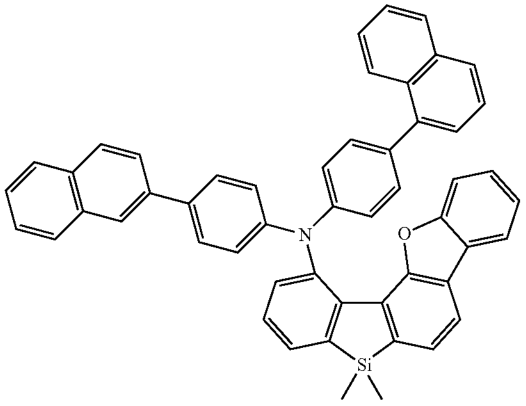
[2-186]
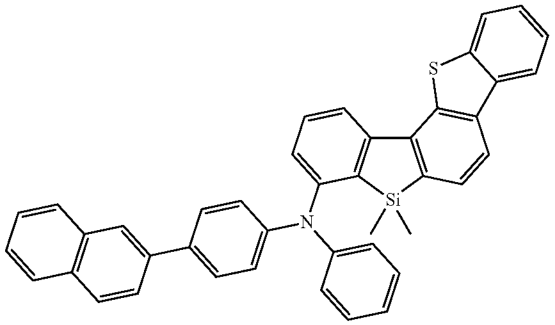
-continued
[2-187]
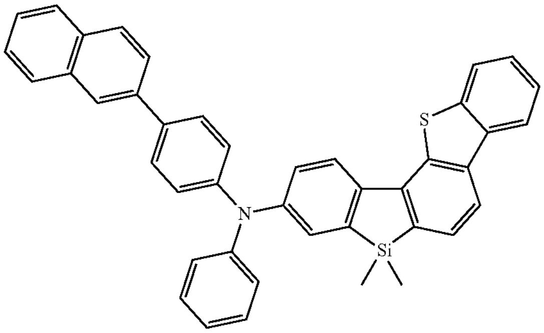
[2-188]
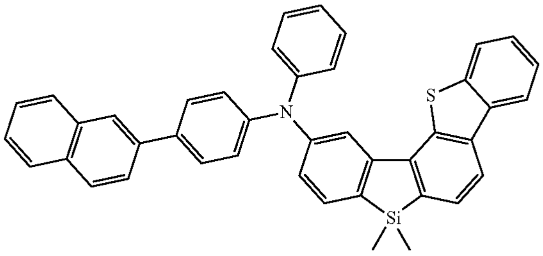
[2-189]
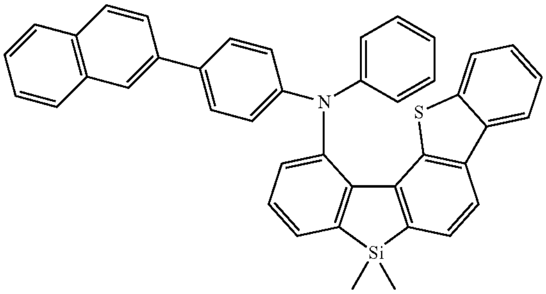
[2-190]
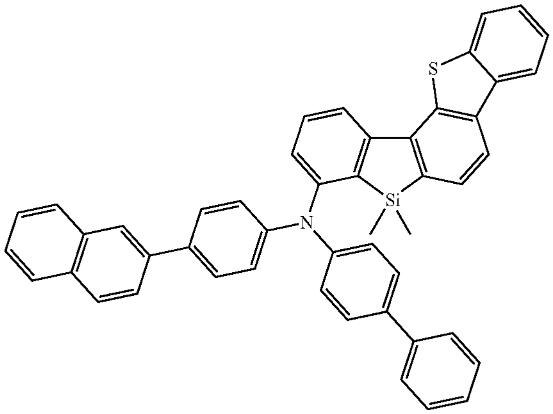

-continued
[2-191]
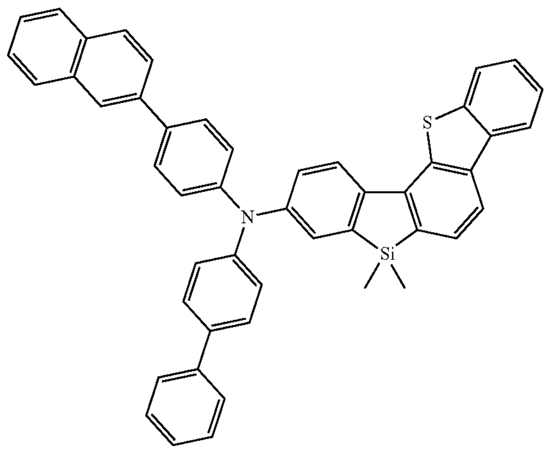
[2-192]
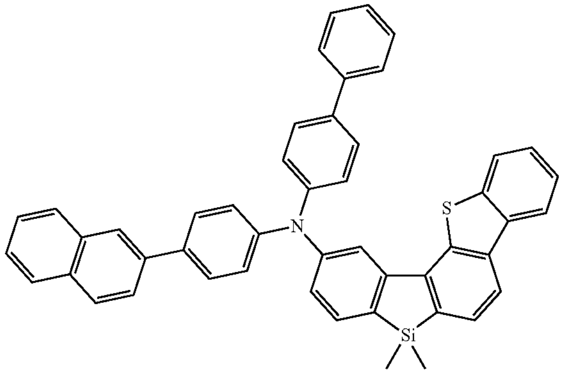
[2-193]
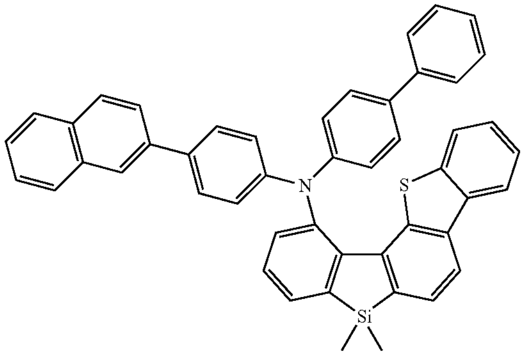
[2-194]
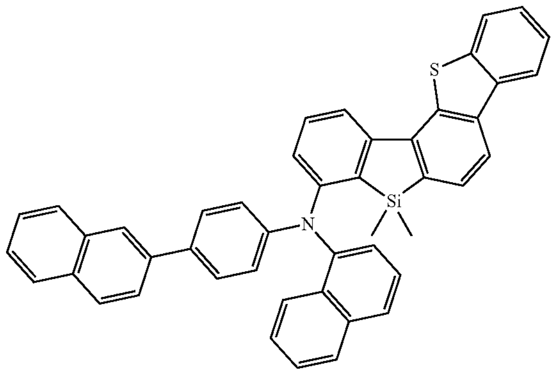
-continued
[2-195]
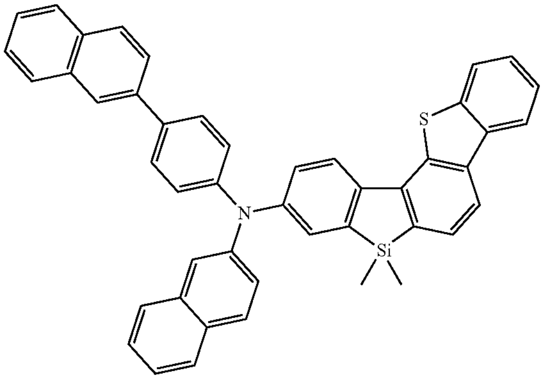
[2-196]
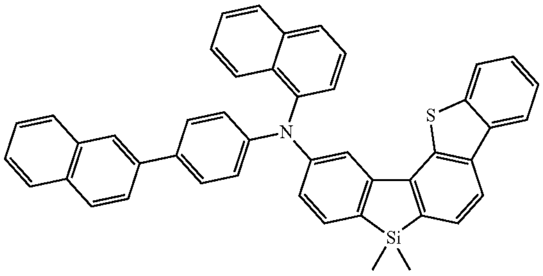
[2-197]
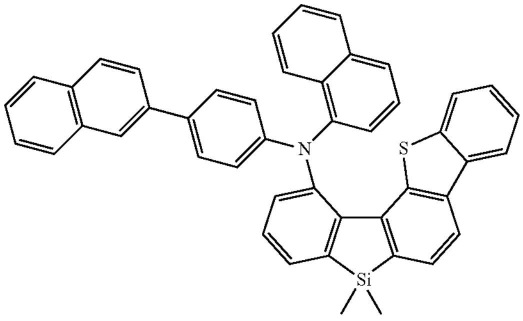
[2-198]
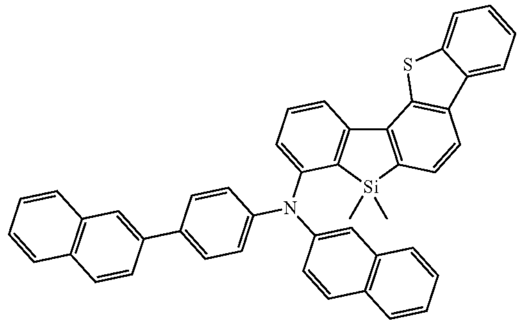

-continued
[2-199]
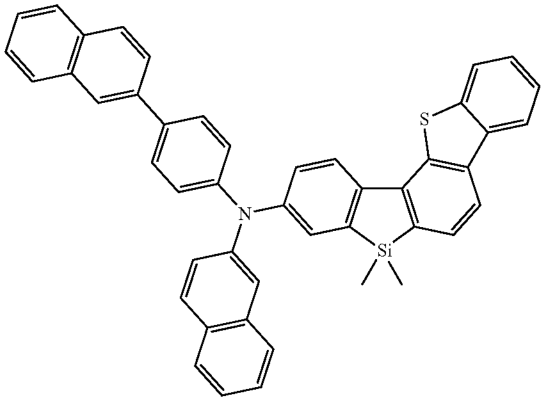
[2-200]
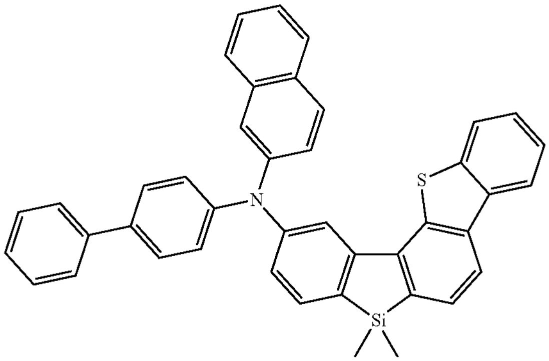
[2-201]
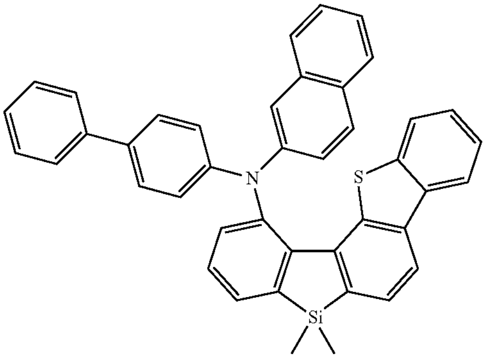
[2-102]
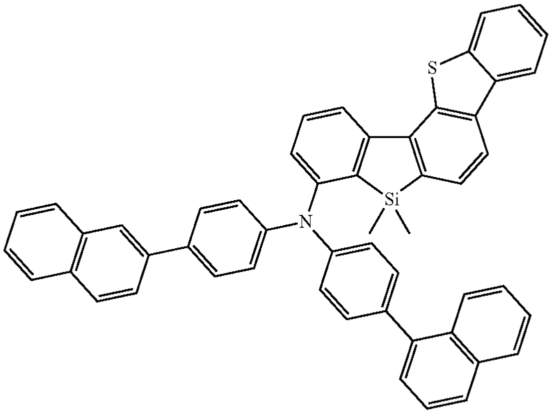
-continued
[2-203]
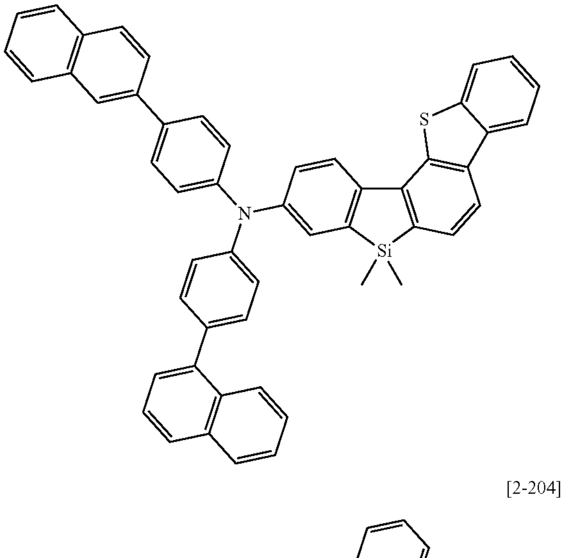
[2-204]
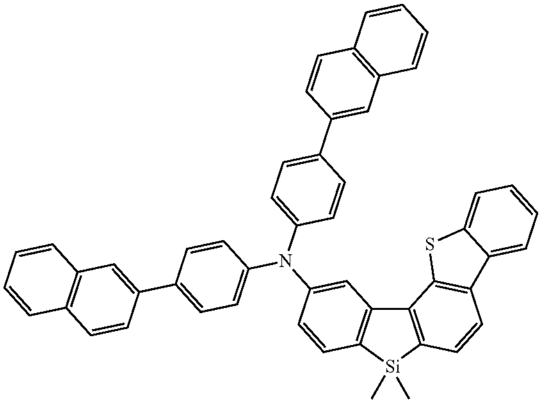
[2-205]
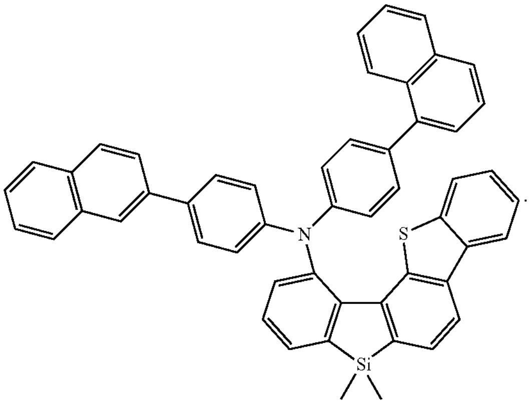
11. The composition as claimed in claim 1, wherein:
the first compound is represented by Chemical Formula 1a,
the second compound is represented by Chemical Formula 2I-C-2 or Chemical Formula 2II-F-2:

[Chemical Formula 1a]

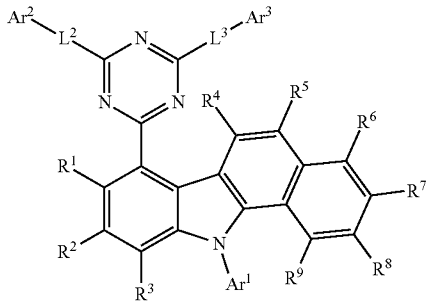

in Chemical Formula 1a, $L^2$ and $L^3$ are each independently a single bond or a substituted or unsubstituted phenylene group, $Ar^1$ is a substituted or unsubstituted phenyl group or a substituted or unsubstituted biphenyl group, $Ar^2$ and $Ar^3$ are each independently a substituted or unsubstituted phenyl group, a substituted or unsubstituted biphenyl group, a substituted or unsubstituted dibenzofuranyl group, or a substituted or unsubstituted dibenzothiophenyl group, and $R^1$ to $R^9$ are each independently hydrogen, deuterium, a substituted or unsubstituted C1 to C10 alkyl group, or a substituted or unsubstituted C6 to C12 aryl group;

[Chemical Formula 2I-C-2]

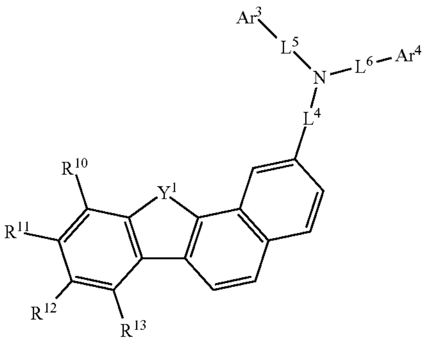

-continued

[Chemical Formula 2I-F-2]

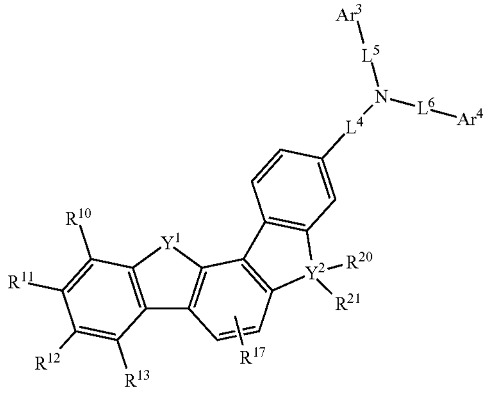

in Chemical Formula 2I-C-2 and Chemical Formula 2II-F-2, $Y^1$ is O, S, or N—$R^b$, $Y^2$ is C or Si, $R^b$ is a substituted or unsubstituted phenyl group, $R^{10}$ to $R^{13}$ and $R^{17}$ are each independently hydrogen, deuterium, a substituted or unsubstituted C1 to C10 alkyl group, or a substituted or unsubstituted C6 to C12 aryl group, $R^{20}$ and $R^{21}$ are each independently a substituted or unsubstituted C1 to C30 alkyl group, or a substituted or unsubstituted C6 to C30 aryl group, $L^4$ is a single bond, $L^5$ and $L^6$ are each independently a single bond or a substituted or unsubstituted phenylene group, and $Ar^3$ and $Ar^4$ are each independently a substituted or unsubstituted phenyl group, a substituted or unsubstituted biphenyl group, or a substituted or unsubstituted naphthyl group.

12. An organic optoelectronic device, comprising:

an anode and a cathode facing each other, and at least one organic layer between the anode and the cathode, wherein:

the at least one organic layer includes a light emitting layer, and the light emitting layer includes the composition for an organic optoelectronic device as claimed in claim 1.

13. The organic optoelectronic device as claimed in claim 12, wherein the composition for an organic optoelectronic device is a host of the light emitting layer.

14. A display device comprising the organic optoelectronic device as claimed in claim 12.

* * * * *